United States Patent [19]
Maeno

[11] Patent Number: 5,784,384
[45] Date of Patent: Jul. 21, 1998

[54] FLIP-FLOP CIRCUIT, SCAN PATH AND STORAGE CIRCUIT

[75] Inventor: Hideshi Maeno, Tokyo, Japan

[73] Assignee: Mitsubishi Denki Kabushiki Kaisha, Tokyo, Japan

[21] Appl. No.: 708,734

[22] Filed: Sep. 5, 1996

[30] Foreign Application Priority Data

| Sep. 5, 1995 | [JP] | Japan | 7-227741 |
| Nov. 24, 1995 | [JP] | Japan | 7-306060 |
| Jan. 29, 1996 | [JP] | Japan | 8-013275 |
| May 14, 1996 | [JP] | Japan | 8-119004 |

[51] Int. Cl.$^6$ ............................................. G06F 11/06
[52] U.S. Cl. ................................................ 371/22.31
[58] Field of Search ........................... 371/22.31, 22.32, 371/22.34, 22.36; 395/183.06

[56] References Cited

FOREIGN PATENT DOCUMENTS

| 3-181098 | 8/1991 | Japan . |
| 5-342881 | 12/1993 | Japan . |
| 7-97333 | 10/1995 | Japan . |
| WO 94/29958 | 12/1994 | WIPO . |

OTHER PUBLICATIONS

Principles of CMOS VLSI Design, pp. 19–21 and 490–493, Neil H. E. Weste, et al.

Motorola, Semiconductor Technical Data, pages MPC27T416 1–15 and D, 1995, "16K x 16 Bit Cache-Tag Ram for PowerPC™ Processors".

IBM Technical Disclosure Bulletin, vol. 28, No. 8, pp. 3547–3548, 1986, "CMOS Toggle Flip-Flop".

*Primary Examiner*—V. Canney
*Attorney, Agent, or Firm*—Oblon, Spivak, McClelland, Maier & Neustadt, P.C.

[57] ABSTRACT

In order to obtain a flip-flop circuit which reduces an S/H time or a T-Q delay while suppressing power consumption, a master latch is formed by a dynamic half latch having a transmission gate (S1) and an invertor (INV1), while a slave latch is formed by a static half latch having transmission gates (S3, S4) and invertors (INV3, INV4). In the slave latch, the operation of the transmission gate (S4) is controlled not only by a clock signal (T) but by a mode signal (MODE). When the mode signal (MODE) is converted to a low level, the transmission gate (S4) enters a nonconducting state, so that the slave latch performs a dynamic operation.

86 Claims, 62 Drawing Sheets

5,784,384

1

FLIP-FLOP CIRCUIT, SCAN PATH AND STORAGE CIRCUIT

BACKGROUND OF THE INVENTION

1. Field of the Invention

The present invention relates to a flip-flop circuit, and more particularly, it relates to a master-slave flip-flop circuit.

2. Description of the Background Art

FIGS. 77A and 77B illustrate a conventional structure of a monophasic edge trigger type flip-flop circuit formed by series connection of a master latch and a slave latch, which are a pair of half latches, and its operation. In other words, FIG. 77A is a circuit diagram showing the structure in case of connecting a static master latch and a static slave latch in series with each other, and FIG. 77B is a timing chart showing its operation.

An input terminal is connected with the master latch, while an output terminal is connected with the slave latch. At a fall timing of a clock signal T which is supplied to a clock end, an input signal D which is supplied to the input terminal is incorporated and an output signal Q is outputted to the output terminal. Namely, FIGS. 77A and 77B illustrate a negative edge trigger type flip-flop circuit.

Around the trailing edge of the clock signal T, it is necessary to stabilize the input signal D which is supplied to the data input terminal for a constant time. Referring to FIG. 77B, the input signal D already takes a value Data1 in advance of the trailing edge of the clock signal T by a setup time. Further, the input signal D holds the data Data1 between the trailing edge of the clock signal T and a lapse of a holding time. The aforementioned constant time indicates the total sum of the setup time and the holding time, and is hereafter referred to as "S/H time" for convenience.

When the clock signal T is at a high level, an output of an invertor INV5 goes low. At this time, both of transmission gates which are formed by MOS transistors N1 and P1 and MOS transistors N4 and P4 respectively are turned on (conduction), while both of transmission gates which are formed by MOS transistors N2 and P2 and MOS transistors N3 and P3 respectively are turned off (nonconduction). The input signal D is transmitted to an input end of an invertor INV1 while an output end of an invertor INV4 is connected with an input end of an invertor INV3, whereby the slave latch enters a data holding state.

When the clock signal T is at a low level, on the other hand, both of the transmission gates which are formed by the MOS transistors N1 and P1 and the MOS transistors N4 and P4 are turned off (nonconduction) while both of the transmission gates which are formed by the MOS transistors N2 and P2 and the MOS transistors N3 and P3 are turned on (conduction). An input end of the invertor INV1 is connected with the input end of the invertor INV3 while the output end of the invertor INV1 is connected with an input end of an invertor INV2, whereby the master latch enters a data holding state.

Therefore, an operation of incorporating the data at the data input terminal and outputting the same to the data output terminal is performed on the trailing edge of the clock signal T, i.e., when the clock signal T is converted from a high level to a low level. However, there is a delay between the trailing edge of the clock signal T and appearance of the output signal Q at the data output terminal, due to the circuit operation. Hereinafter this is called "T-Q delay" for convenience.

While the output terminal of the flip-flop circuit is connected with an output end of the invertor INV3 in FIG. 77A,

2 the same may alternatively be connected with the output end of the invertor INV4 or the input end of the invertor INV3. In this case, an output signal which is logically inverted from the output signal Q of the circuit shown in FIG. 77A is obtained.

FIGS. 78A and 78B illustrate a conventional structure of a biphasic clock type flip-flop circuit formed by series connection of a master latch and a slave latch, which are a pair of half latches, and its operation. FIG. 78A is a circuit diagram showing the structure in case of connecting a static master latch and a static slave latch in series with each other, and FIG. 78B is a timing chart showing its operation.

An input terminal is connected with the master latch, while an output terminal is connected with the slave latch. An input signal D which is inputted in the input terminal is incorporated in the master latch at a fall timing of a clock signal Ti, so that inverted logic of the input signal D is transmitted to the slave latch as a signal D3. In a period when a clock signal T2 is at a low level, an output of an invertorINV 52 goes high and the slave latch is in a data holding state, while an output signal Q is outputted to the output terminal at a rise timing of the clock signal T2. The clock signals T1 and T2 do not simultaneously go high.

The input signal D must hold a constant value at an S/H time around the trailing edge of the clock signal Ti, similarly to the clock signal T. There is a delay between the rising edge of the clock signal T2 and appearance of the output signal Q at the data output terminal due to the circuit operation, and this is called "T2-Q delay" following FIGS. 77A and 77B for convenience.

In the transient state where the clock signal T is converted from the high level to the low level, the MOS transistors N1, P2, P3 and N4 are instantaneously turned on at the same time in the conventional structure of the monophasic edge trigger type flip-flop circuit. Further, the MOS transistors P1, N2, N3 and P4 are turned on at the same time in a delay by a delay time of the invertor INV5.

Therefore, a value instantaneously taken by the input signal D and data which has been developed at the output end of the invertor INV2 compete with each other at the input end of the invertor INV1, and hence the S/H time must be set at a large value as to the value of the input signal D. In other words, the master latch can latch only an input signal D whose value is constant for a period exceeding the S/H time. Further, a current disadvantageously flows due to the competition of the data, to result in unnecessary power consumption.

In the slave latch, on the other hand, data which has been developed at the output end of the invertor INV1 competes with that which has been supplied to the output end of the invertor INV4 at the input end of the invertor INV3, and hence the T-Q delay is increased to disadvantageously retard the circuit operation.

Similarly, in the transient state where the clock signal T1 is converted from the high level to the low level, a value instantaneously taken by the input signal D and data which has been developed at the output end of the invertor INV2 compete with each other at the input end of the invertor INV1 in the conventional structure of the two-phase clock type flip-flop circuit. Further, in the transient state where the clock signal T2 is converted from the low level to the high level, a value instantaneously taken by the signal D3 and data which has been developed at the output end of the invertor INV4 compete with each other at the input end of the invertor INV3.

SUMMARY OF THE INVENTION

According to a first aspect of the present invention, a flip-flop circuit is formed by series connection of first and second half latches and comprises input and output terminals, the first half latch is of a dynamic type, and the second half latch is provided with a first switch including an input end which is operationally coupled with the input terminal and an output end, so that opening/closing thereof is controlled by a clock signal, a first invertor including an input end which is connected with the output end of the first switch and an output end which is operationally coupled with the output terminal, a second invertor, a second switch whose opening/closing is complementary to that of the first switch, and a third switch whose opening/closing is controlled by a mode signal, the second invertor and the second and third switches are connected in series with each other between the output and input ends of the invertor, and the second invertor is connected in antiparallel with the first invertor upon conduction of both of the second and third switches.

According to a second aspect of the present invention, the first and second half latches serve as master and slave latches respectively, the input end of the first switch of the second half latch is indirectly connected with the input terminal through the first half latch, and the output end of the first invertor of the second half latch is connected with the output terminal directly or indirectly through the second invertor.

According to a third aspect of the present invention, the first switch of the second half latch includes a first NMOS and PMOS transistors, the first half latch is provided with a switch including an input end which is connected with the input terminal and an output end, so that opening/closing thereof is complementary to that of the first switch of the second half latch, a second PMOS transistor which is connected in series with the first PMOS transistor between the input end of the first invertor of the second half latch and a first potential point providing a first potential corresponding to one of binary logics, and a second NMOS transistor which is connected in series with the first NMOS transistor between the input end of the first invertor of the second half latch and a second potential point providing a second potential corresponding to the other one of the binary logics, and respective gates of the second NMOS and PMOS transistors are connected with the output end of the switch of the first half latch in common.

According to a fourth aspect of the present invention, the second and first half latches serve as master and slave latches respectively, the input end of the first switch of the second half latch is directly connected with the input terminal, and the output end of the first invertor of the second half latch is indirectly connected with the output terminal through the first half latch.

According to a fifth aspect of the present invention, a flip-flop circuit comprises a selector having a pair of input ends inputting an ordinary input signal and a scan test signal, and an output end outputting either one of the signals, an output terminal, and first and second half latches which are connected in series with each other between the output end of the selector and the output terminal, the first half latch is a dynamic type, the second half latch is switched between the dynamic type and a static type by a mode signal, and the selector is controlled by the mode signal for outputting the ordinary input signal when the second half latch is switched to the dynamic type while outputting the scan test signal when the second half latch is switched to the static type.

According to a sixth aspect of the present invention, the second half latch is provided with a first switch including an input end which is operationally coupled with the output end of the selector and an output end, so that opening/closing thereof is controlled by a clock signal, a first invertor including an input end which is connected with the output end of the first switch and an output end which is operationally coupled with the output terminal, a second invertor, a logic gate performing a logic operation of the clock signal and the mode signal, and a second switch whose opening/closing is controlled by an output of the logic gate, the second invertor and the second switch are connected in series with each other between the input and output ends of the first invertor, the second invertor is connected in antiparallel with the first invertor upon conduction of the second switch, and the second switch is opened/closed complementarily to the first switch when the mode signal takes a prescribed value for switching the second half latch to the static type while not conducting when the mode signal takes another value for switching the second half latch to the dynamic type.

According to a seventh aspect of the present invention, the flip-flop circuit further comprises a logic circuit inputting a hold signal, a clock original signal and a mode original signal and outputting the clock signal and the mode signal, the clock signal and the mode signal are decided on the basis of the clock original signal and the mode original signal respectively when the hold signal takes a first value, and values of the clock signal and the mode signal are fixed regardless of the clock original signal and the mode original signal when the hold signal takes a second value which is complementary to the first value.

According to an eighth aspect of the present invention, the first and second half latches serve as master and slave latches respectively, the input end of the first switch of the second half latch is indirectly connected with the output end of the selector through the first half latch, and the output end of the first invertor of the second half latch is connected with the output terminal directly or indirectly through the second invertor.

According to a ninth aspect of the present invention, the second and first half latches serve as master and slave latches respectively, the input end of the first switch of the second half latch is directly connected with the output end of the selector, and the output end of the first invertor of the second half latch is indirectly connected with the output terminal through the first half latch.

According to a tenth aspect of the present invention, the second half latch is provided with a first switch including an input end which is operationally coupled with the output end of the selector, and an output end, so that opening/closing thereof is controlled by a clock signal, a first invertor including an input end which is connected with the output end of the first switch and an output end which is operationally coupled with the output terminal, a second invertor, a second switch whose opening/closing is complementary to that of the first switch, and a third switch whose opening/closing is controlled by the mode signal, the second invertor and the second and third switches are connected in series with each other between the input and output ends of the first invertor, the second invertor is connected in antiparallel with the first invertor upon conduction of the second and third switches, and the third switch does not conduct when the mode signal switches the second half latch to the dynamic type.

According to an eleventh aspect of the present invention, the flip-flop circuit further comprises a logic circuit inputting a hold signal, a clock original signal and a mode original signal and outputting the clock signal and the mode signal, the clock signal and the mode signal are decided on the basis of the clock original signal and the mode original signal respectively when the hold signal takes a first value, and values of the clock signal and the mode signal are fixed regardless of the clock original signal and the mode original signal when the hold signal takes a second value which is complementary to the first value.

According to a twelfth aspect of the present invention, the second invertor comprises a pair of output lines forming the output end of the second invertor, an NMOS transistor comprising a drain which is connected with the first output line, a gate which is connected with the input end of the second invertor, and a source which is supplied with a first potential corresponding to one of binary logics which are outputted from the second invertor, a PMOS transistor comprising a drain which is connected with the second output line, a gate which is connected with the input end of the second invertor, and a source which is supplied with a second potential corresponding to the other one of the binary logics and being higher than the first potential, the second switch is a transmission gate employing NMOS and PMOS transistors, one and the other one of gates of the PMOS and NMOS transistors of the second switch receive the clock signal and an inverse clock signal which is complementary to the clock signal respectively, the NMOS transistors of the second invertor and the second switch are connected in series with each other, and the PMOS transistors of the second invertor and the second switch are connected in series with each other.

According to a thirteenth aspect of the present invention, the second switch is a transmission gate employing NMOS and PMOS transistors, one and the other one of gates of the PMOS and NMOS transistors of the second switch receive the clock signal and an inverse clock signal which is complementary to the clock signal respectively, the third switch is a transmission gate employing NMOS and PMOS transistors, one and the other one of gates of the NMOS and PMOS transistors of the third switch are supplied with the mode signal and an inverse mode signal which is complementary to the mode signal respectively, the NMOS transistors of the second and third switches are connected in series with each other, and the PMOS transistors of the second and third switches are connected in series with each other.

According to a fourteenth aspect of the present invention, the first and second half latches serve as master and slave latches respectively, the input end of the first switch of the second half latch is indirectly connected with the output end of the selector through the first half latch, and the output end of the first invertor of the second half latch is connected with the output terminal directly or indirectly through the second invertor.

According to a fifteenth aspect of the present invention, the first half latch is provided with a switch including an input end which is connected with the output end of the selector, and an output end, so that opening/closing thereof is complementary to that of the first switch of the second half latch, and an invertor including an input end which is connected with the output end of the switch of the first half latch, and an output end which is indirectly connected with the output terminal through the second half latch, the switch of the first half latch is a transmission gate employing NMOS and PMOS transistors, the selector comprises a first PMOS transistor including a first current electrode receiving the ordinary input signal, a second current electrode which is connected with the input end of the invertor of the first half latch through the PMOS transistor of the switch of the first half latch, and a gate, a first NMOS transistor including a first current electrode receiving the ordinary input signal, a second current electrode which is connected with the input end of the invertor of the first half latch through the NMOS transistor of the switch of the first half latch, and a gate, a second PMOS transistor including a first current electrode receiving the scan test signal, a second current electrode which is connected with the second current electrode of the first PMOS transistor, and a gate which is connected with the gate of the first NMOS transistor, and a second NMOS transistor including a first current electrode receiving the scan test signal, a second current electrode which is connected with the second current electrode of the first NMOS transistor, and a gate which is connected with the gate of the first PMOS transistor, one and the other one of the gates of the first NMOS and PMOS transistors are supplied with the mode signal and the inverse mode signal respectively, and one and the other one of the gates of the NMOS and PMOS transistors of the switch of the half latch are supplied with the clock signal and the inverse clock signal respectively.

According to a sixteenth aspect of the present invention, the second and first half latches serve as master and slave latches respectively, the input end of the first switch of the second half latch is directly connected with the output end of the selector, and the output end of the first invertor of the second half latch is indirectly connected with the output terminal through the first half latch.

According to a seventeenth aspect of the present invention, the first switch of the second half latch is a transmission gate employing NMOS and PMOS transistors, the selector comprises a first PMOS transistor including a first current electrode receiving the ordinary input signal, a second current electrode which is connected with the input end of the first invertor through the PMOS transistor of the first switch of the second half latch, and a gate, a first NMOS transistor including a first current electrode receiving the ordinary input signal, a second current electrode which is connected with the input end of the first invertor through the NMOS transistor of the first switch of the second half latch, and a gate, a second PMOS transistor including a first current electrode receiving the scan test signal, a second current electrode which is connected with the second current electrode of the first PMOS transistor, and a gate which is connected with the gate of the first NMOS transistor, and a second NMOS transistor including a first current electrode receiving the scan test signal, a second current electrode which is connected with the second current electrode of the first NMOS transistor, and a gate which is connected with the gate of the first PMOS transistor, one and the other one of the gates of the first NMOS and PMOS transistors are supplied with the mode signal and an inverse mode signal which is complementary to the mode signal respectively, and one and the other one of the gates of the NMOS and PMOS transistors of the first switch of the second half latch are supplied with the clock signal and an inverse clock signal which is complementary to the clock signal respectively.

According to an eighteenth aspect of the present invention, the second half latch is further provided with logic detection means which is supplied with the mode signal, a comparison signal and the ordinary input signal for supplying a prescribed potential to the input end of the first invertor upon activation of the mode signal and the comparison signal.

According to a nineteenth aspect of the present invention, a scan path comprises first and second flip-flop circuits which are connected in series with each other, the first flip-flop circuit is provided with a selector including a pair of input ends receiving a first ordinary input signal and a scan test signal, and an output end outputting either one thereof on the basis of a mode signal, an output terminal, a first half latch of a dynamic type which is provided between the output end of the selector and the output terminal, and a second half latch which is connected in series with the first half latch between the output end of the selector and the output terminal to be switched between the dynamic type and a static type for operation when the mode signal takes first and second logic values respectively, the second flip-flop circuit is provided with a selector including a pair of input ends receiving a second ordinary input signal and a signal which is supplied to the output terminal of the first flip-flop circuit respectively, and an output end outputting either one thereof on the basis of the mode signal, an output terminal, a first half latch of the dynamic type which is provided between the output end of the selector of the second flip-flop circuit and the output terminal of the second flip-flop circuit, and a second half latch which is connected in series with the first half latch between the output end of the selector of the second flip-flop circuit and the output terminal of the second flip-flop circuit to be switched between the dynamic and static types for operation when the mode signal takes first and second logic values respectively, the selector of the first flip-flop circuit outputs the first ordinary input signal and the scan test signal when the mode signal takes the first and second logic values respectively, and the selector of the second flip-flop circuit outputs the second ordinary input signal and the signal which is supplied to the output terminal of the first flip-flop circuit when the mode signal takes the first and second logic values respectively.

According to a twentieth aspect of the present invention, a scan path comprises first and second flip-flop circuits which are connected in series with each other, the first flip-flop circuit is provided with a selector including a pair of input ends receiving an ordinary input signal and a scan test signal, and an output end outputting either one thereof on the basis of a mode signal, an output terminal, a first half latch of a dynamic type which is provided between the output end of the selector and the output terminal, and a second half latch which is connected in series with the first half latch between the output end of the selector and the output terminal to be switched between the dynamic type and a static type for operation when the mode signal takes first and second logic values respectively, the second flip-flop circuit is provided with an input terminal which is connected with the output terminal of the first flip-flop circuit, an output terminal, a first half latch of a dynamic type which is provided between the input terminal and the output terminal of the second flip-flop circuit, and a second half latch which is connected in series with the first half latch between the input terminal of the second flip-flop circuit and the output terminal of the second flip-flop circuit to be switched between the dynamic and static types for operation when the mode signal takes the first and second logic values respectively, and the selector of the first flip-flop circuit outputs the ordinary input signal and the scan test signal when the mode signal takes the first and second logic values respectively.

According to a twenty-first aspect of the present invention, a flip-flop circuit is formed by series connection of first and second half latches and comprises input and output terminals, the first half latch is a dynamic type, the second half latch comprises a first switch including an input end which is operationally coupled with the input terminal and an output end, so that opening/closing thereof is controlled by a clock signal, a first invertor including an input end which is connected with the output end of the first switch and an output end which is operationally coupled with the output terminal, first to third switches which are connected in series with each other between a first potential point providing a first potential corresponding to one of binary logics and the input end of the first invertor, and fourth to sixth switches which are connected in series with each other between a second potential point providing a second potential corresponding to the other one of the binary logics and the input end of the first invertor, and opening/closing of the first and fourth switches, that of the second switch, that of the third switch, that of the fifth switch, and that of the sixth switch are controlled by an output of the first invertor, the clock signal, a mode signal, an inverse clock signal which complementary to the clock signal, and an inverse mode signal which is complementary to the mode signal respectively.

According to a twenty-second aspect of the present invention, the second and first half latches serve as master and slave latches respectively, the input end of the first switch of the second half latch is directly connected with the input terminal, and the output end of the first invertor of the second half latch is indirectly connected with the output terminal through the first half latch.

According to a twenty-third aspect of the present invention, the first and second half latches serve as master and slave latches respectively, the input end of the first switch of the second half latch is indirectly connected with the input terminal through the first half latch, and the output end of the first invertor of the second half latch is connected with the output terminal directly or indirectly through a connecting wire connecting a path serially connecting the first to third switches with each other excluding portions which are directly connected with the first potential with a path serially connecting the fourth to sixth switches with each other excluding portions which are directly connected with the second potential.

According to a twenty-fourth aspect of the present invention, a storage circuit comprises a first switch including input and output ends, so that opening/closing thereof is controlled by a clock signal, a first invertor including an input end which is connected with the output end of the first switch, and an output end, a second invertor, a second switch whose opening/closing is complementary to that of the first switch, and a third switch whose opening/closing is controlled by a mode signal, the second invertor and the second and third switches are connected in series with each other between the output and input ends of the first invertor, and the second invertor is connected in antiparallel with the first invertor upon conduction of both of the second and third switches.

According to a twenty-fifth aspect of the present invention, the first invertor is a CMOS invertor circuit which is formed by employing a basic cell of a CMOS gate array, and a plurality of MOS transistors of at least one conductivity type are connected in parallel with each other in the CMOS invertor circuit.

According to a twenty-sixth aspect of the present invention, the second invertor is a CMOS invertor circuit which is formed by employing a basic cell of a CMOS gate array, and a plurality of MOS transistors of at least one conductivity type are connected in parallel with each other in the CMOS invertor circuit.

According to a twenty-seventh of the present invention, an input end of the second invertor and the input ends of the second switch, the third switch and the first invertor are connected with the output ends of the first invertor, the second invertor, the second switch and the third switch respectively, the storage circuit further comprises an output terminal which is connected with the input end of the third switch.

According to a twenty-eighth of the present invention, the storage circuit further comprises a half latch having an input end and an output end which is connected with the input end of the first switch, and an operation of the half latch is controlled by a switch between the input and output ends of the half latch which is opened/closed complementarily to opening/closing of the first switch.

According to a twenty-ninth aspect of the present invention, an input end of the second invertor and the input ends of the second switch, the third switch and the first invertor are connected with the output ends of the first invertor, the second invertor, the second switch and the third switch respectively, and the storage circuit further comprises a first drive circuit having an input end which is connected with the input end of the third switch and an output end.

According to a thirtieth aspect of the present invention, the storage circuit further comprises a half latch having an input end and an output end which is connected with the input end of the first switch, and an operation of the half latch is controlled by a switch between the input and output ends of the half latch which is opened/closed complementarily to opening/closing of the first switch.

According to a thirty-first aspect of the present invention, the storage circuit further comprises a plurality of input terminals, and a selector which is connected in series with the first switch between the plurality of input terminals and the first invertor, to be controlled by a prescribed signal.

According to a thirty-second aspect of the present invention, the storage circuit further comprises first and second input terminals, and a selector which is formed by first PMOS and first NMOS transistors each controlled by a prescribed signal, the first switch is formed by second PMOS and second NMOS transistors, the first and second PMOS transistors are connected in series with each other between the first input terminal and the input end of the invertor, and the first and second NMOS transistors are connected in series with each other between the second input terminal and the input end of the first invertor.

According to a thirty-third aspect of the present invention, storage circuit is formed by a plurality of the storage circuits according to the thirty-second aspect which are connected in series with each other for forming a scan path, and the storage circuit further comprises a logic circuit which is supplied with a reset signal for fixing logics of the mode signal, the clock signal and the prescribed signal on the basis of the reset signal.

According to a thirty-fourth aspect of the present invention, the mode signal is employed as the prescribed signal.

According to a thirty-fifth aspect of the present invention, the mode signal is employed as the prescribed signal.

According to a thirty-sixth aspect of the present invention, the storage circuit further comprises a fourth switch having an input end which is connected with the output end of the first invertor and an output end, and a second drive circuit having an input end which is connected with the output end of the fourth switch and an output end, and the first switch is opened/closed complementarily to opening/closing of the fourth switch.

According to a thirty-seventh of the present invention, an input end of the second invertor and the input ends of the second switch, the third switch and the first invertor are connected with the output ends of the first invertor, the second invertor, the second switch and the third switch respectively, the storage circuit further comprises a fourth switch having an input end which is connected with the output end of the first invertor and an output end, a first drive circuit having an input end which is connected with the output end of the fourth switch and an output end, a fifth switch having an input end which is connected with the output end of the first invertor and an output end, and a second drive circuit having an input end which is connected with the output end of the fifth switch and an output end, the fourth and fifth switches are opened/closed complementarily to opening/closing of the first switch, and outputs of the first and second drive circuits take complementary values.

According to a thirty-eighth aspect of the present invention, the third switch conducts only when the second switch conducts.

According to a thirty-ninth aspect of the present invention, a flip-flop circuit comprises a plurality of input terminals, a selector selectively outputting a pair of signals among those which are supplied to the plurality of input terminals on the basis of a mode signal, a master latch which is provided with an input end receiving an output of the selector and an output end, a slave latch provided with a switch including an input end which is connected with the output end of the master latch and an output end, and a drive circuit including an input end which is connected with the output end of the switch and an output end, and a bypass switch having an input end which is connected with one of the plurality of input terminals and an output end which is connected with the input end of the drive circuit of the slave latch and is opened/closed on the basis of a bypass signal, and an operation of at least one of the master and slave latches is switched between dynamic and static types on the basis of the mode signal.

According to a fortieth aspect of the present invention, one of the plurality of input terminals is one of the pair of signals among those supplied to the plurality of input terminals.

According to a forty-first aspect of the present invention, the flip-flop circuit further comprises a bypass invertor having an input end which is connected with one of the plurality of input terminals and an output end which is connected with the input end of the bypass switch.

According to a forty-second aspect of the present invention, the flip-flop circuit further comprises a logic circuit inputting the bypass signal and a clock original signal forming the basis of a clock signal for controlling operations of the master and slave latches, the clock signal is decided on the basis of the clock original signal when the bypass signal takes a first value, and the value of the clock signal is fixed regardless of the clock original signal when the bypass signal takes a second value which is complementary to the first value.

According to a forty-third aspect of the present invention, the master latch is further provided with a switch including an input end which is connected with that of the master latch and an output end, and a drive circuit including an input end which is connected with the output end of the switch of the master latch and an output end, and the drive circuit of the master latch outputs a fixed value when the bypass switch conducts, while outputting a signal which is changed on the basis of change of a signal which is transmitted by the switch of the master latch when the bypass switch does not conduct.

According to a forty-fourth aspect of the present invention, a signal which is provided at one of the plurality of input terminals is different from both of the pair of signals among those supplied to the plurality of input terminals.

According to a forty-fifth aspect of the present invention, a flip-flop circuit comprises series connection of a pair of half latches serving as master and slave latches, at least one of the pair of half latches is switched between dynamic and static types by a mode signal to operate, and operations of the master and slave latches are controlled by a pair of different clock signals respectively.

According to a forty-sixth of the present invention, the flip-flop circuit further comprises a selector selecting one input signal from a plurality of input signals on the basis of the mode signal and transmitting the one input signal to the master latch.

According to a forty-seventh aspect of the present invention, the flip-flop circuit further comprises a logic circuit inputting one of the pair of clock signals and a clock original signal for forming the other one of the pair of clock signals, a pair of transitions are necessarily performed when the value of the clock original signal transits, and the pair of transitions are present in a period when the one of the pair of clock signals is inactive.

According to a forty-eighth aspect of the present invention, one and the other one of the pair of clock signals control operations of the master and slave latches respectively, the plurality of input signals are paired, and the clock original signal is employed as the mode signal.

According to a forty-ninth aspect of the present invention, a flip-flop circuit comprises a first selector inputting a plurality of first inputs for selecting and outputting one therefrom, a first half latch receiving an output of the first selector and operating through a first clock signal for outputting a first output, a second selector inputting the first output and at least one of second input for selecting and outputting one therefrom, and a second half latch receiving an output of the second selector and operating through a second clock signal for outputting a second output.

According to a fiftieth aspect of the present invention, a number of the plurality of first inputs is 2, and a number of the second input is 1, and an operation of each of the first and second selectors is controlled by a mode signal.

According to a fifty-first aspect of the present invention, at least one of the first and second half latches is switched between the dynamic and static types on the basis of the mode signal to operate.

According to a fifty-second aspect of the present invention, a flip-flop circuit comprises a first switch having input and output ends, a first invertor having an input end which is connected with the output end of the first switch and an output end, a second invertor having an input end which is connected with the output end of the first invertor and an output end, a first half latch which is connected with the output end of the first invertor, and a second half latch which is connected with the output end of the second invertor, the first and second half latches operate in synchronization with each other, and the first switch non-conducts when the first and second half latches are in states transmitting information, and conducts when the first and second latches are in states holding information.

According to a fifty-third aspect of the present invention, the flip-flop circuit further comprises a second switch which is interposed between the output end of the second invertor and the input end of the first invertor, the second switch non-conducts when the first and second half latches are in states transmitting information, and conducts when the first and second latches are in states holding information.

According to a fifty-fourth aspect of the present invention, the flip-flop circuit further comprises a third switch which is connected in series with the second switch between the output end of the second invertor and the input end of the first invertor, and the third switch is opened/closed by a mode signal independently of the first and second switches and the first and second half latches.

According to a fifty-fifth aspect of the present invention, the flip-flop circuit further comprises a plurality of input terminals, and a selector alternatively supplying signals which are supplied to the plurality of input terminals to the input end of the first switch, and the selector operates in synchronization with opening/closing of the third switch.

According to a fifty-sixth aspect of the present invention, a storage circuit comprises a core part for writing and reading data in correspondence to addresses, a first flip-flop for inputting a write enable original signal and outputting the same at a timing which is based on a clock signal, a second flip-flop for inputting the data to be written and outputting the same to the core part at a timing which is based on the clock signal, a write control part for inputting an output of the first flip-flop and supplying the same to the core part as a write enable signal at a timing which is based on the clock signal, and selection means having a first input end which is supplied with a read address, a second input end which is supplied with a write address, and an output end, while the output end of the selection means supplies the write address to the core part at a timing which is based on the clock signal when the value of the output of the first flip-flop corresponds to a write operation, and supplies the read address to the core part when the value of the output of the first flip-flop corresponds to a read operation, and the core part writes an output of the second flip-flop in the address corresponding to a signal which is supplied to the output end of selection means by activation of the write enable signal.

According to a fifty-seventh aspect of the present invention, the selection means has a third flip-flop which is connected to the second input end for transmitting the write signal at a timing which is based on the clock signal, and a selector including a first end which is connected to the first input end, a second end which is connected to the third flip-flop, a third end which is connected to the output end of the selection means, and a control end which is connected to an output end of the first flip-flop, and the selector supplies the third end with either one of signals supplied to the first and second ends in accordance with a value which is supplied to the control end.

According to a fifty-eighth aspect of the present invention, the third flip-flop is a scan flip-flop, and the selection means is also supplied with a test signal for supplying the output end of its own with a signal which is supplied to the second end of its own at least either when the test signal is activated or when the output of the first flip-flop corresponds to the write operation.

According to a fifty-ninth aspect of the present invention, the selection means comprises a selector for selectively outputting the write address and a scan test signal on the basis of a mode signal, a master latch for transmitting an output of the selector, a slave latch having a switch including an input end which is connected to an output end of the master latch and an output end, for transmitting an output of the master latch therethrough, and a bypass switch having an input end which is supplied with the read address and an output end which is connected to the output end of the switch of the slave latch to be switched on/off on the basis of activation/inactivation of a bypass signal, the bypass signal is inactivated at least either when the test signal is activated or when the output of the first flip-flop corresponds to the write operation, and the switch of the slave latch enters a nonconducting state regardless of the clock signal when the bypass signal is activated.

According to a sixtieth aspect of the present invention, one of the master and the slave latches operates as a static type when the mode signal controls the selector to output the scan test signal, and operates as a dynamic type when the mode signal controls the selector to output the write address, and the other latch operates as the dynamic type.

According to a sixty-first aspect of the present invention, the first and second input ends are connected in common, to be supplied with both of the write and read addresses in common.

In the flip-flop circuit according to the first, second or fourth aspect of the present invention, it is possible to control the mode signal so that the third switch is turned off and the second half latch performs a dynamic operation in an ordinary operation while the third switch is turned on and the second half latch performs a static operation at the time of making a source current test respectively. Therefore, the circuit operates at a high speed in the ordinary operation, while it is possible to avoid unnecessary current consumption as well as misidentification of a failure at the time of making a source current test.

In the flip-flop circuit according to the fifth aspect of the present invention, the mode signal also has a function of controlling the selector in addition to the function of switching the operation of the second half latch between dynamic and static types, whereby a scan type flip-flop circuit attaining the effect of the first aspect while saving the number of wires can be implemented.

In the flip-flop circuit according to the sixth, eighth or ninth aspect of the present invention, the second switch is controlled by a logic gate on the basis of the mode signal and the clock signal.

In the flip-flop circuit according to the tenth aspect of the present invention, the operation of the second half latch is switched between dynamic and static types by the fourth switch.

In the flip-flop circuit according to the third, twelfth, thirteenth, fourteenth, fifteenth, sixteenth, seventeenth, twenty-first, twenty-second or twenty-third aspect of the present invention, it is possible to avoid congestion of wires, and to reduce the area required for the layout.

In the flip-flop circuit according to the eighteenth aspect of the present invention, it is possible to detect and store such case that the ordinary input signal is not at a prescribed value.

In the scan path according to the nineteenth or twentieth aspect of the present invention, a scan path attaining the effect of the first aspect while saving the number of wires can be implemented.

In the flip-flop circuit according to the seventh or eleventh aspect of the present invention, it is possible to hold the storage content while avoiding power consumption following transition of the clock signal, by controlling the hold signal.

In the storage circuit according to the twenty-fourth aspect of the present invention, it is possible to control the mode signal so that the third switch is turned off and the storage circuit performs a dynamic operation in an ordinary operation while the third switch is turned on and the storage circuit performs a static operation at the time of making a source current test respectively. Therefore, the circuit operates at a high speed in the ordinary operation, while it is possible to avoid unnecessary current consumption as well as misidentification of a failure at the time of making a source current test.

In the storage circuit according to the twenty-fifth or twenty-sixth aspect of the present invention, it is possible to increase the speed of the transition of the output signal by improving drivability of the invertor obtaining the output signal.

In the storage circuit according to the twenty-seventh aspect of the present invention, it is possible to switch and exhibit a function as a static half latch and functions as a dynamic half latch and a tristate buffer.

In the storage circuit according to the twenty-eighth aspect of the present invention, the half latch serves as a master latch. A half period of the clock signal is necessary for transmitting a signal from the input end of the half latch to the output terminal by the functions exhibited by the storage circuit according to the twenty-seventh aspect as a dynamic half latch and a tristate buffer. Therefore, a timing margin of at least a half period of the clock signal can be obtained with respect to a skew of the clock signal when the storage circuit according to the twenty-eighth aspect is connected in series for forming a scan path, whereby a bad influence exerted by the skew can be suppressed.

In the storage circuit according to the twenty-ninth aspect of the present invention, it is possible to switch and exhibit a function as a static half latch and a function as a circut formed by connecting two dynamic half latches in series with each other.

In the storage circuit according to the thirtieth aspect of the present invention, the half latch functions as a master latch. A half period of the clock signal is necessary for transmitting a signal from the input end of the half latch to the output end of the first drive circuit by the function exhibited by the storage circuit according to the twenty-ninth aspect as a circuit formed by connecting two dynamic half latches in series with each other. Therefore, a timing margin of at least a half period of the clock signal can be obtained with respect to a skew of the clock signal when the storage circuit according to the thirtieth aspect is connected in series for forming a scan path, whereby a bad influence exerted by the skew can be suppressed.

In the storage circuit according to the thirty-first or thirty-second aspect of the present invention, a plurality of signals are switched by a prescribed signal and transmitted to the storage circuit according to the twenty-ninth aspect, whereby the circuit can serve as a scan flip-flop. At the time of performing an ordinary operation, further, it is possible to switch static and dynamic operations in correspondence to conduction/nonconduction of the third switch.

In the storage circuit according to the thirty-third aspect of the present invention, resetting of a scan path which is formed by series connection of the storage circuit according to the thirty-second aspect can be implemented by a small-scale circuit.

In the storage circuit according to the thirty-fourth or thirty-fifth aspect of the present invention, the storage circuit has two functions of performing an ordinary operation with a static half latch and performing a shift operation as a dynamic flip-flop circuit by switching of the mode signal. The output end of the ordinary operation can also be employed as a node of the scan path in the shift operation.

In the storage circuit according to the thirty-sixth aspect of the present invention, the dynamic half latch which is formed by the fourth switch and the second drive circuit is so added that a master-slave flip-flop can be formed. On the other hand, the output of the first drive circuit is also that of the master-slave flip-flop when the third switch is opened, whereby two outputs can be selected and transmitted to the scan path.

In the storage circuit according to the thirty-seventh aspect of the present invention, complementary values can be outputted from the first and second drive circuits while being matched in timing.

In the storage circuit according to the thirty-eighth aspect of the present invention, the second switch is not opened/ closed at the time of performing a static operation, whereby current consumption can be suppressed.

In the flip-flop circuit according to the thirty-ninth aspect of the present invention, it is possible to propagate a signal which is supplied to one of input terminals in no synchronization with the clock signal, although the signal which is supplied to the flip-flop circuit is propagated in synchronization with the clock signal.

In the flip-flop circuit according to the fortieth aspect of the present invention, it is possible to transmit one of the signals which are supplied to the selector in synchronization with the clock signal through the flip-flop, or transmit the same as a signal asynchronous with the clock signal.

In the flip-flop circuit according to the forty-first aspect of the present invention, it is possible to avoid consumption of unnecessary power by preventing collision in relation to a signal which is supplied to the input end of the drive circuit of the slave latch when the master latch performs an operation of inverting and outputting a signal inputted therein.

In the flip-flop circuit according to the forty-second aspect of the present invention, it is possible to avoid collision of signals transmitted from the master latch and the bypass circuit respectively and unnecessary power consumption resulting therefrom at the time of performing a bypass operation.

In the flip-flop circuit according to the forty-third aspect of the present invention, it is possible to suppress a through current flowing in the drive circuit due to fluctuating of the signal transmitted by the switch of the master latch.

In the flip-flop circuit according to the forty-fourth aspect of the present invention, a signal which is transmitted asynchronously with the clock signal can be separately inputted independently of the signal transmitted in synchronization with the clock signal.

In the flip-flop circuit according to the forty-fifth aspect of the present invention, it is possible to avoid unnecessary current consumption as well as misidentification of a failure by driving one half latch in a dynamic type to implement high-speed processing in an ordinary operation while driving the same in a static type at the time of making a source current test.

In the flip-flop circuit according to the forty-sixth aspect of the present invention, the mode signal also has a function of controlling the selector in addition to the function of switching the operation of the half latch between dynamic and static types, whereby a scan type flip-flop circuit attaining the effect of the forty-fifth aspect while saving the number of wires can be implemented.

In the flip-flop circuit according to the forty-seventh aspect of the present invention, the other one of the pair of clock signals performs a pair of transitions in a period when one of the clock signals is inactive and the flip-flop circuit operates with a biphasic clock when the clock original signal transits. When the clock original signal does not transit, on the other hand, the other one of the pair of clock signals takes a value which is complementary to that of one of the pair of clock signals, and the flip-flop circuit serves as a monophasic edge trigger type. Therefore, the operation type of the flip-flop circuit can be switched by the clock original signal.

In the flip-flop circuit according to the forty-eighth aspect of the present invention, the mode signal is fixed at a prescribed value when the clock original signal does not transit, whereby the flip-flop circuit operates as a monophasic edge trigger type in relation to one of the input signals. When the clock original signal transits, on the other hand, the transition is performed in a period when the first clock signal is inactive, whereby the master latch will not transmit one of the input signals even if the mode signal takes the prescribed value. In this case, therefore, the other one of the input signals is driven in a biphasic clock type. Thus, it is not necessary to separately provide a wire for guiding the mode signal.

In the flip-flop circuit according to the forty-ninth aspect of the present invention, the first and second half latches test single logic circuits respectively also when a single scan path is formed by serially connecting the flip-flop circuit and transmitting the second output to the subsequent stage, whereby it is possible to test two logic circuits.

In the flip-flop circuit according to the fiftieth aspect of the present invention, it is possible to select a signal for an ordinary operation and that for a shift operation of a scan test by the selector, and transmit the same to the flip-flop circuit.

In the flip-flop circuit according to the fifty-first aspect of the present invention, it is possible to switch the operation of the flip-flop circuit according to the fiftieth aspect between dynamic and static types in ordinary and shift operations.

In the flip-flop circuit according to the fifty-second aspect of the present invention, complementary values can be attained as the outputs of the first and second half latches while being matched in transition timing.

In the flip-flop circuit according to the fifty-third aspect of the present invention, the first half latch serves as a slave latch of a master-slave type flip-flop circuit whose master latch operates in a static type. The second half latch serves as a slave latch of a master- slave type flip-flop circuit whose master latch operates in a dynamic type.

In the flip-flop circuit according to the fifty-fourth aspect of the present invention, it is possible to make the master latch which is formed by the first switch and the first and second invertors serve in dynamic and static types by opening/closing of the third switch.

In the flip-flop circuit according to the fifty-fifth aspect of the present invention, it is possible to make the master latch which is formed by the first switch and the first and second invertors serve in dynamic and static types in response to the types of signals supplied to the plurality of input terminals.

In the storage circuit according to the fifty-sixth aspect of the present invention, the selection means supplies the write and read addresses to the core part in the write and read operations respectively. The write and read operations are synchronous and asynchronous with the clock signal respectively. The read and write addresses are supplied to the first and second input ends respectively, whereby no dummy period may be provided in the process of shifting from the read operation which is asynchronous with the clock signal to the write operation which is synchronous with the clock signal for changing the read address to the write address.

In the storage circuit according to the fifty-seventh aspect of the present invention, the third flip-flop supplies the write address to the selector in synchronization with the clock signal. Namely, the selector selectively supplies the write address and the read address which is asynchronous with the clock signal to the core part. Thus, the read and write operations can be asynchronously and synchronously executed respectively.

In the storage circuit according to the fifty-eighth aspect of the present invention, the scan test signal which is supplied to the third flip-flop can be supplied to the core as a read address by activating the test signal.

In the storage circuit according to the fifty-ninth or sixtieth aspect of the present invention, the bypass signal is not activated in the write operation, whereby the read address is not bypassed and the write address outputted from the selector is outputted from the selection means through the master and slave latches. In the read operation, on the other hand, the bypass signal is activated so that the read address is bypassed and outputted from the selection means with no synchronization with the clock signal.

When the selector is previously controlled to transmit the scan test signal to the master latch by the mode signal and the test signal is activated after the scan test signal is held, the read address is not bypassed and the scan test signal is outputted from the selection means although this is not the write operation. Therefore, the scan test signal can be supplied to the core as the read address.

In the storage circuit according to the sixty-first aspect of the present invention, a test address can be supplied to the core through the scan test signal which is supplied to the third flip-flop although when the first and second input ends are connected in common and a dummy period for changing the read address to the write address must be provided in the process of shifting from the read operation which is asynchronous with the clock signal to the write operation which is synchronous with the clock signal, if the control signal specifies a scan mode.

An object of the present invention is to provide a flip-flop circuit which reduces an S/H time or a T-Q delay (or T2-Q delay) while suppressing power consumption.

Throughout the specification, the term "scan path" indicates series connection of flip-flop circuits, which is adapted to transmit a signal for a scan test in a test operation different from an ordinary operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Before concrete description is made on embodiments of the present invention, leading ideas (hereinafter referred to as "preideas") for reaching the present invention from the prior art are described thereby clarifying the technical contents of the present invention.

A. Preideas (a-1) First Preidea

In order to avoid increase of an S/H time or a T-Q delay, it may be possible to form both of master and slave latches by dynamic half latches. In other words, the MOS transistors N2, N4, P2 and P4 and the invertors INV2 and INV4 may be removed from the structure shown in FIG. 77A. It is assumed here that the invertors INV1 and INV3 are formed by CMOS transistors.

The input end of the invertor INV1 enters a floating state when the master latch is in a data holding state, while that of the invertor INV3 enters a floating state when the slave latch is in a data holding state. Capacitances parasitizing the input ends of the invertors INV1 and INV3 respectively hold either high or low levels, thereby holding the data. Thus, no data competition is caused but speed performance is improved while power consumption can be reduced.

When the clock signal T is stopped, however, the capacitances are charged/discharged by leakage or the like, and the potentials at the input ends of the invertors INV1 and INV3 may fall into intermediate potentials which are neither high nor low. In this case, through currents disadvantageously flow through the invertors INV1 and INV3.

When such a flip-flop circuit is applied to an integrated circuit which is formed by CMOS transistors, a DC test of the integrated circuit, particularly a source current test, which is performed while stopping the clock signal T cannot be correctly carried out. A current hardly flows in a circuit which is formed by CMOS transistors in a normal operation, and hence an erroneous decision of a failure is disadvantageously made if a current flows across the circuit and a power source due to the aforementioned through currents.

The presence of such through currents is unpreferable also in view of reduction in power consumption. One of techniques for reducing power consumption is adapted to stop a clock signal of a flip-flop circuit which is provided in an unused circuit block. If a flip-flop circuit having master and slave latches of dynamic types according to the first preidea is employed in a circuit block to which such a technique is applied, through currents resulting from stoppage of the clock signal consume unnecessary power, as a matter of course.

Therefore, it is unpreferable to form both of master and slave latches by dynamic half latches.

(a-2) Second Preidea

From the background art and the first preidea, it is possible to reach an idea of forming a pair of half latches by dynamic and static types respectively.

Figure 1:
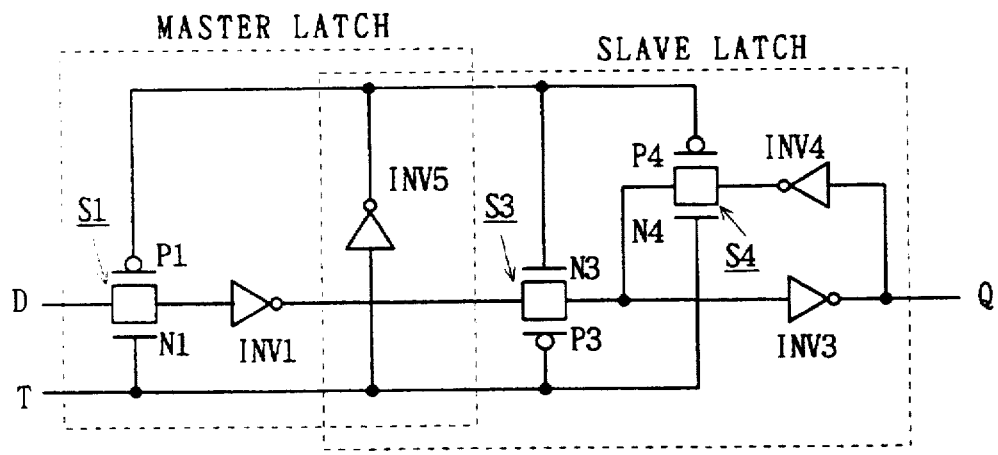
FIG. 1 is a circuit diagram showing the structure of a flip-flip circuit based on a second preidea of the present invention.
Figure 2:
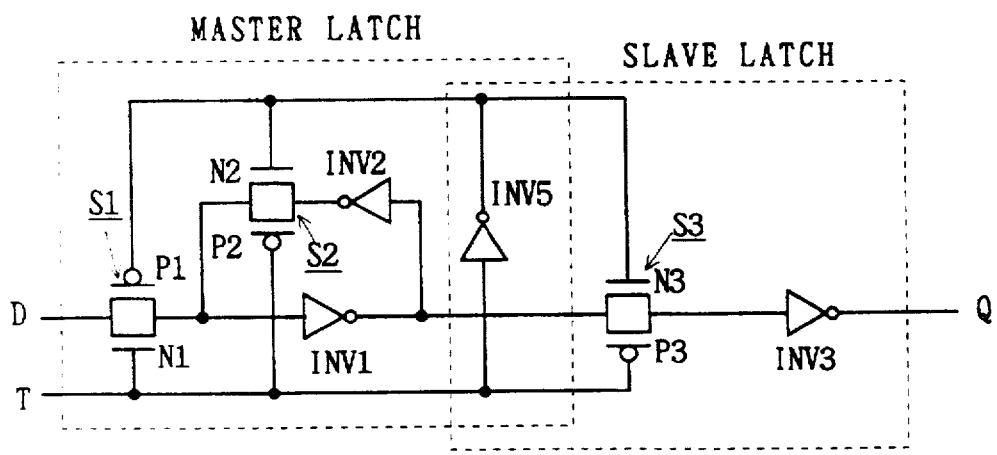
FIG. 2 is a circuit diagram showing the structure of another flip-flop circuit based on the second preidea of the present invention.

FIGS. 1 and 2 are circuit diagrams showing the structures of two types of flip-flop circuits which are based on the second preidea. The structure shown in FIG. 1 is provided with a dynamic master latch and a static slave latch. On the other hand, the structure shown in FIG. 2 is provided with a static master latch and a dynamic slave latch.

The structure shown in FIG. 1 is now described. The master latch comprises a transmission gate S1 consisting of parallel connection of an NMOS transistor N1 and a PMOS transistor P1, an invertor INV1 which is connected in series with the transmission gate S1, and an invertor INV5 which is connected in parallel with the transmission gate S1.

An end of the transmission gate S1 is connected with an input terminal, to receive an input signal D. The other end of the transmission gate S1 is connected with an input end of the invertor INV1. A clock end which is supplied with a clock signal T is connected with a gate of the NMOS transistor N1 and an input end of the invertor INV5 in common. An output end of the invertor INV5 is connected with a gate of the PMOS transistor P1.

On the other hand, the slave latch comprises a transmission gate S3 consisting of parallel connection of an NMOS transistor N3 and a PMOS transistor P3, an invertor INV3 which is connected in series therewith, a transmission gate S4 consisting of parallel connection of an NMOS transistor N4 and a PMOS transistor P4, and an invertor INV4 which is connected in series therewith. Further, the slave latch shares the invertor INV5 with the master latch.

An end of the transmission gate S3 is connected with an output end of the invertor INV1 which is provided on the master latch, while the other end thereof is connected with an input end of the invertor INV3. An output end of the invertor INV3 is connected with an output terminal and an input end of the invertor INV4 in common. An end of the transmission gate S4 is connected with an output end of the invertor INV4, while the other end of the transmission gate S4 is connected with the other end of the transmission gate S3 and the input end of the invertor INV3 in common. Input and output ends of the invertor INV5 are connected with gates of the PMOS and NMOS transistors P3 and N3 respectively. All invertors have CMOS structures.

An end of the transmission gate S1 of the master latch is directly connected with the input terminal, while that of the transmission gate S3 of the slave latch is indirectly and operationally connected with the input terminal. Further, the output end of the invertor INV3 of the slave latch is directly connected with the output terminal, while that of the invertor INV1 of the master latch is indirectly and operationally connected with the output terminal.

Operations of the flip-flop circuit having the structure shown in FIG. 1 are now described. It is assumed that the clock signal T is at a high level. An output of the invertor INV5 is at a low level, and both of the transmission gates S1 and S4 are turned on (conduction), while the transmission gate S3 is turned off (nonconduction). The input signal D is transmitted to the input end of the invertor INV1 while the output end of the invertor INV4 is connected with the input end of the invertor INV3, whereby the slave latch enters a data holding state with no fluctuation of a logical value which is developed at the output terminal.

Due to transition of the clock signal T from the high level to a low level, the transmission gate S1 is turned off so that a capacitance parasitizing the input end of the invertor INV1 holds the value of the input signal D. At this time, the input end of the invertor INV1 is in a floating state dissimilarly to that in a static latch, whereby the value held by the parasitic capacitance will not compete with other values. Thus, an S/H time may not be set at a high level, but it is possible to cope with the input signal D which takes a constant value in a short period.

Since the clock signal T is at the low level, the transmission gate S4 is turned off while the transmission gate S3 is turned on. Therefore, the logic which is held by the capacitance parasitizing the input end of the invertor INV1 is inverted twice by the invertors INV1 and INV3, and supplied to the output terminal as an output signal Q.

When a source current test is performed, the clock signal T is forcibly converted to a high level, whereby the problem caused in the first preidea is solved. This is because the transmission gate S1 is thus turned on so that the input end of the invertor INV1 will not fall into an intermediate potential, whereby no through current flows through the invertor INV1.

In the structure shown in FIG. 1, however, no T-Q delay can be reduced although the S/H time can be suppressed.

The structure shown in FIG. 2 is now described. The master latch comprises a structure obtained by adding series connection of a transmission gate S2 and an invertor INV2 in parallel with the invertor INV1 in the structure shown in FIG. 1. Input and output ends of the invertor INV2 are connected with the output end of the invertor INV1 and an end of the transmission gate S2 respectively, while the other end of the transmission gate S2 is connected with the input end of the invertor INV1.

The transmission gate S2 is formed by parallel connection of an NMOS transistor N2 and a PMOS transistor P2, while output and input ends of an invertor INV5 are connected with gates of the NMOS transistor N2 and the PMOS transistor P2 respectively.

The slave latch has a structure obtained by removing the transmission gate S4 and the invertor INV4 from the structure shown in FIG. 1.

Operations of the flip-flop circuit having the structure shown in FIG. 2 are now described. It is assumed here that a clock signal T is at a high level. An output of the invertor INV5 is at a low level, and the transmission gate S1 is turned on (conduction) while both of the transmission gates S2 and S3 are turned off (nonconduction). A signal developed at the output end of the invertor INV2 is not transmitted to the input end of the invertor INV1, but only an input signal D is transmitted thereto. On the other hand, a signal which is developed at the output end of the invertor INV1 is not transmitted to the input end of the invertor INV3. Thus, the input end of the invertor INV1 enters a floating state, so that a value held by a capacitance parasitizing the same will not compete with other values. Thus, the slave latch enters a data holding state, whereby a T-Q delay can be reduced to increase the operational speed.

Due to transition of the clock signal T from the high level to a low level, the transmission gate S1 is turned off and the transmission gate S2 is turned on, so that the invertors INV1 and INV2 hold the input signal D. The transmission gate S3 is also turned on, whereby a logic held by the input end of the invertor INV1 is inverted twice by the invertors INV1 and INV3, and supplied to an output terminal as an output signal Q.

When a source current test is performed, the clock signal T is forcibly converted to a low level, whereby the problem caused in the first preidea is solved. This is because the transmission gate S3 is thus turned on and the input end of the invertor INV3 will not fall into an intermediate potential, whereby no through current flows through the invertor INV3.

In the structure shown in FIG. 2, however, no S/H time can be reduced although the T-Q delay can be suppressed.

B. Embodiments of the Present Invention

In relation to embodiments of the present invention, a technique of switching at least one of half latches between a dynamic type and a static type for driving the same is described on the basis of the second preidea. Such switching is performed by a mode signal, for quickening the operation of the flip-flop circuit by switching the half latch to a dynamic type while avoiding an erroneous determination in a source current test of the flip-flop circuit by switching the half latch to a static type. The embodiments are now described in order.

(b-1) Embodiment 1

Figure 3:
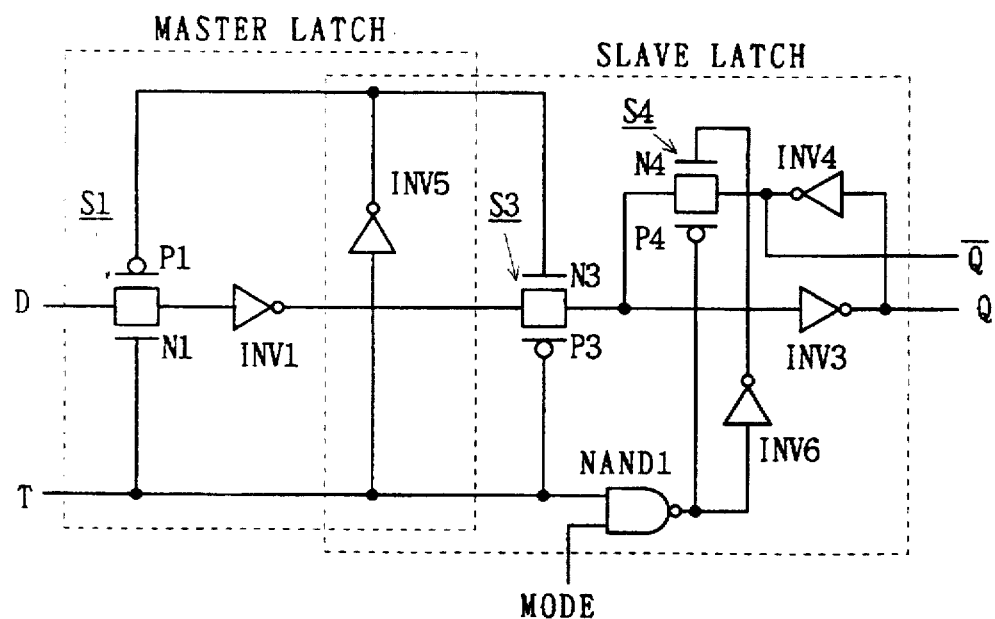
FIG. 3 is a circuit diagram showing the structure of an embodiment 1 of the present invention.

FIG. 3 is a circuit diagram showing the structure of an embodiment 1 of the present invention. A master latch is identical in structure to that employed in the second preidea shown in FIG. 1. On the other hand, a slave latch is different from that shown in FIG. 1 in a way of supplying a signal to the transmission gate S4.

The slave latch further comprises a NAND gate NAND1 and an invertor INV6, so that output and input ends of the invertor INV6 are connected with gates of NMOS and PMOS transistors N4 and P4 forming the transmission gate S4 respectively.

Further, an output end of the NAND gate NAND1 is connected with the input end of the invertor INV6. First and second input ends of the NAND gate NAND1 receive a mode signal MODE and a clock signal T respectively. When the mode signal MODE is at a low level, the embodiment 1 performs an operation which is similar to that of the structure of the series connection of two dynamic half latches described in relation to the first preidea, whereby both of an S/H time and a T-Q delay can be suppressed.

When the mode signal MODE is at a high level, on the other hand, the circuit shown in FIG. 3 performs an operation which is similar to that of the circuit described in relation to the second preidea with reference to FIG. 1.

When this flip-flop circuit performs an ordinary operation, therefore, the mode signal MODE is converted to a low level, whereby the circuit operation can be quickened. When the flip-flop circuit is subjected to a DC test, particularly a source current test, on the other hand, the mode signal MODE is converted to a high level, while the clock signal T is forcibly converted also to a high level. Thus, the transmission gate S4 is turned on to bring the input end of the invertor INV3 out from a floating state, whereby a through current in the invertor INV3 can be avoided.

According to this embodiment, it is possible to overcome the disadvantage of the first preidea while maintaining its advantage. In other words, it is possible to suppress unnecessary power consumption while quickening the circuit operation.

An inverted signal $\overline{Q}$ of the output signal Q can be taken out from the output end of the invertor INV4.

Figure 4:
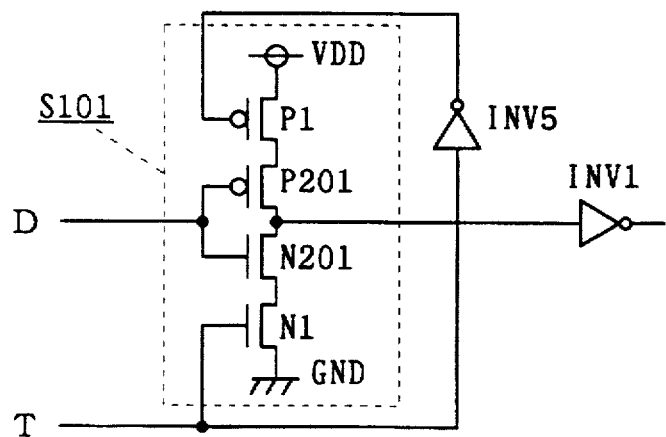
FIG. 4 is a circuit diagram showing a modification of the embodiment 1 of the present invention.

FIG. 4 is a circuit diagram showing a part of a structure modifying this embodiment. For simplification, this figure shows only a part of the master latch. A transmission gate S101 substitutes for the transmission gate S1 of FIG. 3.

An input signal D is supplied to gates of PMOS and NMOS transistors P201 and N201 in common. Drains of the PMOS and NMOS transistors P201 and N201 are connected to the input end of the invertor INV1 in common. A source of the PMOS transistor P201 is connected to a potential point providing a potential VDD through a PMOS transistor P1. A source of the NMOS transistor N201 is grounded through an NMOS transistor N1.

The PMOS and NMOS transistors P1 and N1 are supplied with a clock signal T and its inverted signal in respective gate electrodes thereof similarly to the case shown in FIG. 3, to be substantially simultaneously opened/closed. When the PMOS and NMOS transistors P1 and N1 conduct, the transmission gate S101 serve as an invertor. When the PMOS and NMOS transistors P1 and N1 do not conduct, on the other hand, an output end of the transmission gate S101 is set in a high impedance state.

Such a modification can also be applied to each of various embodiments hereafter described.

(b-2) Embodiment 2

Figure 5:
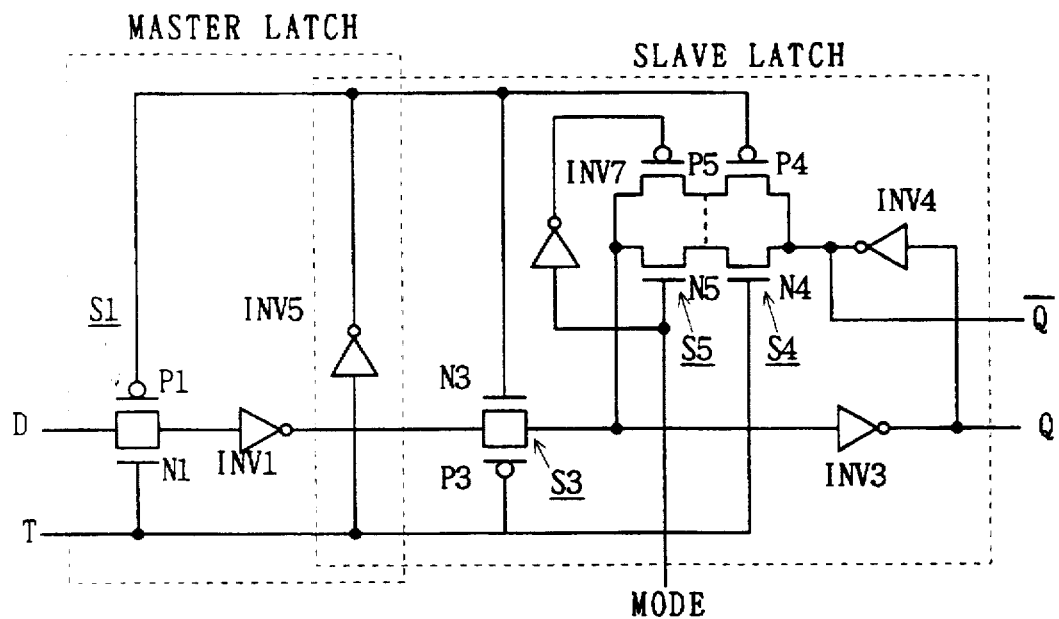
FIG. 5 is a circuit diagram showing the structure of an embodiment 2 of the present invention.

FIG. 5 is a circuit diagram showing the structure of an embodiment 2 of the present invention. A master latch is identical in structure to that employed in the second preidea shown in FIG. 1. On the other hand, a slave latch comprises a transmission gate S5 which is interposed between a point connecting the input end of the invertor INV3 and the second end of the transmission gate S3 in common and the second end of the transmission gate S4, and an invertor INV7 which is connected in parallel with the transmission gate S5.

The transmission gate S5 is formed by parallel connection of a PMOS transistor P5 and an NMOS transistor N5. Output and input ends of the invertor INV7 are connected with gate electrodes of the PMOS and NMOS transistors P5 and N5 respectively. The mode signal MODE is supplied to the input end of the invertor INV7.

When the mode signal MODE is at a low level, therefore, the transmission gate S5 is turned off so that this circuit performs an operation which is similar to that of the structure of series connection of two dynamic half latches described with reference to the first preidea, whereby both of an S/H time and a T-Q delay can be suppressed.

When the mode signal MODE is at a high level, on the other hand, the transmission gate S5 is turned on so that the circuit shown in FIG. 5 operates in a similar manner to the circuit described in relation to the second preidea with reference to FIG. 1.

Therefore, the embodiment 2 has an effect which is similar to that of the embodiment 1. The inverted signal $\overline{Q}$ of the output signal Q can be taken out from the output end of the invertor INV4, as a matter of course.

The connection shown by broken lines in FIG. 5, i.e., that of the PMOS and NMOS transistors P5 and N4 or the PMOS and NMOS transistors P4 and N5 may be omitted with no influence on the operation. When this connection is omitted, the number of wires can be effectively reduced.

(b-3) Embodiment 3

Figure 77A:
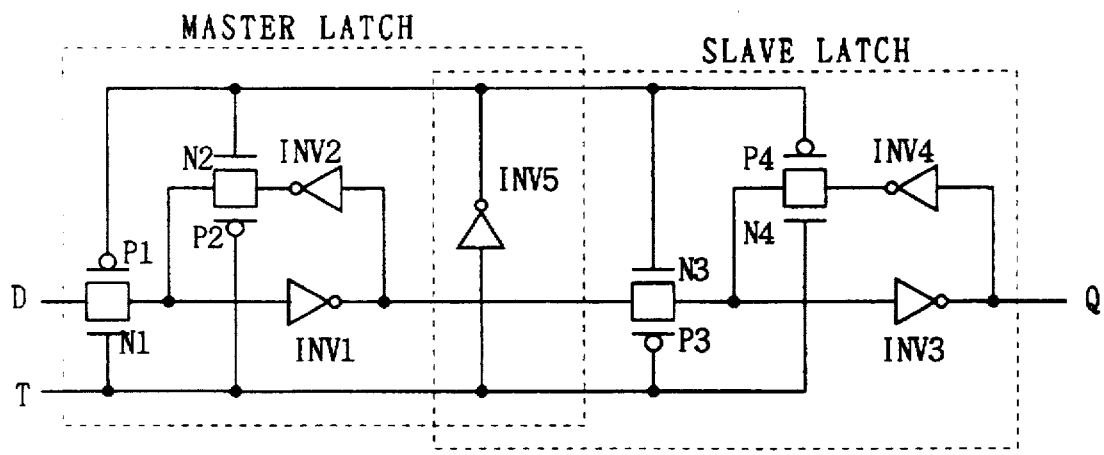
FIGS. 77A and 77B are a circuit diagram and a timing chart showing the prior art.
Figure 77B:
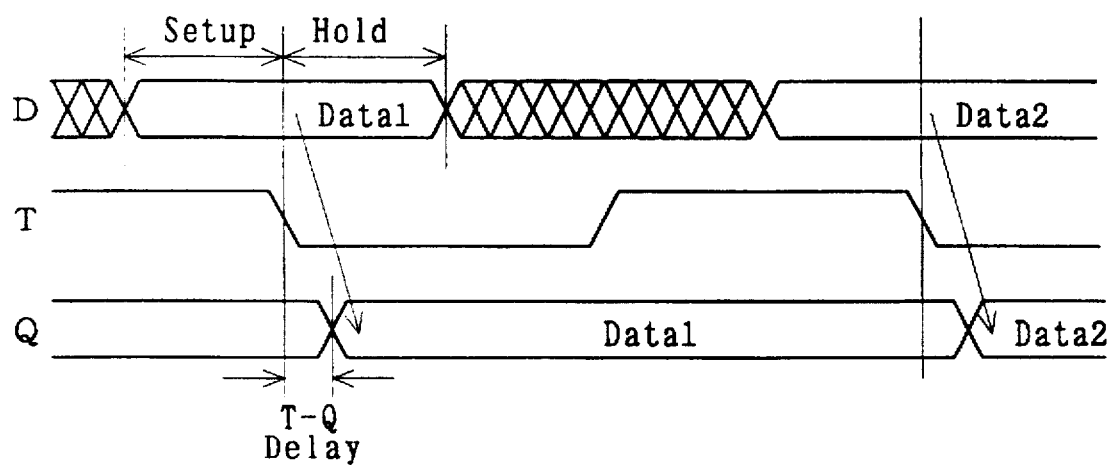

The invertor INV3 in the slave latch shown in FIG. 77A is generally formed by series connection of one PMOS transistor and one NMOS transistor. The holding time of the slave latch is increased when a capacitance serving as a load with respect to the output signal Q is increased. A technique of providing a drive circuit which receives the output signal Q and transmits the same to a subsequent stage so that the aforementioned capacitance is not directly connected with the invertors INV3 and INV4 for preventing this is known.

In the slave latch shown in the embodiment 2, however, a dynamic operation is implemented by converting the mode signal MODE to a low level in case of employing the same for an ordinary operation. Therefore, the holding time of the slave latch is not increased.

In this case, it is not necessary to newly provide the aforementioned drive circuit. As to the output signal Q which is transmitted to the subsequent stage, however, high-speed transition is implemented as the drivability of the invertor INV3 is increased.

Figure 6:
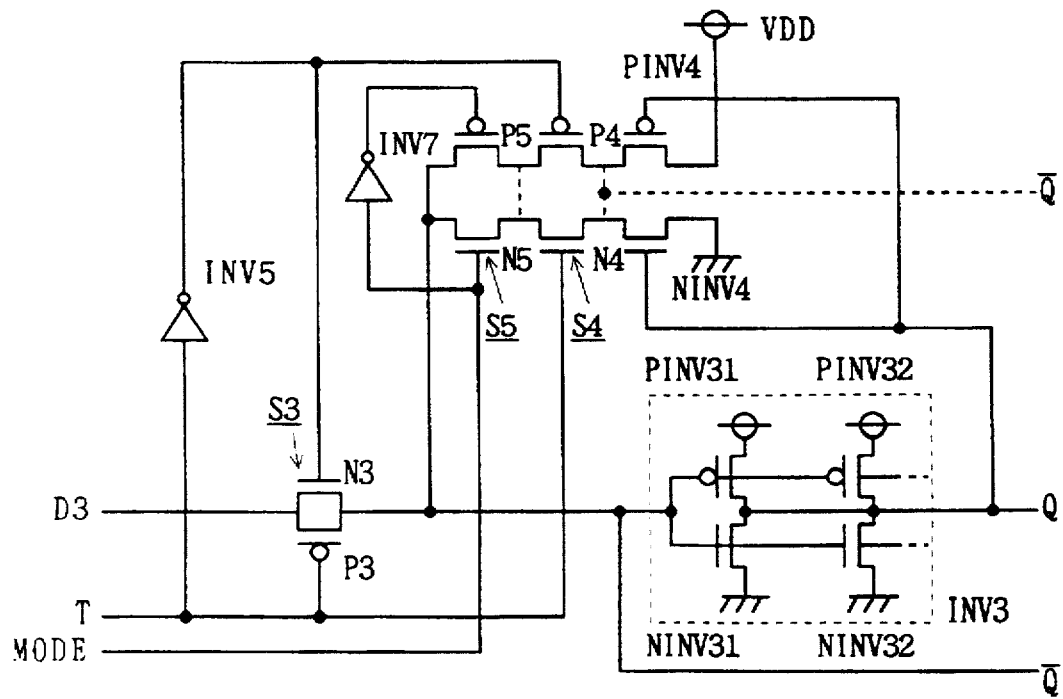
FIG. 6 is a circuit diagram showing the structure of an embodiment 3 of the present invention.

FIG. 6 is a circuit diagram showing the structure of an embodiment 3. Illustrated herein is only a part of a slave latch, which can be applied as the slave latch of the flip-flop circuit shown in FIG. 5. For convenience, it is assumed here that a signal D3 is obtained from a master latch.

Referring to FIG. 6, the invertor INV3 is formed by a plurality of transistor pairs PINV31 and NINV31, PINV32 and NINV32, . . . . Invertors formed by the respective transistor pairs are connected in parallel with each other. The number thereof may be at least three.

In case of employing a CMOS gate array in which transistor sizes are unified in general, therefore, this embodiment is effective for improving drivability of the invertor INV3.

FIG. 6 shows such a state that an invertor INV4 is formed by PMOS and NMOS transistors PINV4 and NINV4. The inverted signal $\overline{Q}$ of the output signal Q, which is obtained as the output of the invertor INV4, can alternatively be obtained from the input end of the invertor INV3. Thus, connection between a PMOS transistor forming the transmission gate S4 and the NMOS transistor NINV4, or that between the PMOS transistor PINV4 and an NMOS transistor N4 is shown by a broken line since no influence is exerted on the operation even if the same is omitted, when the output of the invertor INV4 is not particularly necessary. A further effect of reducing the number of wires can be brought by omitting this connection.

(b-4) Embodiment 4

Figure 7:
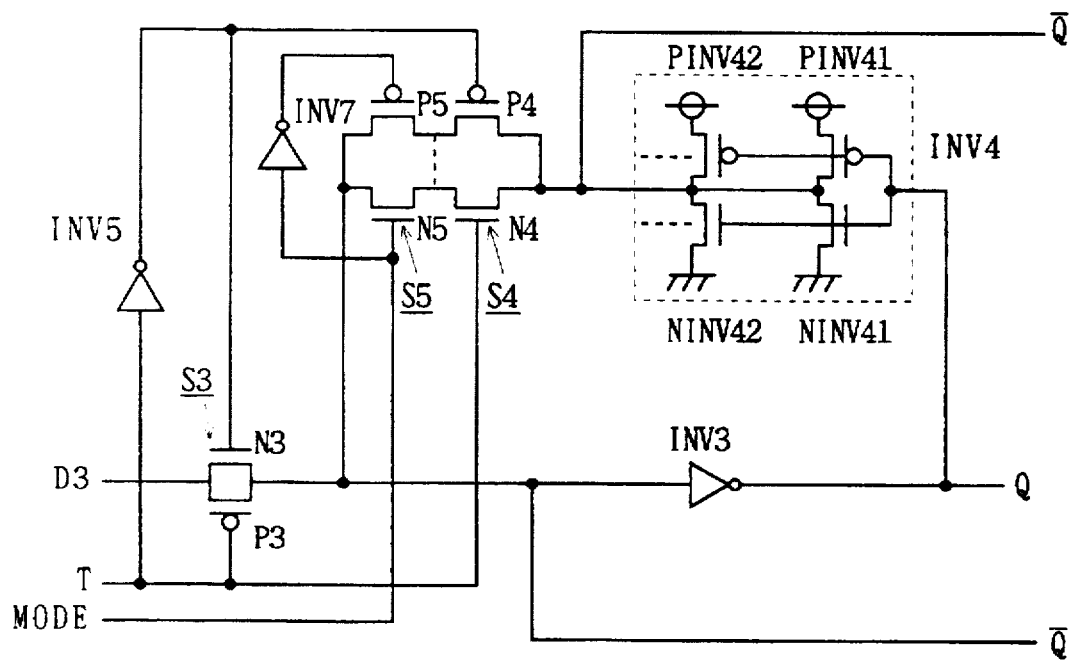
FIG. 7 is a circuit diagram showing the structure of an embodiment 4 of the present invention.

FIG. 7 is a circuit diagram showing the structure of an embodiment 4. Illustrated herein is only a part of a slave latch, which can be applied as a slave latch of the flip-flop circuit shown in FIG. 5.

Referring to FIG. 7, the invertor INV4 is formed by a plurality of transistor pairs PINV41 and NINV41, PINV42 and NINV42, . . . . Invertors formed by the respective transistor pairs are connected in parallel with each other. The number thereof may be at least three.

In case of employing a CMOS gate array in which transistor sizes are unified in general, therefore, this embodiment is effective for improving drivability of the invertor INV4.

While the inverted signal $\overline{Q}$ of the output signal Q can also be obtained from the input end of the invertor INV3, high-speed transition of the inverted signal $\overline{Q}$ is implemented by obtaining the inverted signal $\overline{Q}$ of the output signal Q from the invertor INV4 structured in the aforementioned manner, similarly to the embodiment 3.

(b-5) Embodiment 5

Figure 8A:
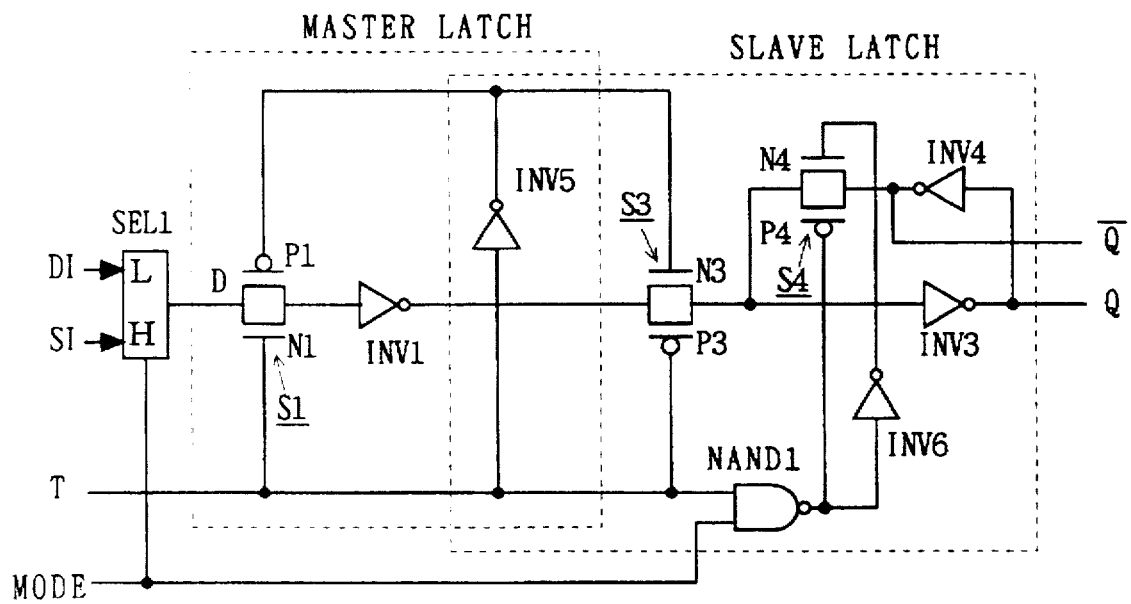
FIGS. 8A and 8B are circuit diagrams showing the structure of an embodiment 5 of the present invention.

FIG. 8A is a circuit diagram showing the structure of an embodiment 5 of the present invention. The flip-flop circuit shown in FIG. 8A has a structure obtained by adding a selector SEL1 to the flip-flop circuit according to the embodiment 1 shown in FIG. 3. Therefore, the flip-flop circuit shown in FIG. 8A can be used as a scan type flip-flop circuit which is employed in test simplification design.

Figure 8B:
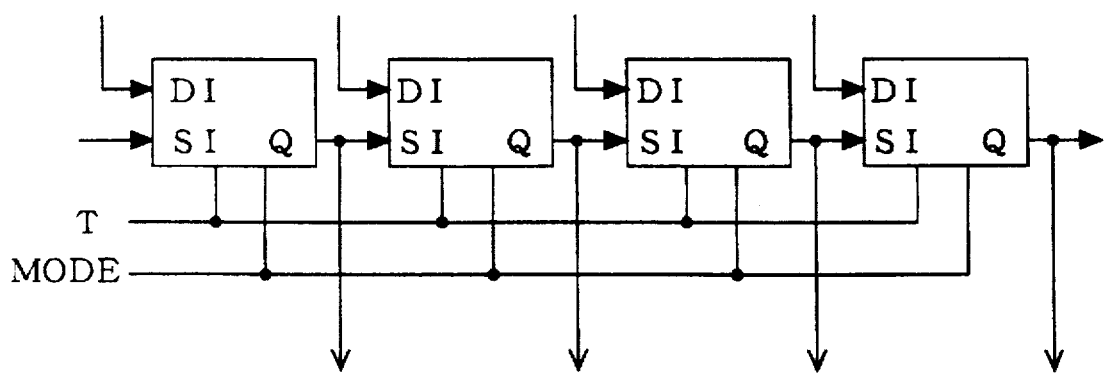

FIG. 8B shows series connection (scan path) of scan type flip-flop circuits, each of which is formed by the flip-flop circuit shown in FIG. 8A.

The selector SEL1 has a pair of input ends receiving an ordinary input signal DI and a scan test signal SI, and an output end outputting either one of these signals depending on a signal which is supplied to its control end. The selector SEL1 supplies the ordinary input signal DI to the output end when its control end is supplied with a low-level signal, while supplying the scan test signal SI to the output end when its control end is supplied with a high-level signal respectively.

In the embodiment 5, a mode signal MODE is supplied to the control end of the selector SEL1. When the mode signal MODE is set at a low level, the selector SEL1 outputs the ordinary input signal DI, and a transmission gate S1 receives the same as the input signal D. In response to fall of a clock signal T, the input signal D is outputted to an output terminal as the output signal Q. As shown in FIG. 8B, the respective output signals Q exert no influence on input signals DI of those of subsequent stages.

At this time, the transmission gate S4 is in an off state and hence both half latches are in dynamic types, whereby both of an S/H time and a T-Q delay can be suppressed. Namely, the operation can be quickened when this circuit is employed as an ordinary flip-flop circuit.

When the mode signal MODE is set at a high level, on the other hand, the on or off state of the transmission gate S4 depends on the clock signal T, and the slave latch operates as a static type. At this time, the selector SEL1 outputs the scan test signal SI, so that the transmission gate S1 receives this signal as the input signal D and outputs the same to the output terminal as the output signal Q in correspondence to fall of the clock signal T.

As shown in FIG. 8B, the serially connected scan type flip-flop circuits successively transmit the scan test signal SI to the subsequent flip-flop circuits as the output signal Q. Such transmission of the scan test signal SI is a shift operation which is performed in a scan test, and no quick circuit operation is required in this case, dissimilarly to the ordinary operation.

An erroneous determination in a source current test can be avoided by setting the mode signal MODE at a high level and further forcibly converting the clock signal T to a high level, similarly to the embodiments 1 and 2.

According to this embodiment, the mode signal MODE is adapted to control both of the selecting operation of the selector SEL1 and the switching of the slave latch between the dynamic and static types, whereby the technique of the embodiment 1 can be applied to a scan type flip-flop circuit while saving the number of wires.

(b-6) Embodiment 6

Figure 9:
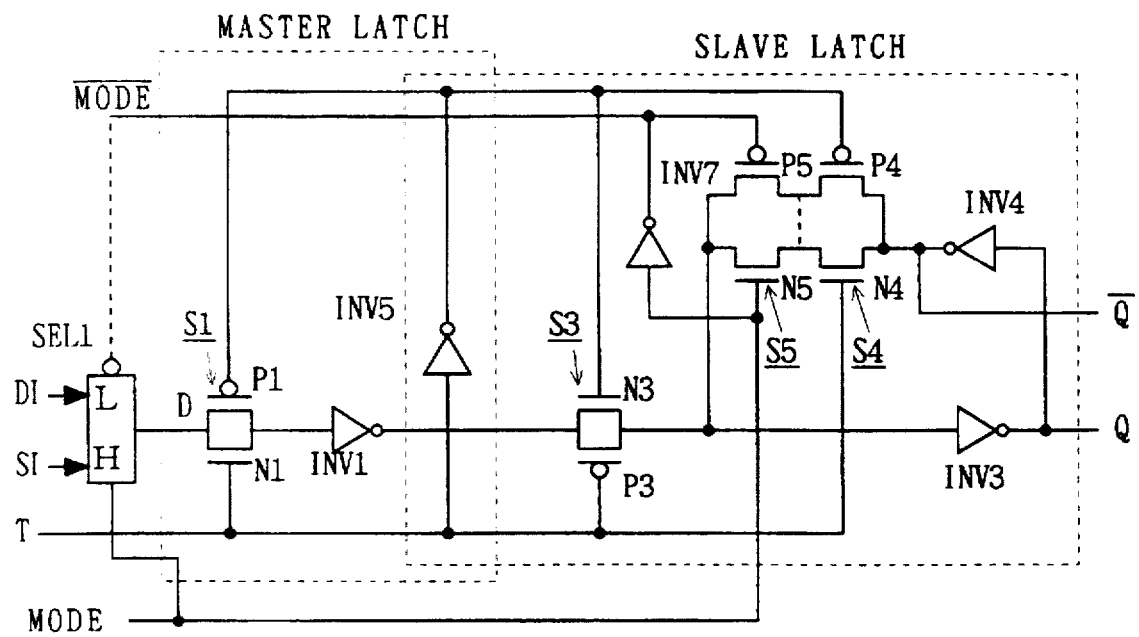
FIG. 9 is a circuit diagram showing the structure of an embodiment 6 of the present invention.

FIG. 9 is a circuit diagram showing the structure of an embodiment 6 of the present invention. The flip-flop circuit shown in FIG. 9 has a structure obtained by adding the selector SEL1 to the flip-flop circuit according to the embodiment 2 shown in FIG. 5. Therefore, the flip-flop circuit shown in FIG. 9 can be used as a scan type flip-flop circuit similarly to that shown in FIG. 8A, through connection shown in FIG. 8B.

Also in this embodiment, a mode signal MODE is supplied to the control end of the selector SEL1. According to this embodiment, therefore, the technique of the embodiment 2 can be applied to a scan type flip-flop circuit while saving the number of wires, similarly to the effect of the embodiment 5.

According to this embodiment, the invertor INV7 outputs an inverse mode signal $\overline{MODE}$ which is inverse in logic to the mode signal MODE, whereby the selector SEL1 may also require the inverse mode signal $\overline{MODE}$ in its selecting operation, in addition to the mode signal MODE.

Figure 15:
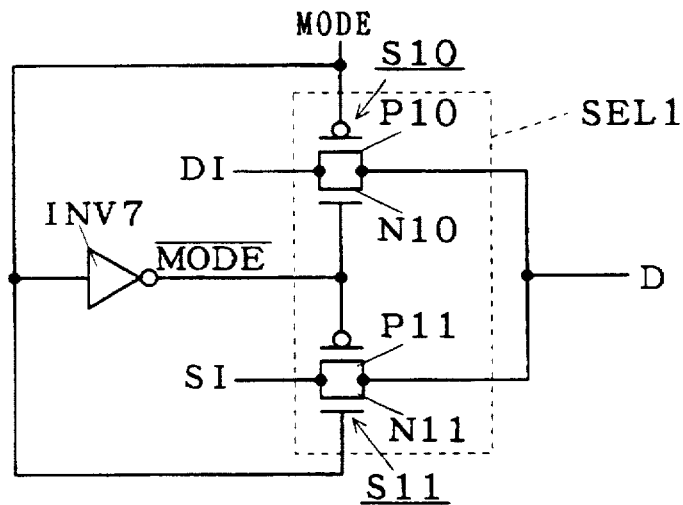
FIG. 15 is a circuit diagram showing the circuit structure of a selector SEL1 and the relation between a mode signal MODE and an inverse mode signal \MODE.

The circuit structure of the selector SEL1 may be selected from various structures. FIG. 15 is a circuit diagram showing the relation between the circuit structure of the selector SEL1 and the mode and inverse mode signals MODE and $\overline{MODE}$.

The selector SEL1 is formed by a transmission gate S10 which is formed by a PMOS transistor P10 and an NMOS transistor N10, and a transmission gate S11 which is formed by a PMOS transistor P11 and an NMOS transistor N11. The transmission gates S10 and S11 receive an ordinary input signal DI and a scan test signal S1 in first ends thereof respectively. Second ends of the transmission gates S10 and S11 are connected in common, to form an output end of the selector SEL1.

When the mode signal MODE is at a high level and hence the inverse mode signal $\overline{MODE}$ is at a low level, the transmission gates S10 and S11 are turned off and on respectively, whereby the scan test signal SI is outputted as the input signal D to the master latch. When the mode signal MODE is at a low level and hence the inverse mode signal $\overline{MODE}$ is at a high level, on the other hand, the transmission gates S10 and S11 are turned on and off respectively, so that the ordinary input signal DI is outputted as the input signal D.

Similarly to the other embodiments, the inverted signal $\overline{Q}$ of the output signal Q can be taken out from the output end of the invertor INV4.

Figure 16A:
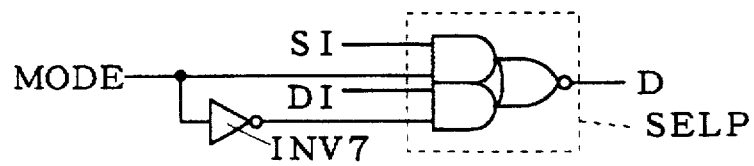
FIGS. 16A and 16B are circuit diagrams showing the structure of a selector SELP.
Figure 16B:
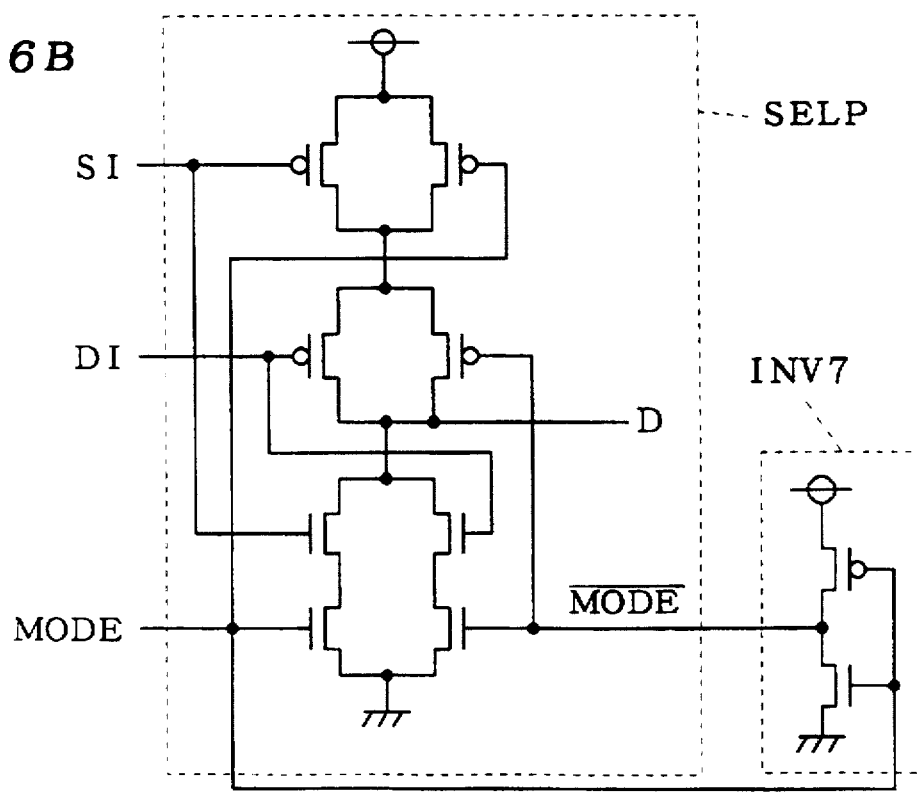

FIGS. 16A and 16B are circuit diagrams showing the structure of a selector SELP forming a part of the selector SEL1. FIG. 16A shows a composite logic gate, while FIG. 16B shows a circuit structure implemented by PMOS and NMOS transistors.

The selector SELP outputs an inverted logic of the scan test signal SI when the mode signal MODE goes high, while outputting an inverted logic of the ordinary input signal DI when the mode signal MODE goes low, as the input signal D. In order to implement the selector SEL1 with the selector SELP, therefore, it is necessary to additionally provide an invertor, or to input inverted logics of the scan test signal SI and the ordinary input signal DI.

(b-7) Embodiment 7

Figure 10:
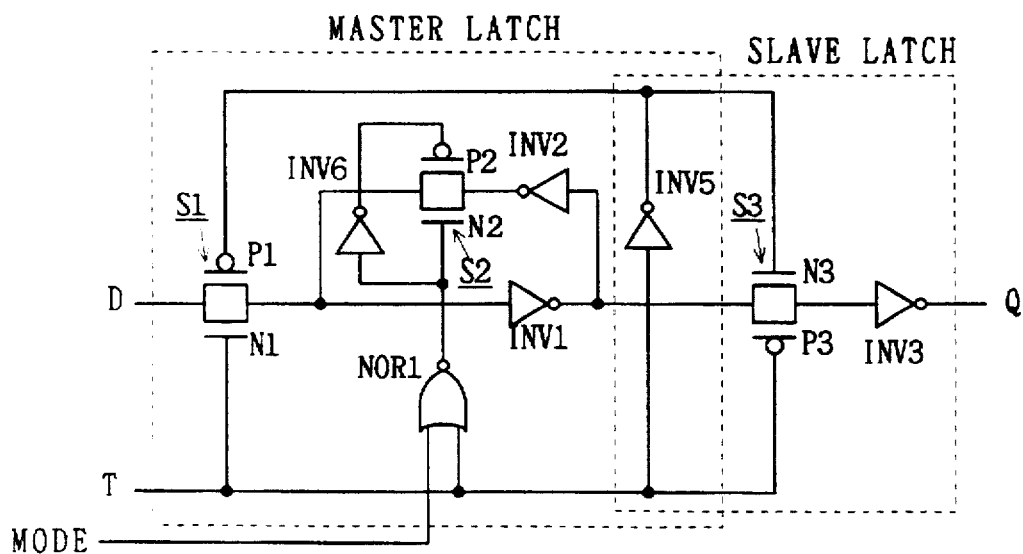
FIG. 10 is a circuit diagram showing the structure of an embodiment 7 of the present invention.

FIG. 10 is a circuit diagram showing the structure of an embodiment 7 of the present invention. A slave latch of this embodiment is identical in structure to the slave latch shown in FIG. 2, which is employed for the second preidea. On the other hand, a master latch of this embodiment is different from that shown in FIG. 2 in a way of supplying a signal to a transmission gate S1.

The master latch further comprises a NOR gate NOR1 and an invertor INV6, while output and input ends of the invertor INV6 are connected with gates of the PMOS transistor P2 and an NMOS transistor N2 forming the transmission gate S2 respectively.

An output end of the NOR gate NOR1 is connected with the input end of the invertor INV6. First and second input ends of the NOR gate NOR1 receive the mode signal MODE and the clock signal T respectively. When the mode signal MODE is at a high level, therefore, the circuit performs an operation which is similar to that of the series connection of two dynamic half latches described in relation to the first preidea, whereby both of an S/H time and a T-Q delay can be suppressed and power consumption can be reduced.

When the mode signal MODE is at a low level, on the other hand, the circuit shown in FIG. 10 operates similarly to the circuit described with reference to FIG. 2 in relation to the second preidea.

When this flip-flop circuit performs an ordinary operation, therefore, the circuit operation can be quickened by converting the mode signal MODE to a high level. When this flip-flop circuit is subjected to a DC test, particularly the source current test, on the other hand, the mode signal MODE is converted to a low level while the clock signal T is forcibly converted also to a low level. Thus, the transmission gate S2 is turned on to bring the input end of the invertor INV1 out from a floating state, whereby a through current in the invertor INV1 can be avoided.

Namely, it is possible to overcome the disadvantage of the first preidea according to this embodiment, without damaging its advantage. In other words, unnecessary power consumption can be suppressed while quickening the circuit operation.

(b-8) Embodiment 8

Figure 11:
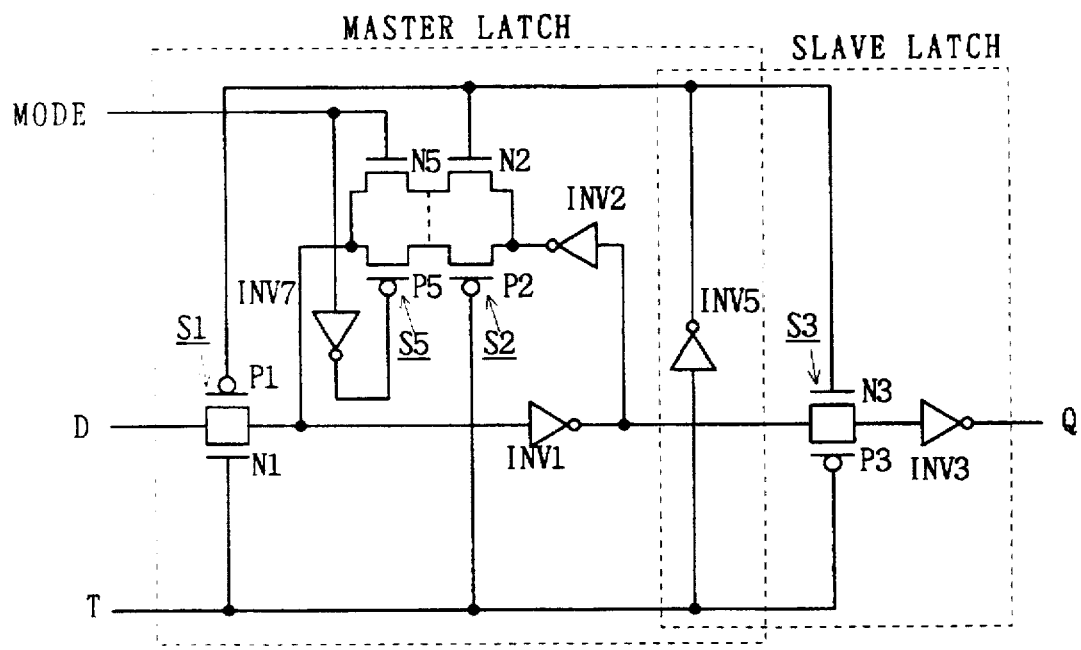
FIG. 11 is a circuit diagram showing the structure of an embodiment 8 of the present invention.

FIG. 11 is a circuit diagram showing the structure of an embodiment 8 of the present invention. A slave latch of this embodiment is identical in structure to the slave latch employed in the second preidea shown in FIG. 2. On the other hand, a master latch comprises the transmission gate S5 which is interposed between a point connecting the input end of the invertor INV1 and the second end of a transmission gate S1 in common and the second end of a transmission gate S2, and an invertor INV7 which is connected in parallel with the transmission gate S5.

The transmission gate S5 is formed by parallel connection of the PMOS transistor P5 and an NMOS transistor N5. Output and input ends of the invertor INV7 are connected with gates of the PMOS and NMOS transistors P5 and N5 respectively. A mode signal MODE is supplied to the input end of the invertor INV7.

When the mode signal MODE is at a low level, therefore, the transmission gate S5 is turned off so that the circuit performs an operation similar to that of the structure of series connection of two dynamic half latches described in relation to the first preidea, whereby both of an S/H time and a T-Q delay can be suppressed.

When the mode signal MODE is at a high level, on the other hand, the transmission gate S5 is turned on so that the operation of the circuit shown in FIG. 9 is similar to that of the circuit described with reference to FIG. 2 in relation to the second preidea.

Therefore, this embodiment has an effect which is similar to that of the embodiment 7.

The connection shown by broken lines in the circuit diagram, i.e., that of the PMOS transistor P5 and the NMOS transistor N2 or N5 may be omitted with no influence on the operation. When this connection is omitted, the number of wires can be effectively reduced.

(b-9) Embodiment 9

Figure 12:
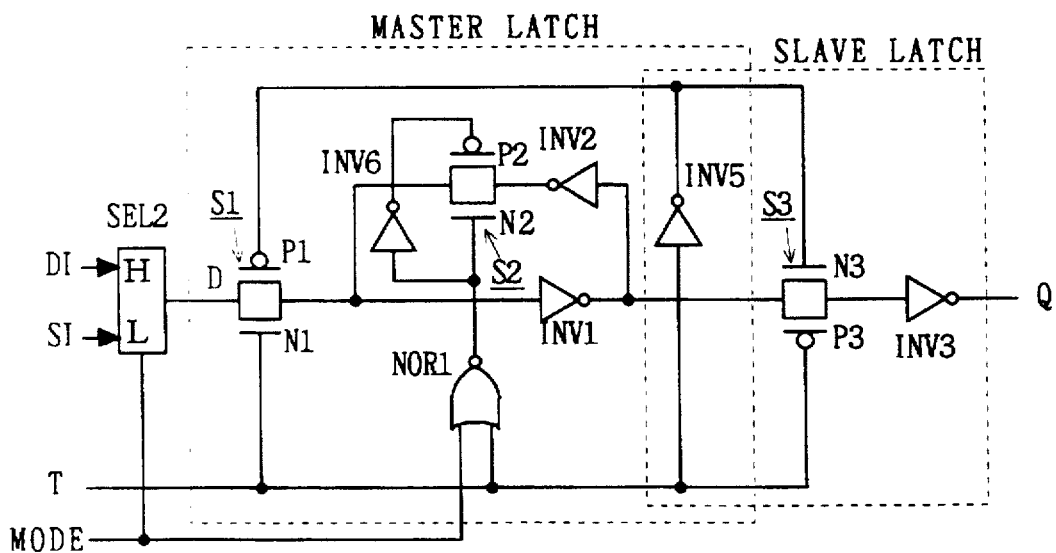
FIG. 12 is a circuit diagram showing the structure of an embodiment 9 of the present invention.

FIG. 12 is a circuit diagram showing the structure of an embodiment 9 of the present invention. The flip-flop circuit shown in FIG. 12 has a structure obtained by adding a selector SEL2 to the flip-flop circuit according to the embodiment 7 shown in FIG. 10. Therefore, the flip-flop circuit shown in FIG. 12 can be used as a scan type flip-flop circuit similarly to that shown in FIG. 8A, through connection shown in FIG. 8B.

The selector SEL2 has a pair of input ends receiving the ordinary input signal DI and the scan test signal SI, and an output end outputting either one of these signals depending on a signal which is supplied to its control end. The selector SEL2 supplies the ordinary input signal DI to the output end when its control end is supplied with a high-level signal, while supplying the scan test signal SI to the output end when its control end is supplied with a low-level signal respectively.

In the embodiment 9, a mode signal MODE is supplied to the control end of the selector SEL2. When the mode signal MODE is set at a high level, the selector SEL2 outputs the ordinary input signal DI, and a transmission gate S1 receives the same as the input signal D. In response to fall of the clock signal T, the input signal D is outputted to an output terminal as the output signal Q. As shown in FIG. 8B, respective output signals Q exert no influence on input signals DI of those of subsequent stages in the scan flip-flop circuits which are connected in series with each other.

At this time, a transmission gate S2 is in an off state and hence both half latches operate as dynamic types, whereby both of an S/H time and a T-Q delay can be suppressed. Namely, the operation can be quickened when this circuit is employed as an ordinary flip-flop circuit.

When the mode signal MODE is set at a low level, on the other hand, the on or off state of the transmission gate S2 depends on the clock signal T, and the master latch operates as a static type. At this time, the selector SEL2 outputs the scan test signal SI, so that the transmission gate S1 receives this signal as the input signal D and outputs the same to the output terminal as the output signal Q in correspondence to fall of the clock signal T.

As shown in FIG. 8B, the serially connected scan type flip-flop circuits successively transmit the scan test signal SI to the subsequent flip-flop circuits as the output signal Q. Such transmission of the scan test signal SI is a shift operation which is performed in a scan test, and no quick circuit operation is required in this case, dissimilarly to the ordinary operation.

An erroneous determination in a source current test can be avoided by setting the mode signal MODE at a low level and forcibly converting the clock signal T to a low level, similarly to the embodiments 7 and 8.

According to this embodiment, the mode signal MODE is adapted to control both of the selecting operation of the selector SEL2 and the switching of the slave latch between the dynamic and static types, whereby the technique of the embodiment 7 can be applied to a scan type flip-flop circuit while saving the number of wires.

(b-10) Embodiment 10

Figure 13:
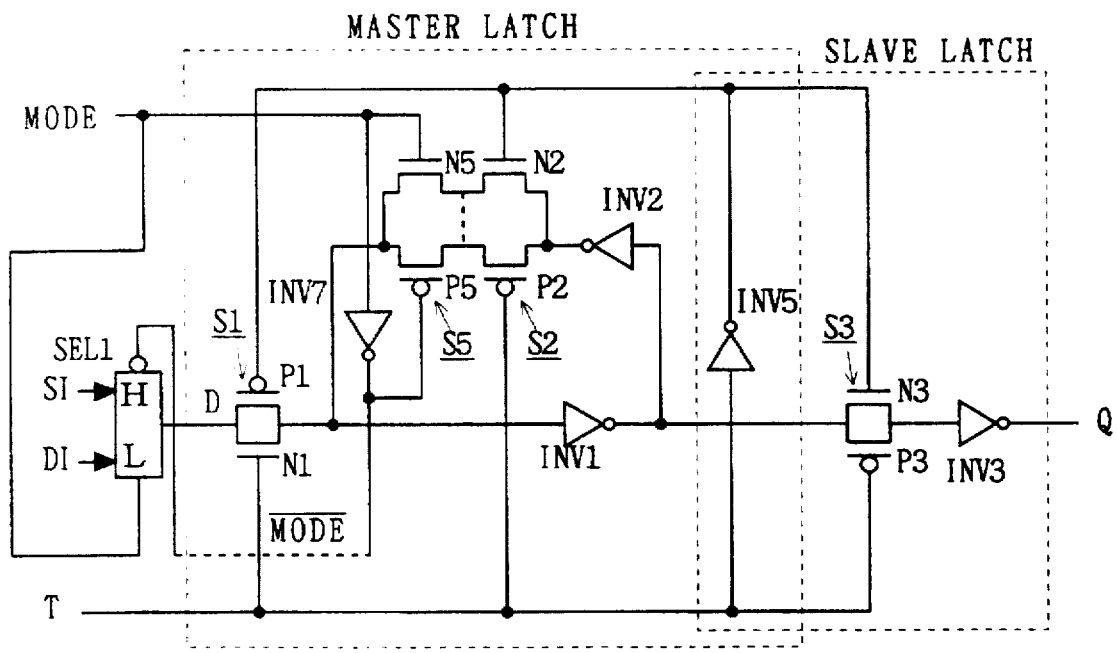
FIG. 13 is a circuit diagram showing the structure of an embodiment 10 of the present invention.

FIG. 13 is a circuit diagram showing the structure of an embodiment 10 of the present invention. The flip-flop circuit shown in FIG. 13 has a structure obtained by adding the selector SEL1 to the flip-flop circuit according to the embodiment 8 shown in FIG. 11. Therefore, the flip-flop circuit shown in FIG. 13 can also be used as a scan type flip-flop circuit similarly to that shown in FIG. 8A, through connection shown in FIG. 8B.

Also in this embodiment, the mode signal MODE is supplied to the control end of the selector SEL1. According to this embodiment, therefore, the technique of the embodiment 8 can be applied to a scan type flip-flop circuit while saving the number of wires, similarly to the effect of the embodiment 9.

According to this embodiment, an invertor INV7 outputs the inverse mode signal $\overline{\text{MODE}}$, whereby the selector SEL1 may also require the inverse mode signal $\overline{\text{MODE}}$ in its selecting operation, in addition to the mode signal MODE.

The flip-flop circuit described in relation to the second preidea with reference to FIG. 1 or 2 may be combined with the flip-flop circuit according to any of the embodiments 1 to 10 to be loaded on a semiconductor chip, as a matter of course. When the inventive flip-flop circuit is employed in a portion of the semiconductor chip to which speed performance is required and the flip-flop circuit shown in FIG. 1 or 2 is employed in a portion to which no speed performance is required, no mode signal MODE is required and congestion of the wires can be eliminated.

In each of the embodiments 7 to 10, the invertor INV3 of the slave latch can be omitted. In this case, logics in the slave latch are stored by a parasitic capacitance which exists in a point where the respective drains of the NMOS and PMOS transistors N3 and P3 forming the transmission gate S3 are connected in common.

When an invertor INV3 is omitted in the embodiment 10, the structure shown in FIGS. 16A or 16B is preferably employed as its selector SEL1. This is because the selector SEL1 itself has drivability for the subsequent stage, so that information held in parasitic capacitances on respective drains of NMOS and PMOS transistors N3 and P3 can be transferred with no damage.

(b-11) Embodiment 11

Figure 14A:
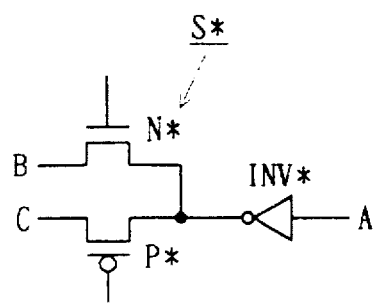
FIGS. 14A and 14B are circuit diagrams illustrating an embodiment 11 of the present invention.
Figure 14B:
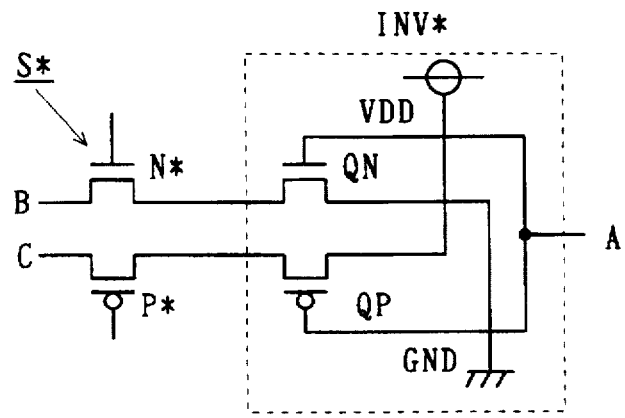

FIGS. 14A and 14B are circuit diagrams illustrating an embodiment 11 of the present invention. FIG. 14(a) shows connection between a transmission gate S* and an invertor INV* employed in each of the embodiments 1 to 10. The transmission gate S* is formed by a PMOS transistor P* and an NMOS transistor N*.

As to each of the embodiments 1 to 6, "*" corresponds to "4", and a terminal A shown in FIG. 14A corresponds to the output terminal. Terminals B and C shown in FIG. 14A are connected with the input end of the invertor INV3 as to each of the embodiments 1 to 5, while these terminals B and C are connected with the NMOS and PMOS transistors N5 and P5 respectively as to each of the embodiments 2 and 6.

As to each of the embodiments 7 to 10, "*" corresponds to "2", and the terminal A is connected with the output end of the invertor INV1. Further, both of the terminals B and C shown in FIG. 14A are connected with the input end of the invertor INV1 as to each of the embodiments 7 and 9, while these terminals B and C are connected with the NMOS and PMOS transistors N5 and P5 respectively as to each of the embodiments 8 and 10.

The connection shown in FIG. 14A can be implemented by the circuit shown in FIG. 14B. The invertor INV* is implemented by a structure enclosed with broken lines. Namely, the invertor INV* is formed by an NMOS transistor QN including a drain which is connected with the NMOS transistor N*, a gate which is connected with the terminal A, and a source which is supplied with a potential GND corresponding to a low level, and a PMOS transistor QP including a drain which is connected with the PMOS transistor P*, a gate which is connected with the terminal A, and a source which is supplied with a potential VDD corresponding to a high level. Due to such structure, no wire is required for connecting the NMOS transistor N* with the PMOS transistor QP (also connecting the NMOS transistor QN with the PMOS transistor P*).

Therefore, it is further possible to reduce the number of wires by applying the circuit structure shown in FIG. 14B to the portion of each of the embodiments 1 to 10 corresponding to the circuit structure shown in FIG. 14A.

The NMOS transistors N* and QN, which are connected in series between the terminal B and a potential point providing the ground potential GND, may be replaced with each other. Similarly, the PMOS transistors P* and QP, which are connected in series between the terminal C and a potential point providing the potential VDD, may be replaced with each other.

(b-12) Embodiment 12

Figure 17A:
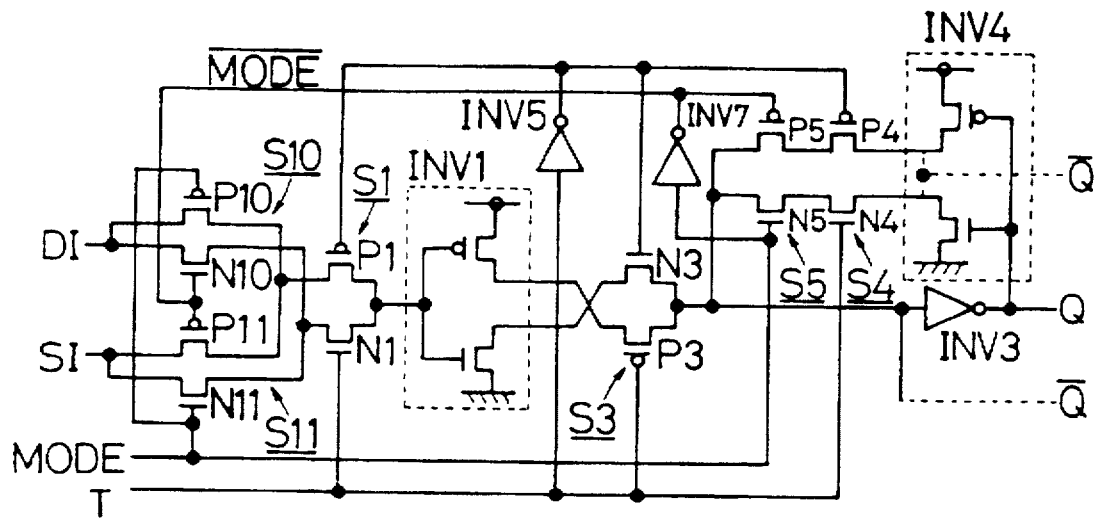
FIG. 17A is a circuit diagram illustrating an embodiment 12 of the present invention.
Figure 17B:
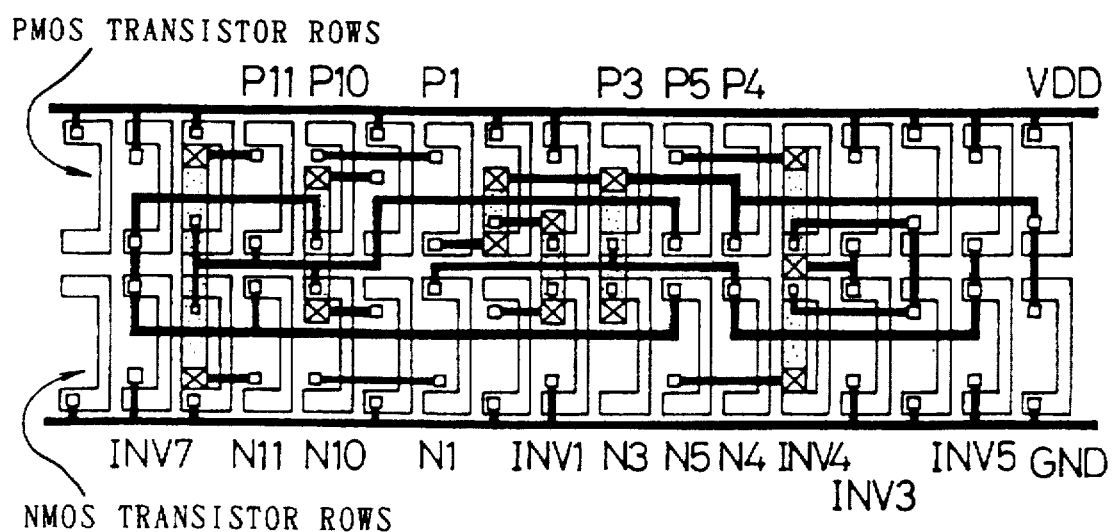
FIG. 17B is a plan view illustrating the embodiment 12 of the present invention.

The wires can be further omitted with respect to the embodiment 11. FIGS. 17A and 17B are a circuit diagram and a plan view of a CMOS gate array in case of applying the structure of FIG. 15 as the selector SEL1 of the circuit in the embodiment 6 shown in FIG. 9.

Connection wiring between an output end of the selector SEL1 and a transmission gate S1 is simplified. Namely, PMOS transistors P10 and P11 of the selector SEL1 are connected with a PMOS transistor P1 of the transmission gate S1, but not with an NMOS transistor N1. Similarly, NMOS transistors N10 and N11 of the selector SEL1 are connected with the NMOS transistor N1 of the transmission gate S1, but not with the PMOS transistor P1.

As to connection between an invertor INV1 and a transmission gate S3 and that between an invertor INV4 and a transmission gate S4, the structure described in the embodiment 11 with reference to FIG. 14B is applied.

The wiring is thus simplified, whereby congestion of wires which are provided on a semiconductor can be relaxed in implementation of such a circuit. In other words, the degree of integration can be improved by narrowing widths for the wires.

FIG. 17B shows exemplary layout of transistors. PMOS transistor rows and NMOS transistor rows are lined up on upper and lower portions respectively. Referring to FIG. 17B, U-shaped portions show gate electrodes, while black lines show first layer wires and wide half-dot lines show second layer wires respectively. Marks □ show contact holes for connecting the first layer wires with semiconductor regions or gate electrodes, and through holes interconnecting the first and second layer wires with each other are formed in portions shown by □ with X. Referring to FIG. 17B, columns are successively numbered as first, second, . . . from the left side.

Elements are isolated from each other by gate isolation. Namely, PMOS transistors having gates which are supplied with a potential VDD and NMOS transistors having gates which are supplied with a potential GND electrically isolate semiconductor regions which are positioned on both sides in rows, to which the semiconductor regions belong, from each other.

The PMOS and NMOS transistors of the first, third, sixth, eighth, fifteenth and seventeenth columns are employed for gate isolation. Invertors INV7, INV1, INV4, INV3 and INV5 are formed in the second, ninth, thirteenth, fourteenth and sixteenth columns respectively. On the other hand, transmission gates S11, S10, S1, S3, S5 and S4 are formed in the fourth, fifth, seventh, tenth, eleventh and twelfth columns respectively.

Due to such layout of CMOS transistors, the number of necessary wires as well as the width necessary for the column direction can be reduced.

It is possible to connect the drains of the PMOS and NMOS transistors forming the invertor INV4 for taking out the inverted signal Q of the output signal Q therefrom. It is alternatively possible to take out the inverted signal Q from the input end of the invertor INV3, as a matter of course.

Further, PMOS transistors P4 and P5 and those forming the invertor INV4 are connected in series with each other, and hence these transistors can be replaced with each other in order. Similarly, NMOS transistors N4 and N5 and those forming the invertor INV4 are connected in series with each other, and hence these transistors can be replaced with each other in order.

Alternatively, the PMOS transistor P3 and that forming the invertor INV1 are connected in series with each other, and hence these transistors can be replaced with each other in order. Similarly, the NMOS transistor N3 and that forming the invertor INV1 are connected in series with each other, and hence these transistors can be replaced with each other in order.

Figure 20A:
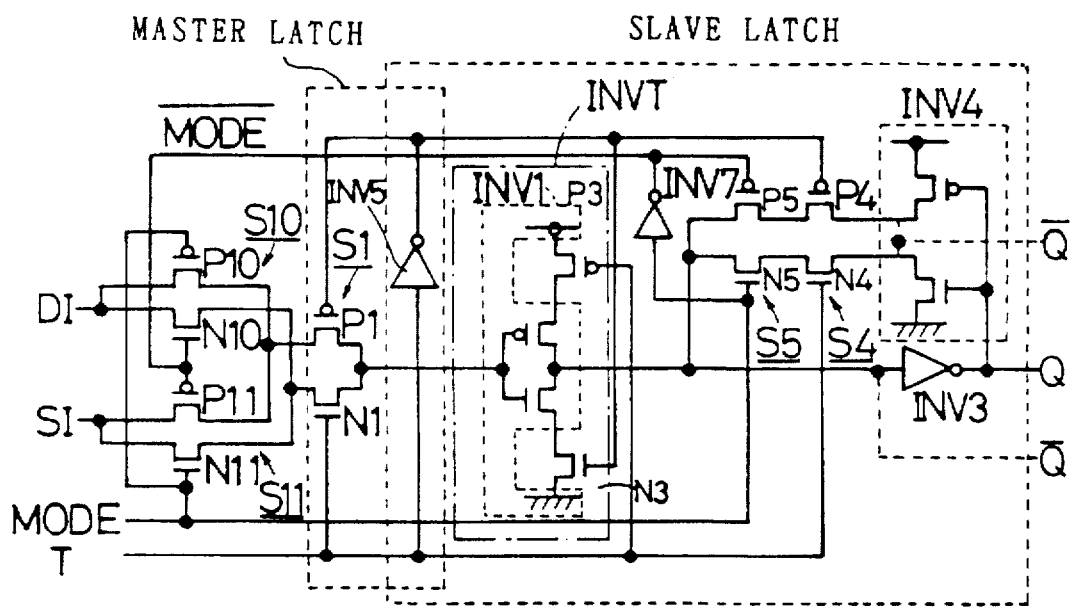
FIG. 20A is a circuit diagrams illustrating still another embodiment 12 of the present invention.
Figure 20B:
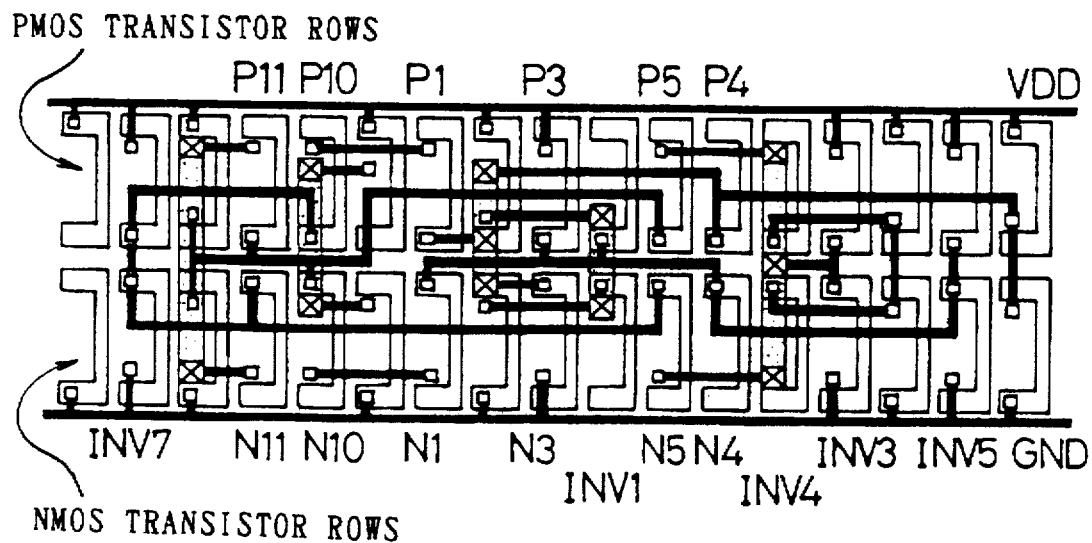
FIG. 20B is a plan view illustrating still another embodiment 12 of the present invention.

FIGS. 20A and 20B show a structure obtained by replacing the PMOS and NMOS transistors P3 and N3 with those forming the invertor INV1 in order respectively.

The invertor INV1 is separated into two transistors and two power sources, and the transistors P3 and N3 are inserted therebetween. These four transistors are connected in series with each other between the two power sources, to form a tristate invertor INVT. Sources of the PMOS and NMOS transistors forming the invertor INV1 are supplied with potentials VDD and GND through the PMOS and NMOS transistors P3 and N3 respectively.

In this case, it is also possible to conceive that the invertor INV1 belongs not to a master latch but to a slave latch. Namely, it can be regarded that an invertor of a dynamic half latch is omitted, as described in the embodiment 10. In this case, logics in the master latch are stored by a parasitic capacitance which exists in a point where respective drains of NMOS and PMOS transistors N1 and P1 forming a transmission gate S1 are connected in common.

Figure 18A:
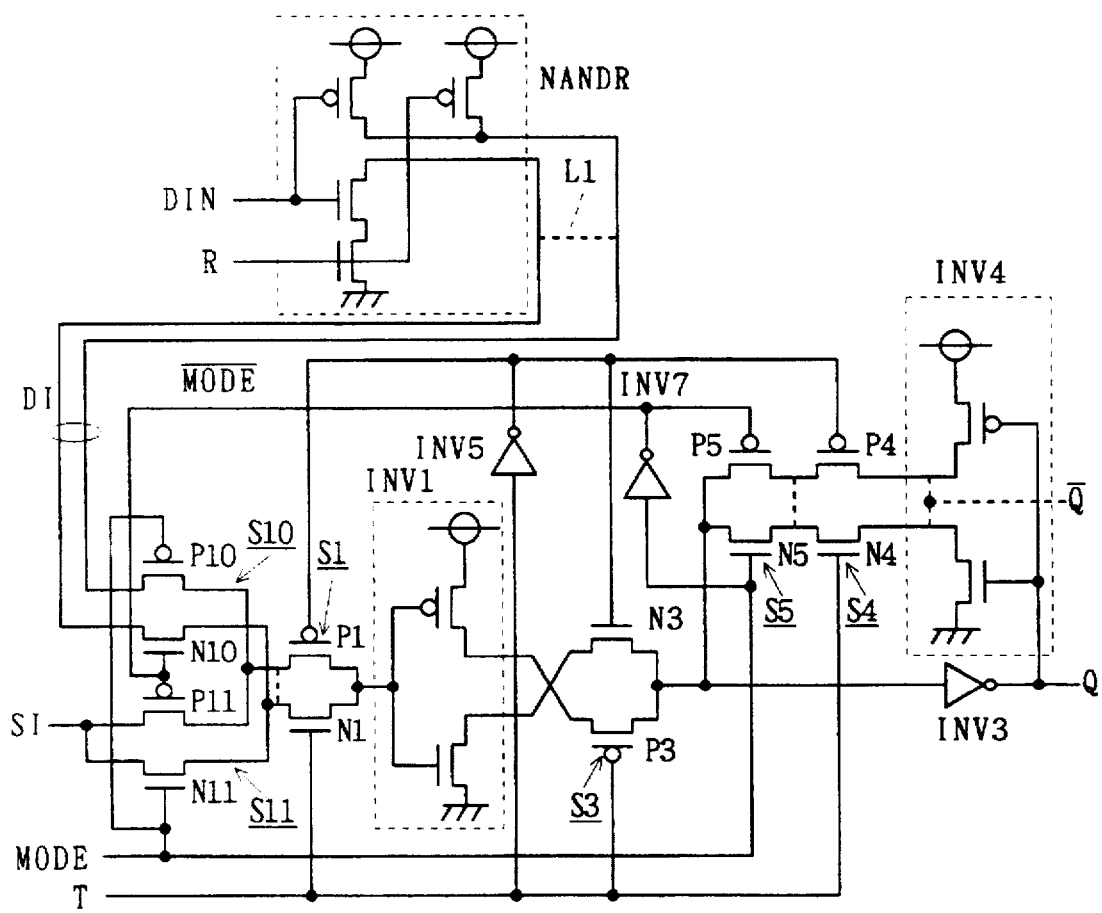
FIG. 18A is a circuit diagram illustrating a modification of the embodiment 12 of the present invention.

FIG. 18A shows a structure obtained by adding a NAND gate NANDR to the circuit illustrated in FIG. 17A. The NAND gate NANDR is formed by a pair of NMOS transistors and a pair of PMOS transistors. Gate electrodes of each pair receive an original input signal DIN forming the basis of the ordinary input signal DI and a reset signal R in gate electrodes respectively. The pair of PMOS transistors are connected in parallel with each other, and drains thereof are connected to a PMOS transistor P10 forming a transmission gate S10 in common. On the other hand, one and the other one of the pair of NMOS transistors are connected in series with each other, and drains thereof are connected with an NMOS transistor N10 forming the transmission gate S10 and grounded respectively. However, the drains of the PMOS and NMOS transistors forming the NAND gate NANDR are not directly connected with each other. The NAND gate NANDR is different from an ordinary two-input NAND gate in this point. Namely, a connecting line L1 can be omitted, and this is shown by illustrating the connecting line L2 by a broken line.

Synchronous resetting can be applied to the circuit shown in FIG. 17A by adding the NAND gate NANDR. In more concrete terms, the mode signal MODE as well as the reset signal R are converted to low levels. The output signal Q is reset to a high level by fall of the clock signal T.

Figure 18B:
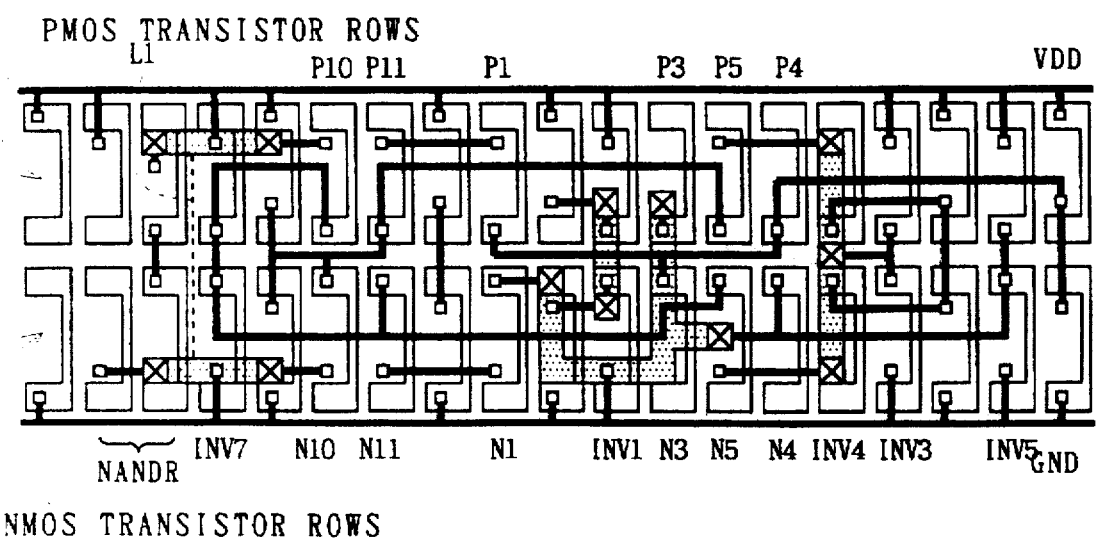
FIG. 18B is a plan view illustrating the modification of the embodiment 12 of the present invention.

FIG. 18B is a plan view of a CMOS gate array implementing FIG. 18A. As compared with the plan view shown in FIG. 17B, arrangement of wires which can reduce the stage number of wires to be provided between wires for a power source VDD and the ground GND is shown. On the other hand, the connecting line L1 shown in a broken line is omittable, and a wire blocking the boundary between rows provided with PMOS and NMOS transistors can be omitted. Thus, it is possible to avoid complicatedness of the arrangement of the wires, whereby the stage number of the wires to be provided between those for the power source VDD and the ground GND is not increased.

Figure 19A:
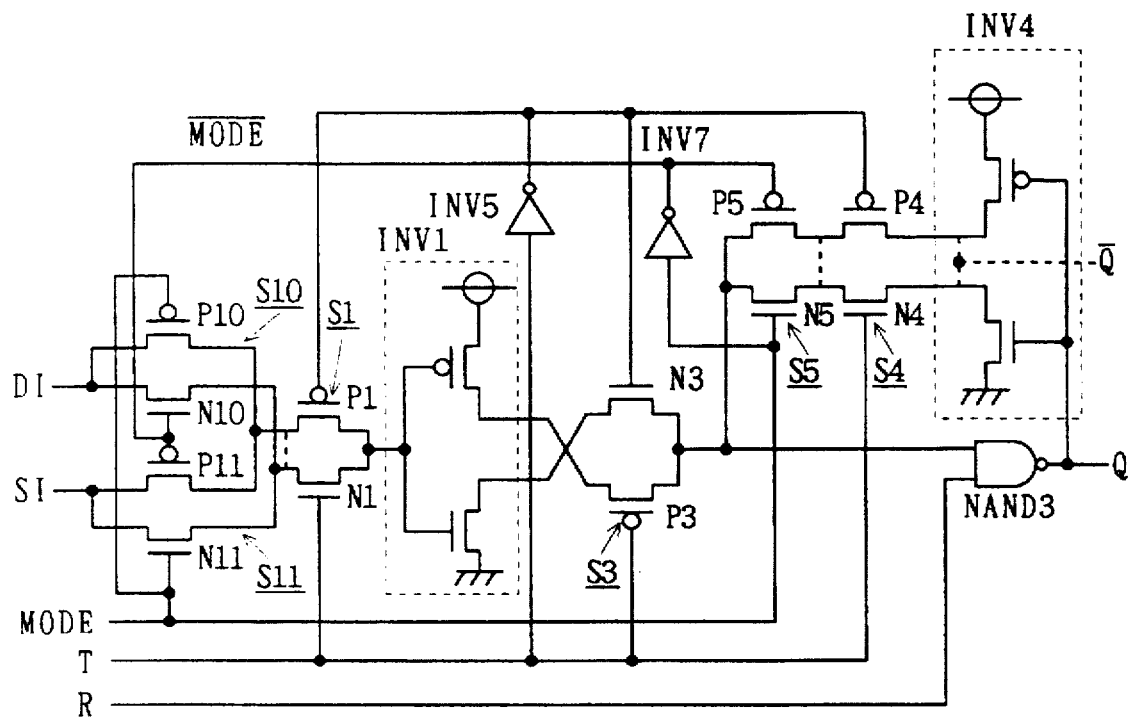
FIG. 19A is a circuit diagram illustrating another modification of the embodiment 12 of the present invention.

FIG. 19A shows a structure obtained by replacing the invertor INV3 with a two-input NAND gate NAND3 in the circuit shown in FIG. 17A. An input end of the NAND gate NAND3 is connected to the transmisison gate S3, while the other input end thereof is supplied with the reset signal R. The slave latch is reset and the output signal Q goes high by setting the reset signal R at a low level.

Figure 19B:
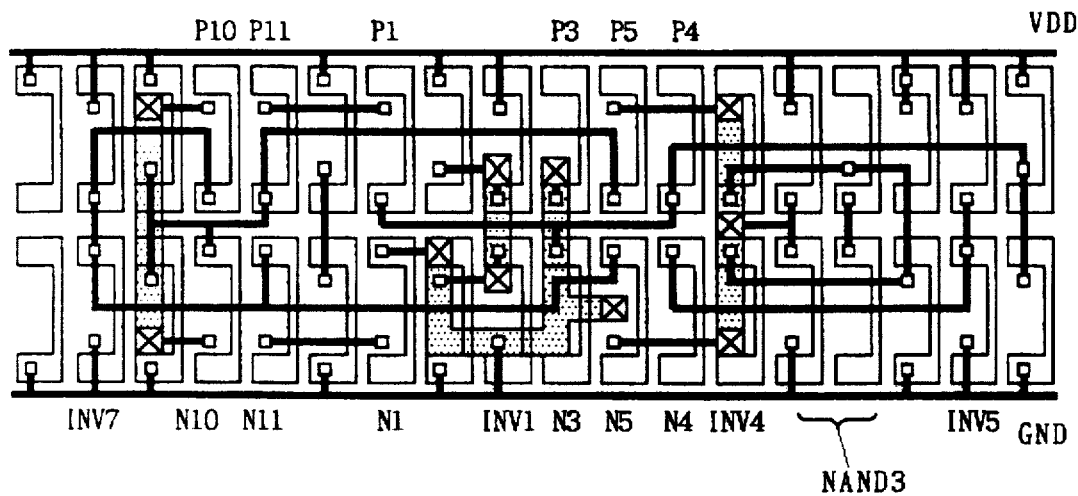
FIG. 19B is a plan view illustrating another modification of the embodiments 12 of the present invention.

If necessary, it is possible to reset a master latch of a subsequent scan flip-flop to be supplied with the output signal Q (or Q ), when the mode signal MODE and the clock signal T are further set at high levels. FIG. 19B is a plan view of a CMOS gate array implementing FIG. 19A.

In either one of the circuits shown in FIGS. 18A and 19A, the slave latch performs a dynamic operation if the mode signal MODE is at a low level, whereby a high speed and low power consumption are attained, as a matter of course. When the mode signal MODE is at a high level, on the other hand, the slave latch performs a static operation, whereby low power consumption can be attained by stopping the clock signal T.

(b-13) Embodiment 13

Figure 21A:
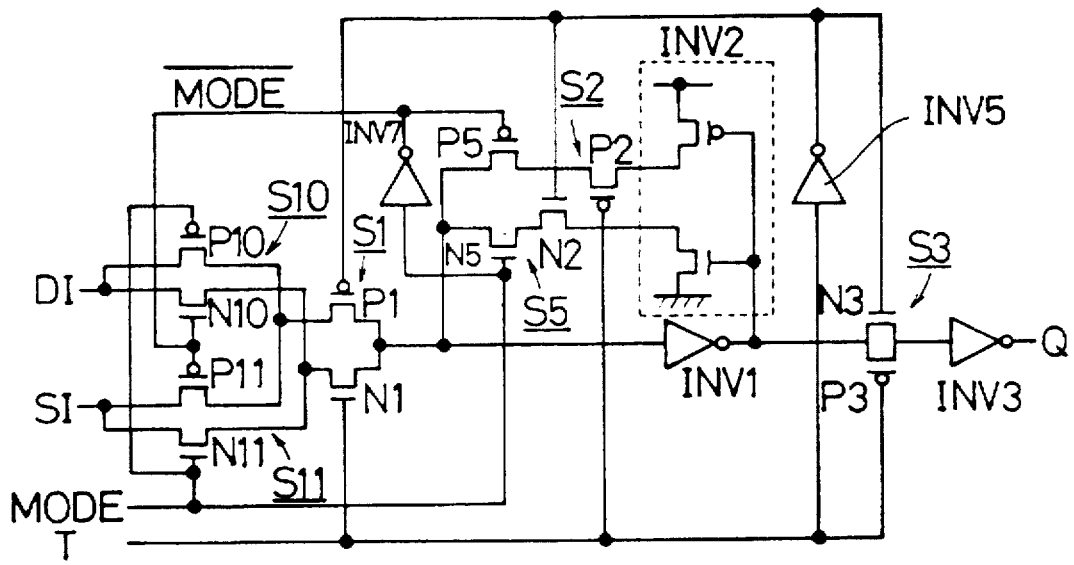
FIG. 21A is a circuit diagrams illustrating an embodiment 13 of the present invention.
Figure 21B:
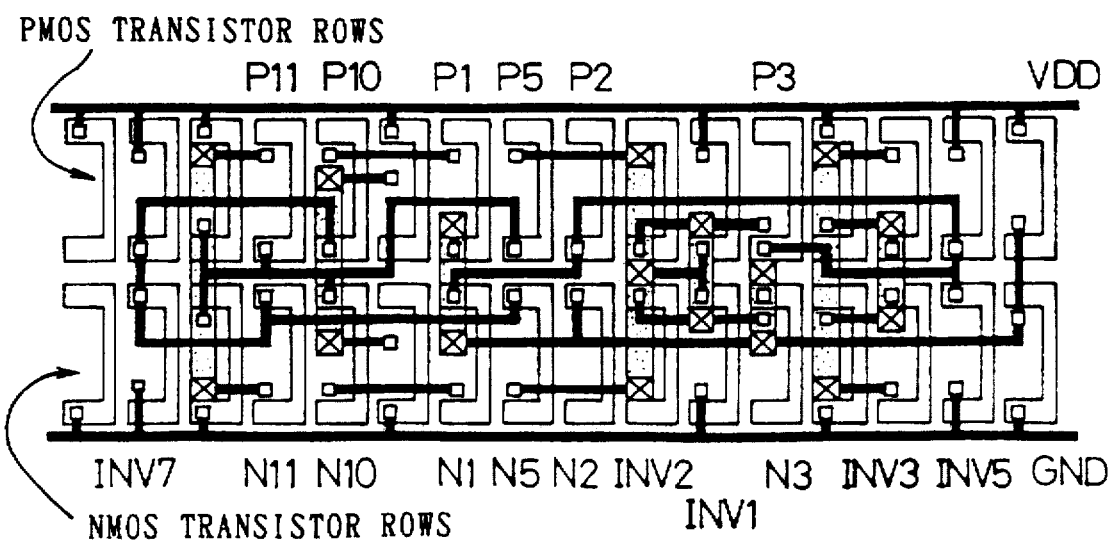
FIG. 21B is a plan view illustrating the embodiment 13 of the present invention.

Similarly to the embodiment 12, wires can be omitted with respect to the circuit shown in FIG. 13 in the embodiment 10. FIGS. 21A and 21B are a circuit diagram and a plan view of a CMOS gate array in case of applying the structure of FIG. 15 as the selector SEL2 of the circuit shown in FIG. 13 respectively.

Similarly to the embodiment 12, PMOS transistors P10 and P11 are connected with the PMOS transistor P1 of the transmission gate S1, but not with an NMOS transistor N1. Similarly, NMOS transistors N10 and N11 of the selector SEL1 are connected with the NMOS transistor N1 of the transmission gate S1, but not with the PMOS transistor P1.

As to connection between the invertor INV2 and the transmission gate S2, further, the structure described with reference to FIG. 14B in the embodiment 11 is applied.

FIG. 21B shows exemplary transistor layout. PMOS and NMOS transistors of first, third, sixth, eighth, thirteenth and sixteenth columns are adapted to gate isolation. Invertors INV7, INV2, INV1, INV3 and INV5 are formed in the second, tenth, eleventh, fourteenth and fifteenth columns respectively. On the other hand, transmission gates S11, S10, S1, S5, S2 and S3 are formed in the fourth, fifth, seventh, eighth, ninth and twelfth columns respectively.

Due to such layout of CMOS transistors, congestion of wires which are provided on a semiconductor can be relaxed in implementation of such a circuit. In other words, the degree of integration can be improved by narrowing widths for the wires.

PMOS transistors P2 and P5 and those forming the invertor INV2 are connected in series with each other, and hence these transistors can be replaced with each other in order, as a matter of course. Similarly, NMOS transistors N2 and N5 and those forming the invertor INV2 are connected in series with each other, and hence these transistors can be replaced with each other in order.

(b-14) Embodiment 14

Figure 22:
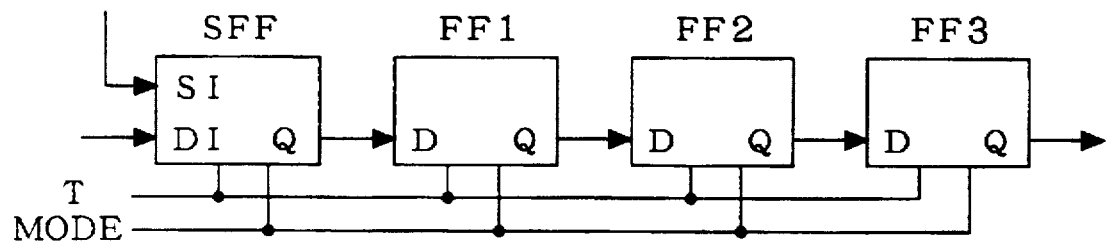
FIG. 22 is a block diagram illustrating an embodiment 14 of the present invention.

FIG. 22 is a block diagram illustrating an embodiment 14 of the present invention. Flip-flop circuits FF1, FF2 and FF3 are successively connected in series with a scan type flip-flop circuit SFF.

The scan type flip-flop circuit SFF can be in the circuit structure described with reference to FIGS. 8A or 9 in relation to the embodiment 5 or 6, for example, while each of the flip-flop circuits FF1, FF2 and FF3 can be in the circuit structure described with reference to FIGS. 3 or 5 in relation to the embodiment 1 or 2, for example. The clock signal T and the mode signal MODE are shared in these four flip-flop circuits.

All slave latches of these four flip-flop circuits perform dynamic and static operations in response to the mode signal MODE taking low and high levels respectively. The scan type flip-flop circuit SFF outputs the ordinary input signal DI and the scan test signal SI in correspondence to the mode signal MODE taking low and high levels respectively. When the mode signal MODE is at a low level, therefore, these four flip-flop circuits serve as a 4-bit shift register operating at a high speed. When the mode signal MODE is at a high level, on the other hand, the flip-flop circuits form a scan path which is similar to that shown in FIG. 8B, whereby an effect similar to that of the embodiment 5 can be attained.

Alternatively, the circuit structure described with reference to FIG. 12 in relation to the embodiment 9 can be employed for the scan type flip-flop circuit SFF, for example, while the circuit structure described with reference to FIG. 10 in relation to the embodiment 7 can be employed for each of the flip-flop circuits FF1, FF2 and FF3, for example. All slave latches of these four flip-flop circuits perform dynamic and static operations in response to the mode signal MODE taking high and low levels respectively. The scan type flip-flop circuit SFF outputs the ordinary input signal DI and the scan test signal SI in correspondence to the mode signal MODE taking high and low levels respectively. When the mode signal MODE is at a high level, therefore, these four flip-flop circuits serve as a 4-bit shift register operating at a high speed. When the mode signal MODE is at a low level, on the other hand, the flip-flop circuits form a scan path which is similar to that shown in FIG. 8B, whereby an effect similar to that of the embodiment 5 can be attained.

The circuit structures described with reference to FIGS. 13 and 11 in relation to the embodiments 10 and 8 can be employed for the scan flip-flop circuit SFF and the flip-flop circuits FF1, FF2 and FF3 respectively, for example. All slave latches of these four flip-flop circuits perform dynamic and static operations in correspondence to the mode signal MODE taking low and high levels respectively. The scan flip-flop circuit SFF outputs the ordinary input signal DI and the scan test signal SI in correspondence to the mode signal MODE taking low and high levels respectively. Therefore, the four flip-flop circuits serve as 4-bit shift registers operating at a high speed, when the mode signal MODE is at a low level. When the mode signal MODE is at a high level, on the other hand, an effect similar to the of the embodiment 5 can be attained by forming a scan path which is similar to that shown in FIG. 8B.

The scan type flip-flop circuit SFF and the flip-flop circuits FF1, FF2 and FF3 can form the scan path shown in FIG. 22, whether the mode signal MODE bringing operations of these circuits into dynamic states is high or low. In this case, it is necessary to properly provide an invertor for inverting and inputting the mode signal MODE so that all flip-flop circuits which are connected in series with each other perform dynamic operations or either the master or slave latches of all flip-flop circuits which are connected in series with each other perform static operations when the mode signal MODE takes the same value.

Also as to the clock signal T, it is necessary to similarly provide an invertor for inverting its logic and supplying the same to the flip-flop circuits so that a source current test of all flip-flop circuits can be made with a single logic of the clock signal T when operations of either the master or slave latches of all flip-flop circuits which are connected in series with each other are brought into static states by the mode signal MODE.

However, a substantial stage number of a shift register in an ordinary operation may be reduced by interposing an invertor in the path of thus transmitting the clock signal T, in case of connecting positive and negative edge trigger type flip-flop circuits in series with each other, for example.

(b-15) Embodiment 15

It is possible to provide the scan flip-flop circuit described in each of the embodiments 5, 6, 9 and 10 with a function of detecting a failure by adding checking circuits.

Figure 23:
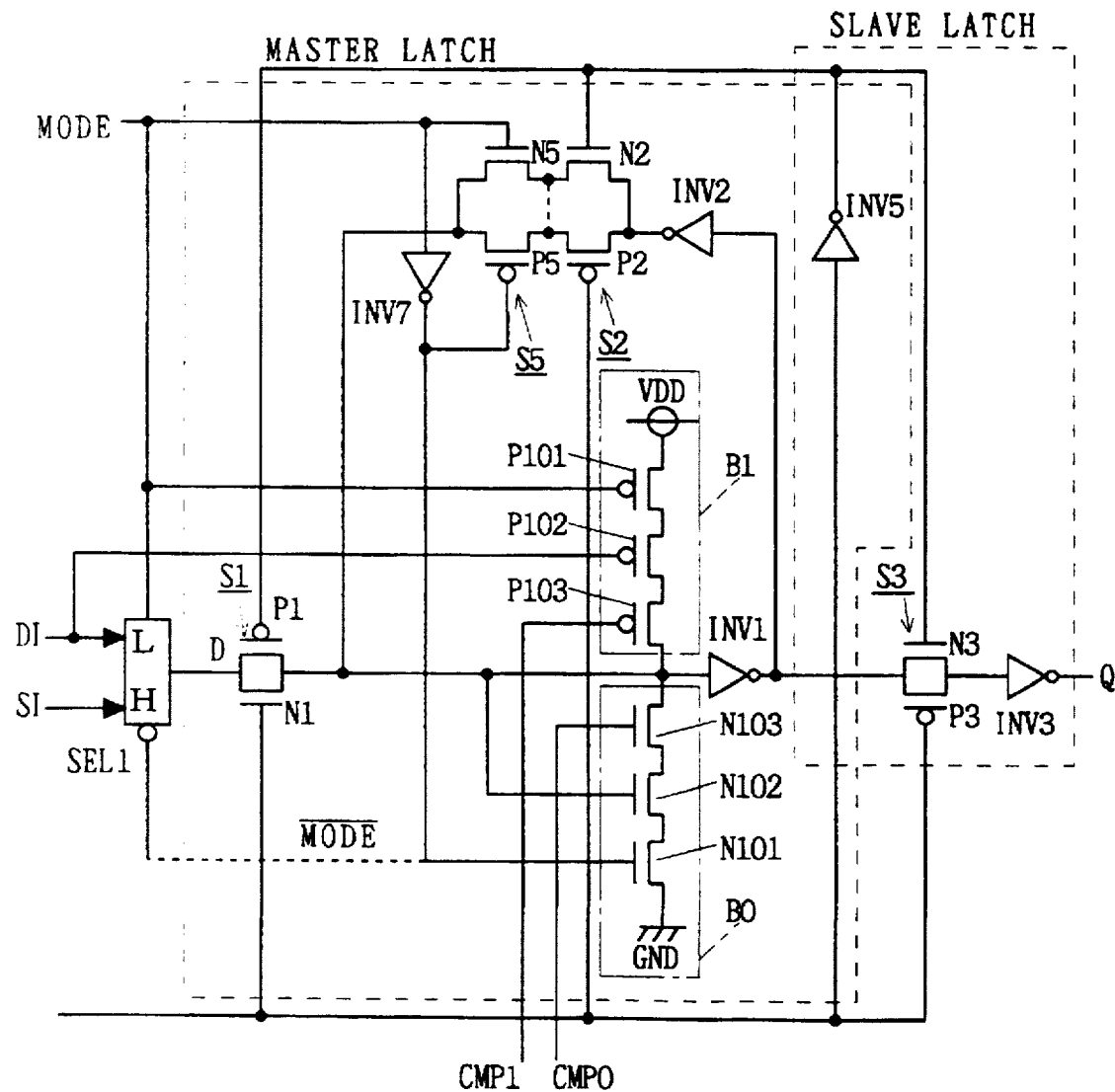
FIG. 23 is a circuit diagram illustrating an embodiment 15 of the present invention.

FIG. 23 is a circuit diagram showing the structure of an embodiment 15. This circuit has a structure obtained by adding "0" checking circuit B0 and "1" checking circuit B1 to that of the circuit shown in FIG. 13.

The "1" checking circuit B1 is formed by three PMOS transistors P101, P102 and P103 which are connected in series with each other between an input end of the invertor INV1 and a power source (referred to as a power source VDD for simplification) providing a potential VDD. Gates of the PMOS transistors P101, P102 and P103 are supplied with the mode signal MODE, the ordinary input signal DI and a comparison control signal CMP1 respectively.

Similarly, the "0" checking circuit B0 is formed by three NMOS transistors N101, N102 and N103 which are connected in series with each other between the input end of the invertor INV1 and a power source (referred to as the ground GND for simplification) providing the ground potential GND. Gates of the NMOS transistors N101, N102 and N103 are supplied with the inverted mode signal $\overline{\text{MODE}}$, the ordinary input signal DI and a comparison control signal CMP0 respectively.

A RAM can be typically illustrated as a circuit for failure detection. An output of the RAM is supplied to the selector SEL1 as the ordinary input signal DI.

When ordinary and shift operations are performed, the comparison control signals CMP0 and CMP1 are set at low and high levels respectively, so that the "0" checking circuit B0 and the "1" checking circuit B1 do not connect the input end of the invertor INV1 to the power source VDD and the ground GND. Namely, operations are similar to those described with reference to the embodiment 10 in this case.

In an operation of testing the RAM, on the other hand, a prescribed value is previously stored in a master latch by a shift operation. When all values stored in the RAM are at low levels, for example, a high level is inputted in the input end of the invertor INV1 of the master latch, to be stored therein.

When a clock signal T is fixed at a low level, a transmission gate S1 is turned off, and the master latch can statically hold the aforementioned data by converting the mode signal MODE to a high level.

Thereafter both of the comparison control signals CMP0 and CMP1 are set at high levels. Thus, the "1" checking circuit B1 does not pull up the invertor INV1 to the potential VDD. Further, a test strobe pulse of the RAM is supplied as the mode signal MODE. When the mode signal MODE goes low, the output of the RAM is supplied to the selector SEL1.

If the output of the RAM goes high in such a state, the NMOS transistor N102 is turned on while the inverted mode signal $\overline{\text{MODE}}$ goes high by the strobe pulse of the RAM so that the NMOS transistor N101 is turned on and the NMOS transistor N103 is also turned on by the comparison control signal CMP0. Therefore, the value at the input end of the invertor INV1 is converted from the high level to a low level. Namely, failure detection is performed by the fact that the level of data stored in the input end of the master latch is not high but low.

Similarly, a low level is inputted in the input end of the invertor INV1 of the master latch by a shift operation, if all values which must be stored in the RAM are at high levels. The master latch can statically hold the aforementioned data by fixing the clock signal T at a low level and converting the mode signal MODE to a high level.

Thereafter both of the comparison control signals CMP0 and CMP1 are set at low levels. Thus, the "0" checking circuit B0 does not pull down the invertor INV1 to the ground GND.

If the output of the RAM goes low in such a state, the PMOS transistor P102 is turned on, while the mode signal MODE goes low by a strobe pulse of the RAM and the PMOS transistor P101 is turned on. The PMOS transistor P103 is also turned on by the comparison control signal CMP1, whereby the value at the input end of the invertor INV1 is converted from the low level to a high level. Namely, failure detection is performed by the fact that the level of the data stored in the input end of the master latch is not low but high.

Presence/absence of these failures of the RAM can be decided in the exterior by reading contents of scan registers by a shift operation after the aforementioned operations (reading and decision) with respect to a plurality of addresses.

The invertor INV3 can be omitted as described with reference to the embodiment 10 as a matter of course, and the selector SEL1 preferably has the structure shown in FIGS. 16A or 16B in this case.

(b-16) Embodiment 16

Figure 24A:
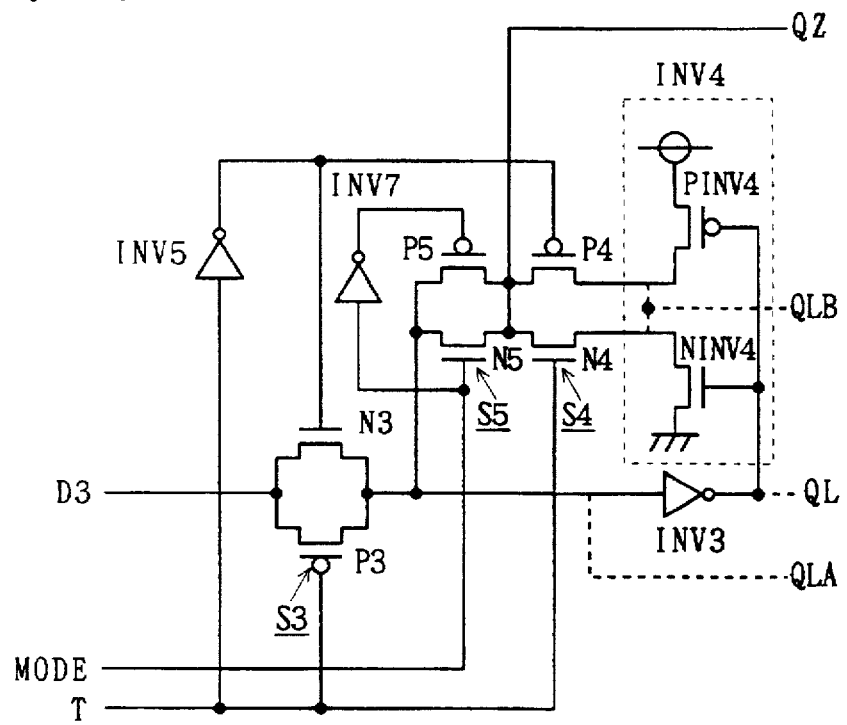
FIGS. 24A and 24B are circuit diagrams illustrating an embodiment 16 of the present invention.
Figure 24B:
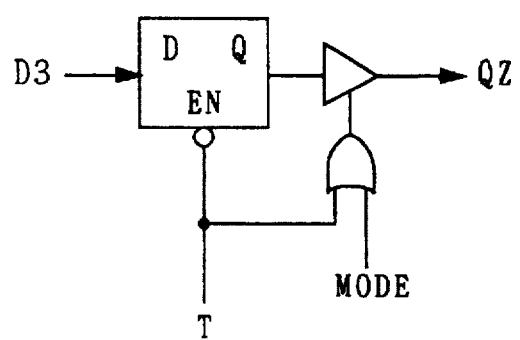
Figure 25:
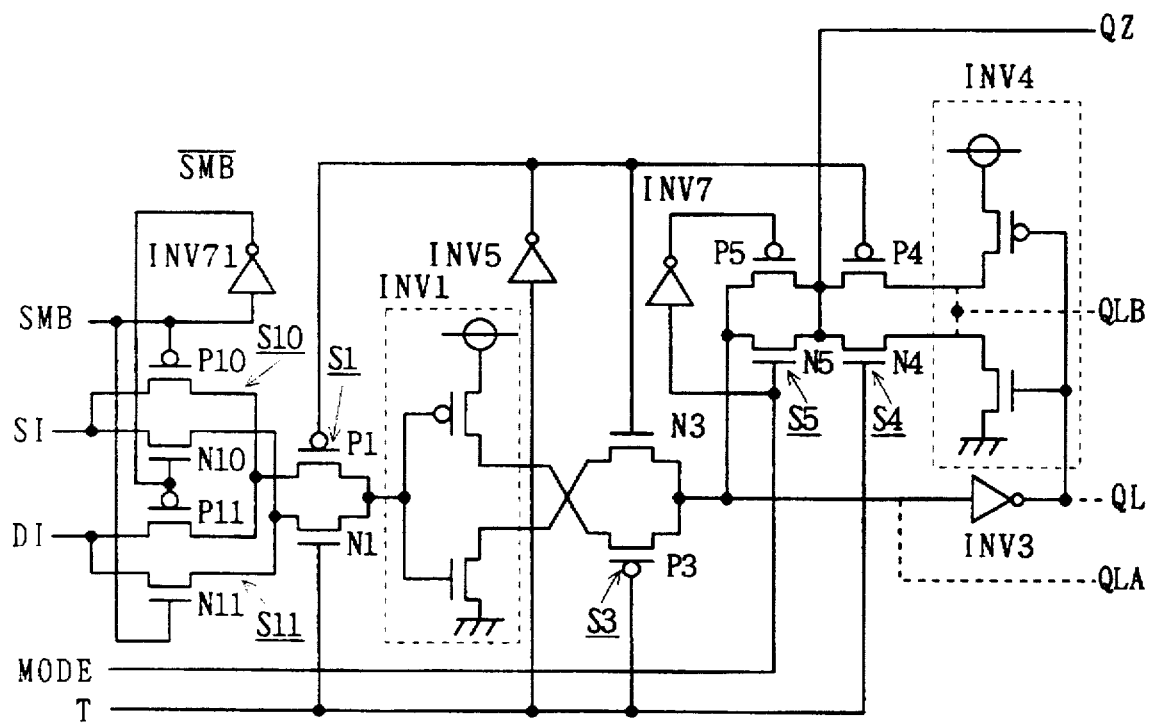
FIG. 25 is a circuit diagram illustrating the embodiment 16 of the present invention.

FIGS. 24A, 24B and 25 are circuit diagrams illustrating the structure of an embodiment 16. FIGS. 24A and 24B show a half latch which serves as that of a master-slave flip-flop circuit. FIG. 25 shows a flip-flop circuit employing the slave latch shown in FIG. 24A. Description is now made on the half latch shown in FIGS. 24A and 24B, followed by that on the flip-flop circuit shown in FIG. 25.

The half latch shown in FIG. 24A is adapted to take out a signal QZ from the circuit of the structure shown in FIG. 5. However, FIG. 24A shows such a state that the invertor INV4 is formed by PMOS and NMOS transistors PINV4 and NINV4, similarly to FIG. 6. The PMOS and NMOS transistors PINV4 and NINV4 are connected with PMOS and NMOS transistors P4 and N4 respectively. It is not necessary to directly connect the PMOS and NMOS transistors PINV4 and NINV4 with each other.

When the mode signal MODE is at a high level, the transmission gate S5 is turned on, and the signal QZ takes the same logic as the signal D3 transmitted by a transmission gate S3. In this case, the circuit shown in FIG. 24A serves as a static half latch.

A signal QLA obtained from the input end of the invertor INV3 or a signal QLB obtained from the output end of the invertor INV4 can also be employed as a signal taking the same logic as the signal D3, as a matter of course. On the other hand, a signal QL obtained from the output end of the invertor INV3 can be employed as a signal taking a logic which is complementary to the signal D3.

When the mode signal MODE is at a low level, the transmission gate S5 is turned off, and the circuit shown in FIG. 24A serves as that series-connecting a dynamic half latch which is formed by the transmission gate S3 and the invertor INV3 with a tristate invertor which is formed by the transmission gate S4 and the invertor INV4.

FIG. 24B is a circuit diagram conceptually showing the function of FIG. 24A, but not directly in correspondence to the circuit of FIG. 24A. If the mode signal MODE is at a high level, the same logic as the signal D3 is obtained as the signal QZ. If the mode signal MODE is at a low level, on the other hand, a high impedance may be attained by the clock signal or the signal QZ may be obtained.

The flip-flop circuit shown in FIG. 25 is a scan flip-flop circuit employing the half latch shown in FIG. 24A as a slave latch while providing a master latch as a front stage circuit therefor, and the structure of this master latch is similar to that shown in FIG. 17A.

The difference between the master latches shown in FIGS. 17A and 25 resides in a point that conduction/nonconduction of transistors P10, P11, N10 and N11 forming a selector are controlled not by the mode signal MODE (and the inverted mode signal $\overline{\text{MODE}}$) but another signal SMB (and its inverted signal $\overline{\text{SMB}}$).

In more concrete terms, the signal SMB is supplied to gates of the PMOS and NMOS transistors P10 and N11 and an input end of an invertor INV71. The signal $\overline{\text{SMB}}$ is obtained from an output end of the invertor INV71, to be supplied to gates of the PMOS and NMOS transistors P11 and N10.

As to connection between the transmission gate S3 of the slave latch and the invertor INV1 of the master latch, the NMOS and PMOS transistors N3 and P3 of the transmission gate S3 may not necessarily be connected in parallel with each other (FIG. 17). While the slave latch shown in FIG. 25 is different from the half latch shown in FIG. 24A in this point, the operations are not different but complicatedness of wiring can be rather avoided.

Dissimilarly to the circuit shown in FIG. 17A, operations of transmission gates S10 and S11 forming the selector are controlled not by the mode signal MODE but by the signal SMB, whereby the value of the mode signal MODE does not contribute to whether the ordinary or shift operation is performed.

When the shift operation is performed, the signal SMB is converted to a low level, and the scan test signal SI is transmitted to the transmission gate S1. The mode signal MODE is set at a low level. Therefore, the overall flip-flop circuit shown in FIG. 25 serves as series connection of the master latch in which signals are transmitted with the clock signal T being at a high level, the slave latch in which signals are transmitted with the clock signal T being at a low level, and a tristate invertor in which signals are transmitted with the clock signal T being at a high level.

In relation to the flip-flop circuit formed by alternately serially arranging signal transmission means in which states of the clock signal T transmitting the signals are different from each other, there is an advantage of suppressing a malfunction by skews of the clock signal T when these means are connected in series with each other.

Such a technique utilizes the fact that a half period of the clock signal T is necessary for transmitting the signals through the overall flip-flop circuit. Namely, an output of the transmission gate S1 which is ascertained by fall of the clock signal T is supplied to the input end of the invertor INV3 since the transmission gate S3 conducts when the clock signal T is at a low level, while the same does not contribute to decision of the value of the output signal QZ since the transmission gate S4 is turned off. The transmission gate S4 is turned on by rise of the clock signal T, to decide the value of the output signal QZ.

Thus, a half period of the clock signal T is required for transmitting the signals, and hence this half period is obtained as a margin for skews of the clock signal T. Japanese Patent Laying-Open Gazette No. 6-68691 (1994) discloses a case of employing tristate signal transmission means in particular.

When the flip-flop circuit shown in FIG. 25 is employed, an influence by skews of the clock signal T can be advantageously suppressed in case of forming a scan path by serially connecting the same.

When an ordinary operation is performed, on the other hand, the signal SMB is converted to a high level and the ordinary input signal DI is transmitted to the transmission gate S1. At this time, it is possible to convert the mode signal MODE to a low level for driving the slave latch as a dynamic type thereby making power consumption and speed performance advantageous, to convert the mode signal MODE to a high level for driving the slave latch as a static type thereby making a DC test, or to stop the clock signal T for reducing power consumption.

The master latch is not restricted to the aforementioned dynamic type, but a static type one may alternatively be employed, as a matter of course.

Figure 26A:
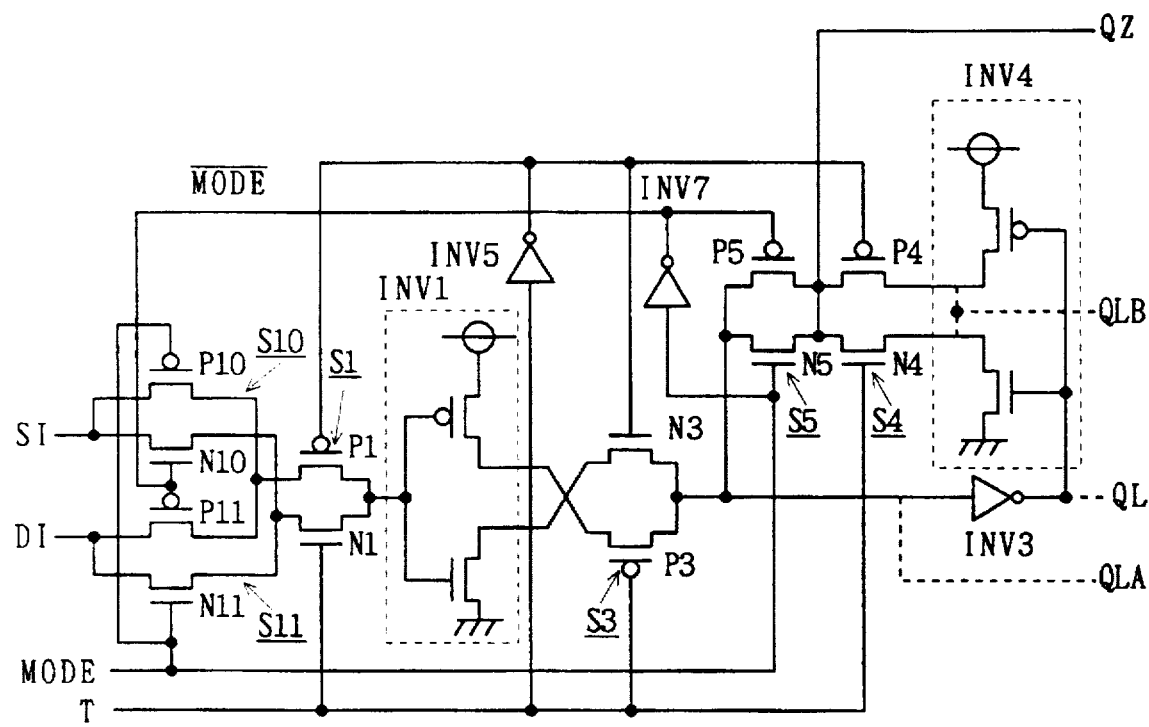
FIG. 26A is a circuit diagram illustrating a modification of the embodiment 16 of the present invention.
Figure 26B:
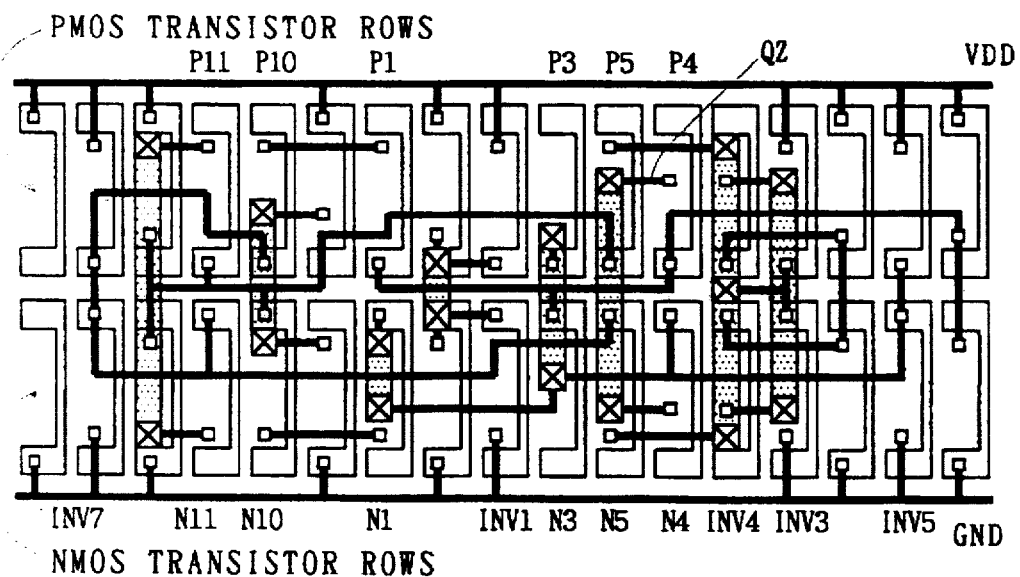
FIG. 26B is a plan view illustrating the modification of the embodiment 16 of the present invention.

FIGS. 26A and 26B are a circuit diagram and a plan view illustrating a modified structure of the embodiment 16. While the signal SMB is separately employed in the circuit shown in FIG. 25 for controlling the selector, this can be concurrently held by the mode signal MODE. In this case, the invertor INV7 can also serve as the invertor INV71 shown in FIG. 25, as shown in FIG. 26A.

Thus, it is not necessary to separately obtain the signal SMB, whereby the number of wires forming the flip-flop circuit is advantageously reduced. FIG. 26B shows a state of implementing respective transistors in a CMOS gate array, similarly to FIG. 17B.

Due to the modification of making the mode signal MODE also serve as the signal SMB, however, the mode signal MODE must be set at a high level in the ordinary operation, and only a static operation can be performed.

(b-17) Embodiment 17

Figure 27A:
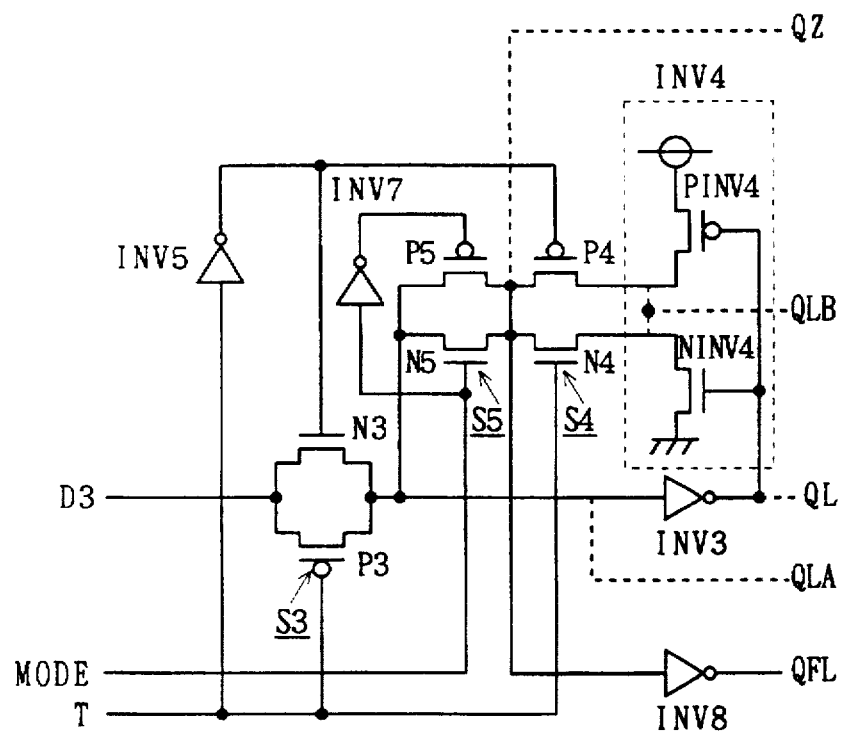
FIGS. 27A and 27B are circuit diagrams illustrating an embodiment 17 of the present invention.
Figure 27B:
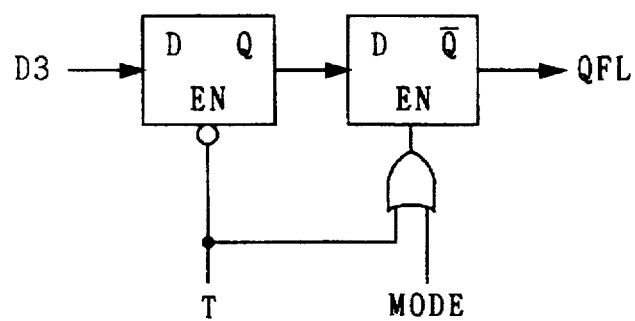
Figure 28:
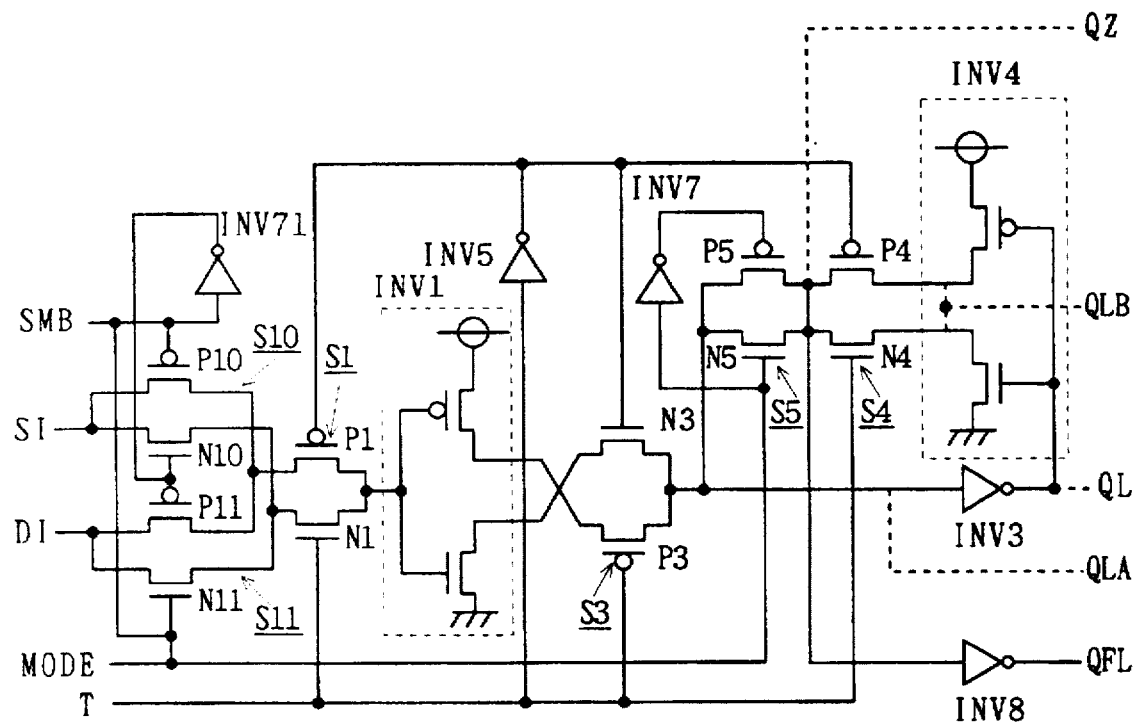
FIG. 28 is a circuit diagram illustrating the embodiment 17 of the present invention.

FIGS. 27A, 27B and 28 are circuit diagrams illustrating the structure of an embodiment 17. FIGS. 27A and 27B show a half latch serving as a slave latch of a master-slave flip-flop circuit. FIG. 28 shows a flip-flop circuit employing the slave latch shown in FIG. 27A. Description is now made on the half latch shown in FIGS. 27A and 27B, followed by that on the flip-flop circuit shown in FIG. 28.

The half latch shown in FIG. 27A indicates a structure obtained by adding an invertor INV8 to the circuit shown in FIG. 24A. The invertor INV8 has an input end which is connected to a node between transmission gates S4 and S5, and an output end which outputs an output signal QFL.

When the mode signal MODE is at a high level, the transmission gate S5 is turned on and the signal QFL takes a logic which is complementary to the signal D3 transmitted by a transmission gate S3. In this case, the circuit shown in FIG. 27A serves as a static half latch.

The signal QL obtained from the output end of the invertor INV3 can also be employed as a signal taking the logic which is complementary to the signal D3, as a matter of course. Further, the signal QLA which is obtained from the input end of the invertor INV3 and signals QZ and QLB which are obtained from both ends of the transmission gate S4 can be employed as signals taking the same logic as the signal D3.

When the mode signal MODE is at a low level, on the other hand, the transmission gate S5 is turned off and the circuit shown in FIG. 27A serves as that series-connecting a dynamic half latch (outputs a supplied signal without inverting the same) which is formed by the transmission gate S3 and the invertors INV3 and INV4 with a dynamic half latch (outputs a supplied signal while inverting the same) which is formed by the transmission gate S4 and the invertor INV8.

FIG. 27B is a circuit diagram conceptually showing the function of FIG. 27A, not directly in correspondence to the circuit of FIG. 27A. If the mode signal MODE is at a high level, a logic which is complementary to the signal D3 is obtained as the signal QFL.

When the mode signal MODE is at a low level, on the other hand, the clock signal T goes high and hence the transmission gate S4 conducts to update the signal QFL. Namely, it comes to that the circuit shown in FIG. 27A serves as an edge trigger type flip-flop circuit which is obtained by series connection of level trigger type half latches operating by different levels in this case, as shown in FIG. 27B.

The flip-flop circuit shown in FIG. 28 is a scan flip-flop circuit employing the half latch shown in FIG. 27A as a slave latch and providing the master latch employed in FIG. 25 as a front stage circuit therefor.

Similarly to the embodiment 16, the signal SMB is converted to a low level and the scan test signal SI is transmitted to the transmission gate S1 in case of performing the shift operation. The mode signal MODE is set at a low level. Therefore, the overall flip-flop circuit shown in FIG. 28 serves as series connection of a master latch in which signals are transmitted with the clock signal being at a high level, a slave latch in which signals are transmitted with the clock signal T being at a low level, and a half latch in which signals are transmitted with the clock signal T being at a high level.

Thus, a flip-flop circuit formed by alternately serially arranging signal transmission means in which states of the clock signal T transmitting the signals are different from each other is obtained, whereby there is an advantage of suppressing a malfunction by skews of the clock signal T when these means are connected in series with each other, similarly to the embodiment 16. Namely, a half period of the clock signal T is obtained as a margin for skews of the clock signal T. Japanese Patent Laying-Open Gazette No. 6-5090 (1994) discloses a case of serially connecting half latches in three stages in particular.

When the flip-flop circuit shown in FIG. 28 is employed, an influence by skews of the clock signal T can be advantageously suppressed in case of forming a scan path by serially connecting the same, as hereinabove described.

Figure 29:
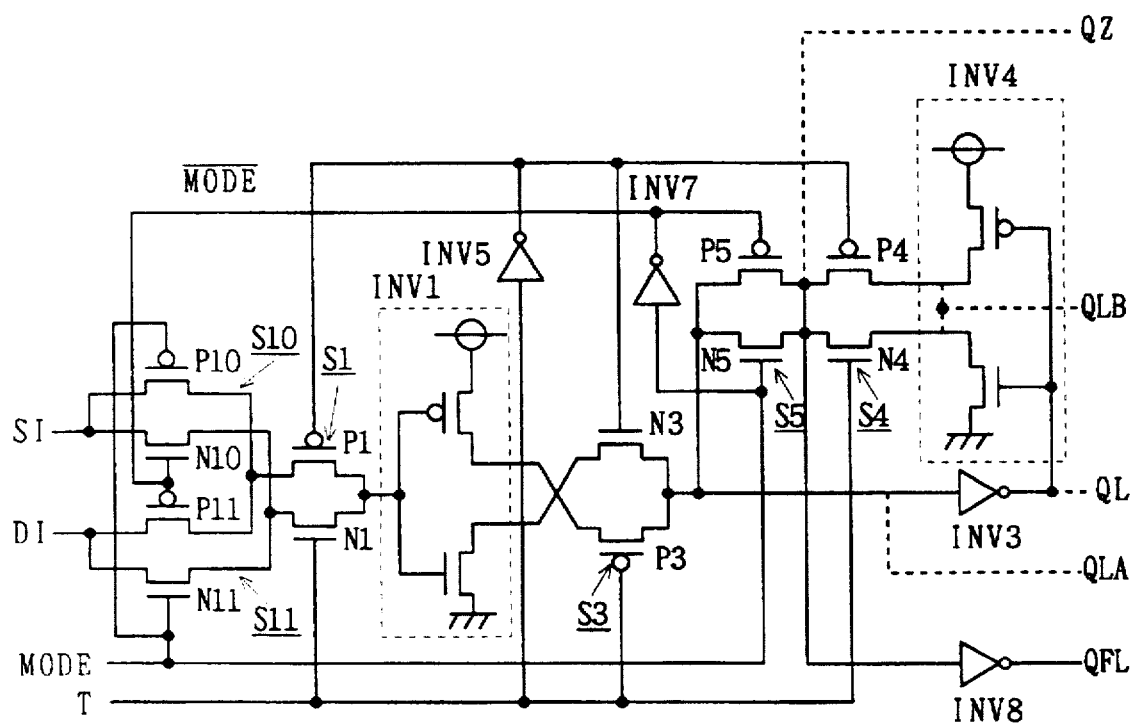
FIG. 29 is a circuit diagram illustrating a modification of the embodiment 17 of the present invention.

The structure shown in FIG. 28 can be modified, similarly to the modification on the embodiment 16. FIG. 29 is a circuit diagram showing such a modification. The mode signal MODE is made to also serve as the signal SMB, while the invertor INV7 also serves as the invertor INV71. Thus, the number of wires forming the flip-flop circuit can be advantageously reduced.

(b-18) Embodiment 18

Figure 30:
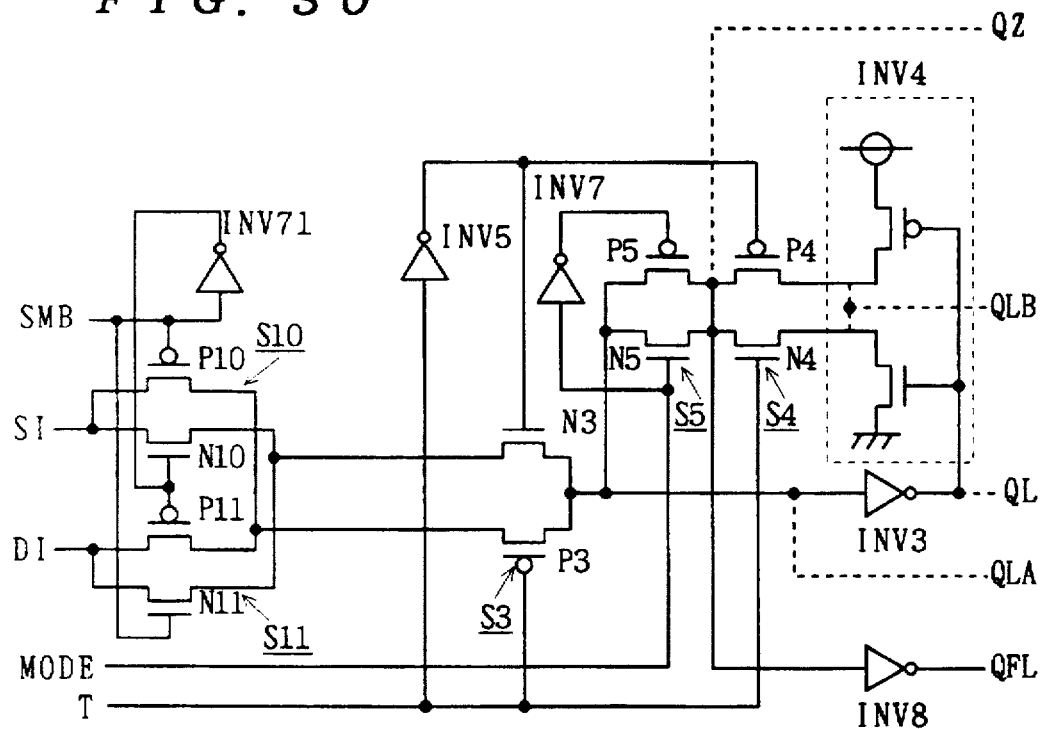
FIG. 30 is a circuit diagram illustrating an embodiment 18 of the present invention.

FIG. 30 is a circuit diagram illustrating the structure of an embodiment 18. This figure shows a scan flip-flop circuit having a structure obtained by adding a selector outputting the signal D3 to the structure shown in FIG. 27A.

The selector is formed by transmission gates S10 and S11, similarly to the structure shown in FIG. 17. Further, the selector is controlled by the signal SMB and its inverted signal SMB, similarly to the structure shown in FIG. 25.

However, the scan test signal SI or the ordinary input signal DI transmitting the transmission gate S10 or S11, respectively, is employed as the signal D3 which is supplied to a transmission gate S3, while all of the transmission gates S3, S10 and S11 are formed by MOS transistor pairs P3 and N3, P10 and N10 and P11 and N11 respectively, whereby NMOS transistor N3 may not be connected with the PMOS transistors P10 and P11. PMOS transistor P3 may not be connected with the NMOS transistors N10 and N11.

When the mode signal MODE is at a low level, the transmission gate S5 is turned off and the circuit shown in FIG. 30 serves as that series-connecting a dynamic half latch (outputs a supplied signal without inverting the same) which is formed by the transmission gate S3 and invertors INV3 and INV4 and a dynamic half latch (outputs a supplied signal while inverting the same) which is formed by the transmission gate S4 and the invertor INV8.

When a shift operation is performed, the signal SMB is set at a low level, whereby the scan test signal SI is inverted by the aforementioned two dynamic half latches and outputted as the signal QFL. If the logic of the signal QFL must be made identical to that of the scan test signal SI, it is possible to further provide an invertor having an input end which is connected to an output end of the invertor INV8 so that the signal QFL is obtained from its output end, or the invertor INV8 may be replaced with a non-inversion buffer.

When an ordinary operation is performed, on the other hand, the signal SMB is set at a high level, whereby an ordinary input signal DI is inverted by the aforementioned two dynamic half latches and outputted as the signal QFL. The signal QLA obtained from the input end of the invertor INV3 and signals QLB and QZ obtained from both ends of the transmission gate S4 can also be employed as signals taking the same logic as the ordinary input signal DI, as a matter of course. Further, the signal QL which is obtained from the output end of the invertor INV3 can also be employed as a signal taking a logic which is complementary to the ordinary input signal DI.

When the ordinary operation is performed, it is also possible to set the mode signal MODE at a high level. Thus, the circuit shown in FIG. 30 serves as a static half latch. Therefore, it is possible to hold data by stopping the clock signal T, thereby reducing power consumption.

Figure 31:
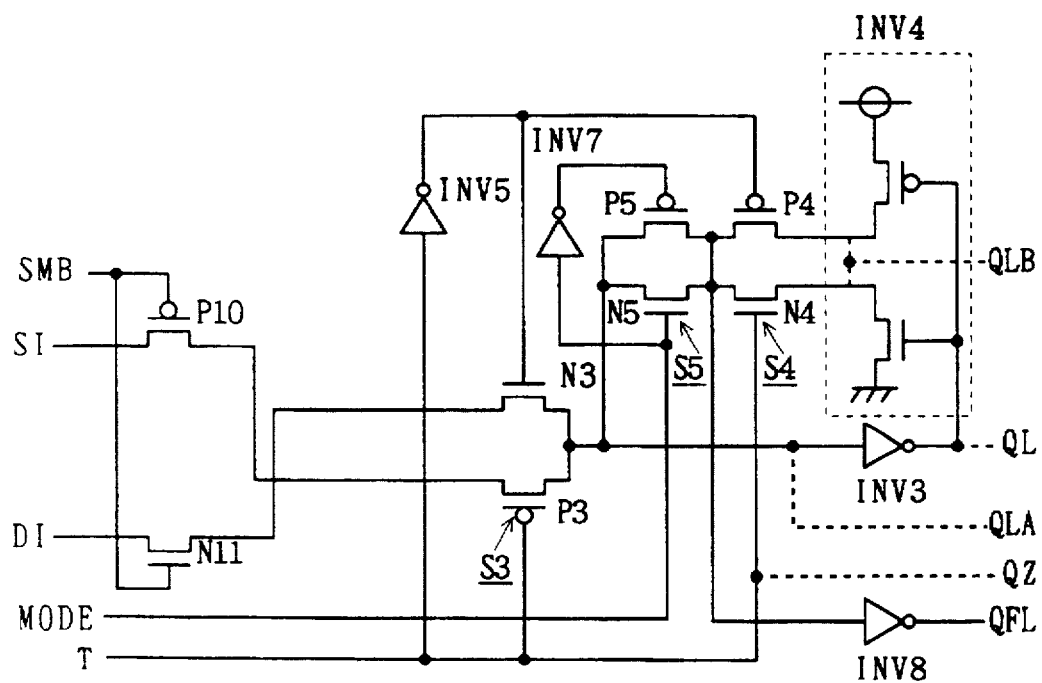
FIG. 31 is a circuit diagram illustrating a modification of the embodiment 18 of the present invention.

FIG. 31 is a circuit diagram showing a modified structure of this embodiment. The circuit shown in this figure has a structure which is obtained by omitting the NMOS and PMOS transistors N10 and P11 from the structure shown in FIG. 30. Also in this case, the scan test signal SI or the ordinary input signal DI can be employed as the signal D3, similarly to the circuit shown in FIG. 30.

Thus, it is not necessary to form the inverted signal $\overline{SMB}$ either, whereby the invertor INV71 is also omitted.

In the structure shown in FIG. 31, PMOS transistors P10 and P3 which are controlled by the signal SMB and the clock signal T respectively are connected in series with each other. On the other hand, the NMOS transistor N11 controlled by the signal SMB and the NMOS transistor N3 controlled by an inverted signal of the clock signal T outputted by the invertor INV5 are connected in series with each other. Therefore, various modifications are possible so far as the relation of such series connection is maintained.

Figure 32:
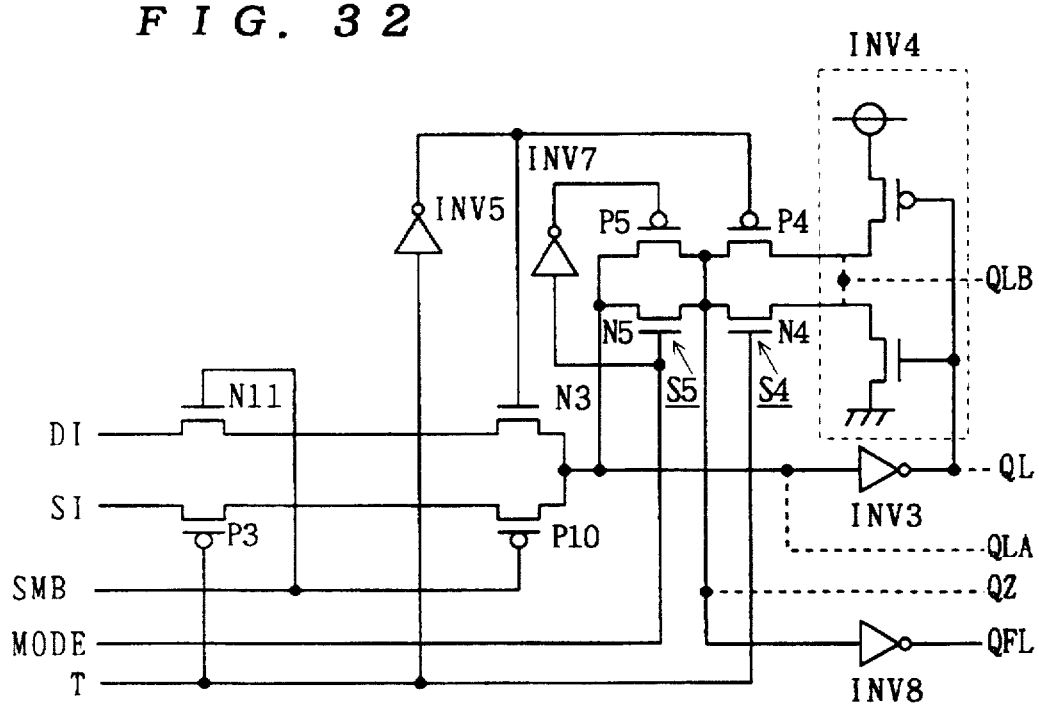
FIG. 32 is a circuit diagram illustrating another modification of the embodiment 18 of the present invention.
Figure 33:
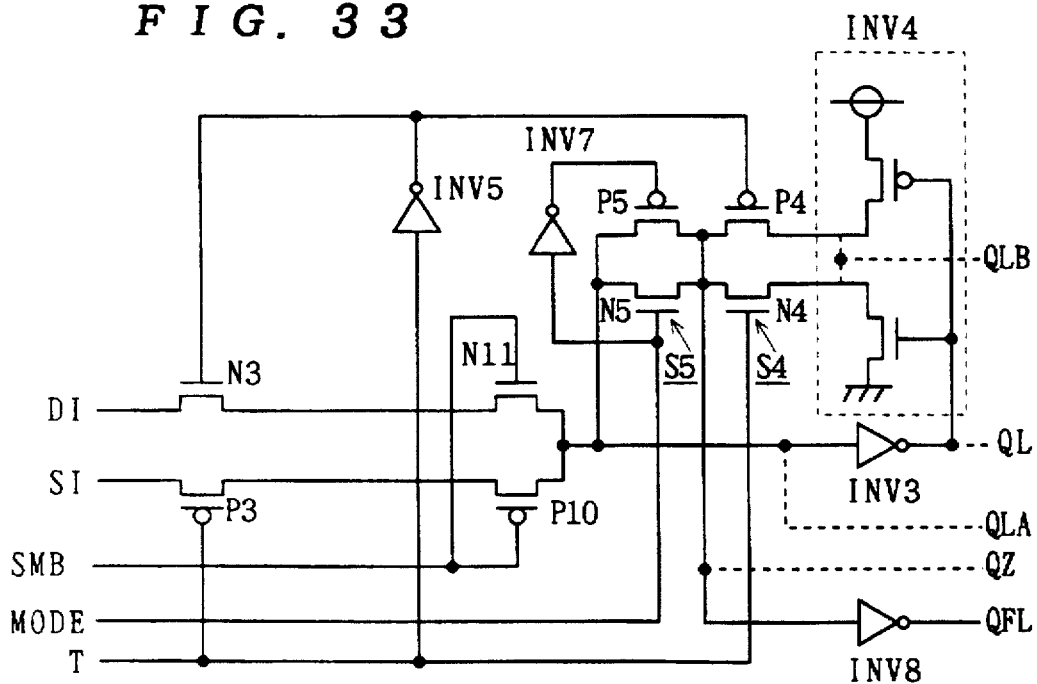
FIG. 33 is a circuit diagram illustrating still another modification of the embodiment 18 of the present invention.

FIGS. 32 and 33 show modifications implemented by replacing PMOS transistors P3 and P10 and NMOS transistors N3 and N11 with each other respectively. In either case, the operations are not different from those of FIG. 31.

(b-19) Embodiment 19

Figure 34:
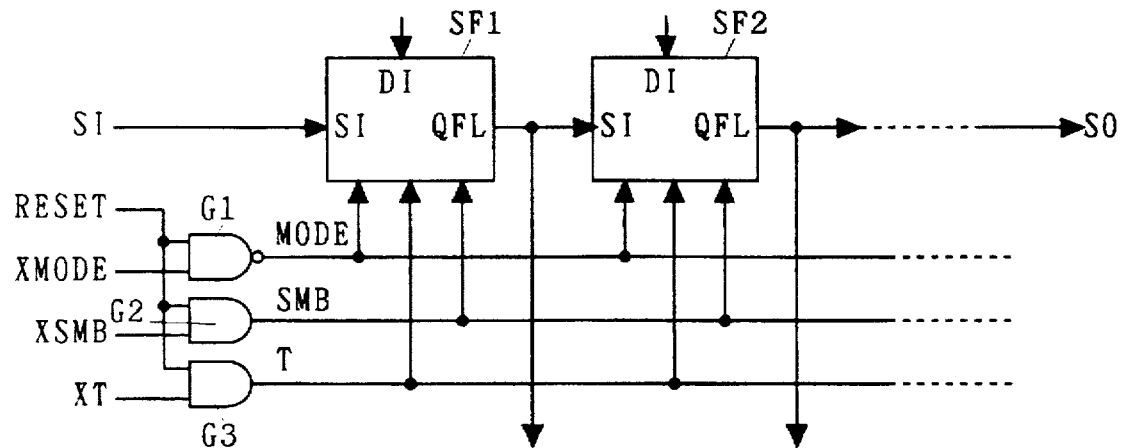
FIG. 34 is a circuit diagram illustrating an embodiment 19 of the present invention.

FIG. 34 is a circuit diagram illustrating the structure of an embodiment 19. This figure shows a scan path obtained by serially connecting scan flip-flop circuits SF1, SF2, . . . with each other. Each of the scan flip-flop circuits SF1, SF2, . . . has a structure shown in any of FIGS. 30 to 33, and the mode signal MODE, the signal SMB and the clock signal T thereof can be obtained from a NAND gate G1, an AND gate G2, and an AND gate G3 respectively.

The NAND gate G1 outputs an inverted signal of the logical product of signals RESET and XMODE as the mode signal MODE, while the AND gate G2 outputs logical product of the signal RESET and signal XSMB as the signal SMB, and the AND gate 93 outputs logical product of th signal RESET and signal XT as the clock signal T respectively.

When the scan path is not reset, the signal RESET is set at a high level. Thus, the mode signal MODE, the signal SMB and the clock signal T take the same values as an inverted signal of the signal XMODE, the signal XSMB and the signal XT respectively.

When the scan path is reset, on the other hand, the signal RESET is set at a low level. Thus, the mode signal MODE, the signal SMB and the clock signal T are regularly set at high, low and low levels respectively. Thus, a transmission gate S3 (or PMOS and NMOS transistors P3 and N3) of each of the scan flip-flop circuits SF1, SF2, . . . is turned on and the scan test signal SI is outputted as the signal QFL while being inverted by the invertor INV3. Therefore, the scan flip-flop circuits are successively initialized at low, high, low, high, . . . levels (or high, low, high, low, . . . levels) in arranged order thereof.

According to this embodiment, scan flip-flop circuits forming a scan path can be reset by a small-scale circuit.

Figure 35:
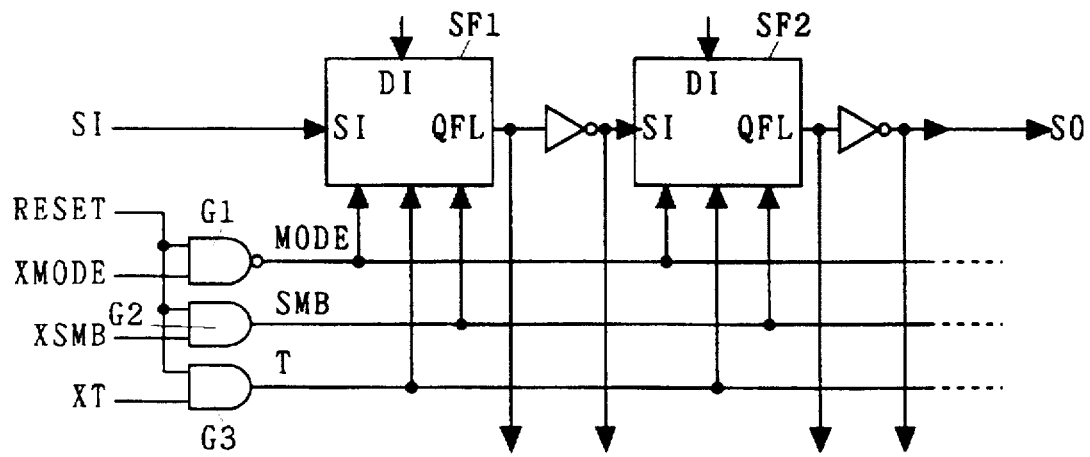
FIG. 35 is a circuit diagram illustrating an embodiment of the embodiment 19 of the present invention.

FIG. 35 is a circuit diagram showing a modification of this embodiment. With respect to the scan path shown in FIG. 34, invertors are serially inserted between the respective scan flip-flop circuits SF1, SF2, . . . . Thus, all scan flip-flop circuits can be initialized at the same values.

(b-20) Embodiment 20

Figure 36:
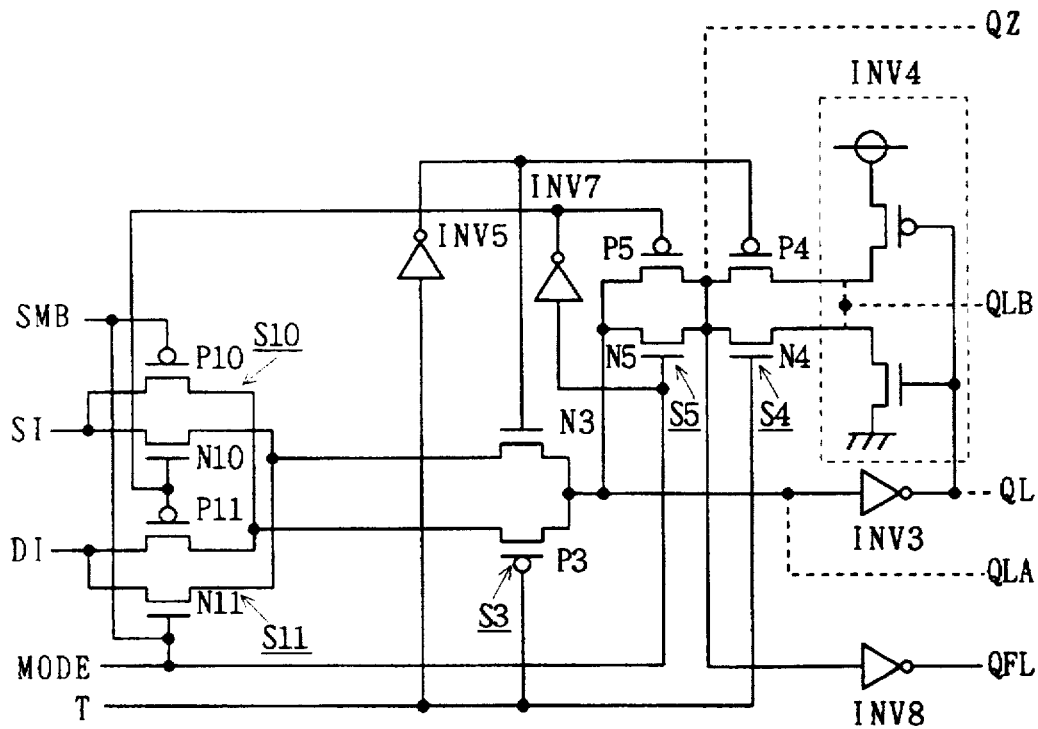
FIG. 36 is a circuit diagram illustrating an embodiment 20 of the present invention.

FIG. 36 is a circuit diagram illustrating the structure of an embodiment 20. While the signal SMB is separately employed for controlling the selector in the embodiment shown in FIG. 30 in relation to the embodiment 18, the mode signal MODE is made to also serve as this while the invertor INV7 also serves as the invertor INV71 in this embodiment.

In a shift operation, the mode signal MODE is set at a low level. Thus, the scan test signal SI is transmitted to a flip-flop circuit formed by series connection of a dynamic half latch which is formed by the transmission gate S3 and invertors INV3 and INV4 and a dynamic half latch which is formed by the transmission gate S4 and the invertor INV8, through the transmission gate S10. Namely, a storage circuit shown in FIG. 36 serves as a flip-flop circuit which is formed by master and slave latches being dynamic half latches in a shift operation.

In an ordinary operation, on the other hand, the mode signal MODE is set at a high level. Thus, the ordinary input signal DI is supplied to the transmission gate S3 through the transmission gate S11. When a signal QL outputted from the invertor INV3 is employed as an output of this circuit, therefore, it comes to that this circuit serves as a static half latch which is formed by the transmission gate S3 and the invertor INV3.

However, the transmission gate S5 conducts and hence the input end of the invertor INV8 is connected to that of the invertor INV3, whereby this circuit still serves as a static half latch as a result, also when the signal QFL outputted by the invertor INV8 is employed as the output of this circuit.

Namely, this circuit has two functions of performing the ordinary and shift operations as a static half latch and a dynamic flip-flop circuit respectively on the basis of the mode signal MODE, by employing the signal QFL as its output.

A scan path formed by serially connecting the circuit shown in FIG. 36 can be applied to a scan path requiring a half latch in an ordinary operation. Further, the output end of the invertor INV8 can serve both as a node of the scan path in the shift operation and the output end for the ordinary operation.

Figure 37:
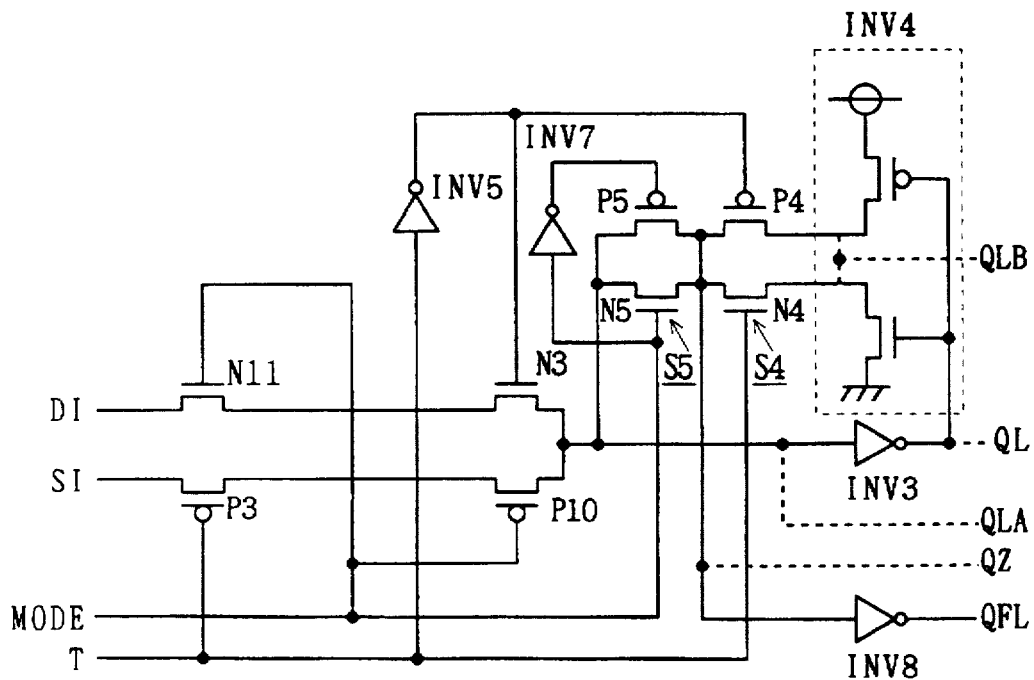
FIG. 37 is a circuit diagram illustrating a modification of the embodiment 20 of the present invention.
Figure 38:
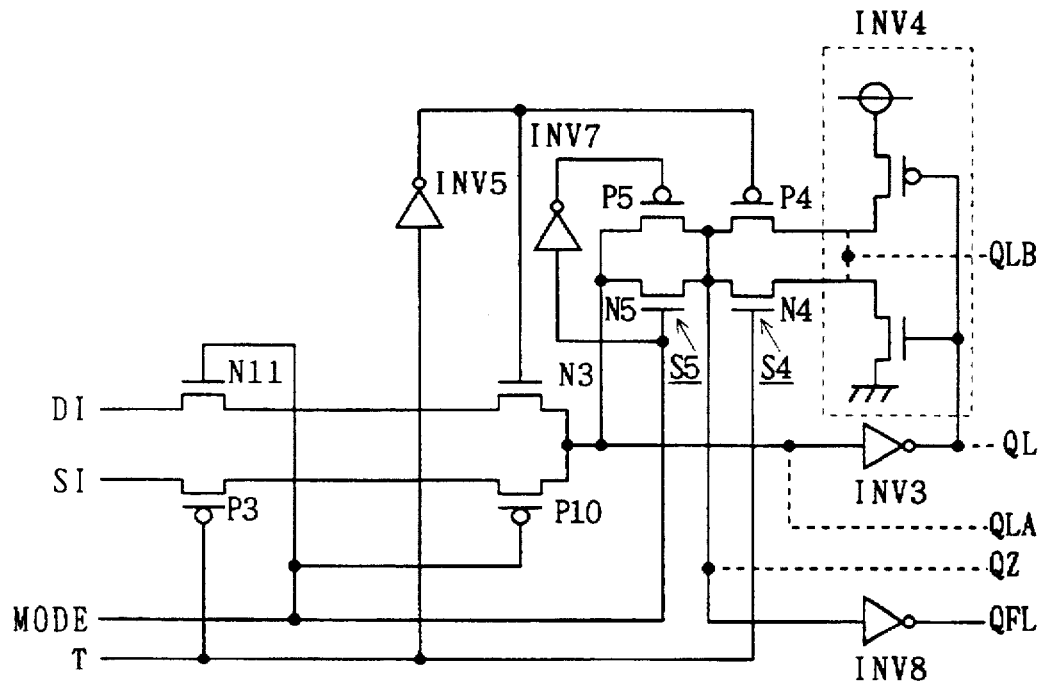
FIG. 38 is a circuit diagram illustrating another modification of the embodiment 20 of the present invention.
Figure 39:
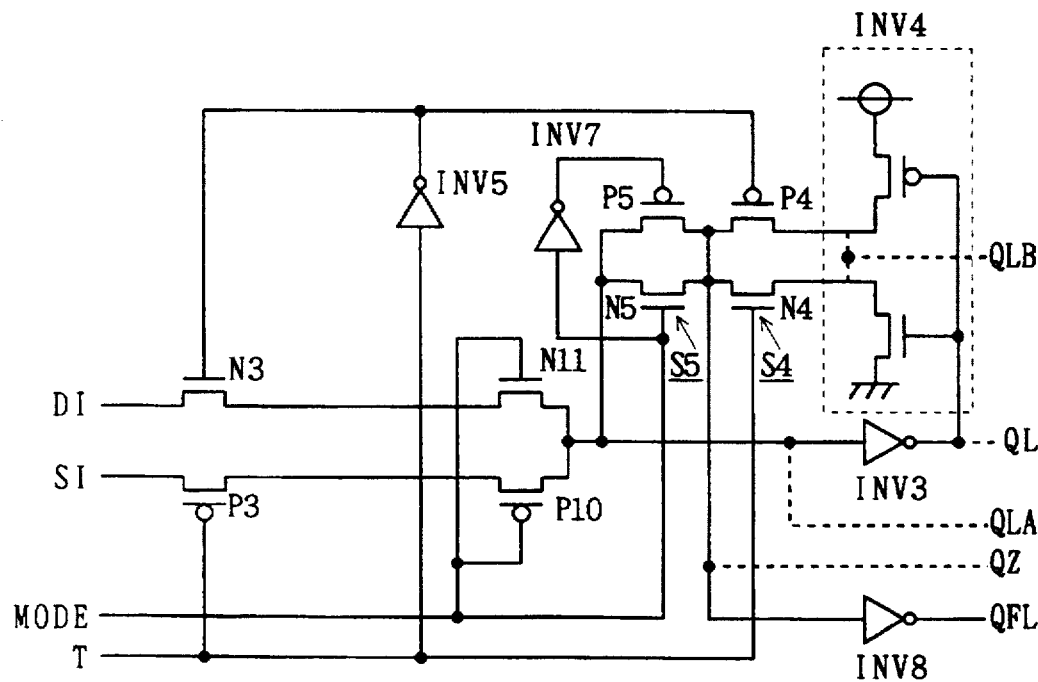
FIG. 39 is a circuit diagram illustrating still another modification of the embodiment 20 of the present invention.

Also in relation to this embodiment, modifications which are similar to those of the embodiment 18 can be carried out. FIGS. 37 to 39 are circuit diagrams showing the structures of modifications of this embodiment, in correspondence to the modifications shown in FIGS. 31 to 33 respectively.

(b-21) Embodiment 21

Figure 40A:
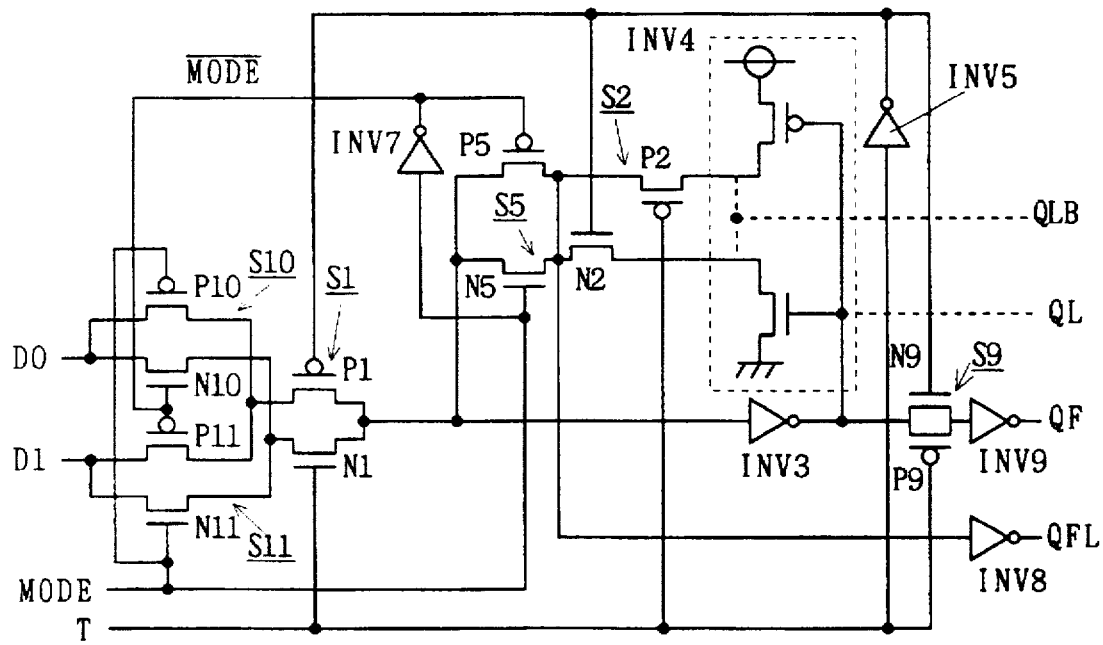
FIGS. 40A, 40B, 40C and 40D are circuit diagrams illustrating an embodiment 21 of the present invention.

FIG. 40A is a circuit diagram illustrating the structure of an embodiment 21. As compared with the circuit shown in FIG. 27A, the transmission gates S3 and S4 are replaced with transmission gates S1 and S2 respectively. Further, the transmission gate S1 is selectively supplied with either one of input signals D0 and D1 by a selector consisting of transmission gates S10 and S11. In addition, a dynamic half latch which is formed by series connection of a transmission gate S9 and an invertor INV9 is connected to the output end of the invertor INV3. The transmission gate S9 is formed by PMOS and NMOS transistors P9 and N9, and this half latch serves as a slave latch.

The transmission gates S1 and S2 are opened/closed complementarily to transmission gates S3 and S4 respectively in relation to a clock signal T. Therefore, a half latch which is formed by the transmission gates S1, S2 and S5 and the invertors INV3, INV4, INV5 and INV7 substantially performs the same operation as that shown in FIG. 27A, although complementary in relation to the clock signal T. Further, the transmission gate S1 is complementarily opened/closed to the transmission gate S9 in relation to the clock signal T, whereby this half latch serves as a master latch.

Figure 40B:
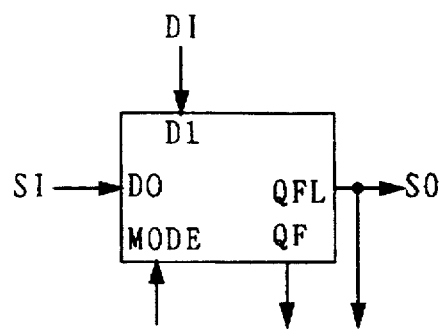
Figure 40C:
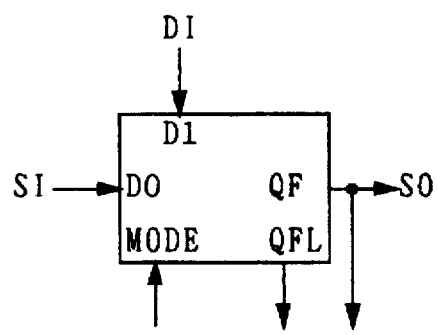
Figure 40D:
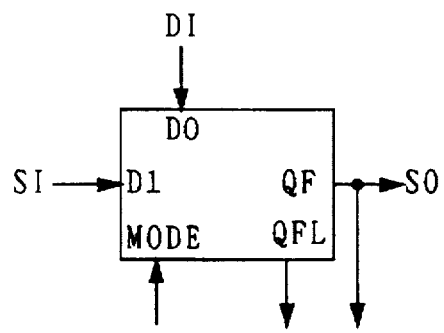

Therefore, the circuit shown in FIG. 40A serves as a master-slave scan FF. FIGS. 40B to 40D indicate methods of employing the circuit shown in FIG. 40A.

FIGS. 40B and 40C show such states that the scan test signal SI and the ordinary input signal DI are supplied as the input signals D0 and D1 respectively. In an ordinary operation, the mode signal MODE is set at a high level. Thus, the ordinary input signal DI is supplied to the transmission gate S1, while the transmission gate S5 conducts so that the output signal QF is obtained as an output of a flip-flop circuit consisting of series connection of a static master latch which is formed by the transmission gates S1, S2 and S5 and the invertors INV3 and INV4 and a dynamic slave latch which is formed by a transmission gate S9 and an invertor INV9. On the other hand, the output signal QFL becomes an output of a dynamic half latch which is formed by the transmission gates S1 and S5 and the invertor INV8.

In a shift operation, on the other hand, the mode signal MODE is converted to a low level, the scan test signal SI is supplied to the transmission gate SI and the transmission gate S5 is brought into a nonconducting state, whereby the output signal QF is obtained as an output of a flip-flop circuit consisting of series connection of a dynamic master latch which is formed by the transmission gate S1 and the invertor INV3 and a dynamic slave latch which is formed by the transmission gate S9 and the invertor INV9. On the other hand, the output signal QFL outputted by the invertor INV8 is obtained as an output of a flip-flop circuit consisting of series connection of a dynamic master latch which is formed by the transmission gate S1 and the invertors INV3 and INV4 and a dynamic slave latch which is formed by the transmission gate S2 and the invertor INV8.

Due to the aforementioned operations, it is possible to shift out the output signal QFL as shown in FIG. 40B, as well as to shift out the output signal QF as shown in 40C. Particularly the latter case is effective in a point that shifted signals are transmitted with no inversion.

FIG. 40D shows such a state that the ordinary input signal DI and the scan test signal SI are supplied as the input signals D0 and D1 respectively. In an ordinary operation, the mode signal MODE is set at a low level and the ordinary input signal DI is supplied to the transmission gate S1. At this time, the output signal QF is obtained as an output of a flip-flop circuit consisting of series connection of two dynamic half latches. The output signal QFL is also obtained as an output of a flip-flop circuit consisting of series connection of two dynamic half latches.

In a shift operation, on the other hand, the mode signal MODE is converted to a high level, and the scan test signal S1 is supplied to the transmission gate S1. The transmission gate S5 conducts, whereby the output signal QF is obtained as an output of a flip-flop circuit consisting of series connection of a static master latch and a dynamic slave latch. On the other hand, the output signal QFL becomes an output of a dynamic half latch which is formed by the transmission gates S1 and S5 and the invertor INV8.

Thus, the output signal QFL becomes an output of a half latch in the shift operation, whereby the output signal QF which becomes an output of a flip-flop circuit is preferably employed as a shift-out signal SO.

(b-22) Embodiment 22

Figure 41A:
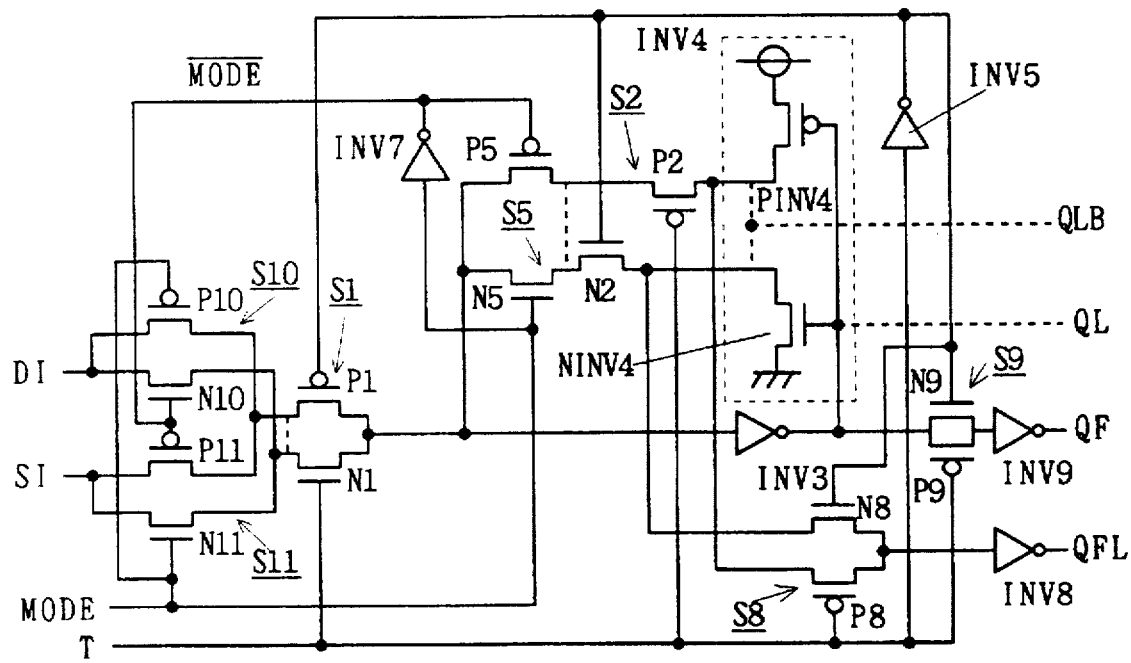
FIGS. 41A and 41B are circuit diagrams illustrating an embodiment 22 of the present invention.
Figure 41B:
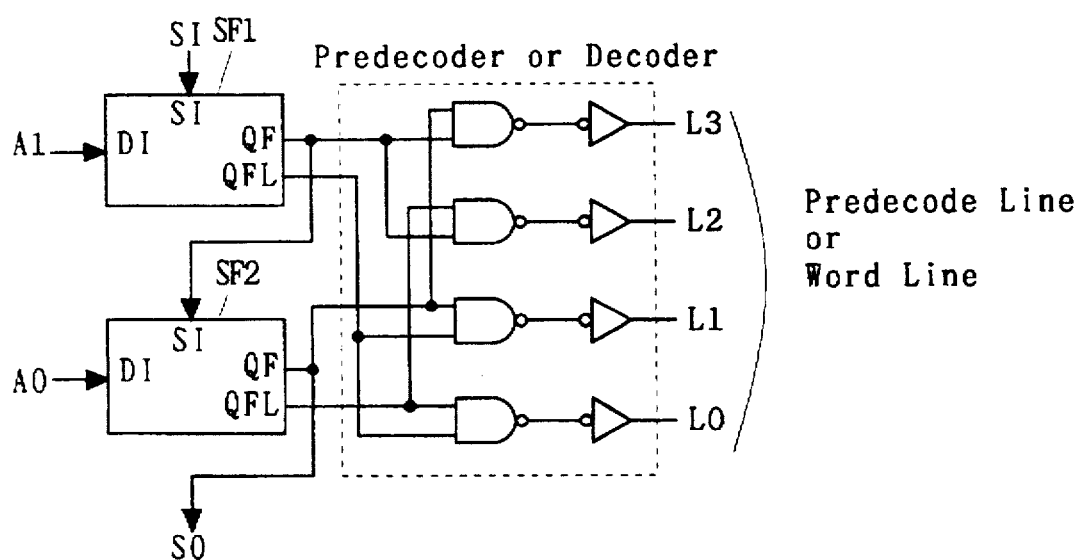

FIGS. 41A and 41B are circuit diagrams illustrating the structure of an embodiment 22. The circuit shown in FIG. 41A is different from that shown in FIG. 40A in a portion connecting an input end of an invertor INV8.

In this embodiment, the input end of the invertor INV8 is connected to an output end of the invertor INV4 through a transmission gate S8. However, the transmission gate S8 is formed by PMOS and NMOS transistors P8 and N8, and hence it is not necessary to connect PMOS and NMOS transistors PINV4 and NINV4 forming the invertor INV4 with the NMOS and PMOS transistors N8 and P8 respectively. Similarly, it is not necessary to connect PMOS and NMOS transistors P2 and N2 with NMOS and PMOS transistors N5 and P5 respectively.

Dissimilarly to the circuit shown in FIG. 40A, the circuit shown in FIG. 41A is so employed that the ordinary input signal DI and the scan test signal SI are supplied to transmission gates S10 and S11 forming a selector respectively.

In such a structure, it comes to that the transmission gate S8 and the invertor INV8 form a dynamic slave latch. Further, an operation of the transmission gate S8 in relation to the clock signal T is identical to that of the transmission gate S9, whereby it comes to that output signals QF and QFL take complementary values at a matched timing. Namely, it comes to that such relation that these signals take complementary values is kept also when both values transit at a high speed.

The circuit shown in FIG. 41B indicate connection in case of employing the circuit shown in FIG. 41A as each of scan flip-flops SF1 and SF2. When address inputs of a synchronous RAM are decoded, it is preferable to provide complementary values which transit at a high speed in synchronization with each other to a decoder (or a predecoder). When address inputs A0 and A1 are employed as ordinary input signals DI, it is possible to provide output signals QF and QFL to the decoder (or the predecoder).

Both of the output signals QF and QFL can be employed as signals transmitted in a shift operation.

Invertors INV8 and INV9 can be replaced with other drive circuits such as NAND or NOR gates, as a matter of course. Further, the invertors INV8 and INV9 can be omitted if drive circuits are provided in a subsequent stage.

Figure 42A:
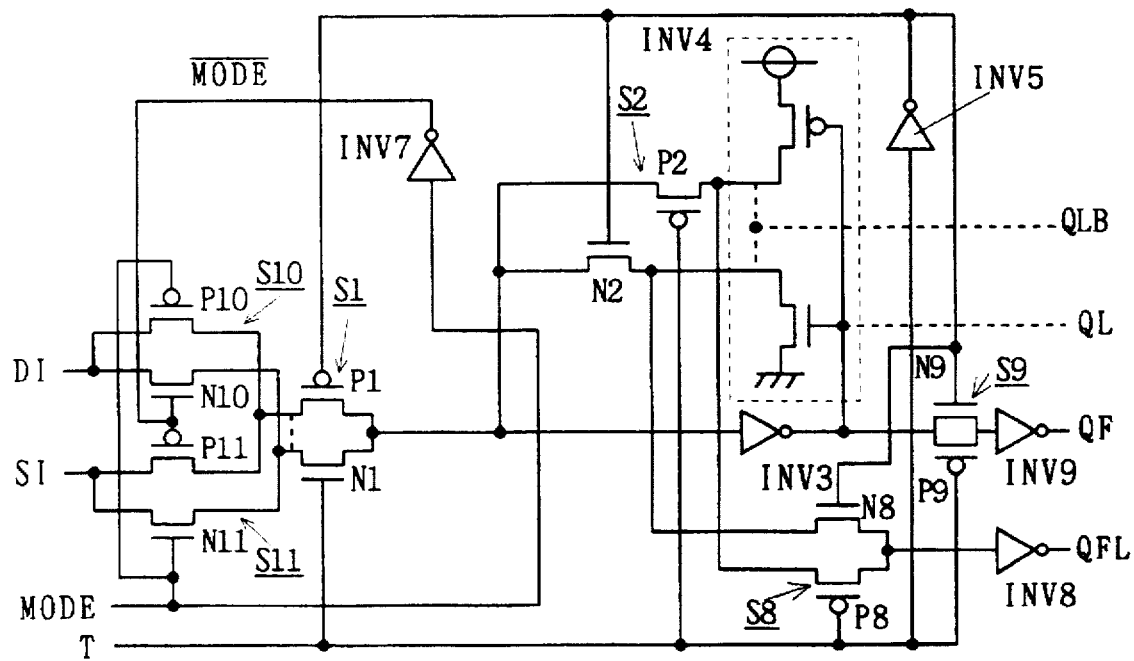
FIGS. 42A and 42B are circuit diagrams illustrating modifications of the embodiment 22 of the present invention.
Figure 42B:
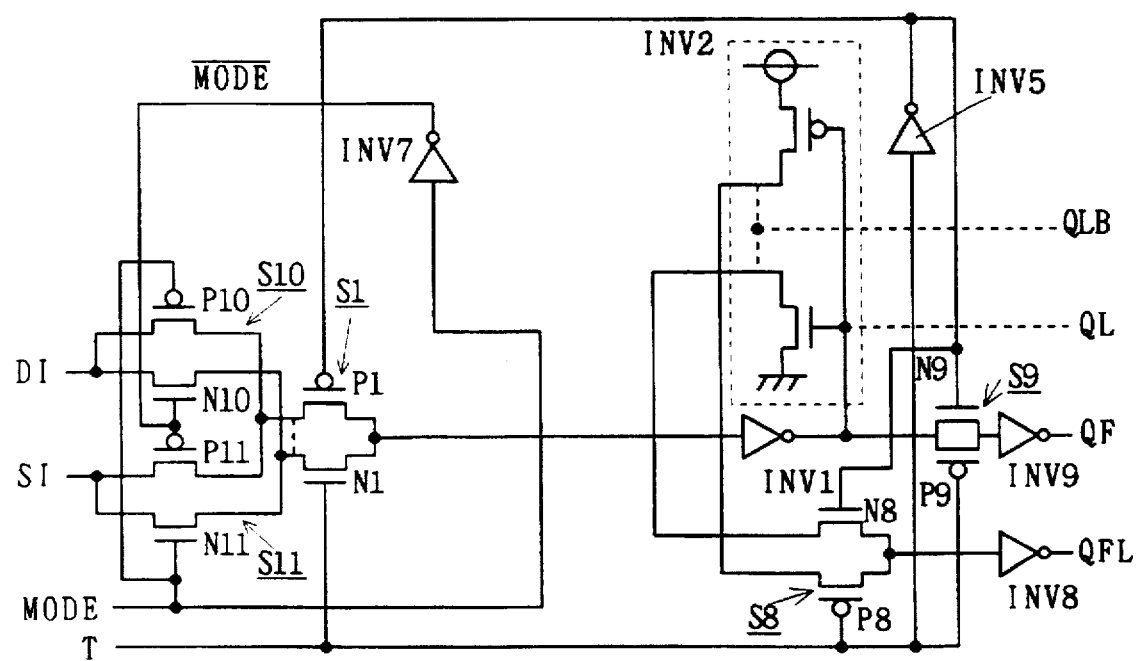

FIGS. 42A and 42B are circuit diagrams showing modifications of this embodiment. The circuit shown in FIG. 42A has a structure obtained by omitting the transmission gate S5 from the circuit shown in FIG. 41A. Thus, it comes to that the output signal QF is obtained as an output of a master-slave flip-flop circuit whose master and slave latches operate in static and dynamic types respectively, while the output signal QFL is obtained as an output of a flip-flop circuit which is series connection of master and slave latches operating in dynamic types. The output signals QF and QFL take complementary values while matching transition timings as a matter of course, similarly to the circuit shown in FIG. 41A.

The circuit shown in FIG. 42A can obtain output signals QF and QFL with a smaller number of elements as compared with the circuit shown in FIG. 41A, although the same has no effect of reducing power consumption.

The circuit shown in FIG. 42B has a structure obtained by further omitting a transmission gate S2 from the circuit shown in FIG. 42A. Thus, it comes to that both of the output signals QF and QFL are obtained as outputs of flip-flops which are series connection of master and slave latches operating in dynamic types.

In each of the circuits shown in FIGS. 42A and 42B, the invertors INV8 and INV9 can be replaced with other drive circuits or omitted, similarly to the circuit shown in FIG. 41A.

(b-23) Embodiment 23

Figure 43A:
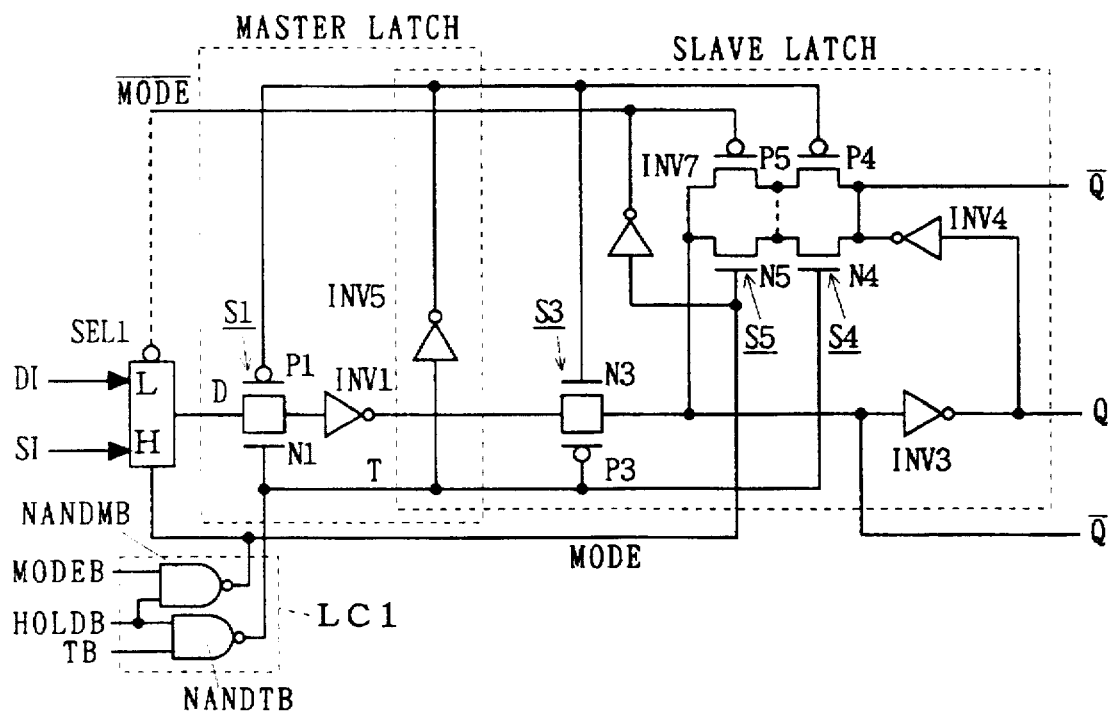
FIGS. 43A and 43B are circuit diagrams illustrating an embodiment 23 of the present invention.
Figure 43B:
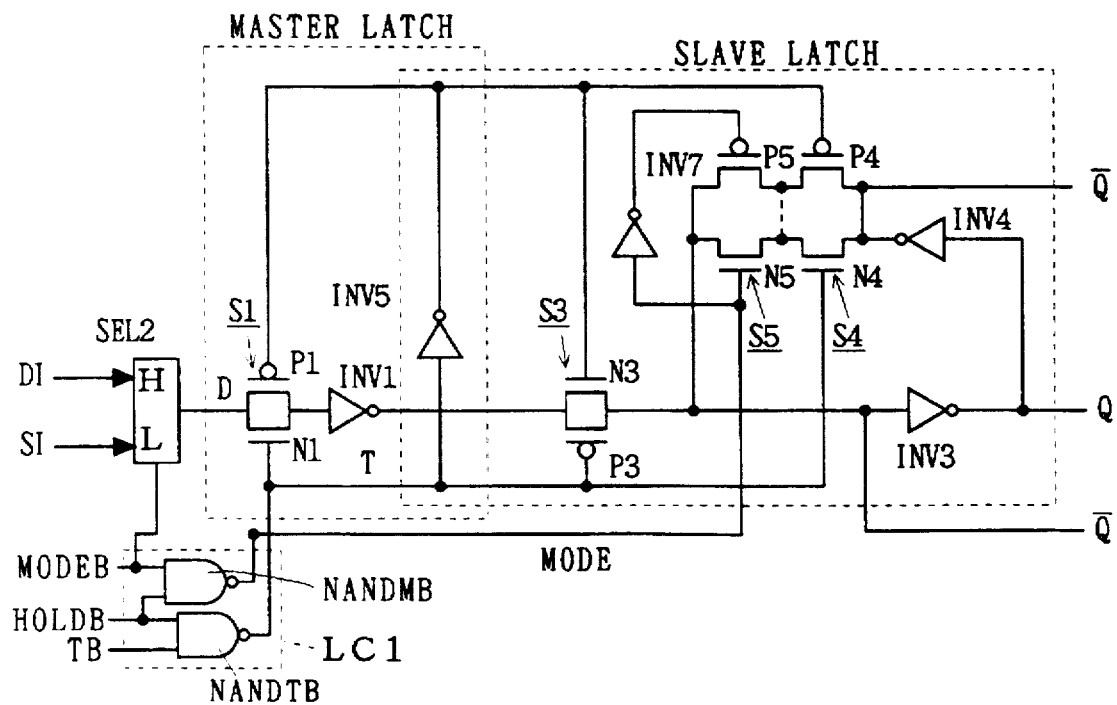

FIGS. 43A and 43B are circuit diagrams illustrating the structure of an embodiment 23. The circuit shown in FIG. 43A has a structure obtained by adding a logic circuit LC1 supplying the mode signal MODE and the clock signal T to the circuit shown in FIG. 9. The logic circuit LC1 consists of two two-input NAND gates NANDMB and NANDTB. Respective first input ends of the NAND gates NANDMB and NANDTB are supplied with a hold signal HOLDB in common. A second input end of the NAND gate NANDMB is supplied with a mode original signal MODEB forming the basis of the mode signal MODE. On the other hand, a second input end of the NAND gate NANDTB is supplied with a clock original signal TB forming the basis of the clock signal T.

When the hold signal HOLDB is set at a low level, both of the clock signal T and the mode signal MODE are fixed at high levels, the slave latch operates in a static type, and the selector SEL1 selects the scan test signal SI and supplies the same to a transmission gate S1 while this signal is not transmitted to the slave latch since the transmission gate S3 is in an OFF state.

Thus, the circuit shown in FIG. 43A is a flip-flop circuit having a dynamic master latch and a slave latch which is switched between dynamic and static types to operate, and it is possible to hold storage contents while avoiding power consumption following transition of the clock signal T by controlling the hold signal HOLDB. The ordinary input signal DI and the scan test signal SI can be selected by directly employing the mode original signal MODEB, as in the circuit shown in FIG. 43B. In this case, however, it is necessary to provide the selector SEL2 in substitution for the selector SEL1. The selector SEL2 has a function similar to that of the selector SEL2 shown in FIG. 12, so that the ordinary input signal DI and the scan test signal SI are selectively outputted when the control signal is at high and low levels respectively.

(b-24) Embodiment 24

Figure 44A:
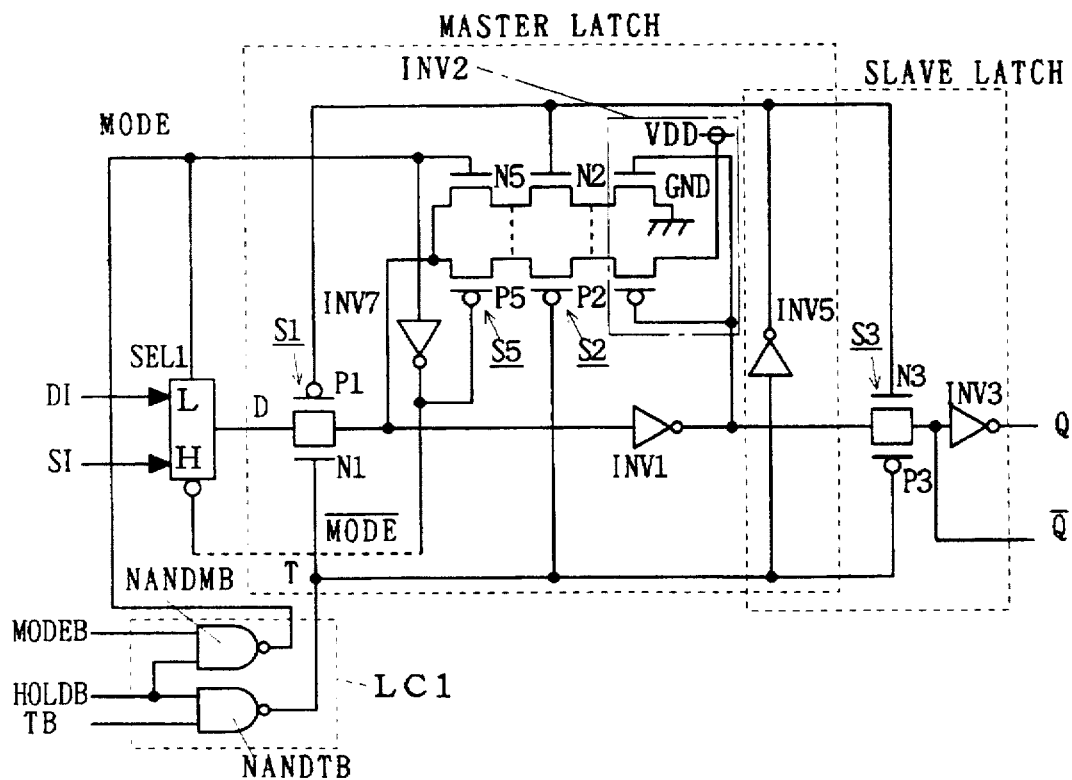
FIGS. 44A and 44B are circuit diagrams illustrating an embodiment 24 of the present invention.
Figure 44B:
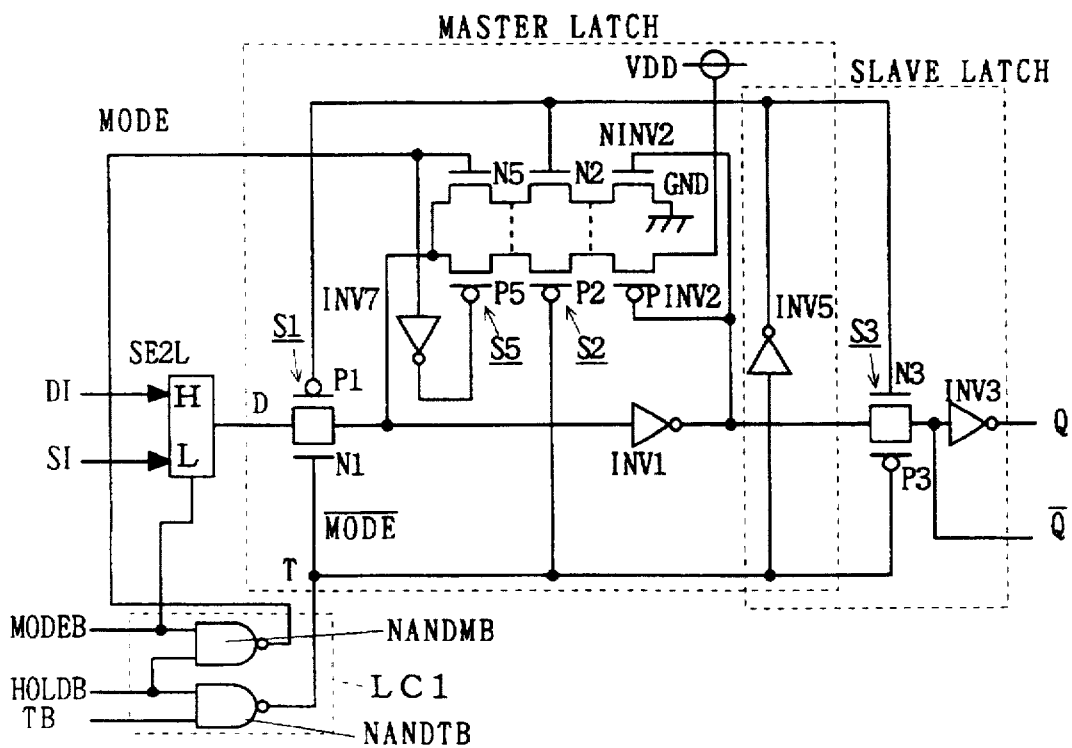

FIGS. 44A and 44B are circuit diagrams illustrating the structure of an embodiment 24. The circuit shown in FIG. 44A has a structure obtained by adding the logic circuit LC1 to the circuit shown in FIG. 21A. However, the selector shown by the transmission gates S10 and S11 in FIG. 21A is drawn as the selector SEL1 in this figure.

This embodiment can also hold storage contents while avoiding power consumption following transition of a clock signal T, similarly to the embodiment 23.

Thus, the circuit shown in FIG. 44A is a flip-flop circuit having a master latch which is switched between dynamic and static types to operate and a dynamic slave latch, and storage contents can be held while avoiding power consumption following transition of the clock signal T by controlling a hold signal.

A modification similar to the relation of FIG. 43B with respect to FIG. 43A is also possible for FIG. 44A, and FIG. 44B shows such a modification.

(b-25) Embodiment 25

Figure 45A:
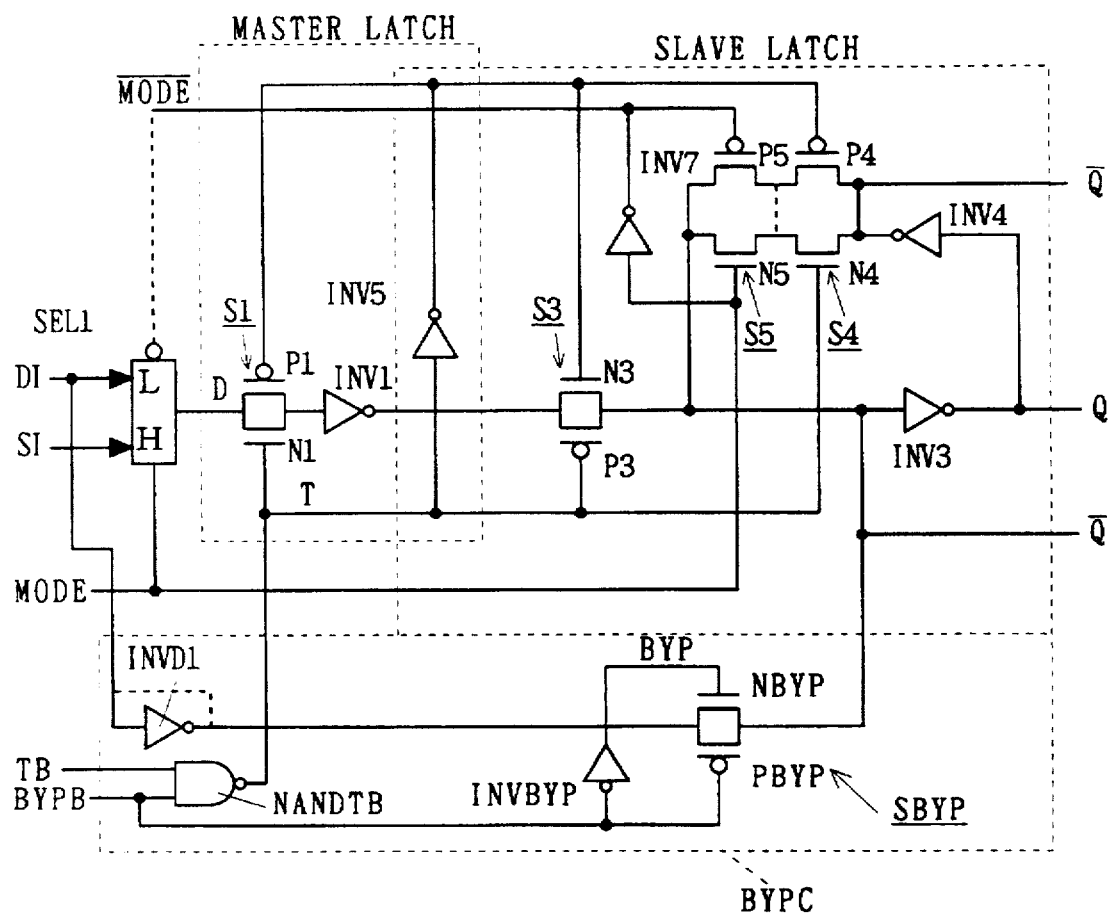
FIGS. 45A and 45B are circuit diagrams illustrating an embodiment 25 of the present invention.
Figure 45B:
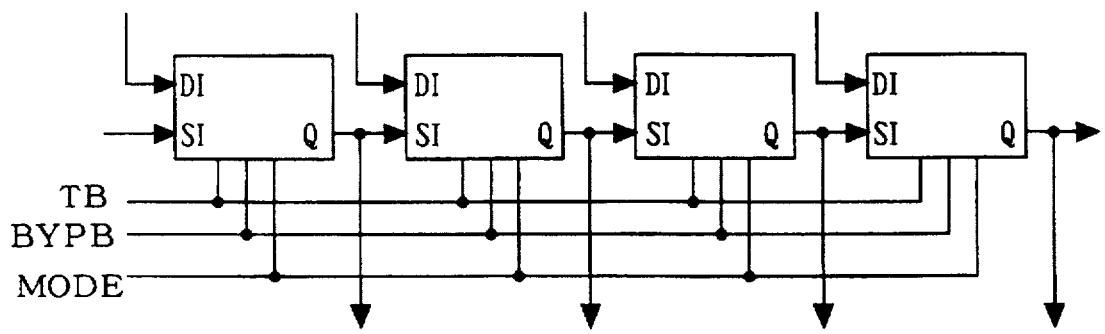

FIGS. 45A and 45B are circuit diagrams illustrating the structure of an embodiment 25. The circuit shown in FIG. 45A has a structure obtained by adding a bypass circuit BYPC to the circuit shown in FIG. 9. The bypass circuit BYPC supplies the ordinary input signal DI to the input end of the invertor INV3 of the slave latch without through the master latch while depending not on the clock signal T but on a bypass signal BYPB.

The bypass circuit BYPC comprises invertors INVD1 and INVBYP and a transmission gate SBYP. The transmission gate SBYP is formed by parallel connection of NMOS and PMOS transistors NBYP and PBYP. Gate electrodes of the PMOS and NMOS transistors PBYP and NBYP are supplied with the bypass signal BYPB and a signal BYP which is inverted in logic to the bypass signal BYPB respectively. The signal BYP is outputted by the invertor INVBYP.

When the bypass signal BYPB is set at a low level, therefore, the ordinary input signal DI is inverted by the invertor INVD1 and thereafter transmitted to the input end of the invertor INV3 through the transmission gate SBYP. The inverted signal $\overline{Q}$ of the output signal Q can be taken out from the transmission gate SBYP.

A scan flip-flop circuit provided with such a bypass function can be employed as a transmission circuit for address signals or data input or output signals for a RAM or a ROM, for example.

In an ordinary operation, the bypass signal BYPB is set at a low level. At this time, it is also possible to set the mode signal MODE also at a low level. When an address signal, a data input signal or a data output signal is employed as the ordinary input signal DI, it is possible to asynchronously transmit the same to a RAM or a ROM. In a shift operation, on the other hand, both of the bypass signal BYPB and the mode signal MODE are set at high levels. In this case, a scan test of a logic or a memory can be carried out in a state of inserting the scan flip-flop circuit without bypassing the scan test signal SI.

FIG. 45B shows a state of connecting the flip-flop circuit shown in FIG. 45A in case of forming a scan path transmitting an output signal Q to a subsequent stage.

In this embodiment, the logics of signals which are supplied to the input end of the invertor INV3 of the slave latch are preferably singularly decided. This is because unnecessary power is disadvantageously consumed if signals transmitted through the transmission gates S3 and SBYP take different values on the input end of the invertor INV3 (i.e., if "collision" of these signals takes place).

In order to avoid this, two considerations are made on the bypass circuit BYPC. The ordinary input signal DI is inverted by the invertor INVD1 to be supplied to the input end of the invertor INV3 in the first place, and the clock signal T is stopped to bring the transmission gate S3 into a nonconducting state in bypassing (ordinary operation) in the second place.

The first consideration is implemented by the invertor INVD1. When the signals transmitted by the transmission gates SBYP and S3 are different from each other in switching between ordinary and shift operations, unnecessary transition of logic values takes place on the input end of the invertor INV3. In order to avoid this, the invertor INVD1 having a function similar to the invertor INV1 of the master latch is provided. If the selector SEL1 has a function of selectively inputting a signal and outputting the same inverted, the invertor INVD1 is unnecessary, as a matter of course. Also when transition of logic values on the input end of the invertor INV3 causes no problem, the invertor INVD1 is unnecessary. The fact that such omission of the invertor INVD1 is possible is indicated by a broken line connecting both ends of the invertor INVD1 in FIG. 45A.

However, the signal transmitted through the bypass circuit is asynchronous with the clock signal T, while the signals transmitted through the master and slave latches are synchronous with the clock signal T. As to collision of the signals which are supplied to the input end of the invertor INV3 in bypassing, therefore, it is preferable that not only the invertor INVD1 is simply provided but there is the second consideration.

In order to implement the second consideration, the bypass circuit BYPC further comprises a two-input NAND gate NANDTB. The NAND gate NANDTB is supplied with a clock original signal TB and the bypass signal BYPB. When the bypass signal BYPB is at a low level, therefore, an output of the NAND gate NANDTB is regularly at a high level with no dependence on the value of the clock original signal TB. When the bypass signal BYPB is at a high level, on the other hand, a signal which is complementary to the value of the clock original signal TB is outputted. Therefore, it is possible to bring the transmission gate S3 into a nonconducting state in bypassing by employing the output of the NAND gate NANDTB as the clock signal T, so that the logics at the input end of the invertor INV3 are uniquely decided by the signal transmitted by the transmission gate SBYP. When no bypassing is performed (in a shift operation), the transmission gate SBYP does not conduct, and hence the logics at the input end of the invertor INV3 are uniquely decided by the signal transmitted by the transmission gate S3. Thus, collision of the signals at the input end of the invertor INV3 and unnecessary power consumption resulting therefrom can be avoided.

Figure 46A:
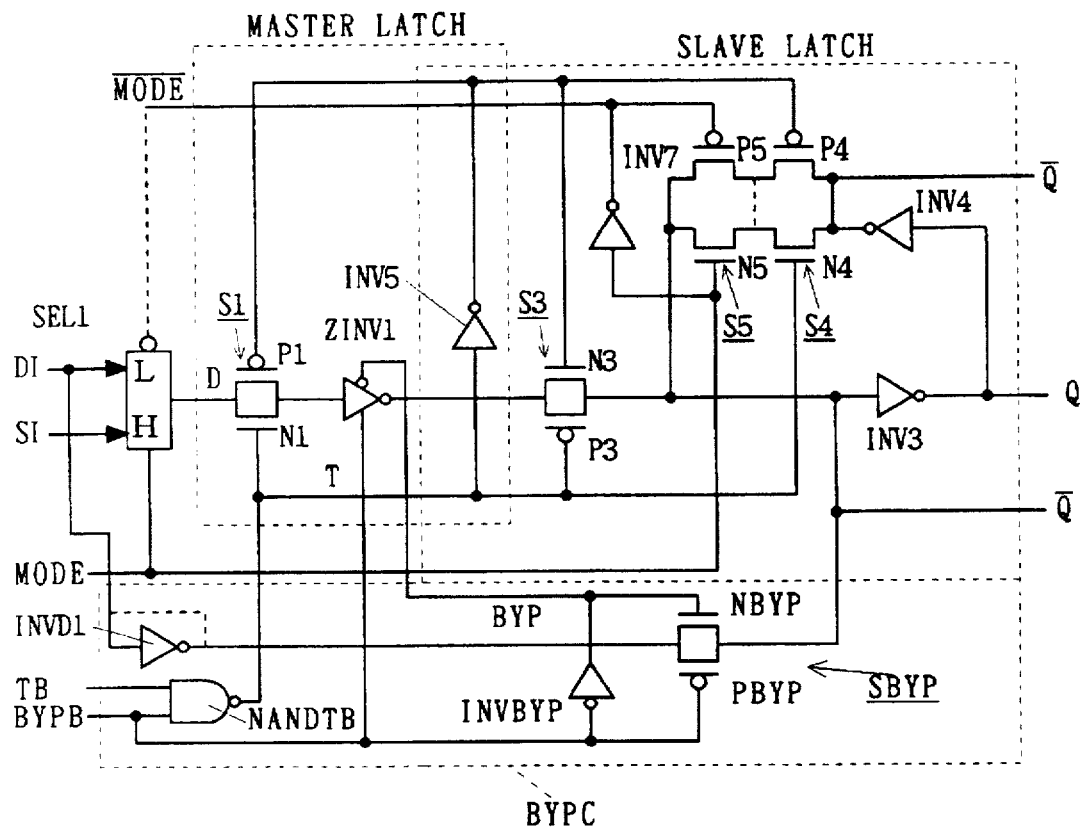
FIGS. 46A, 46B, 46C, 46D and 46E are circuit diagrams illustrating a first modification of the embodiment 25 of the present invention.

FIGS. 46A to 46E are circuit diagrams showing a first modification of this embodiment. FIG. 46A shows a structure obtained by replacing the invertor INV1 of the structure shown in FIG. 45A with a tristate invertor ZINV1.

In the circuit shown in FIG. 45A, the transmission gate S1 conducts while the transmission gate S3 does not conduct in bypassing. Also in this state, there is such a probability that a through current flows in the invertor INV1 by fluctuating of the ordinary input signal DI, and power consumption thereof cannot be overlooked when the bypassing requires a long period.

In order to suppress such power consumption, the tristate invertor ZINV1 so serves as to present a high-impedance state when the bypass signal BYPB is at a low level. The tristate invertor ZINV1 is supplied with the bypass signal BYPB and the signal BYP. The invertor INVBYP can be utilized in order to obtain the signal BYP which is supplied to the tristate invertor ZINV1.

Figure 46B:
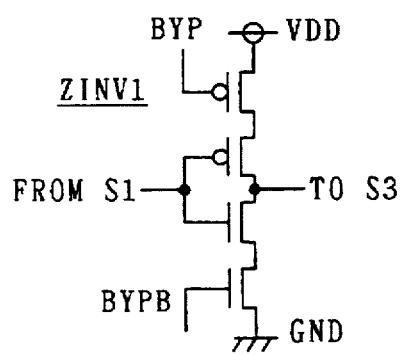
Figure 46C:
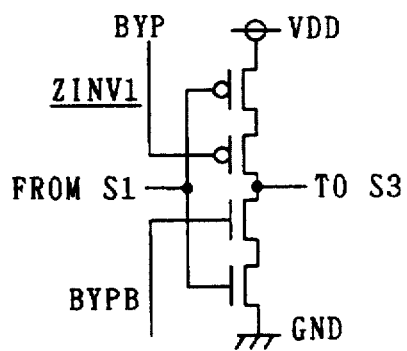

FIGS. 46B and 46C are circuit diagrams illustrating the structure of the tristate invertor ZINV1. The tristate invertor ZINV1 may be formed by two PMOS transistors and two NMOS transistors which are connected in series with each other.

Among these, single ones of the PMOS and NMOS transistors are selected so that gate electrodes of the selected pair of transistors are connected to an output end of a transmission gate S1 in common. Gate electrodes of the remaining PMOS and NMOS transistors are supplied with the signal BYP and the bypass signal BYPB respectively. The input end of the transmission gate S3 is connected at a point where the PMOS and NMOS transistors are directly connected with each other.

Figure 46D:
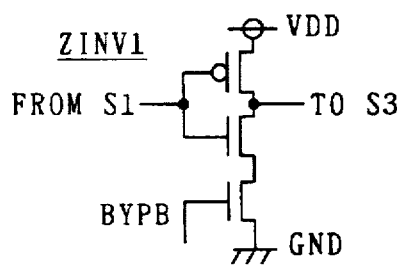
Figure 46E:
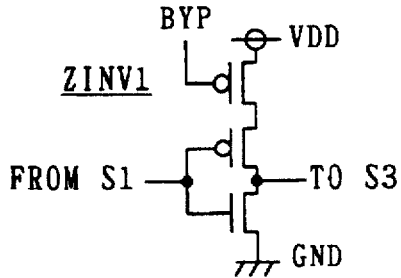

FIGS. 46D and 46E are circuit diagrams illustrating another structure of the tristate invertor ZINV1. Thus, it is also possible to omit one of the PMOS and NMOS transistors receiving the signal BYP and the bypass signal BYPB respectively.

Figure 47A:
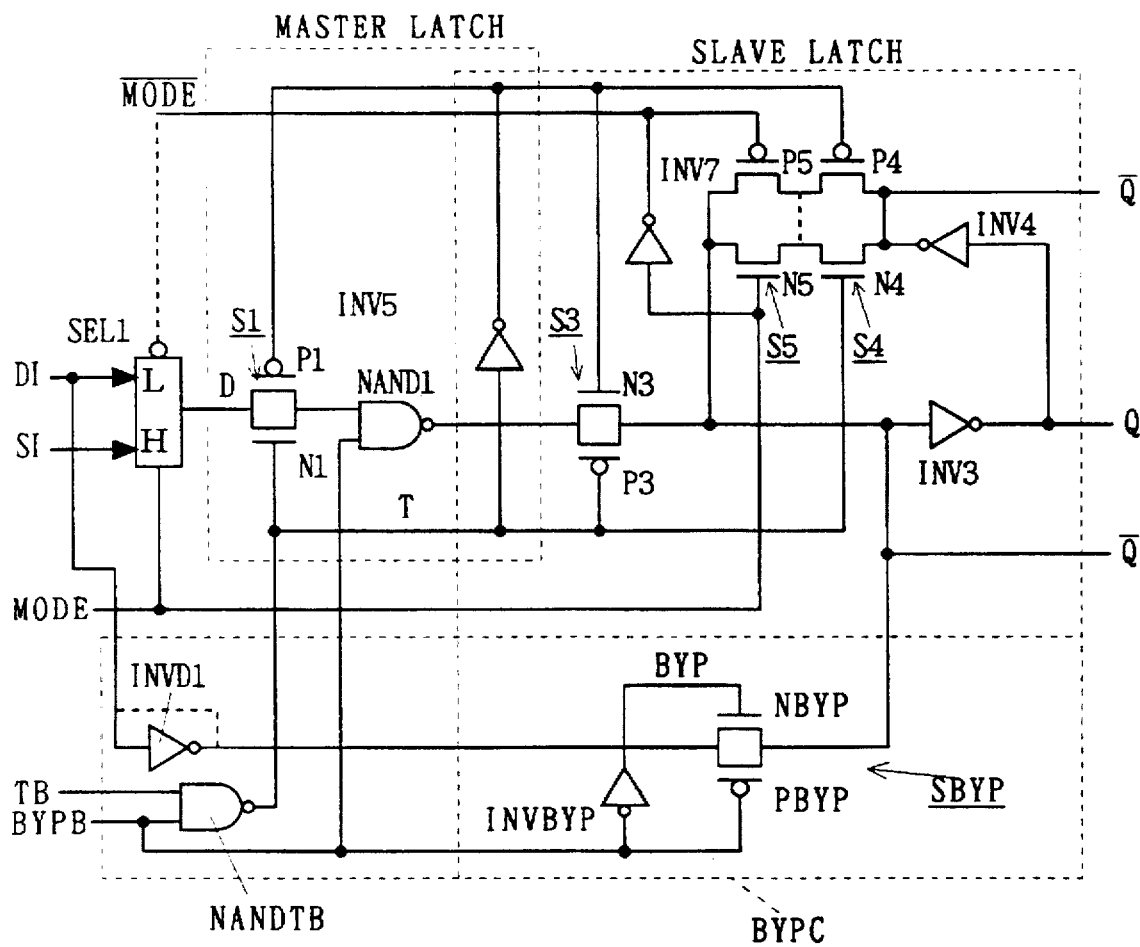
FIGS. 47A and 47B are circuit diagrams illustrating a second modification of the embodiment 25 of the present invention.
Figure 47B:
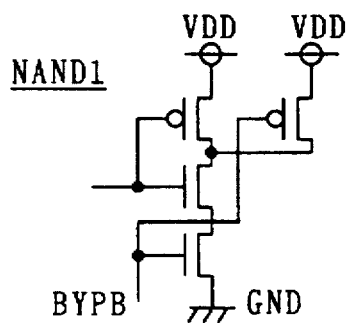

FIGS. 47A and 47B are circuit diagrams showing a second modification of this embodiment. FIG. 47A shows a structure obtained by replacing the invertor INV1 of the structure shown in FIG. 45A with a two-input NAND gate NAND1. The NAND gate NAND1 has a first input end which is supplied with a bypass signal BYPB and a second input end which is connected to the output end of the transmission gate S1 and an output end which is connected to the input end of the transmission gate S3. FIG. 47B is a circuit diagram illustrating the structure of the two-input NAND gate NAND1.

In such a structure, the NAND gate NAND1 serves the same function as the invertor INV1 when the bypass signal BYPB is at a high level (when no bypass operation is performed). In bypassing, on the other hand, the bypass signal BYPB is set at a low level, and the NAND gate NAND1 outputs a high level regardless of a signal transmitted through the transmission gate S1. Thus, a through current resulting from fluctuating of the ordinary input signal DI is avoided. Therefore, an effect identical to that of the first modification can be attained. Alternatively, an AND gate may be employed in place of the NAND gate NAND1, as a matter of course.

Figure 48A:
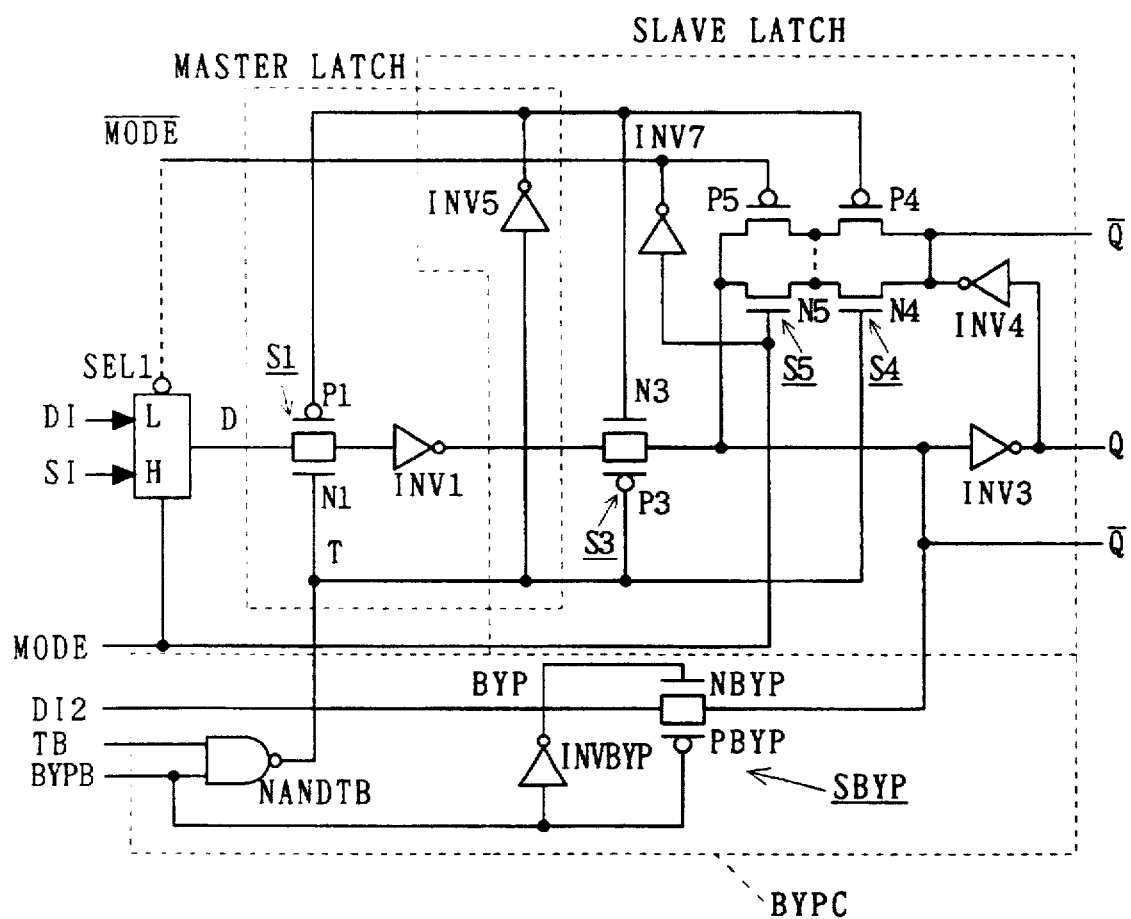
FIGS. 48A and 48B are circuit diagrams illustrating a third modification of the embodiment 25 of the present invention.
Figure 48B:
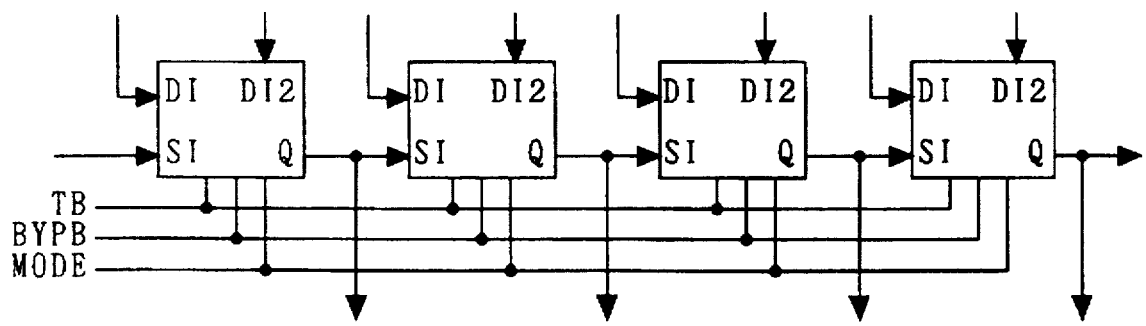

FIGS. 48A and 48B are circuit diagrams showing a third modification of this embodiment. FIG. 48A shows an aspect of transmitting an asynchronously transmitted signal DI2 to the input end of the invertor INV3 through the transmission gate SBYP independently of the ordinary input signal DI. FIG. 48B illustrates a scan path obtained by serially connecting a flip-flop circuit having the structure shown in FIG. 48A.

(b-26) Embodiment 26

Figure 49A:
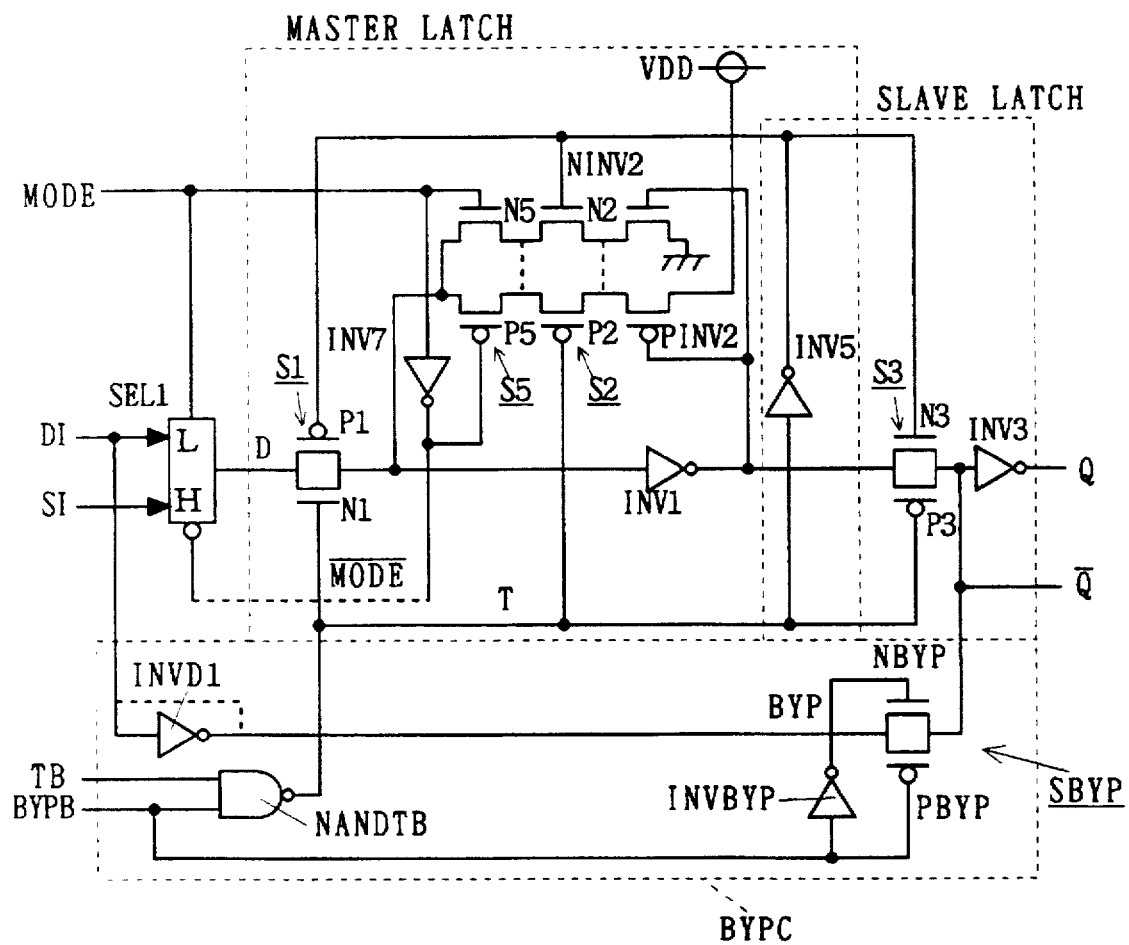
FIGS. 49A and 49B are circuit diagrams illustrating an embodiment 26 of the present invention.
Figure 49B:
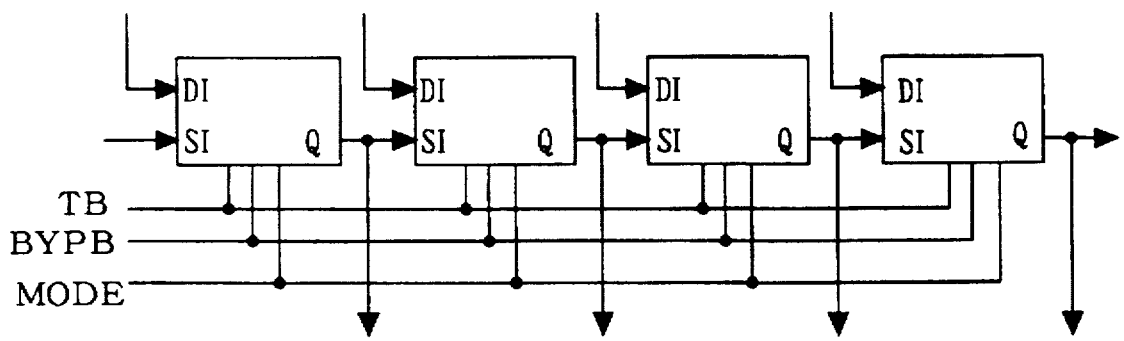

FIGS. 49A and 49B are circuit diagrams illustrating the structure of an embodiment 26. The circuit shown in FIG. 49A has a structure obtained by adding a bypass circuit BYPC to the circuit shown in FIG. 21A. However, the selector shown by the transmission gates S10 and S11 in FIG. 21A is drawn as the selector SEL1 in this figure.

While the master latch functions in a dynamic type and the slave latch is switched between dynamic and static types by the mode signal in the embodiment 25, the master latch is switched between dynamic and static types by the mode signal MODE and the slave latch functions in a dynamic type in the embodiment 26.

However, the bypass circuit BYPC operates similarly to that in the embodiment 25, also in the embodiment 26. Namely, the ordinary input signal DI is supplied to the input end of the invertor INV3 of the slave latch without through the master latch, while depending not on the clock signal T but on the bypass signal BYPB. Further, the clock signal T is fixed at a high level to place the transmission gate S3 of the slave latch in a nonconducting state in bypassing. Thus, an effect similar to that of the embodiment 25 can be attained also in this embodiment.

As shown in FIG. 49B, a scan path can be formed by serially connecting a plurality of circuits shown in FIG. 49A with each other.

Figure 50:
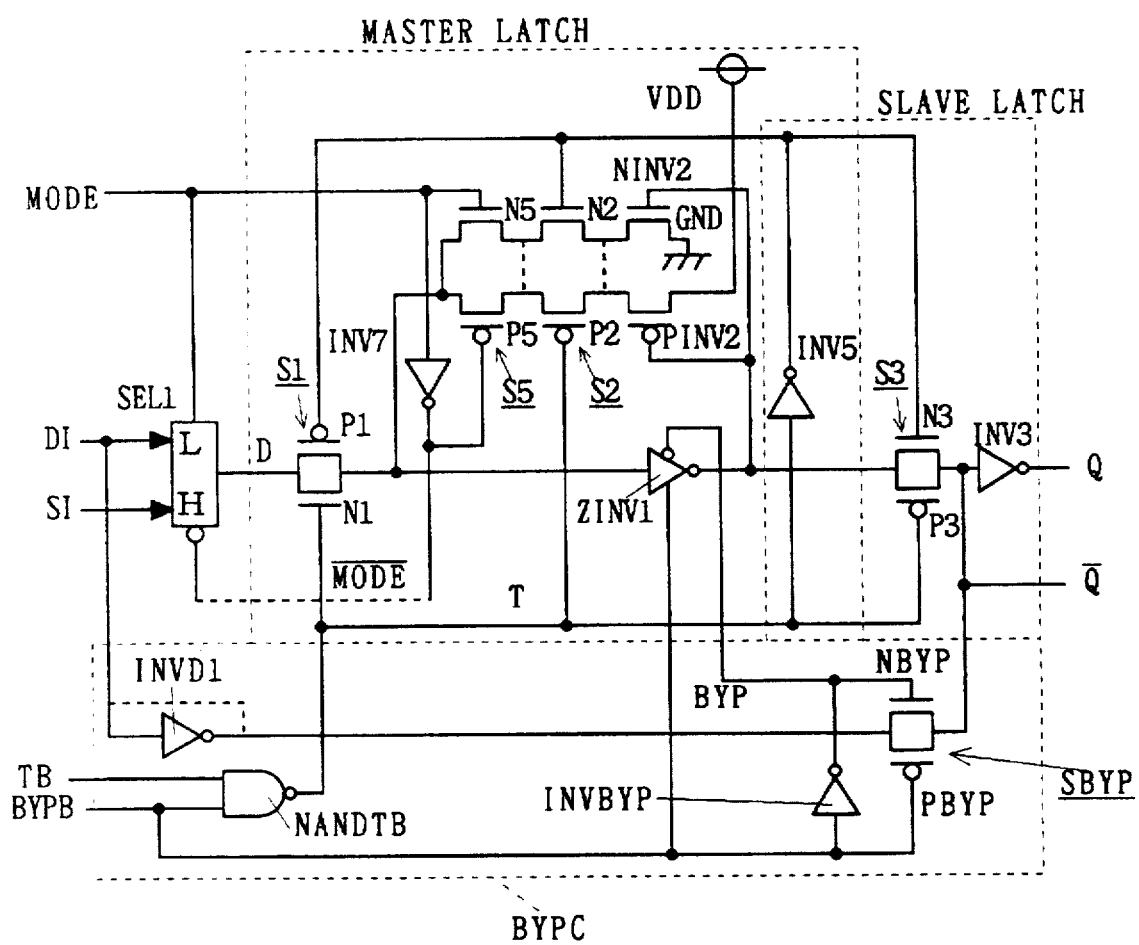
FIG. 50 is a circuit diagram illustrating a first modification of the embodiment 26 of the present invention.
Figure 51:
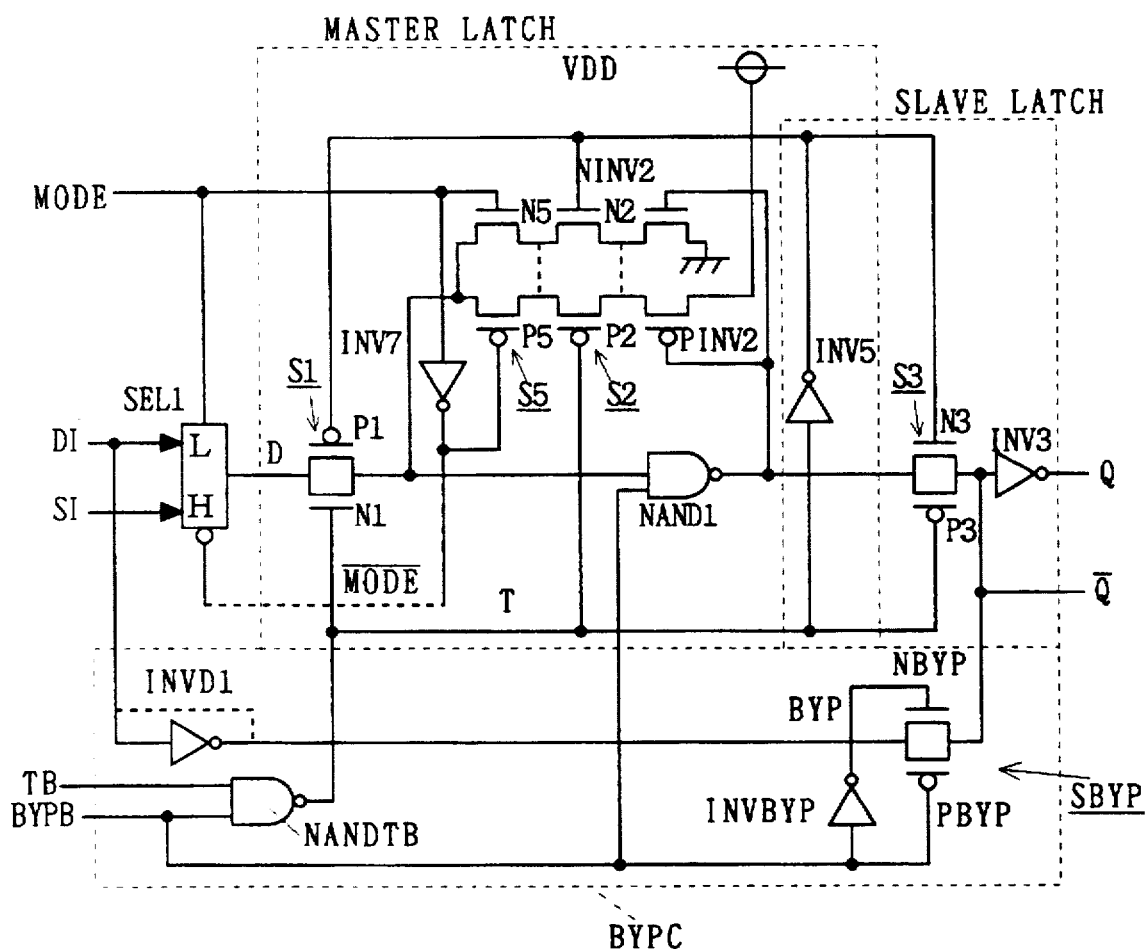
FIG. 51 is a circuit diagram illustrating a second modification of the embodiment 26 of the present invention.
Figure 52:
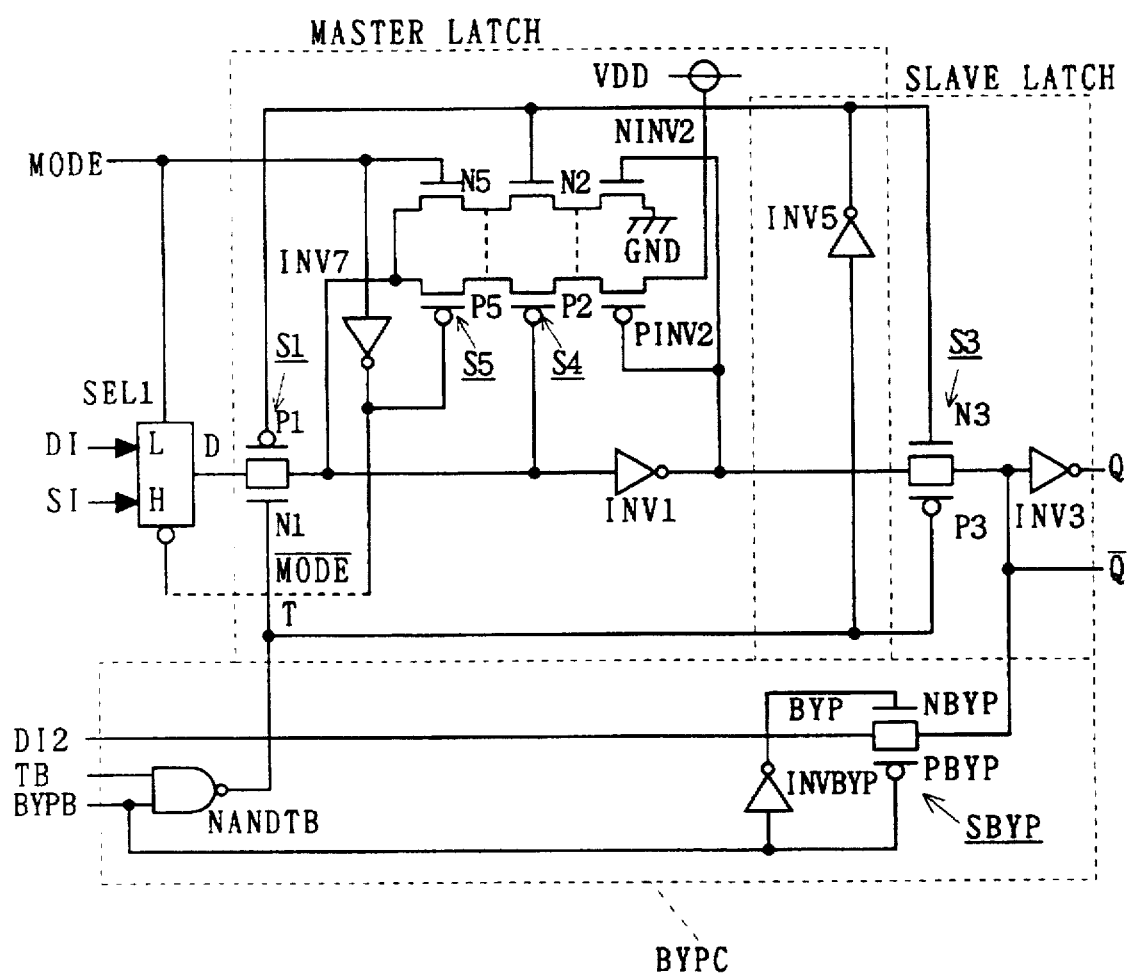
FIG. 52 is a circuit diagram illustrating a third modification of the embodiment 26 of the present invention.

Also in this embodiment, the first to third modifications shown in the embodiment 25 are possible. FIG. 50 is a circuit diagram illustrating a first modification of this embodiment, in which the invertor INV1 is replaced with a tristate invertor ZINV1. FIG. 51 is a circuit diagram illustrating a second modification of this embodiment, in which the invertor INV1 is replaced with a NAND gate NAND1 (the invertor INV1 may alternatively be replaced with an AND gate). FIG. 52 is a circuit diagram showing a third modification of this embodiment. This figure shows a mode of transmitting the asynchronously transmitted signal DI2 to the input end of the invertor INV3 through the transmission gate SBYP independently of the ordinary input signal DI.

Effects brought by these are similar to those brought by the first to third modifications of the embodiment 25 respectively.

C. Biphasic Clock Flip-Flop Circuit

While each of the above embodiments 1 to 26 has been described in relation to a monophasic edge trigger type flip-flop circuit, the basic idea of switching at least one of master and slave latches between dynamic and static types for driving the same according to the present invention can also be embodied in a biphasic clock flip-flop circuit.

(c-1) Embodiment 27

Figure 53A:
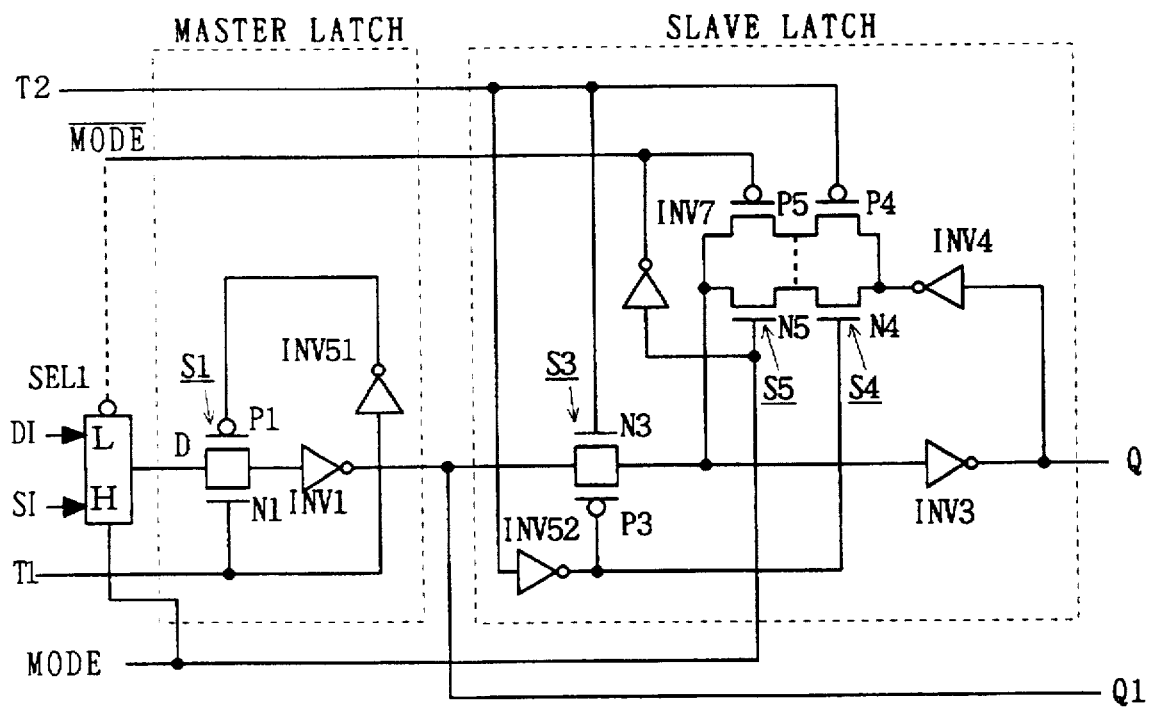
FIGS. 53A and 53B are circuit diagrams illustrating an embodiment 27 of the present invention.
Figure 53B:
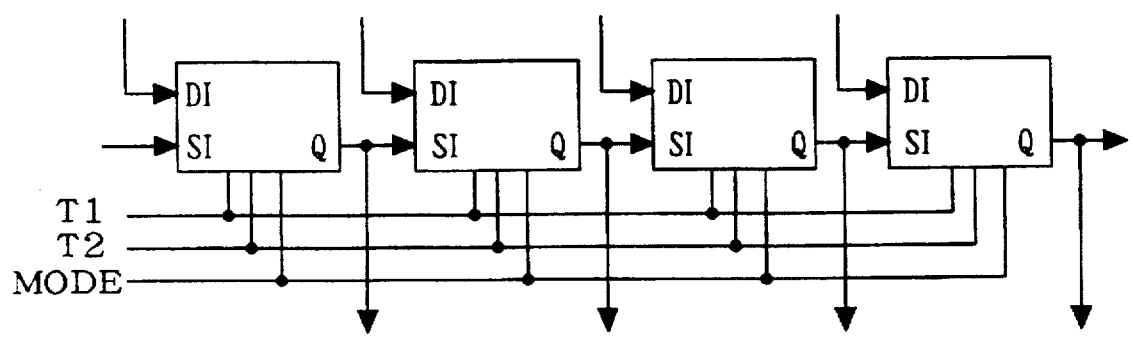
Figure 78A:
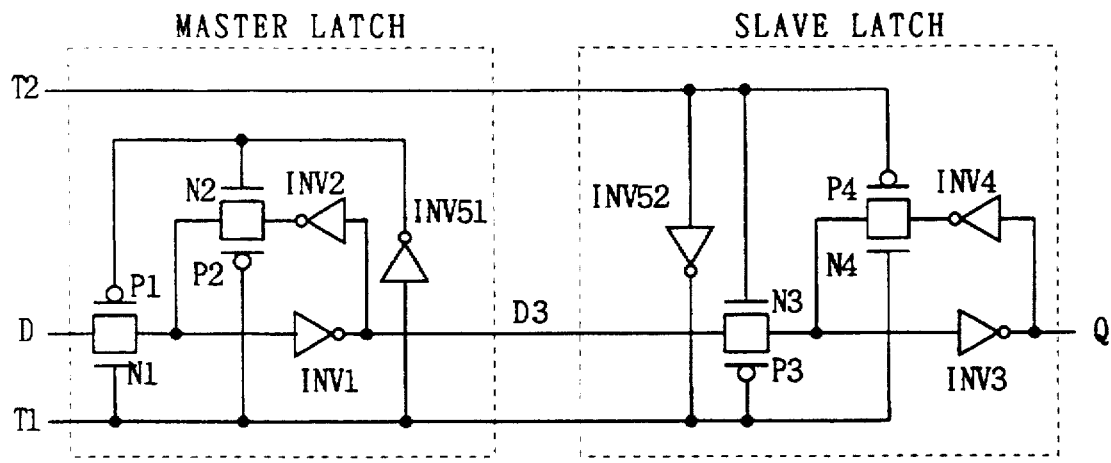
FIGS. 78A and 78B are a circuit diagram and a timing chart showing the prior art.
Figure 78B:
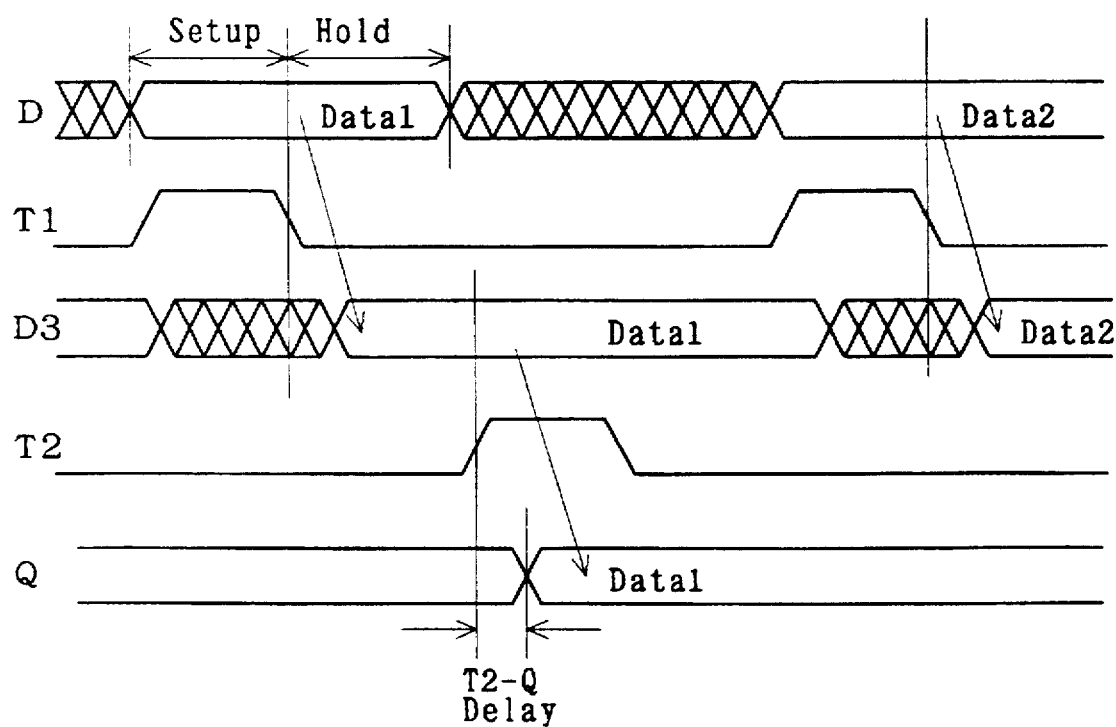

FIGS. 53A and 53B are circuit diagrams showing the structure of a flip-flop circuit according to an embodiment 27. The circuit shown in FIG. 53A has such a structure that a clock signal T is divided into first and second clock signals T1 and T2 with respect to the structure shown in FIG. 9. The first and second clock signals T1 and T2 control operations of master and slave latches respectively, and waveforms thereof are shown in FIG. 78B.

In order to invert the first and second clock signals T1 and T2 independently of each other, the invertor INV5 in the circuit shown in FIG. 9 is divided into INV51 and INV52 in FIG. 53A.

Namely, the invertor INV51 inverts the first clock signal T1 and supplies the same to a gate electrode of a PMOS transistor P1 forming a transmission gate S1, while the invertor INV52 inverts the second clock signal T2 and supplies the same to gate electrodes of PMOS and NMOS transistors P3 and N4 forming transmission gates S3 and S4 respectively.

Thus, it is possible to switch the slave latch between static and dynamic types for driving the same also in a biphasic clock flip-flop circuit similarly to the structure shown in FIG. 9, by providing a transmission gate S5 between the transmission gate S4 and an input end of an invertor INV3 and controlling opening/closing thereof by a mode signal MODE.

It is possible to drive the slave latch in static and dynamic types for transmitting a scan test signal SI in a shift operation and for transmitting an ordinary input signal DI respectively by also controlling an operation of a selector SEL1 by the mode signal MODE. An output Q1 of the master latch may be transmitted to a subsequent stage, as a matter of course.

FIG. 53B is a circuit diagram illustrating a state of forming a scan path by serially connecting the circuit shown in FIG. 53A.

(c-2) Embodiment 28

Figure 54:
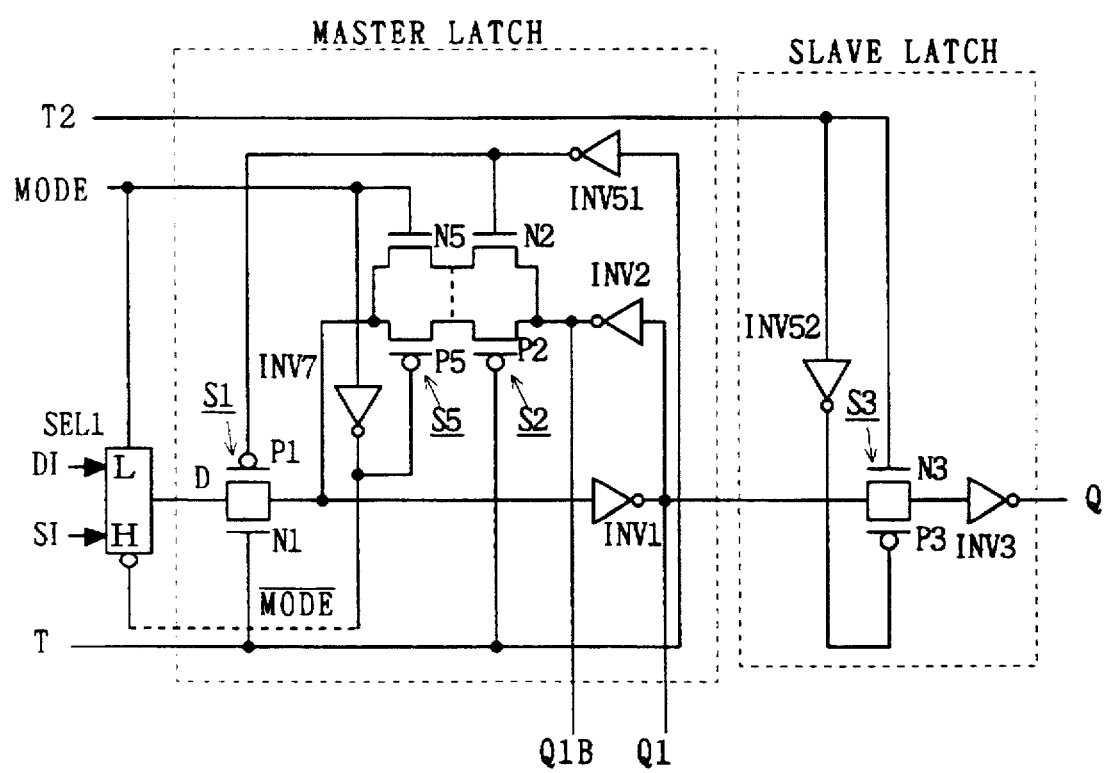
FIG. 54 is a circuit diagram illustrating an embodiment 28 of the present invention.

FIG. 54 is a circuit diagram showing the structure of a flip-flop circuit according to an embodiment 28. The circuit shown in FIG. 54 has a structure obtained by dividing a clock signal T into first and second clock signals T1 and T2 with respect to the structure shown in FIG. 13. In order to invert the first and second clock signals T1 and T2 independently of each other, the invertor INV5 in the circuit shown in FIG. 13 is divided into invertors INV51 and INV52 in FIG. 54. Thus, it is possible to switch a master latch between static and dynamic types for driving the same, contrarily to the embodiment 27.

(c-3) Embodiment 29

Figure 55A:
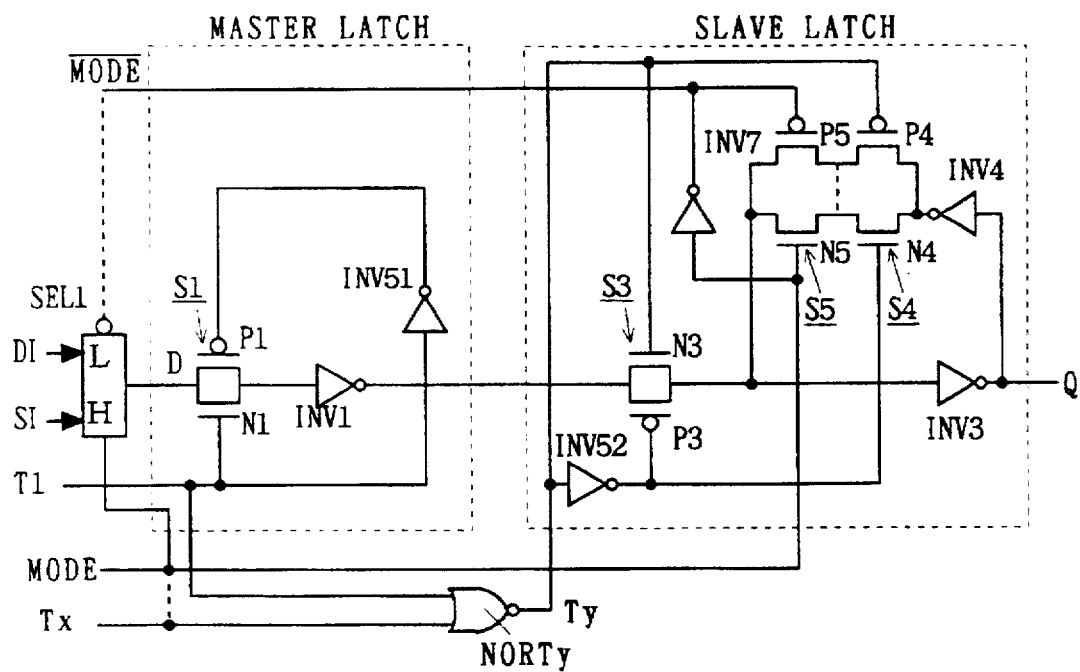
FIGS. 55A and 55B and 55C are circuit diagrams of the present invention.
Figure 55B:
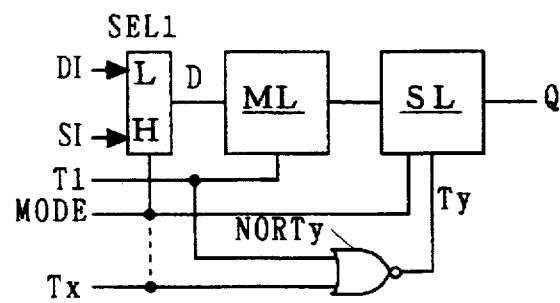
Figure 55C:
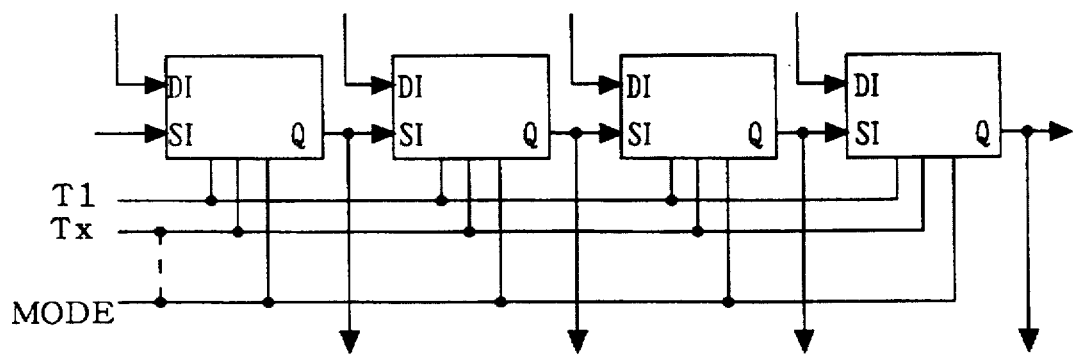

FIGS. 55A to 55C are circuit diagrams showing the structure of a flip-flop circuit according to an embodiment 29. The circuit shown in FIG. 55A has a structure obtained by adding a NOR gate NORTy for supplying a signal Ty in place of the second clock signal T2 with respect to the circuit shown in FIG. 53A. The NOR gate NORTy is supplied with a clock original signal Tx and a first clock signal T1.

In an ordinary operation, the clock original signal Tx is set at a low level, thereby making the NOR gate NORTy serve as an invertor. Thus, it comes to that the signal Ty takes a value which is complementary to the first clock signal T1, so that a transmission gate S3 non-conducts/conducts with respect to conduction/nonconduction of a transmission gate S1, and the circuit operates as a monophasic edge trigger type flip-flop circuit on the basis of the first clock signal T1, similarly to the circuit shown in FIG. 9. In an ordinary operation, however, a mode signal MODE is set at a low level in order to supply an ordinary input signal DI to a master latch, whereby a slave latch also operates as a dynamic type.

In a shift operation of a scan test, the clock original signal Tx is set to obtain relation of a biphasic clock along with the first clock signal T1. In this case, the clock original signal Tx and the first clock signal T1 are set to serve as a low enable signal (a case of taking a low level is an activated state of the clock original signal Tx) and a high enable signal (a case of taking a high level is an activated state of the first clock signal T1) respectively.

Figure 56:
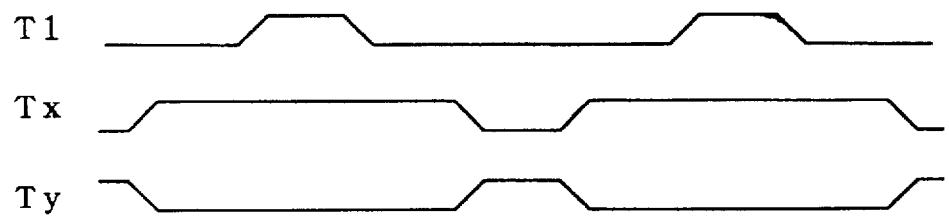
FIG. 56 is a timing chart illustrating the operation of an embodiment 29 of the present invention.

FIG. 56 is a timing chart showing the relation between the clock original signal Tx and the first clock signal T1. The clock original signal Tx and the first clock signal T1 are not simultaneously activated, i.e., there is no state that the clock original signal Tx is at a low level and the first clock signal T1 is at a high level, and hence the signal Ty regularly takes a value which is complementary to the clock original signal Tx. Namely, the signal Ty serves as a second clock signal T2 which is a high enable signal.

The clock original signal Tx can be used as a mode signal MODE, since the mode signal MODE is also set at a low level in an ordinary operation, similarly to the clock original signal Tx. In a shift operation, on the other hand, the first clock signal T1 necessarily at a low level when the clock original signal Tx goes low and the transmission gate S1 does not conduct, whereby the storage contents of the master latch are not influenced even if a selector outputs the ordinary input signal DI. While a transmission gate S5 does not conduct either, the slave latch simply serves as a dynamic type in this case, and implementation of a biphasic clock flip-flop circuit is not inhibited.

Thus, it is not necessary to separately provide a wire for supplying the mode signal MODE, and the necessary area can be reduced.

FIG. 55B is a circuit diagram functionally showing the circuit of FIG. 55A. A master latch ML operates in synchronization with the first clock signal T1, while a slave latch SL operates in synchronization with the signal Ty, with selection of either a dynamic or static type by the mode signal MODE.

FIG. 55C is a circuit diagram illustrating a scan path which is formed by serially connecting the circuit of FIG. 55A. Even if such a skew that timings for supplying the first clock signal T1 and the clock original signal Tx to each flip-flop circuit are different is caused, it is possible to inhibit the skew from exerting a bad influence on the operation of the scan path by making a biphasic clock operation in a shift operation.

(c-4) Embodiment 30

Figure 57A:
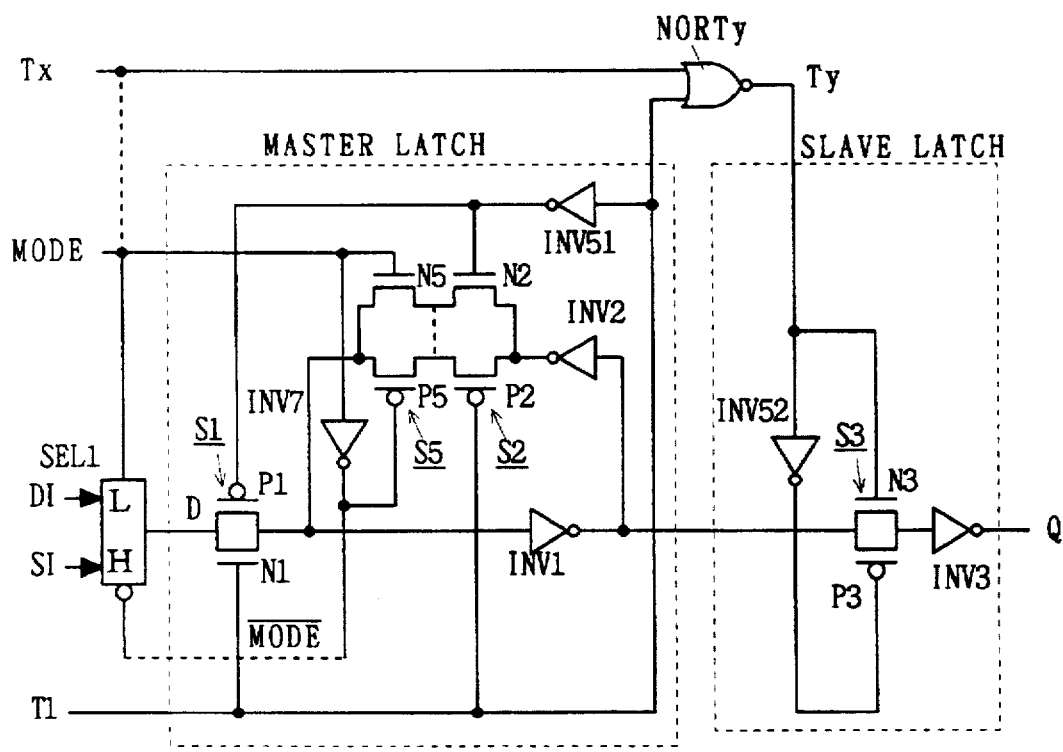
FIGS. 57A and 57B are circuit diagrams illustrating an embodiment 30 of the present invention.
Figure 57B:
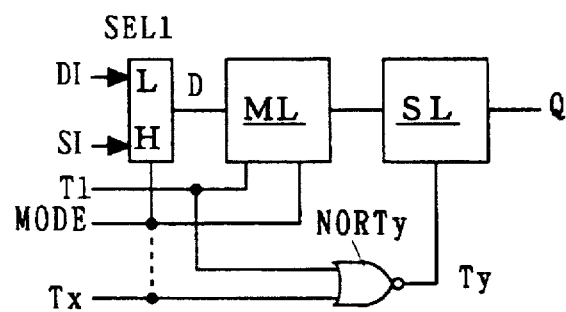

FIGS. 57A and 57B are circuit diagrams showing the structure of a flip-flop circuit according to an embodiment 30. The relation between the embodiments 30 and 28 is identical to that between the embodiments 29 and 27.

Namely, the circuit shown in FIG. 57A has a structure obtained by adding a NOR gate NORTy for supplying a signal Ty in place of the clock signal T2 to the circuit shown in FIG. 54. The NOR gate NORTy is supplied with a clock original signal Tx and a first clock signal T1. Values taken by the clock original signal Tx and the first clock signal T1 are similar to those in the embodiment 29.

FIG. 57B is a circuit diagram functionally showing the circuit of FIG. 57A. A master latch ML operates in synchronization with the first clock signal T1 with selection of either a dynamic or static type by the mode signal MODE, while a slave latch SL operates in synchronization with the signal Ty.

The clock original signal Tx can be utilized as the mode signal MODE, similarly to the embodiment 29.

(c-5) Embodiment 31

Figure 58A:
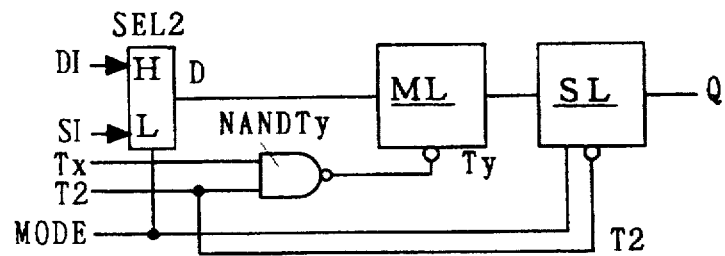
FIGS. 58A, 58B and 58C are circuit diagrams illustrating an embodiment 31 of the present invention.
Figure 58B:
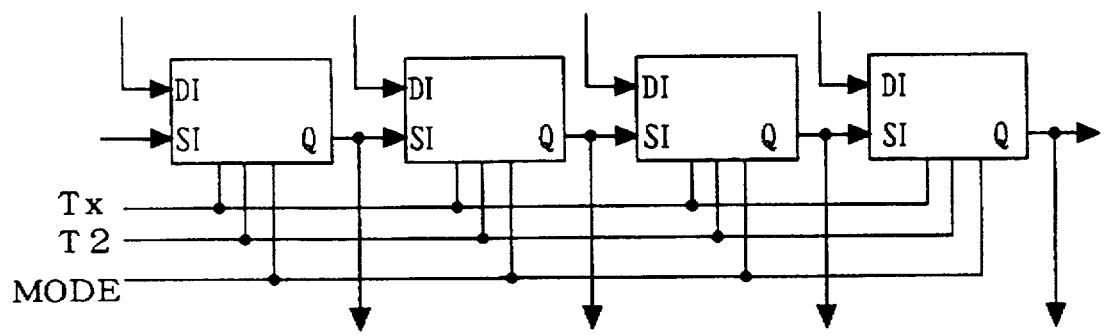
Figure 58C:
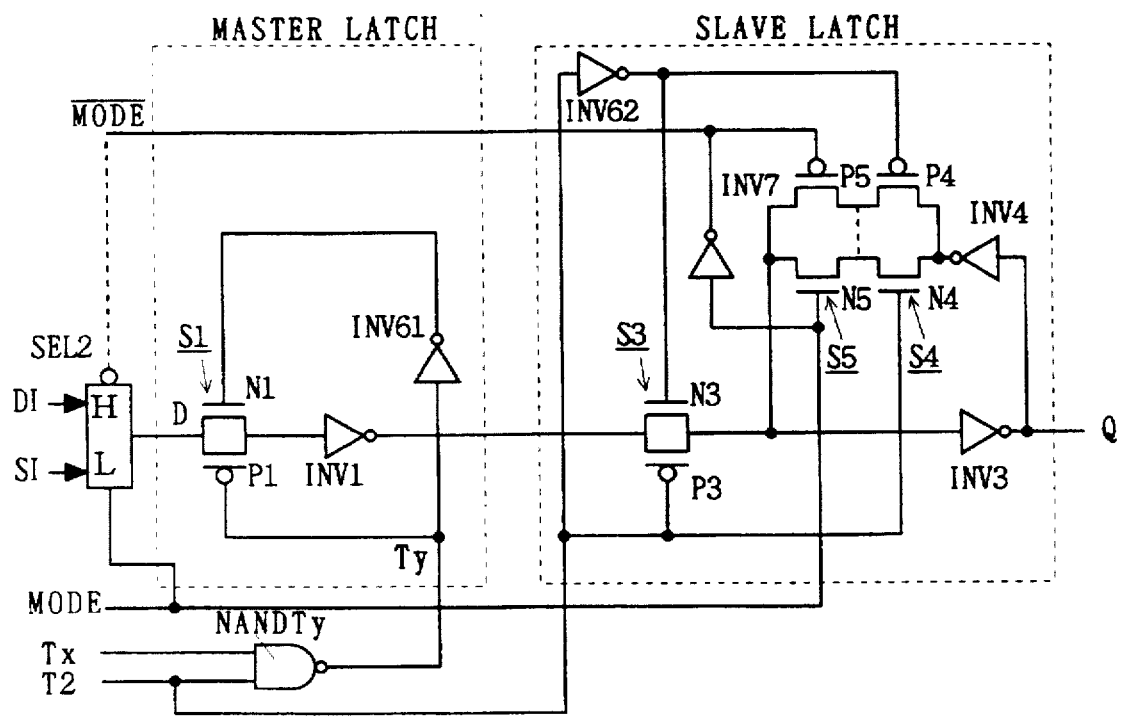

FIGS. 58A to 58C are circuit diagrams showing the structure of a flip-flop circuit according to an embodiment 31. FIG. 58A shows a structure obtained by reversing enable levels of both of the master latch ML and the slave latch SL shown in FIG. 55B. In this case, a NAND gate NADTy is supplied with a second clock signal T2 and a clock original signal Tx, and outputs a signal Ty. However, the second clock signal T2 is activated when the same takes a low level (low enable).

In an ordinary operation, the clock original signal Tx is set at a high level thereby making the NAND gate NANDTy serve as an invertor, whereby the signal Ty takes a value which is complementary to the second clock signal T2. The master latch ML and the slave latch SL, both of which perform operations as low enable signals, operate complementarily to each other. Namely, the circuit operates as a monophasic edge trigger type flip-flop circuit on the basis of the second clock signal T2, similarly to the circuit shown in FIG. 9.

In an ordinary operation, however, a mode signal MODE is set at a high level in order to supply an ordinary input signal DI to the master latch ML, whereby the slave latch SL operates as a static type.

In a shift operation of a scan test, the clock original signal Tx is so set that relation of biphasic clock is attained along with the second clock signal T2. In this case, the clock original signal Tx and the second clock signal T2 are set to serve as high and low enable signals respectively.

Figure 59:
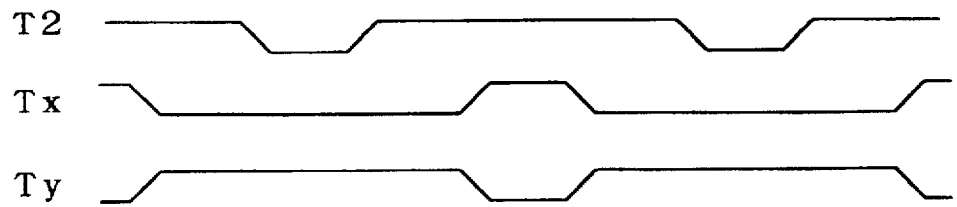
FIG. 59 is a timing chart illustrating the operation of the embodiment 31 of the present invention.

FIG. 59 is a timing chart showing the relation between the clock original signal Tx and the second clock signal T2. The clock original signal Tx and the second clock signal T2 are not simultaneously activated, i.e., there is no state that the clock original signal Tx is at a high level and the second clock signal T2 is at a low level, whereby the signal Ty regularly takes a value which is complementary to the clock original signal Tx. Namely, the signal Ty serves as a first clock signal T1 which is a low enable signal. Thus, an effect similar to that of the embodiment 29 can be attained also in this embodiment.

FIG. 58B is a circuit diagram showing a scan path which is formed by serially connecting the flip-flop circuit shown in FIG. 58A.

FIG. 58C is a circuit diagram illustrating the internal structure of the flip-flop circuit shown in FIG. 58A. The enable level of a master latch shown in FIG. 58C is reverse to that of the master latch shown in FIG. 55A, and hence invertors INV61 and INV62 whose directions are reverse to the invertors INV51 and INV52 are provided in place thereof so that opening/closing of a transmission gate S1 with respect to a clock signal received from the exterior is reversed. The signal Ty serving as a clock signal and the clock signal T2 are supplied to input ends of the invertors INV61 and INV62 respectively.

(c-6) Embodiment 32

Figure 60A:
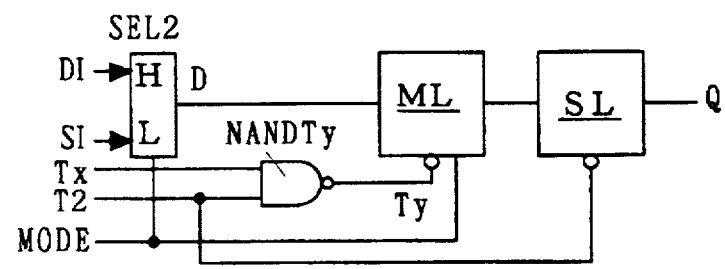
FIGS. 60A and 60B are circuit diagrams illustrating an embodiment 32 of the present invention.
Figure 60B:
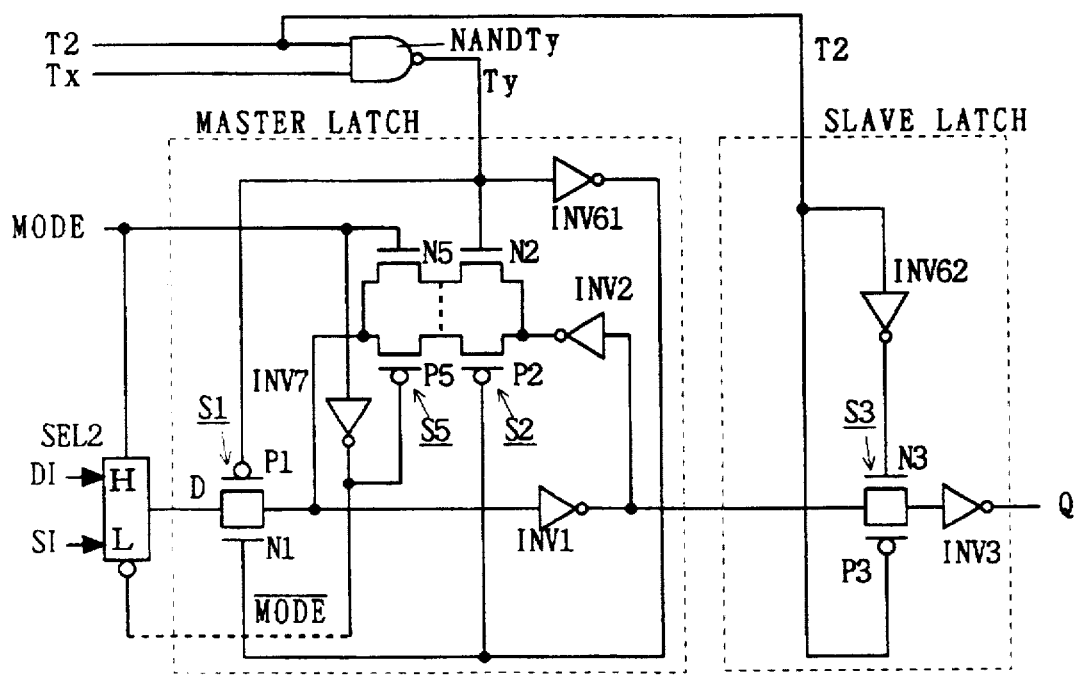

FIGS. 60A and 60B are circuit diagrams showing the structure of a flip-flop circuit according to an embodiment 32. The relation between the embodiments 32 and 30 is identical to that between the embodiments 31 and 29.

Namely, the circuit shown in FIG. 60A has a structure obtained by reversing enable levels of both of the master latch ML and the slave latch SL shown in FIG. 57B. The NOR gate NORTy is replaced with a NAND gate NANDTy.

In the circuit shown in FIG. 60A, the master latch ML receives a signal Ty which is outputted from the NAND gate NANDTy, and a mode signal MODE. The master latch ML is switched between static and dynamic types on the basis of the mode signal MODE to operate. A slave latch SL receives a second clock signal T2 to operate.

The NAND gate NANDTy is supplied with a second clock signal T2 and a clock original signal Tx, and outputs the signal Ty. Values taken by the second clock signal T2 and the clock original signal Tx are similar to those of the embodiment 31. In an ordinary operation, therefore, the circuit operates as a monophasic edge trigger type flip-flop circuit on the basis of the second clock signal T2. In a shift operation of a scan test, on the other hand, it comes to that the signal Ty serves as a first clock signal T1 which is a high enable signal. Thus, an effect similar to that of the embodiment 29 can be attained also in this embodiment.

FIG. 60B is a circuit diagram illustrating the internal structure of the flip-flop circuit shown in FIG. 60A. The enable level of a master latch shown in FIG. 60B is reverse to that of the master latch shown in FIG. 57A, and hence invertors INV61 and INV62 whose directions are reverse to the invertors INV51 and INV52 are provided in place thereof so that opening/closing of a transmission gate S1 with respect to a clock signal received from the exterior is reversed. The signal Ty serving as a clock signal and the clock signal T2 are supplied to input ends of the invertors INV61 and INV62 respectively.

(c-7) Embodiment 33

Figure 61:
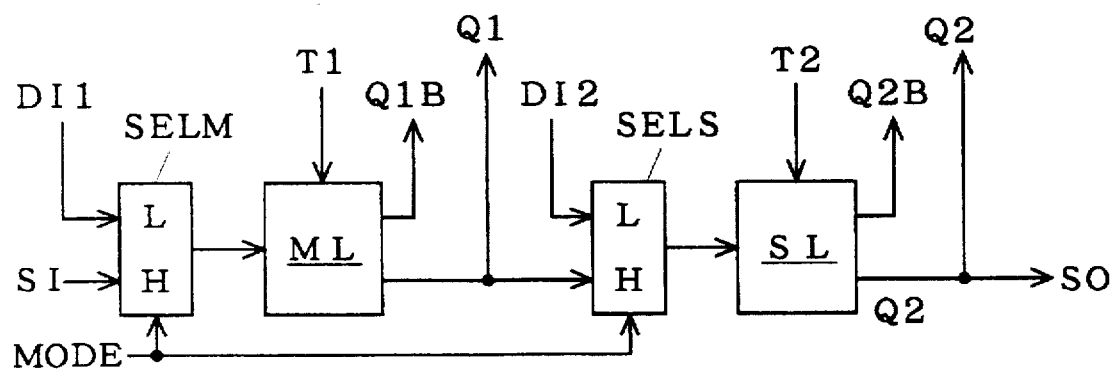
FIGS. 61 and 62 are circuit diagrams illustrating an embodiment 33 of the present invention.

FIG. 61 is a circuit diagram showing the structure of a flip-flop circuit according to an embodiment 33. A selector SELM selectively outputs a first ordinary input signal DI1 or a scan test signal SI, depending on whether a mode signal MODE takes a low or high level. A master latch ML receives the output of the selector SELM, and outputs a first output signal Q1 and its inverted signal Q1B. A selector SELS selectively outputs a second ordinary input signal DI2 or the first output signal Q1 depending on whether the mode signal MODE takes a low or high level. A slave latch SL receives the output of the selector SELS, and outputs a second output signal Q2 and its inverted signal Q2B. The second output signal Q2 is employed as a scan-out signal SO. The master latch ML and the slave latch SL operate on the basis of the first and second clock signals T1 and T2 shown in the embodiment 27 respectively.

Figure 62:
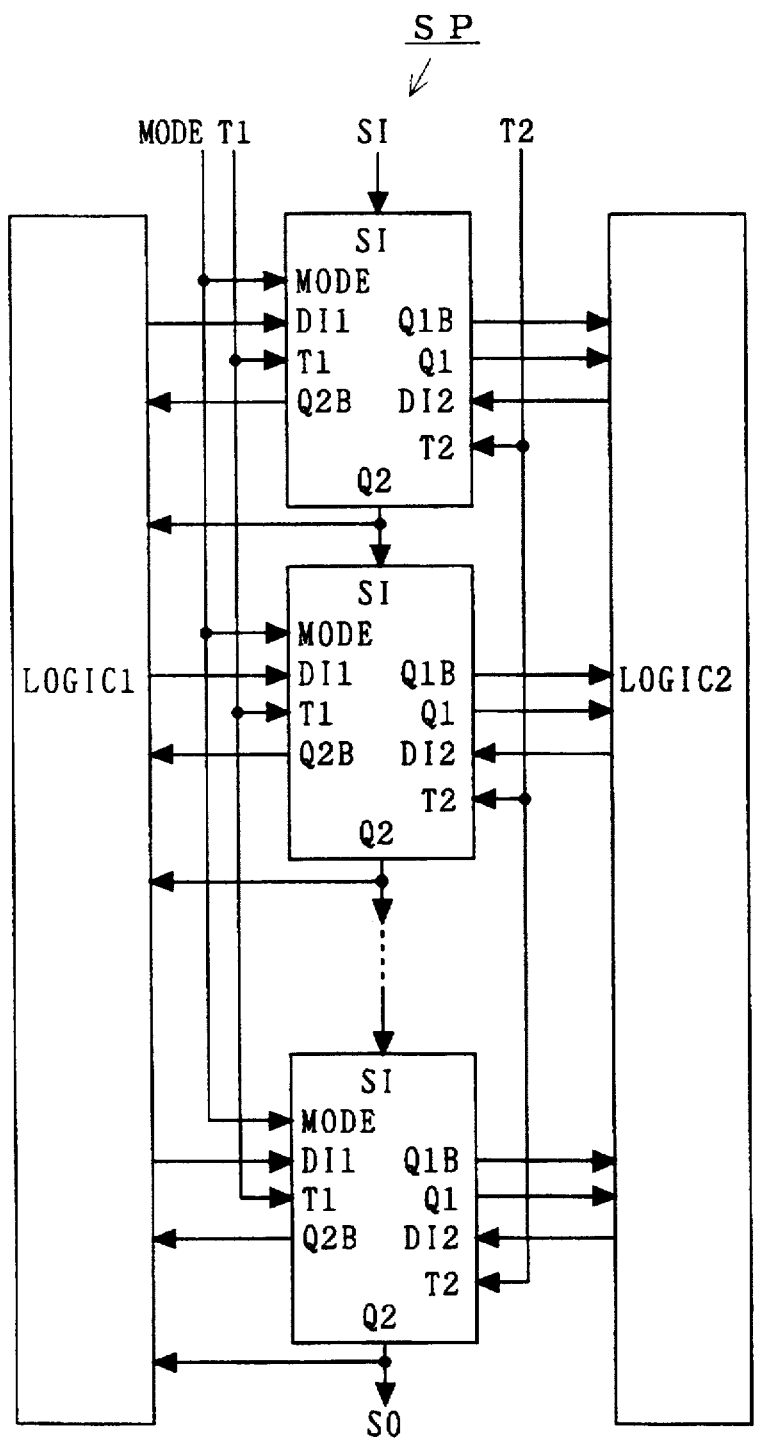

FIG. 62 is a circuit diagram illustrating a scan path SP which is formed by serially connecting the flip-flop circuit shown in FIG. 61. This scan path SP receives a first ordinary input signal DI1 from a first logic circuit LOGIC1, and outputs the first output signal Q1 and its inverted signal Q1B to a second logic circuit LOGIC2. The scan path further receives a second ordinary input signal DI2 from the second logic circuit LOGIC2, and outputs the second output signal Q2 and its inverted signal Q2B to the first logic circuit LOGIC1.

The first and second logic circuits LOGIC1 and LOGIC2 are tested independently of each other. The following operations are performed in each flip-flop circuit.

In order to test the first logic circuit LOGIC1, the mode signal MODE is set at a high level, the scan test signal SI is supplied to the slave latch SL through the selector SELM, the master latch ML and the selector SELS, and the second output signal Q2 and its inverted signal Q2B are set for performing a shift operation. Thereafter the mode signal MODE is set at a low level, an output of the first logic circuit LOGIC1 responding to the second output signal Q2 and its inverted signal Q2B is received as the first ordinary input signal DI1, and the value of the first output signal Q1 is updated. Further, the mode signal MODE is set at a high level to perform a shift operation, the first output signal Q1 is selected by the selector SELS, and the second output signal Q2 is updated as a test result of the first logic circuit LOGIC1.

In order to test the second logic circuit LOGIC 2, on the other hand, the mode signal MODE is set at a high level to perfom a shift operation, the scan test signal SI is supplied to the master latch ML through the selector SELM, and the first output signal Q1 and its inverted signal Q1B are set. Thereafter the mode signal MODE is set at a low level, the output of the second logic circuit LOGIC2 responding to the first output signal Q1 and its inverted signal Q1B is received as the second ordinary input signal DI2 and the value of the second output signal Q2 is updated. Further, the mode signal MODE is set at a high level to perform a shift operation, and the scan-out signal SO is transmitted to a master latch of a subsequent stage flip-flop circuit through its selector SELM as a test result of the second logic circuit LOGIC2.

Thus, two logic circuits can be tested by employing the flip-flop circuit shown in FIG. 61, also when the single scan path SP is formed. In an ordinary operation, signal transmission from the first logic circuit LOGIC1 to the second logic circuit LOGIC2 and vice versa can be implemented through the master latch ML and the slave latch SL which are half latches respectively by regularly setting the mode signal MODE at a low level, as a matter of course.

(c-8) Embodiment 34

Figure 63:
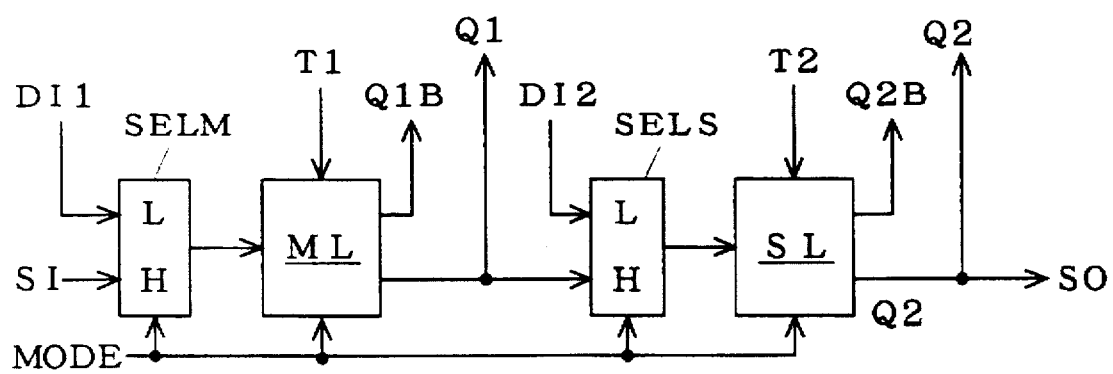
FIGS. 63 and 64 are circuit diagrams illustrating an embodiment 34 of the present invention.

FIG. 63 is a circuit diagram showing the structure of a flip-flop circuit according to an embodiment 34. The structure shown in FIG. 63 is obtained by supplying the mode signal MODE to the master latch ML and the slave latch SL in the structure shown in FIG. 61. The master latch ML and the slave latch SL are switched between static and dynamic types on the basis of the mode signal MODE to operate.

Figure 64:
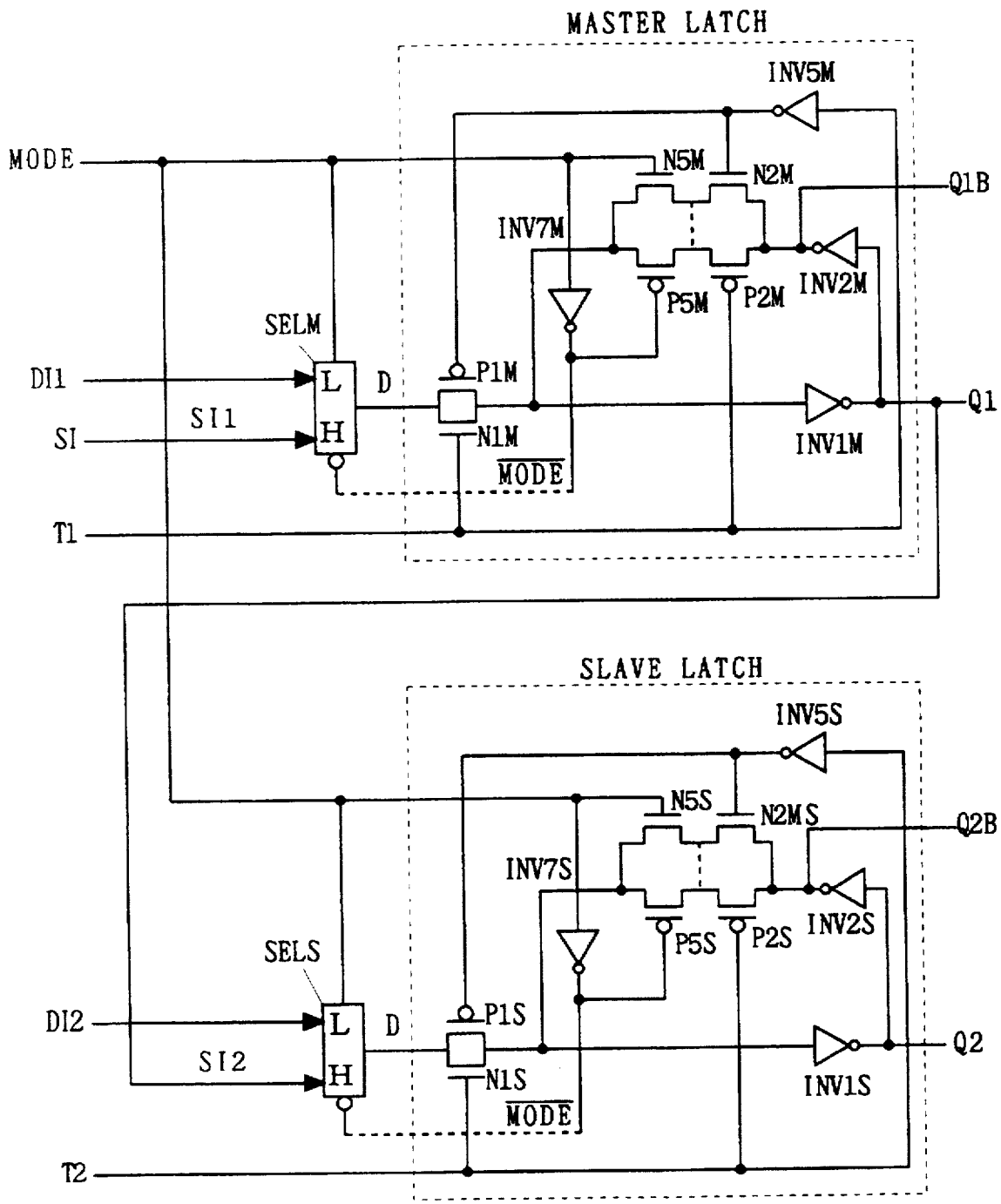

FIG. 64 is a circuit diagram concretely showing the structures of the master latch ML and the slave latch SL shown in FIG. 63.

A selector SELM and the master latch shown in FIG. 64 are in the same structures as the selector SEL1 and the master latch shown in FIG. 13. Namely, the selector SELM, PMOS transistors P1M, P2M and P5M, NMOS transistors N1M, N2M and N5M and invertors INV1M, INV2M and INV5M in FIG. 64 correspond to the selector SEL1, the PMOS transistors P1, P2 and P5, the NMOS transistors N1, N2 and N5 and the invertors INV1, INV2 and INV5 in FIG. 13 respectively.

A selector SELS and a slave latch shown in FIG. 64 also have the same structures as the selector SEL1 and the master latch shown in FIG. 13. Namely, the selector SELS, PMOS transistors P1S, P2S and P5S, NMOS transistors N1S, N2S and N5S and invertors INV1S, INV2S and INV5S in FIG. 64 correspond to the selector SEL1, the PMOS transistors P1, P2 and P5, the NMOS transistors N1, N2 and N5 and the invertors INV1, INV2 and INV5 in FIG. 13 respectively.

Therefore, operations of the selectors SELM and SELS are controlled by the mode signal MODE, while those of the master and slave latches are also switched between dynamic and static types. In more concrete terms, both of the master and slave latches operate as dynamic types in an ordinary operation, while the same operate as static types in a shift operation or in a sleep mode stopping clocks.

The inverted signals Q1B and Q2B are obtained from output ends of the invertors INV2M and INV2S respectively.

(c-9) Embodiment 35

Figure 65:
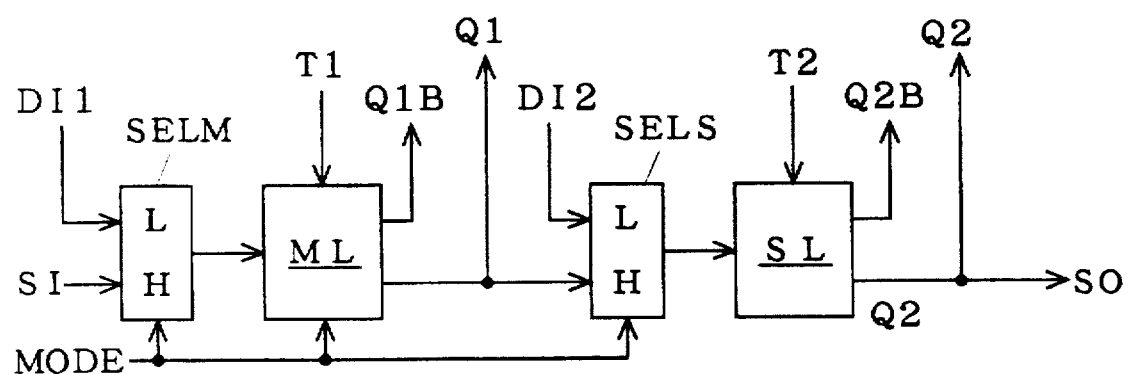
FIGS. 65 and 66 are circuit diagrams illustrating an embodiment 35 of the present invention.

FIG. 65 is a circuit diagram showing the structure of a flip-flop circuit according to an embodiment 35. The structure shown in FIG. 65 is obtained by supplying a mode signal MODE to the master latch ML in the structure shown in FIG. 61. The master latch ML is switched between static and dynamic types on the basis of the mode signal MODE to operate.

Figure 66:
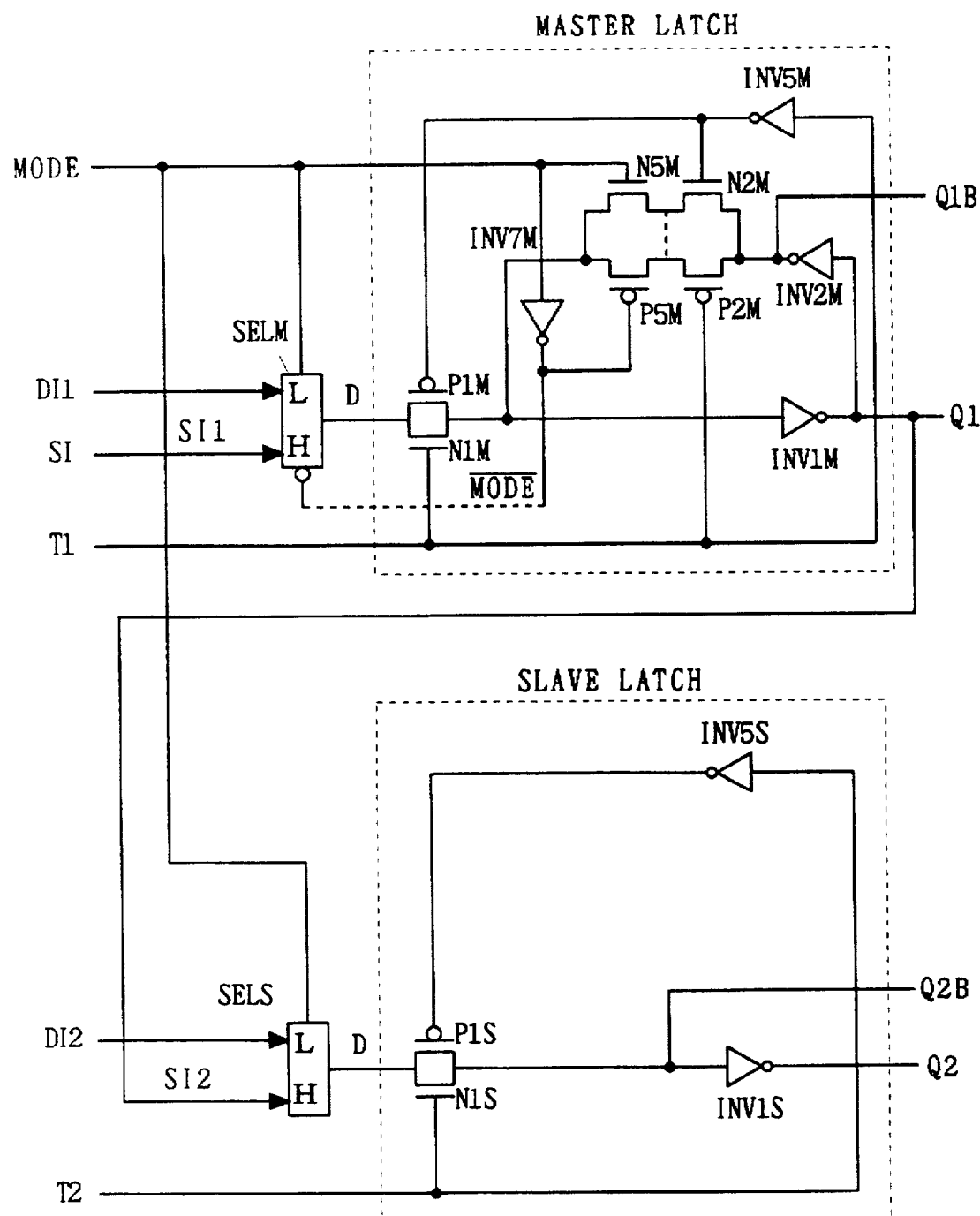

FIG. 66 is a circuit diagram concretely showing the structures of the master latch ML and a slave latch SL shown in FIG. 65. This circuit has a structure obtained by replacing the master latch of the structure shown in FIG. 64 with a dynamic slave latch.

A selector SELS and the slave latch shown in FIG. 66 have the same structures as the selector SEL1 and the master latch shown in FIG. 9. Namely, the selector SELS, a PMOS transistor P1S, an NMOS transistor N1S and invertors INV1S and INV5S shown in FIG. 66 correspond to the selector SEL1, the PMOS transistor P1, the NMOS transistor N1 and the invertors INV1 and INV5 shown in FIG. 9 respectively.

Therefore, operations of the selectors SELM and SELS are controlled by the mode signal MODE, while those of the master and slave latches are also switched between dynamic and static types. In more concrete terms, both of the master and slave latches operate as dynamic types in an ordinary operation, while the master latch operates as a static type in a shift operation or in a sleep mode stopping clocks.

Inverted signals Q1B and Q2B are obtained from an output end of an invertor INV2M and an input end of the invertor INV1S respectively.

(c-10) Embodiment 36

Figure 67:
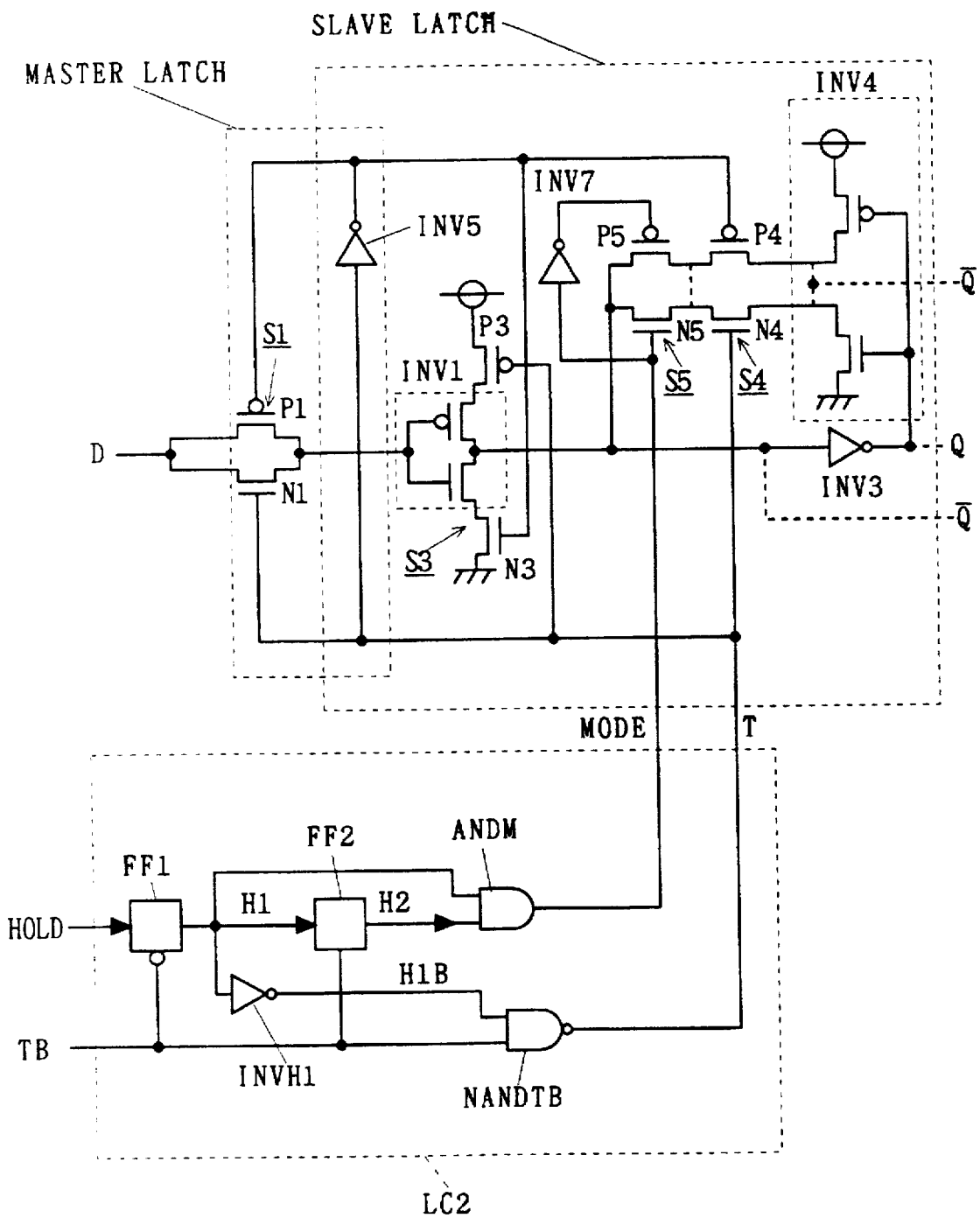
FIG. 67 is a circuit diagram illustrating an embodiment 36 of the present invention.

FIG. 67 is a circuit diagram illustrating the structure of an embodiment 36. The circuit shown in FIG. 67 has a structure obtained by adding a logic circuit LC2 supplying a mode signal MODE and a clock signal T to the circuit shown in FIG. 20A. However, transmission gates S10 and S11 forming a selector are omitted here.

A hold signal HOLD and a clock original signal TB are inputted in the logic circuit LC2. The logic circuit LC2 is formed by a negative edge trigger type flip-flop circuit FF1, a positive edge trigger type flip-flop circuit FF2, an invertor INVH1, a two-input NAND gate NADTB, and a two-input AND gate ANDM.

The flip-flop circuit FF1 incorporates the hold signal HOLD on a trailing edge of the clock original signal TB. An output H1 of the flip-flop circuit FF1 is incorporated on a rising edge of the clock original signal TB. Respective outputs H1 and H2 of the flip-flop circuits FF1 and FF2 are supplied to the AND gate ANDM, so that the mode signal MODE is formed as the logical product thereof.

The invertor INVH1 inverts the output H1 and outputs an inverted signal H1B, which is supplied to the NAND gate NANDTB along with the clock original signal TB so that a clock signal T is formed as an inverted signal of the logical product thereof.

Figure 68:
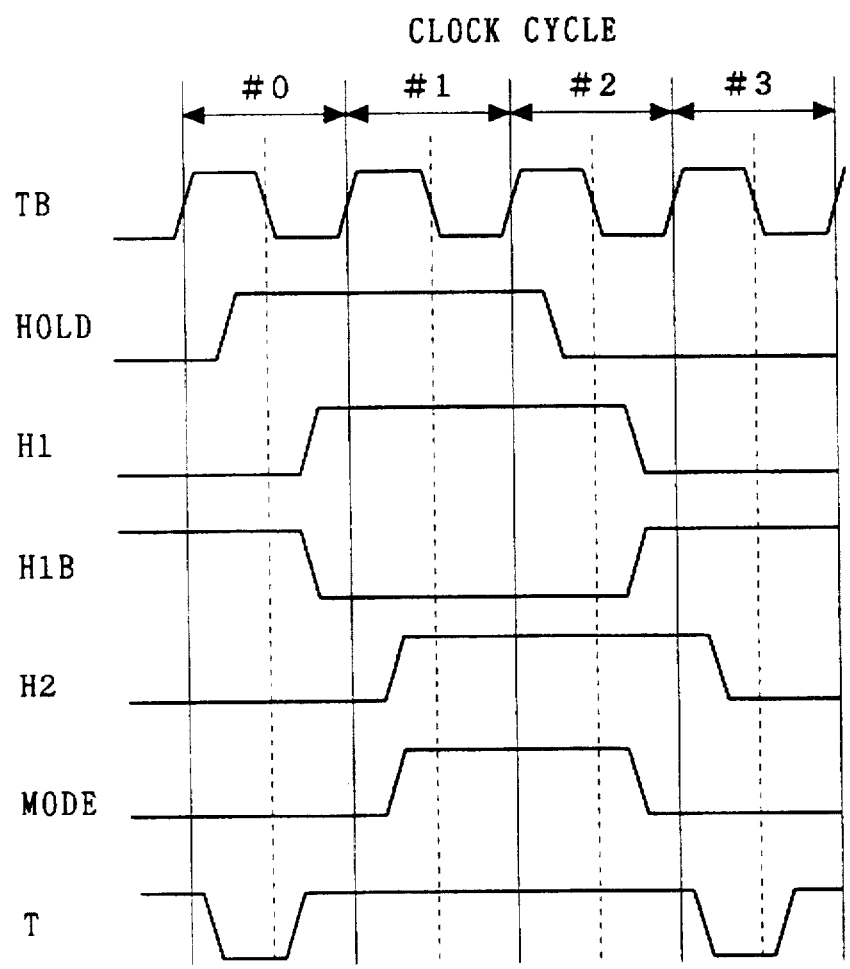
FIG. 68 is a timing chart illustrating the embodiment 36 of the present invention.

FIG. 68 is a timing chart showing the waveforms of the respective signals shown in FIG. 67. On the trailing edge of the clock original signal TB in a clock cycle #0, the hold signal HOLD is incorporated, the output H1 rises and its inverted signal H1B falls. The output H2 rises on the rising edge of the clock original signal TB forming the boundary between the clock cycle #0 and a clock cycle #1. Thus, the mode signal MODE also rises.

On the other hand, the signal H1B is at a high level until the output H1 rises, whereby the NAND gate NANDTB serves as an invertor, and the clock signal T is obtained as an inverted signal of the clock original signal TB. Thereafter the signal H1B goes low, whereby the clock signal T is maintained at the high level.

In a clock cycle #2, transition of the hold signal HOLD from a high level to a low level is transmitted to the output H1 by fall of the clock original signal TB in the clock cycle #2. Following this, the signal H1B goes high. The output H2 is at a high level at this time, whereby the AND gate ANDM transmits transition of the output H1 from a high level to a low level as that of the mode signal MODE from a high level to a low level. Further, the clock signal T falls at the chance of rise of the clock original signal TB in a boundary between the clock cycle #2 and a clock cycle #3.

As described above, the clock signal T necessarily goes high when at least the mode signal MODE is at a high level. Therefore, a transmission gate S4 is necessarily closed when a transmission gate S5 is closed.

Thus, the slave latch is switched to a static type and the clock signal T is fixed at a high level by converting the hold signal HOLD to a high level, whereby increase of power consumption caused by collision (competition) of the signals can be avoided.

The logic circuit LC2 can be shared by a plurality of flip-flop circuits, as a matter of course.

(c-11) Embodiment 36

Figure 69:
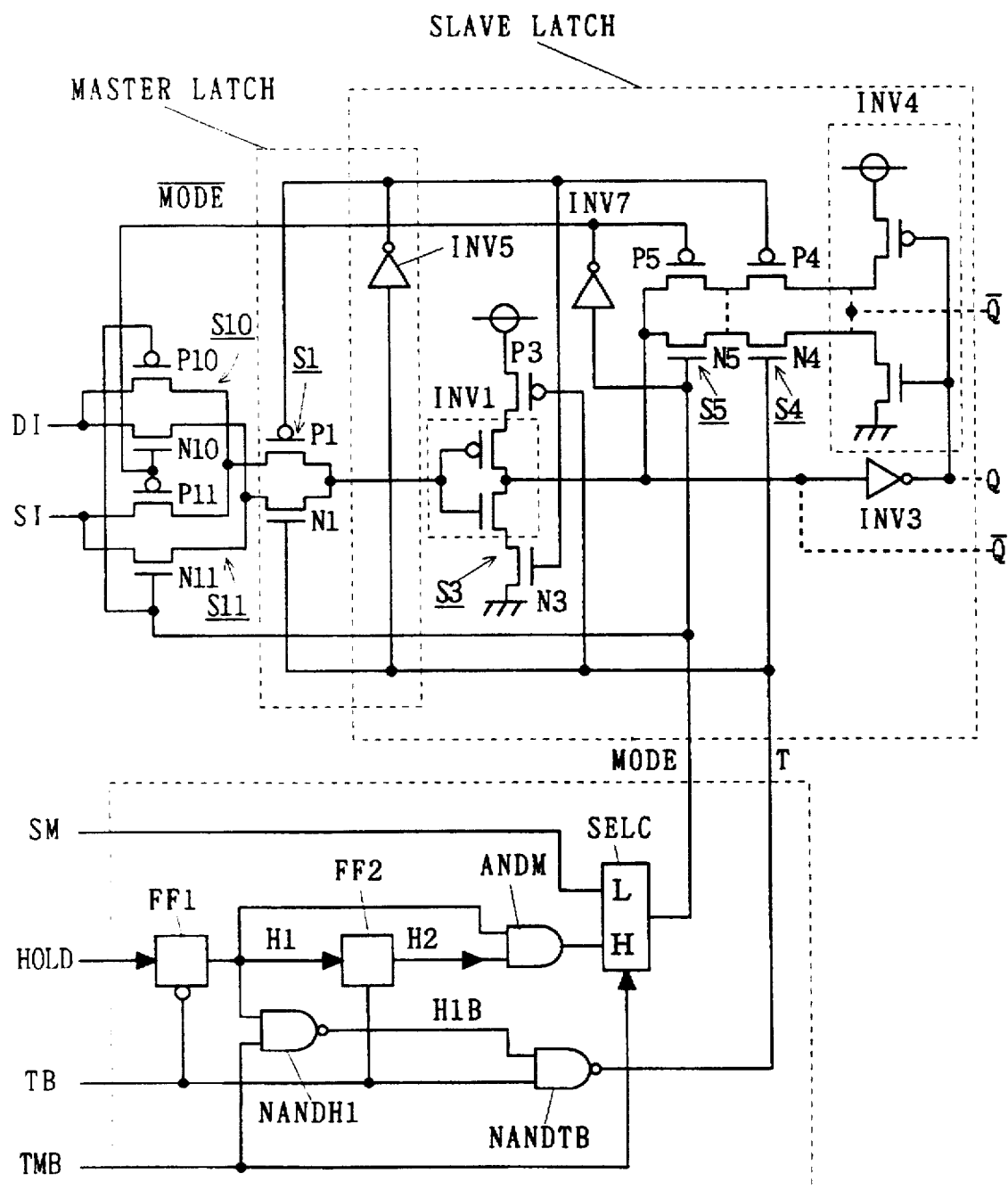
FIG. 69 is a circuit diagram illustrating an embodiment 37 of the present invention.

FIG. 69 is a circuit diagram illustrating the structure of an embodiment 37. The circuit shown in FIG. 69 has a structure obtained by adding a logic circuit LC3 supplying a mode signal MODE and a clock signal T to the circuit shown in FIG. 20A.

A hold signal HOLD, a clock original signal TB, a test mode signal TMB and a signal SM are inputted in the logic circuit LC3. The logic circuit LC3 has a structure obtained by adding a selector SELC to the logic circuit LC2 shown in FIG. 67 and replacing the invertor INVH1 with a NAND gate NANDH1.

One input end of the NAND gate NANDH1 inputs an output H1 similarly to the invertor INVH1, and the other input end inputs the test mode signal TMB. The selector SELC outputs an output of an AND gate ANDM or the signal SM as the mode signal MODE on the basis of the test mode signal TMB which goes high or low.

In an ordinary operation, the test mode signal TMB is set at a high level. Thus, the selector SELC selects the output of the AND gate ANDM as the mode signal MODE while the NAND gate NANDH1 serves as an invertor, whereby the circuit performs an operation similar to that of the circuit shown in FIG. 67. Namely, the signal SM exerts no influence on the ordinary operation.

While a transmission gate S11 conducts to transmit a scan test signal SI to a master latch by setting the mode signal MODE at a high level, a clock signal T is necessarily at a high level when the mode signal MODE is at a high level, whereby a transmission gate S3 is turned off, not to inhibit storage contents of a slave latch operating in a static type.

In a test operation, on the other hand, the test mode signal TMB is set at a low level. Thus, the selector SELC outputs the signal SM as the mode signal MODE, and the clock signal T takes a value which is complementary to the clock original signal TB. Namely, the value of the hold signal HOLD is not related with the test operation.

Figure 70:
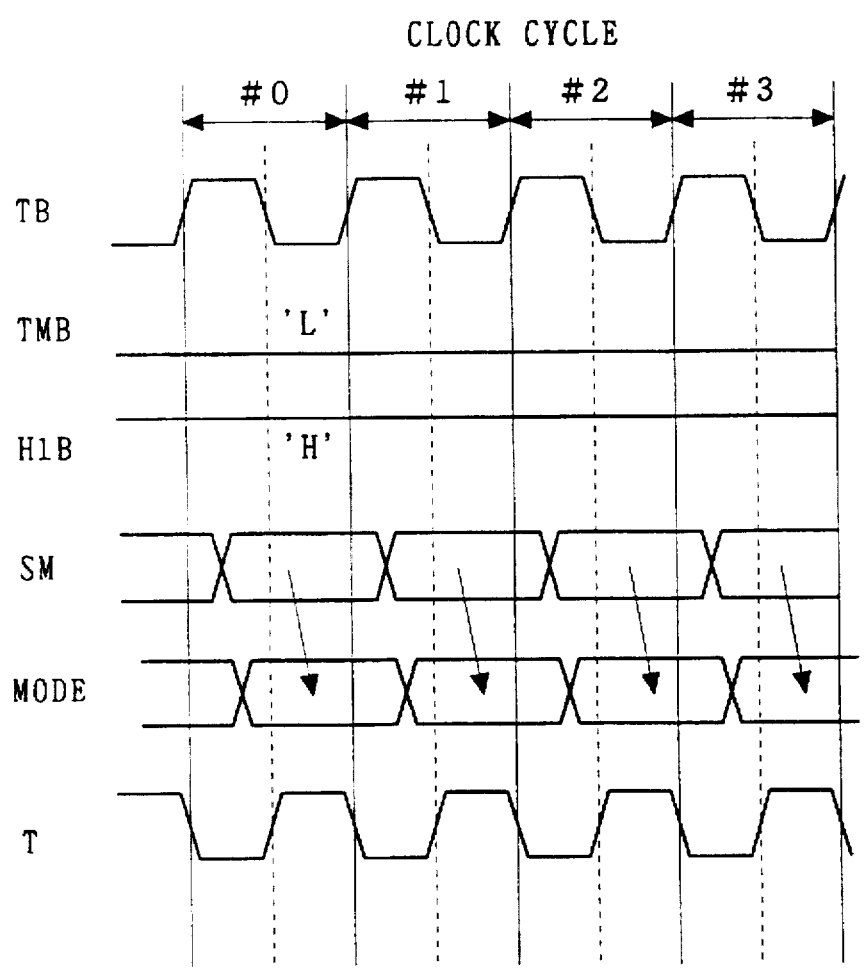
FIG. 70 is a timing chart illustrating the operation of the embodiment 37 of the present invention.

FIG. 70 is a timing chart showing the waveforms of the respective signals shown in FIG. 69 in a shift operation. As shown in FIG. 70, the signal SM serves as the mode signal MODE, whereby the same can be employed as that controlling switching between an ordinary input signal DI and a scan test signal SI in a scan flip-flop circuit generally performed in a scan test.

D. Application to RAM

The present invention can be utilized for implementing a RAM performing write and read operations which are synchronous and asynchronous with a clock signal respectively.

Figure 71:
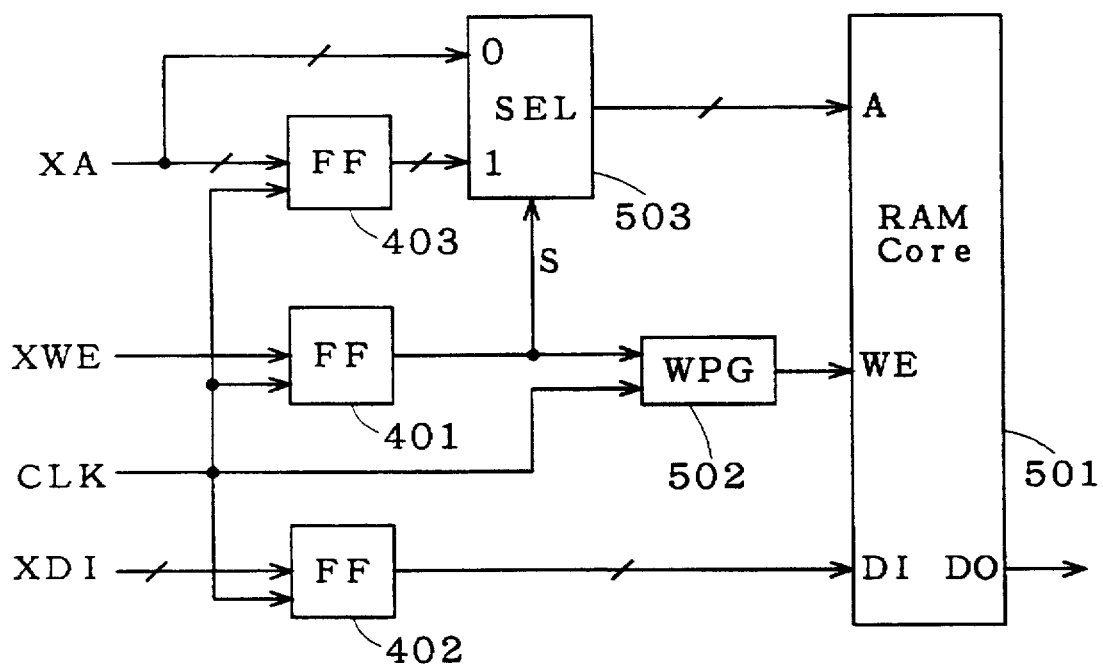
FIG. 71 is a block diagram showing the structure of a RAM for synchronously and asynchronously performing a write operation and a read operation respectively.

FIG. 71 is a block diagram showing the structure of a RAM asynchronously and synchronously performing read and write operations respectively. A RAM core 501 comprises an address input end A for receiving write and read addresses, a data input end DI for receiving write data, a data end DO for outputting read data, and a write enable end WE for receiving a write enable signal.

A selector 503 has "0" and "1" input ends for receiving an address XA directly and through a flip-flop 403 respectively, and its output is supplied to the address input end A of the RAM core 501. Which one of signals supplied to the "0" and "1" input ends is outputted depends on the value ("0" or "1") of a selection signal S outputted from a flip-flop 401. The flip-flop 401 is supplied with a write enable original signal XWE. The write enable original signal XWE passing through the flip-flop 401 serves as a control signal S, while being inputted in a write pulse generation control circuit 502. The write pulse generation control circuit 502 supplies the write enable signal to the write enable end WE on the basis of a clock signal CLK and the control signal S.

On the other hand, a flip-flop 402 inputs write data XDI, and its output is supplied to the data input end DI of the RAM core 501. The flip-flops 401 to 403 are controlled by the same clock signal CLK, to perform output operations in synchronization with the clock signal CLK.

In such a structure, the write enable original signal XWE becomes "1" in case of performing a write operation, so that the control signal S outputted from the flip-flop 401 controls the selector 503 to output the signal which is supplied to the "1" input end. Therefore, a write address may be supplied as the address XA which is inputted in the flip-flop 403. Due to the function of the flip-flop 403, the write address reaches the address input end A in synchronization with the clock signal CLK. In this case, the write enable signal also becomes "1", so that the write operation is performed on the RAM core 501.

In case of performing a read operation, on the other hand, the write enable original signal XWE becomes "0", so that the control signal S outputted from the flip-flop 401 controls the selector 503 to output the signal which is supplied to the "0" input end. Therefore, a read address may be supplied as the address XA. Thee read address reaches the address input end A in no synchronization with the clock signal CLK since the same does not pass through the flip-flop 403. In this case, not the write operation but the read operation is performed on the RAM core 501.

As hereinabove described, the RAM of the structure shown in FIG. 71 can asynchronously and synchronously perform read and write operations respectively. When the write operation is performed subsequently to the read operation, however, it is necessary to provide a dummy period for synchronizing the write operation with the clock signal since each of the write and read addresses is treated as the address XA.

Figure 72:
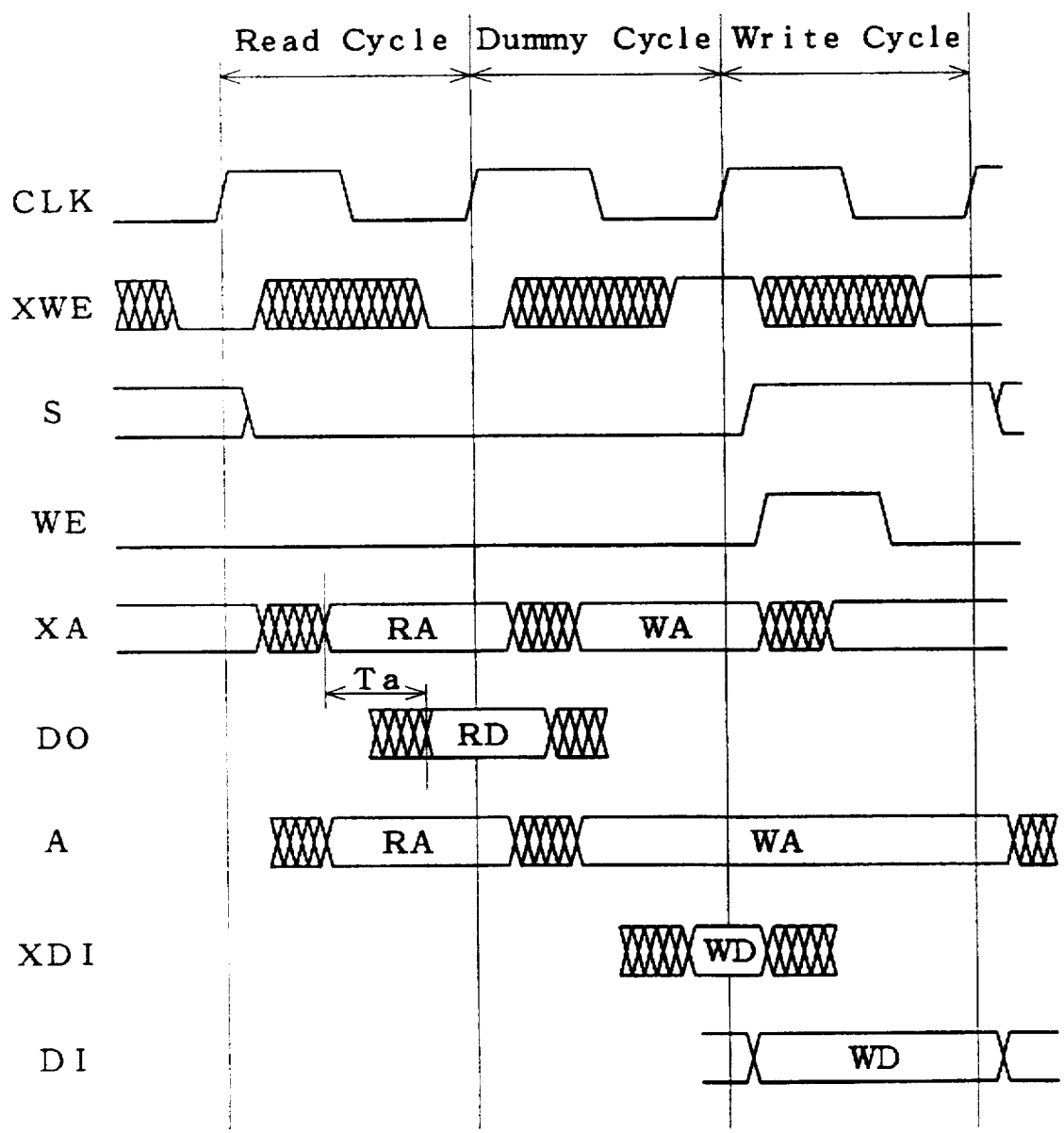
FIG. 72 is a timing chart illustrating the operation of the RAM shown in FIG. 71.

FIG. 72 is a timing chart showing the clock signal CLK, the write enable original signal XWE, the control signal S, the value at the write enable end WE, the address XA, the value read at the data end DO, the value at the address input end A, the value of the write data XDI, and the value at the data input end DI in case of shifting from the read operation to the write operation in the RAM shown in FIG. 71 respectively.

First, the write enable original signal XWE goes low (corresponding to "0") on the rising edge of the clock signal CLK, whereby the read operation is performed in the subsequent period corresponding to one cycle of the clock signal CLK (read cycle). Namely, when a read address RA is supplied in this read cycle as the address XA even not in synchronization with the clock signal CLK, read data RD is obtained after a lapse of a delay time Ta for reading data from the RAM core 501.

However, there is such a case that writing cannot be immediately performed in the cycle next to this read cycle. This is because a period is required for preparing a write address WA to be in time for the rising edge of the clock signal CLK in the address XA since the address RA is supplied in no synchronization with the clock signal CLK.

In the case shown in FIG. 72, the write enable original signal XWE must go low on the rising edge of the clock signal CLK at the end of the read cycle (at the start of a dummy cycle). Further, the address XA must be changed from the read address RA to the write address WA in the period of this dummy cycle.

After the write address WA is thus supplied as the address XA, the write enable original signal XWE is supplied to go high (corresponding to "1") on the rising edge of the clock signal CLK, so that the write operation is performed (write cycle).

The RAM shown in FIG. 71 must be provided with such a dummy cycle, and hence its operation is redundant.

(d-1) Embodiment 38

Figure 73:
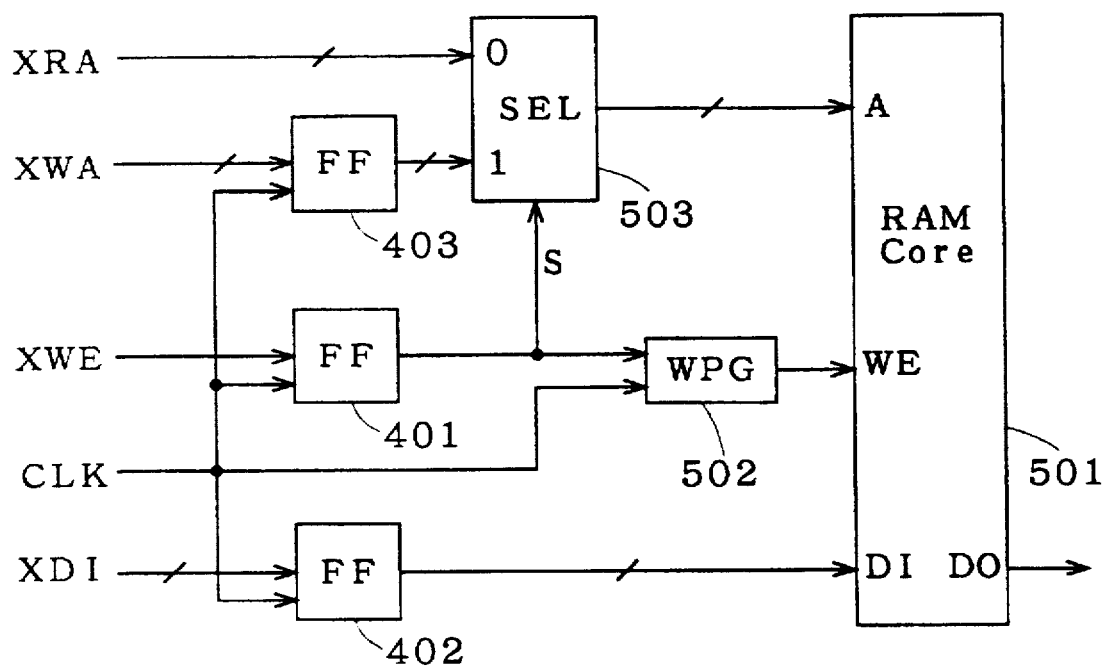
FIG. 73 is a block diagram illustrating an embodiment 38 of the present invention.

FIG. 73 is a block diagram showing the structure of an embodiment 38 of the present invention. A write enable original signal XWE is supplied to a write pulse generation control circuit 502 through a flip-flop 401, so that the write pulse generation control circuit 502 outputs a write enable signal on the basis of the write enable original signal XWE and a clock signal CLK. Write data XDI is inputted in a flip-flop 402.

A read address XRA is supplied to a "0" input end of a selector 503, while a write address XWA can be supplied to a "1" input end of the selector 503 through a flip-flop 403. Namely, the read address XRA is supplied independently of the write address XWA in this embodiment.

Operations of all flip-flops 401 to 403 are controlled by the clock signal CLK. The selector 503 outputs the value of the "0" or "1" input end of its own in correspondence to the value of a control signal S, which is outputted from the flip-flop 401, taking "0" or "1".

The RAM core 501 has an address input end A for receiving the output of the selector 503, a write enable end WE for receiving the write enable signal, a data input end DI for receiving an output of the flip-flop 402, and a data end DO for outputting read data.

Figure 74:
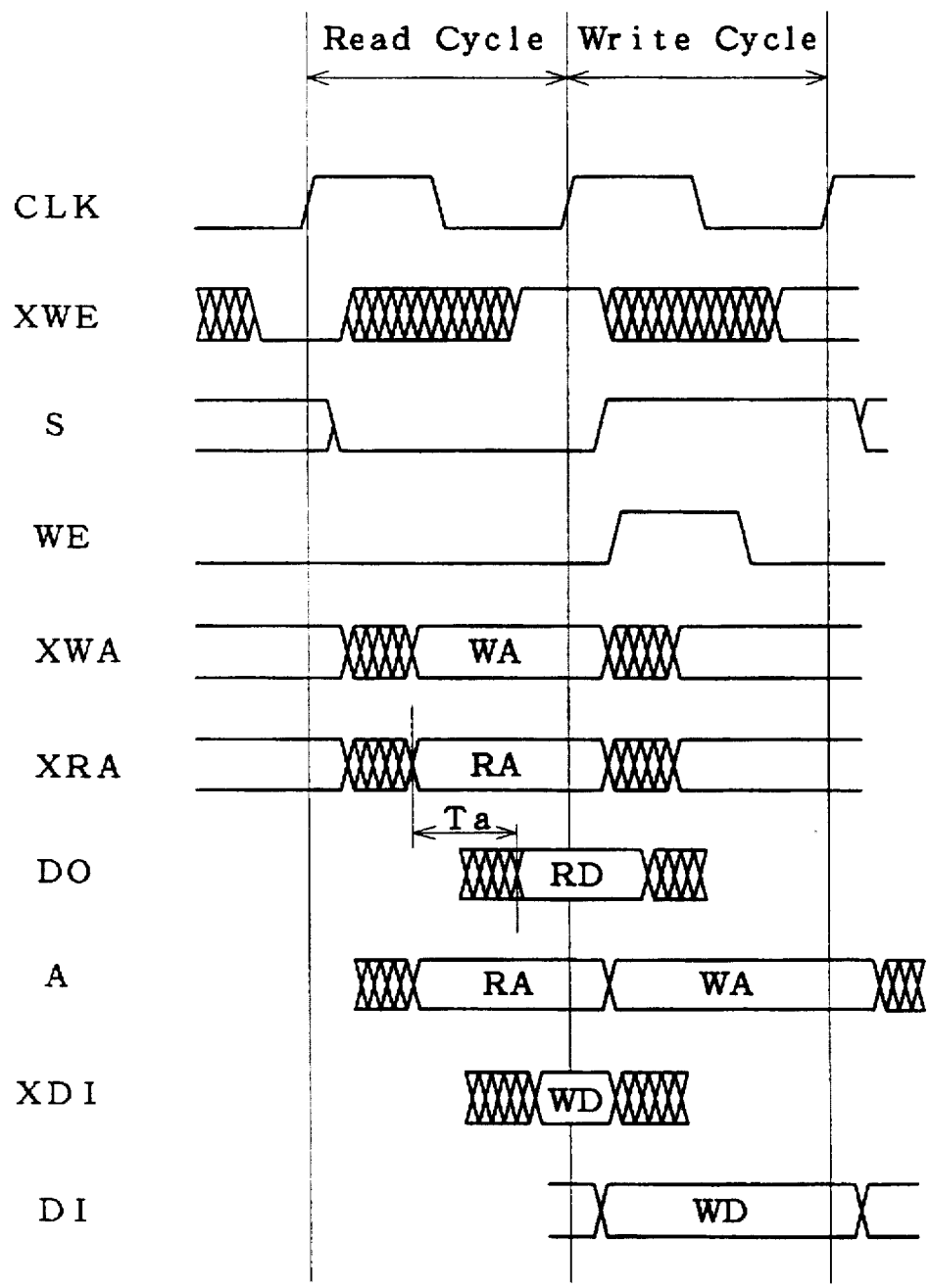
FIG. 74 is a timing chart illustrating the operation of the embodiment 38 of the present invention.

FIG. 74 is a timing chart showing the clock signal CLK, the write enable original signal XWE, the control signal S, the value at the write enable end WE, the write address XWA, the read address XRA, the value read at the data end DO, the value at the address input end A, the value of the write data XDI, and the value at the data input end DI in case of shifting from a read operation to a write operation in the RAM shown in FIG. 73 respectively.

In this embodiment, the read and write operations can be asynchronously and synchronously performed respectively similarly to the RAM having the structure shown in FIG. 71 as a matter of course, while the write address XWA and the read address XRA can be simultaneously set independently of each other. Even if the read address XRA takes a value RA in a read cycle, therefore, the value of the write address XWA for a write cycle to be subsequently performed can be set at WA at the same time. Therefore, no dummy cycle is necessary for resetting the address from the read address to the write address, dissimilarly to the RAM having the structure shown in FIG. 71. Thus, no redundant operation cycle is required and hence quick reading/writing can be performed.

(d-2) Embodiment 39

Figure 75:
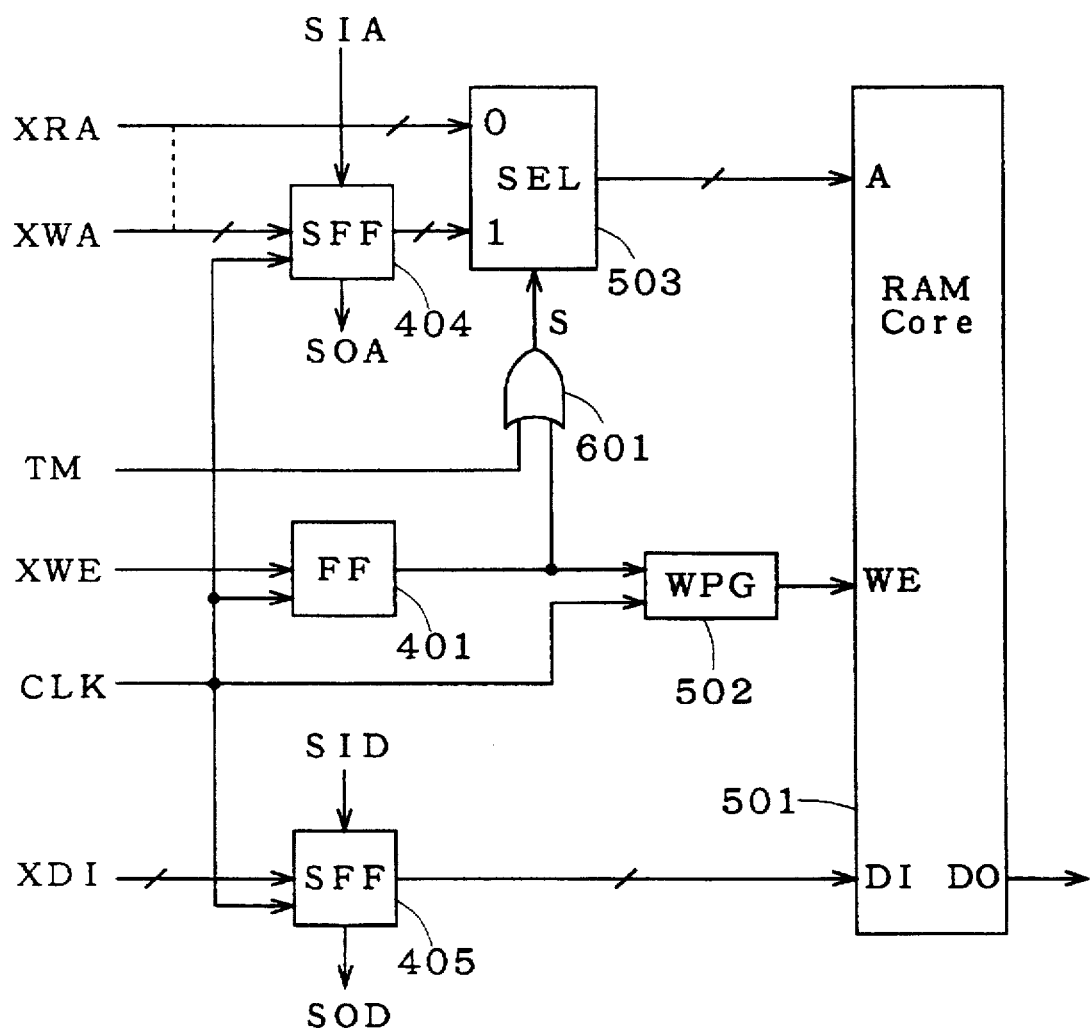
FIG. 75 is a block diagram illustrating an embodiment 39 of the present invention.

FIG. 75 is a block diagram showing the structure of an embodiment 39 of the present invention. As compared with the structure illustrated in FIG. 73 in relation to the embodiment 38, the flip-flops 402 and 403 are replaced with scan flip-flops 405 and 404 respectively, with addition of an OR circuit 601. An output of a flip-flop 401 and a test signal TM are inputted in the OR circuit 601, so that the logical OR of these inputs serves as a control signal S.

First, the scan flip-flop 404 functions in a scan mode, and stores a scan test signal for an address transmitted through scan paths denoted as scan-in SIA and scan-out SOA. Similarly, the scan flip-flop 405 functions in a scan mode, and stores a scan test signal for data transmitted through scan paths denoted as scan-in SID and scan-out SOD.

Thereafter the scan flip-flops 404 and 405 output the data stored therein in synchronization with a clock signal CLK respectively. At this time, a test signal TM is made "1" and activated, whereby the control signal S becomes "1" and the address scan test signal stored in the scan flip-flop 404 is supplied to an address input end A. On the other hand, the data scan test signal stored in the scan flip-flop 405 is supplied to a data input end DI in synchronization with the clock signal CLK. Thus, the scan test signal can be supplied to a RAM core 501, so that the RAM core 501 can be readily tested.

Also when the test signal TM takes "0" and is not activated in such a mode that the scan flip-flops 404 and 405 perform ordinary operations, the control signal S takes "1" if a write enable signal XWE is made "1", whereby an operation which is similar to that of the circuit shown in FIG. 73 can be performed.

In this embodiment, the idea of employing a scan test signal as the address to be supplied to the address input end A is applicable not only to a write address but to a read address. Namely, the RAM core 501 can be tested not only in a write operation but in a read operation.

Considering such functional characteristics, it is obvious that the RAM having the structure shown in FIG. 71 can alternatively take such a structure that the flip-flops 402 and 403 are replaced with the scan flip-flops 405 and 404 respectively, the OR circuit 601 is added, and the output of the flip-flop 401 and the test signal TM are inputted in the OR circuit 601 so that the logical OR of these elements serves as the control signal S. Namely, also when the part shown by a broken line in FIG. 75 is connected and the read address XRA and the write address XWA are integrally supplied as the address XA, the read and write operations of the RAM 501 can be effectively readily tested.

(d-3) Embodiment 40

Figure 76:
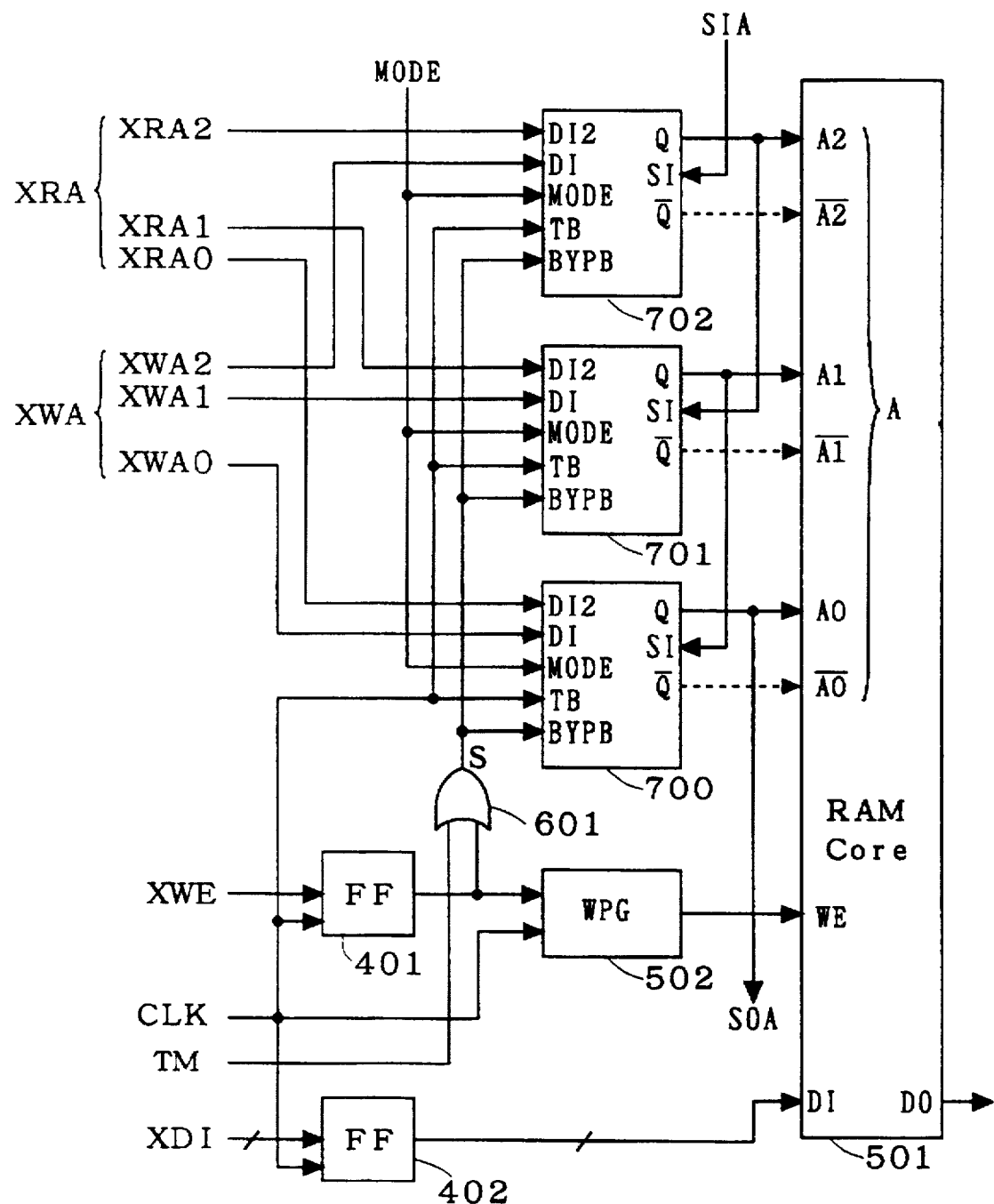
FIG. 76 is a block diagram illustrating an embodiment 40 of the present invention.

FIG. 76 is a block diagram showing the structure of an embodiment 40 of the present invention. As compared with the structure illustrated in FIG. 75 in relation to the embodiment 39, the scan flip-flop 404 and a selector 503 are replaced with scan flip-flops 700 to 702. Dissimilarly to FIGS. 73 and 75, addresses are illustrated bitwise in FIG. 76. FIG. 76 illustrates such a case that a RAM core 501 has 3-bit addresses, for example, while a write address XWA, a read address XRA and an address input end A are dividedly illustrated as XWA0 to XWA2, XRA0 to XRA2 and A0 to A2 respectively.

The structure shown in FIG. 48A or 52 can be employed for each of the scan flip-flops 700 to 702. In the scan flip-flop 702, for example, the write address XWA2, the read address XRA2, a clock signal CLK, and a control signal S are inputted as an ordinary input signal DI, an asynchronously transmitted signal DI2, a clock original signal TB, and a bypass signal BYPB respectively. This also applies to the remaining scan flip-flops 700 and 701. The scan flip-flops 700 to 702 define a scan path.

In a write operation, the control signal S becomes "1", the bypass signal BYPB which is low-active is not activated, and a bypass circuit BYPC transmits no read address XRAi (i=0, 1, 2) to an input end of an invertor INV3. The write address XWAi is transmitted to an output of the invertor INV3 through master and slave latches. Since the control signal S is "1", this transmission is performed in synchronization with a clock signal T which is synchronous with the clock signal CLK although the logic is inverted, whereby it comes to that the write operation is performed in synchronization with the clock signal CLK.

In a read operation, on the other hand, the control signal S becomes "0" and the bypass signal BYPB is activated, whereby the bypass circuit BYPC transmits the read address XRAi to the input end of the invertor INV3. On the other hand, a NAND gate NANDTB fixes the clock signal T at a high level, whereby the write address is not transmitted through the slave latch regardless of the operation of the clock signal CLK. Consequently, it comes to that the read operation is performed asynchronously with the clock signal CLK.

When a mode signal MODE is converted to a high level and scan test data is supplied to the master latch, the control signal S becomes "1" if a test signal TM is thereafter made "1", so that the scan test data can be transmitted through the master and slave latches in synchronization with the clock signal CLK.

As already described, further, one of the master and slave latches operates as a dynamic type while the other one operates as a static type when the scan test data is transmitted and operates as a dynamic type when the signal DI is transmitted, whereby an erroneous determination in a source current test of a flip-flop circuit can be avoided in the former case while the operation of the flip-flop circuit can be quickly made in the latter case.

E. Modification of Embodiment

In the embodiments 1 to 15, the operation of one of the half latches forming the flip-flop circuit is brought into a dynamic state while the other one is driven in either dynamic or static state. A storage loop of the half latch operating in a static state has a CMOS structure.

In a transmission gate not contributing to the storage loop, one of PMOS and NMOS transistors forming the same can be omitted. In the circuit shown in FIG. 21A, for example, the PMOS transistor P1 of the transmission gate S1 can be omitted. In this case, the PMOS transistors P10 and P11 can also be omitted. Alternatively, the NMOS transistor N1 can be omitted. In this case, the NMOS transistors N10 and N11 can also be omitted.

In the transmission gate S3, however, it is unpreferable to omit the transistors. This is because only the second end of the transmission gate S3 is connected with the invertor INV3 and the potential preferably full swings between high and low levels in this portion.

While the invention has been shown and described in detail, the foregoing description is in all aspects illustrative and not restrictive. It is therefore understood that numerous modifications and variations can be devised without departing from the scope of the invention.

What is claimed is:

1. A flip-flop circuit being formed by series connection of first and second half latches and comprising input and output terminals, wherein (a) said first half latch is of a dynamic type, and
(b) said second half latch is provided with:
   (b-1) a first switch including an input end being operationally coupled with said input terminal and an output end, so that opening/closing thereof is controlled by a clock signal,
   (b-2) a first invertor including an input end being connected with said output end of said first switch and an output end being operationally coupled with said output terminal,
   (b-3) a second invertor,
   (b-4) a second switch whose opening/closing is complementary to that of said first switch, and
   (b-5) a third switch whose opening/closing is controlled by a mode signal,
said second invertor and said second and third switches are connected in series with each other between said output and input ends of said invertor, and
said second invertor is connected in antiparallel with said first invertor upon conduction of both of said second and third switches.

2. The flip-flop circuit in accordance with claim 1, wherein
said first and second half latches serve as master and slave latches respectively,
said input end of said first switch of said second half latch is indirectly connected with said input terminal through said first half latch, and
said output end of said first invertor of said second half latch is connected with said output terminal directly or indirectly through said second invertor.

3. The flip-flop circuit in accordance with claim 2, wherein
said first half latch is provided with:
   (a-1) a switch including an input end being connected with said input terminal and an output end being connected with said input end of said first switch of said second half latch, so that opening/closing thereof is complementary to that of said first switch of said second half latch.

4. The flip-flop circuit in accordance with claim 3, wherein said switch of said first half latch is formed by a transmission gate.

5. The flip-flop circuit in accordance with claim 3, wherein
said switch of said first half latch further includes:
   (a-1-1) a first conductivity type first MOS transistor comprising a gate being connected with said input terminal, a drain being connected with said output end of said switch of said first half latch, and a source,
   (a-1-2) a second conductivity type second MOS transistor comprising a gate being connected with said input terminal, a drain being connected with said output end of said switch of said first half latch, and a drain,
   (a-1-3) a first switching element being connected between said source of said first MOS transistor and a first potential point providing a first potential corresponding to one of binary logics, and
   (a-1-4) a second switching element being connected between said source of said second MOS transistor and a second potential point providing a second potential corresponding to the other one of said binary logics, and
said first and second switching elements are substantially simultaneously opened/closed on the basis of said clock signal.

6. The flip-flop circuit in accordance with claim 2, wherein
said first switch of said second half latch includes a first NMOS and PMOS transistors,
said first half latch is provided with:
   (a-1) a switch including an input end being connected with said input terminal and an output end, so that opening/closing thereof is complementary to that of said first switch of said second half latch,
   (a-2) a second PMOS transistor being connected in series with said first PMOS transistor between said input end of said first invertor of said second half latch and a first potential point providing a first potential corresponding to one of binary logics, and
   (a-3) a second NMOS transistor being connected in series with said first NMOS transistor between said input end of said first invertor of said second half latch and a second potential point providing a second potential corresponding to the other one of said binary logics, and
respective gates of said second NMOS and PMOS transistors are connected with said output end of said switch of said first half latch in common.

7. The flip-flop circuit in accordance with claim 1, wherein
said second and first half latches serve as master and slave latches respectively,
said input end of said first switch of said second half latch is directly connected with said input terminal, and
said output end of said first invertor of said second half latch is indirectly connected with said output terminal through said first half latch.

8. The flip-flop circuit in accordance with claim 7, wherein
said first switch of said second half latch is formed by a transmission gate.

9. The flip-flop circuit in accordance with claim 7, wherein
said first switch of said second half latch further includes:
   (b-1-1) a first conductivity type first MOS transistor comprising a gate being connected with said input terminal, a drain being connected with said output end of said first switch of said second half latch, and a source,
   (b-1-2) a second conductivity type second MOS transistor comprising a gate being connected with said input terminal, a drain being connected with said output end of said first switch of said second half latch, and a source,
   (b-1-3) a first switching element being connected between said source of said first MOS transistor and a first potential point providing a first potential corresponding to one of binary logics, and
   (b-1-4) a second switching element being connected between said source of said second MOS transistor and a second potential point providing a second potential corresponding to the other one of said binary logics, and
said first and second switching elements are substantially simultaneously opened/closed on the basis of said clock signal.

10. A flip-flop circuit comprising:
(a) a selector having a pair of input ends inputting an ordinary input signal and a scan test signal, and an output end outputting either one of said signals;

(b) an output terminal; and
(c) first and second half latches being connected in series with each other between said output end of said selector and said output terminal, wherein
said first half latch is a dynamic type,
said second half latch is switched between said dynamic type and a static type by a mode signal, and
said selector is controlled by said mode signal for outputting said ordinary input signal when said second half latch is switched to said dynamic type while outputting said scan test signal when said second half latch is switched to said static type.

11. The flip-flop circuit in accordance with claim 10, wherein
said second half latch is provided with:
(c-1) a first switch including an input end being operationally coupled with said output end of said selector and an output end, so that opening/closing thereof is controlled by a clock signal,
(c-2) a first invertor including an input end being connected with said output end of said first switch and an output end being operationally coupled with said output terminal,
(c-3) a second invertor,
(c-4) a logic gate performing a logic operation of said clock signal and said mode signal, and
(c-5) a second switch whose opening/closing is controlled by an output of said logic gate,
said second invertor and said second switch are connected in series with each other between said input and output ends of said first invertor,
said second invertor is connected in antiparallel with said first invertor upon conduction of said second switch, and
said second switch is opened/closed complementarily to said first switch when said mode signal takes a prescribed value for switching said second half latch to said static type while not conducting when said mode signal takes another value for switching said second half latch to said dynamic type.

12. The flip-flop circuit in accordance with claim 11, further comprising:
(d) a logic circuit inputting a hold signal, a clock original signal and a mode original signal and outputting said clock signal and said mode signal, wherein
said clock signal and said mode signal are decided on the basis of said clock original signal and said mode original signal respectively when said hold signal takes a first value, and
values of said clock signal and said mode signal are fixed regardless of said clock original signal and said mode original signal when said hold signal takes a second value being complementary to said first value.

13. The flip-flop circuit in accordance with claim 11, wherein
said first and second half latches serve as master and slave latches respectively,
said input end of said first switch of said second half latch is indirectly connected with said output end of said selector through said first half latch, and
said output end of said first invertor of said second half latch is connected with said output terminal directly or indirectly through said second invertor.

14. The flip-flop circuit in accordance with claim 11, wherein said second and first half latches serve as master and slave latches respectively,
said input end of said first switch of said second half latch is directly connected with said output end of said selector, and
said output end of said first invertor of said second half latch is indirectly connected with said output terminal through said first half latch.

15. The flip-flop circuit in accordance with claim 10, wherein
said second half latch is provided with:
(c-1) a first switch including an input end being operationally coupled with said output end of said selector, and an output end, so that opening/closing thereof is controlled by a clock signal,
(c-2) a first invertor including an input end being connected with said output end of said first switch and an output end being operationally coupled with said output terminal,
(c-3) a second invertor,
(c-4) a second switch whose opening/closing is complementary to that of said first switch, and
(c-5) a third switch whose opening/closing is controlled by said mode signal,
said second invertor and said second and third switches are connected in series with each other between said input and output ends of said first invertor,
said second invertor is connected in antiparallel with said first invertor upon conduction of said second and third switches, and
said third switch does not conduct when said mode signal switches said second half latch to said dynamic type.

16. The flip-flop circuit in accordance with claim 15, further comprising:
(d) a logic circuit inputting a hold signal, a clock original signal and a mode original signal and outputting said clock signal and said mode signal, wherein
said clock signal and said mode signal are decided on the basis of said clock original signal and said mode original signal respectively when said hold signal takes a first value, and
values of said clock signal and said mode signal are fixed regardless of said clock original signal and said mode original signal when said hold signal takes a second value being complementary to said first value.

17. The flip-flop circuit in accordance with claim 15, wherein
said second invertor comprises:
(c-3-1) a pair of output lines forming said output end of said second invertor,
(c-3-2) an NMOS transistor comprising a drain being connected with first said output line, a gate being connected with said input end of said second invertor, and a source being supplied with a first potential corresponding to one of binary logics being outputted from said second invertor,
(c-3-3) a PMOS transistor comprising a drain being connected with second said output line, a gate being connected with said input end of said second invertor, and a source being supplied with a second potential corresponding to the other one of said binary logics and being higher than said first potential,
said second switch is a transmission gate employing NMOS and PMOS transistors, one and the other one of gates of said PMOS and NMOS transistors of said second switch receive said clock signal and an inverse clock signal being complementary to said clock signal respectively, said NMOS transistors of said second invertor and said second switch are connected in series with each other, and said PMOS transistors of said second invertor and said second switch are connected in series with each other.

18. The flip-flop circuit in accordance with claim 17, wherein said second switch is a transmission gate employing NMOS and PMOS transistors, one and the other one of gates of said PMOS and NMOS transistors of said second switch receive said clock signal and an inverse clock signal being complementary to said clock signal respectively, said third switch is a transmission gate employing NMOS and PMOS transistors, one and the other one of gates of said NMOS and PMOS transistors of said third switch are supplied with said mode signal and an inverse mode signal being complementary to said mode signal respectively, said NMOS transistors of said second and third switches are connected in series with each other, and said PMOS transistors of said second and third switches are connected in series with each other.

19. The flip-flop circuit in accordance with claim 15, wherein said first and second half latches serve as master and slave latches respectively, said input end of said first switch of said second half latch is indirectly connected with said output end of said selector through said first half latch, and said output end of said first invertor of said second half latch is connected with said output terminal directly or indirectly through said second invertor.

20. The flip-flop circuit in accordance with claim 19, wherein said first half latch is provided with:

(c-6) a switch including an input end being connected with said output end of said selector, and an output end, so that opening/closing thereof is complementary to that of said first switch of said second half latch, and (c-7) an invertor including an input end being connected with said output end of said switch of said first half latch, and an output end being indirectly connected with said output terminal through said second half latch, said switch of said first half latch is a transmission gate employing NMOS and PMOS transistors, said selector comprises:

(a-1) a first PMOS transistor including a first current electrode receiving said ordinary input signal, a second current electrode being connected with said input end of said invertor of said first half latch through said PMOS transistor of said switch of said first half latch, and a gate, (a-2) a first NMOS transistor including a first current electrode receiving said ordinary input signal, a second current electrode being connected with said input end of said invertor of said first half latch through said NMOS transistor of said switch of said first half latch, and a gate, (a-3) a second PMOS transistor including a first current electrode receiving said scan test signal, a second current electrode being connected with said second current electrode of said first PMOS transistor, and a gate being connected with said gate of said first NMOS transistor, and (a-4) a second NMOS transistor including a first current electrode receiving said scan test signal, a second current electrode being connected with said second current electrode of said first NMOS transistor, and a gate being connected with said gate of said first PMOS transistor, one and the other one of said gates of said first NMOS and PMOS transistors are supplied with said mode signal and said inverse mode signal respectively, and one and the other one of said gates of said NMOS and PMOS transistors of said switch of said half latch are supplied with said clock signal and said inverse clock signal respectively.

21. The flip-flop circuit in accordance with claim 15, wherein said second and first half latches serve as master and slave latches respectively, said input end of said first switch of said second half latch is directly connected with said output end of said selector, and said output end of said first invertor of said second half latch is indirectly connected with said output terminal through said first half latch.

22. The flip-flop circuit in accordance with claim 21, wherein said first switch of said second half latch is a transmission gate employing NMOS and PMOS transistors, said selector comprises:

(a-1) a first PMOS transistor including a first current electrode receiving said ordinary input signal, a second current electrode being connected with said input end of said first invertor through said PMOS transistor of said first switch of said second half latch, and a gate, (a-2) a first NMOS transistor including a first current electrode receiving said ordinary input signal, a second current electrode being connected with said input end of said first invertor through said NMOS transistor of said first switch of said second half latch, and a gate, (a-3) a second PMOS transistor including a first current electrode receiving said scan test signal, a second current electrode being connected with said second current electrode of said first PMOS transistor, and a gate being connected with said gate of said first NMOS transistor, and (a-4) a second NMOS transistor including a first current electrode receiving said scan test signal, a second current electrode being connected with said second current electrode of said first NMOS transistor, and a gate being connected with said gate of said first PMOS transistor, one and the other one of said gates of said first NMOS and PMOS transistors are supplied with said mode signal and an inverse mode signal being complementary to said mode signal respectively, and one and the other one of said gates of said NMOS and PMOS transistors of said first switch of said second half latch are supplied with said clock signal and an inverse clock signal being complementary to said clock signal respectively.

23. The flip-flop circuit in accordance with claim 22, wherein said second half latch is further provided with:
- (c-6) logic detection means being supplied with said mode signal, a comparison signal and said ordinary input signal for supplying a prescribed potential to said input end of said first invertor upon activation of said mode signal and said comparison signal.

24. A scan path comprising first and second flip-flop circuits being connected in series with each other, wherein said first flip-flop circuit is provided with:
- (a-1) a selector including a pair of input ends receiving a first ordinary input signal and a scan test signal, and an output end outputting either one thereof on the basis of a mode signal,
- (a-2) an output terminal,
- (a-3) a first half latch of a dynamic type being provided between said output end of said selector and said output terminal, and
- (a-4) a second half latch being connected in series with said first half latch between said output end of said selector and said output terminal to be switched between said dynamic type and a static type for operation when said mode signal takes first and second logic values respectively, said second flip-flop circuit is provided with:
- (b-1) a selector including a pair of input ends receiving a second ordinary input signal and a signal being supplied to said output terminal of said first flip-flop circuit respectively, and an output end outputting either one thereof on the basis of said mode signal,
- (b-2) an output terminal,
- (b-3) a first half latch of said dynamic type being provided between said output end of said selector of said second flip-flop circuit and said output terminal of said second flip-flop circuit, and
- (b-4) a second half latch being connected in series with said first half latch between said output end of said selector of said second flip-flop circuit and said output terminal of said second flip-flop circuit to be switched between said dynamic and static types for operation when said mode signal takes first and second logic values respectively, said selector of said first flip-flop circuit outputs said first ordinary input signal and said scan test signal when said mode signal takes said first and second logic values respectively, and said selector of said second flip-flop circuit outputs said second ordinary input signal and said signal being supplied to said output terminal of said first flip-flop circuit when said mode signal takes said first and second logic values respectively.

25. A scan path comprising first and second flip-flop circuits being connected in series with each other, wherein said first flip-flop circuit is provided with:
- (a-1) a selector including a pair of input ends receiving an ordinary input signal and a scan test signal, and an output end outputting either one thereof on the basis of a mode signal,
- (a-2) an output terminal,
- (a-3) a first half latch of a dynamic type being provided between said output end of said selector and said output terminal, and
- (a-4) a second half latch being connected in series with said first half latch between said output end of said selector and said output terminal to be switched between said dynamic type and a static type for operation when said mode signal takes first and second logic values respectively, said second flip-flop circuit is provided with:
- (b-1) an input terminal being connected with said output terminal of said first flip-flop circuit,
- (b-2) an output terminal,
- (b-3) a first half latch of a dynamic type being provided between said input terminal and said output terminal of said second flip-flop circuit, and
- (b-4) a second half latch being connected in series with said first half latch between said input terminal of said second flip-flop circuit and said output terminal of said second flip-flop circuit to be switched between said dynamic and static types for operation when said mode signal takes said first and second logic values respectively, and said selector of said first flip-flop circuit outputs said ordinary input signal and said scan test signal when said mode signal takes said first and second logic values respectively.

26. A flip-flop circuit being formed by series connection of first and second half latches and comprising input and output terminals, wherein
- (a) said first half latch is a dynamic type,
- (b) said second half latch comprises:
  - (b-1) a first switch including an input end being operationally coupled with said input terminal and an output end, so that opening/closing thereof is controlled by a clock signal,
  - (b-2) a first invertor including an input end being connected with said output end of said first switch and an output end being operationally coupled with said output terminal,
  - (b-3) first to third switches being connected in series with each other between a first potential point providing a first potential corresponding to one of binary logics and said input end of said first invertor, and
  - (b-4) fourth to sixth switches being connected in series with each other between a second potential point providing a second potential corresponding to the other one of said binary logics and said input end of said first invertor, and opening/closing of said first and fourth switches, that of said second switch, that of said third switch, that of said fifth switch, and that of said sixth switch are controlled by an output of said first invertor, said clock signal, a mode signal, an inverse clock signal being complementary to said clock signal, and an inverse mode signal being complementary to said mode signal respectively.

27. The flip-flop circuit in accordance with claim 26, wherein said second and first half latches serve as master and slave latches respectively, said input end of said first switch of said second half latch is directly connected with said input terminal, and said output end of said first invertor of said second half latch is indirectly connected with said output terminal through said first half latch.

28. The flip-flop circuit in accordance with claim 26, wherein said first and second half latches serve as master and slave latches respectively, said input end of said first switch of said second half latch is indirectly connected with said input terminal through said first half latch, and said output end of said first invertor of said second half latch is connected with said output terminal directly or indirectly through a connecting wire connecting a path serially connecting said first to third switches with each other excluding portions being directly connected with said first potential with a path serially connecting said fourth to sixth switches with each other excluding portions being directly connected with said second potential.

29. A storage circuit comprising:

(a) a first switch including input and output ends, so that opening/closing thereof is controlled by a clock signal;

(b) a first invertor including an input end being connected with said output end of said first switch, and an output end;

(c) a second invertor;

(d) a second switch whose opening/closing is complementary to that of said first switch; and (e) a third switch whose opening/closing is controlled by a mode signal, wherein said second invertor and said second and third switches are connected in series with each other between said output and input ends of said first invertor, and said second invertor is connected in antiparallel with said first invertor upon conduction of both of said second and third switches.

30. The storage circuit in accordance with claim 29, wherein said second invertor is provided with:

(c-1) a pair of output lines forming an output end of said second invertor, (c-2) an NMOS transistor comprising a drain being connected with first said output line, a gate being connected with an input end of said second invertor, and a source being supplied with a first potential corresponding to one of binary logics being outputted from said second invertor, and (c-3) a PMOS transistor comprising a drain being connected with second said output line, a gate being connected with said input end of said second invertor, and a source being supplied with a second potential corresponding to the other one of said binary logics and being higher than said first potential, said second switch is a transmission gate employing NMOS and PMOS transistors, one and the other one of gates of said PMOS and NMOS transistors of said second switch receive said clock signal and an inverse clock signal being complementary to said clock signal respectively, said NMOS transistors of said second invertor and said second switch are connected in series with each other, and said PMOS transistors of said second invertor and said second switch are connected in series with each other.

31. The storage circuit in accordance with claim 29, wherein said second switch is a transmission gate employing NMOS and PMOS transistors, one and the other one of gates of said PMOS and NMOS transistors of said second switch receive said clock signal and an inverse clock signal being complementary to said clock signal respectively, said third switch is a transmission gate employing NMOS and PMOS transistors, one and the other one of gates of said NMOS and PMOS transistors of said third switch are supplied with said mode signal and an inverse mode signal being complementary to said mode signal respectively, said NMOS transistors of said second and third switches are connected in series with each other, and said PMOS transistors of said second and third switches are connected in series with each other.

32. The storage circuit in accordance with claim 29, wherein said first invertor is a CMOS invertor circuit being formed by employing a basic cell of a CMOS gate array, a plurality of MOS transistors of at least one conductivity type being connected in parallel with each other in said CMOS invertor circuit.

33. The storage circuit in accordance with claim 29, wherein said second invertor is a CMOS invertor circuit being formed by employing a basic cell of a CMOS gate array, a plurality of MOS transistors of at least one conductivity type being connected in parallel with each other in said CMOS invertor circuit.

34. The storage circuit in accordance with claim 29, wherein an input end of said second invertor and said input ends of said second switch, said third switch and said first invertor are connected with said output ends of said first invertor, said second invertor, said second switch and said third switch respectively, said storage circuit further comprising:

(f) an output terminal being connected with said input end of said third switch.

35. The storage circuit in accordance with claim 34, further comprising:

(g) a half latch having an input end and an output end being connected with said input end of said first switch, an operation of said half latch being controlled by a switch between said input and output ends of said half latch being opened/closed complementarily to opening/closing of said first switch.

36. The storage circuit in accordance with claim 35, further comprising:

(h) a plurality of input terminals, and (i) a selector being provided between said plurality of input terminals and said input end of said half latch, to be controlled by a prescribed signal.

37. The storage circuit in accordance with claim 36, wherein said mode signal is employed as said prescribed signal.

38. The storage circuit in accordance with claim 29, wherein an input end of said second invertor and said input ends of said second switch, said third switch and said first invertor are connected with said output ends of said first invertor, said second invertor, said second switch and said third switch respectively, said storage circuit further comprising:

(f) a first drive circuit having an input end being connected with said input end of said third switch and an output end.

39. The storage circuit in accordance with claim 38, further comprising:

(g) a half latch having an input end and an output end being connected with said input end of said first switch, an operation of said half latch being controlled by a switch between said input and output ends of said half latch being opened/closed complementarily to opening/ closing of said first switch.

40. The storage circuit in accordance with claim 39, further comprising:

(h) a plurality of input terminals, and (i) a selector being provided between said plurality of input terminals and said input end of said half latch, to be controlled by a prescribed signal.

41. The storage circuit in accordance with claim 40, wherein said mode signal is employed as said prescribed signal.

42. The storage circuit in accordance with claim 38, further comprising:

(g) a plurality of input terminals, and (h) a selector being connected in series with said first switch between said plurality of input terminals and said first invertor, to be controlled by a prescribed signal.

43. The storage circuit in accordance with claim 38, further comprising:

(g) first and second input terminals, and (h) a selector being formed by first PMOS and first NMOS transistors each being controlled by a prescribed signal, wherein said first switch is formed by second PMOS and second NMOS transistors, said first and second PMOS transistors are connected in series with each other between said first input terminal and said input end of said invertor, and said first and second NMOS transistors are connected in series with each other between said second input terminal and said input end of said first invertor.

44. A storage circuit being formed by a plurality of the storage circuits in accordance with claim 43 being connected in series with each other for forming a scan path, said storage circuit further comprising a logic circuit being supplied with a reset signal for fixing logics of said mode signal, said clock signal and said prescribed signal on the basis of said reset signal.

45. The storage circuit in accordance with claim 42, wherein said mode signal is employed as said prescribed signal.

46. The storage circuit in accordance with claim 43, wherein said mode signal is employed as said prescribed signal.

47. The storage circuit in accordance with claim 38, further comprising:

(g) a fourth switch having an input end being connected with said output end of said first invertor and an output end, and (h) a second drive circuit having an input end being connected with said output end of said fourth switch and an output end, said first switch being opened/closed complementarily to opening/closing of said fourth switch.

48. The storage circuit in accordance with claim 47, further comprising:

(i) a plurality of input terminals, and (j) a selector being connected in series with said first switch between said plurality of input terminals and said first invertor, to be controlled by a prescribed signal.

49. The storage circuit in accordance with claim 29, wherein an input end of said second invertor and said input ends of said second switch, said third switch and said first invertor are connected with said output ends of said first invertor, said second invertor, said second switch and said third switch respectively, said storage circuit further comprises:

(f) a fourth switch having an input end being connected with said output end of said first invertor and an output end, (g) a first drive circuit having an input end being connected with said output end of said fourth switch and an output end, (h) a fifth switch having an input end being connected with said output end of said first invertor and an output end, and (i) a second drive circuit having an input end being connected with said output end of said fifth switch and an output end, said fourth and fifth switches are opened/closed complementarily to opening/closing of said first switch, and outputs of said first and second drive circuits take complementary values.

50. The storage circuit in accordance with claim 29, wherein said third switch conducts only when said second switch conducts.

51. A flip-flop circuit comprising:

(a) a plurality of input terminals;

(b) a selector selectively outputting a pair of signals among those being supplied to said plurality of input terminals on the basis of a mode signal;

(c) a master latch being provided with an input end receiving an output of said selector and an output end;

(d) a slave latch being provided with:

(d-1) a switch including an input end being connected with said output end of said master latch and an output end, and (d-2) a drive circuit including an input end being connected with said output end of said switch and an output end; and (e) a bypass switch having an input end being connected with one of said plurality of input terminals and an output end being connected with said input end of said drive circuit of said slave latch and being opened/ closed on the basis of a bypass signal, an operation of at least one of said master and slave latches being switched between dynamic and static types on the basis of said mode signal.

52. The flip-flop circuit in accordance with claim 51, wherein an operation of said master latch is switched between said dynamic and static types on the basis of said mode signal.

53. The flip-flop circuit in accordance with claim 51, wherein an operation of said slave latch is switched between said dynamic and static types on the basis of said mode signal.

54. The flip-flop circuit in accordance with claim 51, wherein said one of said plurality of input terminals is one of said pair of signals among those being supplied to said plurality of input terminals.

55. The flip-flop circuit in accordance with claim 54, further comprising:
   (f) a bypass invertor having an input end being connected with said one of said plurality of input terminals and an output end being connected with said input end of said bypass switch.

56. The flip-flop circuit in accordance with claim 55, further comprising:
   (g) a logic circuit inputting said bypass signal and a clock original signal forming the basis of a clock signal for controlling operations of said master and slave latches, wherein
      said clock signal is decided on the basis of said clock original signal when said bypass signal takes a first value, and
      the value of said clock signal is fixed regardless of said clock original signal when said bypass signal takes a second value being complementary to said first value.

57. The flip-flop circuit in accordance with claim 54, wherein
   said master latch is further provided with:
      (c-1) a switch including an input end being connected with that of said master latch and an output end, and
      (c-2) a drive circuit including an input end being connected with said output end of said switch of said master latch and an output end, and
   said drive circuit of said master latch outputs a fixed value when said bypass switch conducts, while outputting a signal being changed on the basis of change of a signal being transmitted by said switch of said master latch when said bypass switch does not conduct.

58. The flip-flop circuit in accordance with claim 57, wherein
   said drive circuit of said master latch is a tristate buffer being supplied with said bypass signal.

59. The flip-flop circuit in accordance with claim 58, wherein
   said drive circuit of said master latch is a tristate invertor.

60. The flip-flop circuit in accordance with claim 57, wherein
   said drive circuit of said master latch is a logic element further having a second input end being supplied with said bypass signal.

61. The flip-flop circuit in accordance with claim 60, wherein
   said drive circuit of said master latch is a two-input NAND gate.

62. The flip-flop circuit in accordance with claim 51, wherein
   a signal being provided at said one of said plurality of input terminals is different from both of said pair of signals among those being supplied to said plurality of input terminals.

63. A flip-flop circuit comprising series connection of a pair of half latches serving as master and slave latches, wherein
   at least one of said pair of half latches is switched between dynamic and static types by a mode signal to operate,
   operations of said master and slave latches being controlled by a pair of different clock signals respectively.

64. The flip-flop circuit in accordance with claim 63, wherein
   at least one of said pair of half latches regularly operates in said dynamic type.

65. The flip-flop circuit in accordance with claim 63, further comprising a selector selecting one input signal from a plurality of input signals on the basis of said mode signal and transmitting said one input signal to said master latch.

66. The flip-flop circuit in accordance with claim 65, further comprising a logic circuit inputting one of said pair of clock signals and a clock original signal for forming the other one of said pair of clock signals, wherein
   a pair of transitions are necessarily performed when value of said clock original signal transits, said pair of transitions being present in a period when said one of said pair of clock signals is inactive.

67. The flip-flop circuit in accordance with claim 66, wherein
   said one and said other one of said pair of clock signals control operations of said master and slave latches respectively,
   said plurality of input signals are paired, and
   said clock original signal is employed as said mode signal.

68. The flip-flop circuit in accordance with claim 67, wherein
   said master latch is switched between said dynamic and static operations by said clock original signal.

69. The flip-flop circuit in accordance with claim 67, wherein
   said slave latch is switched between said dynamic and static operations by said clock original signal.

70. A flip-flop circuit comprising:
   a first selector inputting a plurality of first inputs for selecting and outputting one therefrom;
   a first half latch receiving an output of said first selector and operating through a first clock signal for outputting a first output;
   a second selector inputting said first output and at least one of second input for selecting and outputting one therefrom; and
   a second half latch receiving an output of said second selector and operating through a second clock signal for outputting a second output.

71. The flip-flop circuit in accordance with claim 70, wherein
   a number of said plurality of first inputs is 2, and a number of said second input is 1, and
   an operation of each of said first and second selectors is controlled by a mode signal.

72. The flip-flop circuit in accordance with claim 71, wherein
   at least one of said first and second half latches is switched between said dynamic and static types on the basis of said mode signal to operate.

73. The flip-flop circuit in accordance with claim 72, wherein
   said first half latch is switched between said dynamic and static types on the basis of said mode signal to operate.

74. The flip-flop circuit in accordance with claim 73, wherein
   said second half latch is switched between said dynamic and static types on the basis of said mode signal to operate.

75. A flip-flop circuit comprising:
   (a) a first switch having input and output ends;
   (b) a first invertor having an input end being connected with said output end of said first switch and an output end;
   (c) a second invertor having an input end being connected with said output end of said first invertor and an output end;

(d) a first half latch being connected with said output end of said first invertor; and (e) a second half latch being connected with said output end of said second invertor, wherein said first and second half latches operate in synchronization with each other, and said first switch non-conducts when said first and second half latches are in states transmitting information, and conducts when said first and second latches are in states holding information.

76. The flip-flop circuit in accordance with claim 75, further comprising:

(f) a second switch being interposed between said output end of said second invertor and said input end of said first invertor, wherein said second switch non-conducts when said first and second half latches are in states transmitting information, and conducts when said first and second latches are in states holding information.

77. The flip-flop circuit in accordance with claim 76, further comprising:

(g) a third switch being connected in series with said second switch between said output end of said second invertor and said input end of said first invertor, said third switch being opened/closed by a mode signal independently of said first and second switches and said first and second half latches.

78. The flip-flop circuit in accordance with claim 77, further comprising:

(h) a plurality of input terminals, and (i) a selector alternatively supplying signals being supplied to said plurality of input terminals to said input end of said first switch, said selector operating in synchronization with opening/closing of said third switch.

79. A storage circuit comprising:

a core part for writing and reading data in correspondence to addresses;

a first flip-flop for inputting a write enable original signal and outputting the same at a timing being based on a clock signal;

a second flip-flop for inputting said data to be written and outputting the same to said core part at a timing being based on said clock signal;

a write control part for inputting an output of said first flip-flop and supplying the same to said core part as a write enable signal at a timing being based on said clock signal; and selection means having a first input end being supplied with a read address, a second input end being supplied with a write address, and an output end, wherein said output end of said selection means (a) supplies said write address to said core part at a timing being based on said clock signal when the value of said output of said first flip-flop corresponds to a write operation, and (b) supplies said read address to said core part when the value of said output of said first flip-flop corresponds to a read operation, and said core part writes an output of said second flip-flop in said address corresponding to a signal being supplied to said output end of said selection means by activation of said write enable signal.

80. The storage circuit in accordance with claim 79, wherein said selection means has:

a third flip-flop being connected to said second input end for transmitting said write signal at a timing being based on said clock signal, and a selector including a first end being connected to said first input end, a second end being connected to said third flip-flop, a third end being connected to said output end of said selection means, and a control end being connected to an output end of said first flip-flop, and said selector supplies said third end with either one of signals being supplied to said first and second ends in accordance with a value being supplied to said control end.

81. The storage circuit in accordance with claim 80, wherein said third flip-flop is a scan flip-flop, and said selection means is also supplied with a test signal for supplying said output end of its own with a signal being supplied to said second end of its own at least either when said test signal is activated or when said output of said first flip-flop corresponds to said write operation.

82. The storage circuit in accordance with claim 81, wherein said second flip-flop is a scan flip-flop.

83. The storage circuit in accordance with claim 79, wherein said selection means comprises:

a selector for selectively outputting said write address and a scan test signal on the basis of a mode signal, a master latch for transmitting an output of said selector, a slave latch having a switch including an input end being connected to an output end of said master latch and an output end, for transmitting an output of said master latch therethrough, and a bypass switch having an input end being supplied with said read address and an output end being connected to said output end of said switch of said slave latch to be switched on/off on the basis of activation/inactivation of a bypass signal, said bypass signal is inactivated at least either when said test signal is activated or when said output of said first flip-flop corresponds to said write operation, and said switch of said slave latch enters a nonconducting state regardless of said clock signal when said bypass signal is activated.

84. The storage circuit in accordance with claim 83, wherein one of said master and said slave latches i) operates as a static type when said mode signal controls said selector to output said scan test signal, and ii) operates as a dynamic type when said mode signal controls said selector to output said write address, and the other said latch operates as said dynamic type.

85. The storage circuit in accordance with claim 79, wherein said first and second input ends are connected in common, to be supplied with both of said write and read addresses in common.

86. The storage circuit in accordance with claim 85, wherein said second flip-flop is a scan flip-flop, so that whether its operation is in a scan mode or an ordinary mode is controlled by said control signal.

* * * * *